US007405439B2

(12) United States Patent
Ichimori

(10) Patent No.: US 7,405,439 B2
(45) Date of Patent: Jul. 29, 2008

(54) MEMORY CELL STRUCTURE AND SEMICONDUCTOR MEMORY DEVICE

(75) Inventor: Takashi Ichimori, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 41 days.

(21) Appl. No.: 11/277,923

(22) Filed: Mar. 29, 2006

(65) Prior Publication Data
US 2006/0244031 A1 Nov. 2, 2006

(30) Foreign Application Priority Data
Apr. 27, 2005 (JP) ............................. 2005-130534

(51) Int. Cl.
*H01L 27/108* (2006.01)
(52) U.S. Cl. ................. 257/306; 257/296; 257/311; 257/E21.008; 257/E21.396; 438/386

(58) Field of Classification Search .................. None
See application file for complete search history.

(56) References Cited

U.S. PATENT DOCUMENTS

| 5,289,416 A | * | 2/1994 | Iwai et al. .................. 365/200 |
| 5,953,619 A | | 9/1999 | Miyazawa et al. |
| 2002/0045311 A1 | * | 4/2002 | Mikawa ...................... 438/240 |

* cited by examiner

*Primary Examiner*—A. Sefer
*Assistant Examiner*—Scott R Wilson
(74) *Attorney, Agent, or Firm*—Rabin & Berdo, P.C.

(57) ABSTRACT

A memory cell structure comprises a first memory capacitor that is arranged in a first local area, and includes a first lower electrode, a first upper electrode, and a first dielectric oxide film interposed between the first lower electrode and the first upper electrode; a second memory capacitor that is spaced apart from the first memory capacitor and arranged in the first local area, and includes a second lower electrode, a second upper electrode, and a second dielectric oxide film interposed between the second lower electrode and the second upper electrode; and a first local interconnection layer.

15 Claims, 65 Drawing Sheets

MEMORY CELL STRUCTURE AND SEMICONDUCTOR MEMORY DEVICE

CROSS-REFERENCE TO RELATED APPLICATIONS

The present application is related to commonly assigned and U.S. patent application titled "SEMICONDUCTOR MEMORY DEVICE AND METHOD FOR MANUFACTURING THE SAME", filed on an even date herewith.

BACKGROUND OF THE INVENTION

1. Field of the Invention

The present invention relates to a semiconductor device that includes an oxide dielectric and a method for manufacturing the same, particularly (i) the surrounding structure of a local interconnection that electrically interconnects memory cells that include a metal oxide dielectric film and a method for manufacturing the same, and (ii) a semiconductor memory device that includes the surrounding structure of the local interconnection and a method for manufacturing the same.

2. Background of the Related Art

In general, interconnections used in a semiconductor device can be classified as a global interconnection and a local interconnection. An electrical connection over great distance is provided by a global interconnection. Therefore, a global interconnection is generally composed of a conductive material having a low resistance rate in order to reduce wiring delay. On the other hand, an electrical connection over short distance is provided by a local interconnection, in contrast to the above described global interconnection. Because of this, a local interconnection has a lower level of demand for reducing wiring delay compared to the global interconnection. Therefore, the local interconnection can be composed of a conductive material having a resistance rate that is higher than that of the global interconnection.

The above described heretofore known points are hereinafter explained by using a semiconductor memory device as an example. The semiconductor memory device includes a two-dimensional matrix array of a plurality of memory cells. In addition, each memory cell is comprised of at least a capacitor and a switching transistor. Therefore, a memory cell array of a semiconductor memory device has a plurality of capacitors. It is preferable to increase the number of memory cells because storage capacity is increased by the increased number of memory cells. However, problems related to the wiring delay tend to be caused by the increase in the number of memory cells.

The amount of the wiring delay is increased by the increase in the capacitance connected to one wiring. In particular, when numerous capacitors are connected to one global interconnection and the total capacitance connected to the global interconnection grows large, a large wiring delay tends to be caused in the global interconnection. Therefore, the local interconnection that electrically connects a plurality of capacitors located within a local region of a memory cell is generally provided. Thus, the capacitance connected to the global interconnection is lowered by connecting the local interconnection to the global interconnection through a switching transistor. This structure makes it possible for a semiconductor memory device to have high speed operation properties.

The distance of the local interconnection is shorter than that of the global interconnection. Therefore, the demand for lowering the resistance rate of conductive material composed of the local interconnection is lower than that of the global interconnection. For example, the global interconnection can be composed of aluminum (Al). On the other hand, the local interconnection can be composed of titanium nitride (TiN). Japan Patent Application Publication JP-A-11-54716 (especially paragraph number 0035 and FIG. 13) discloses a local interconnection composed of titanium nitride (TiN).

Recently, demands for increasing the degree of integration of the above described memory cell array have been increasing. In order to increase the degree of integration of the memory cell array, technologies in which the capacitor obtains high capacitance and each memory cell is miniaturized are in demand. It is widely known that metal oxide ferroelectrics or metal oxide high dielectrics are used as a capacitor dielectric comprising a capacitor in response to these demands.

On the other hand, it is also well known that the ferroelectric properties of the metal oxide ferroelectrics or the high dielectric properties of metal oxide high dielectrics are deteriorated by means of the reduction of the metal oxide ferroelectrics or the metal oxide high dielectrics. Specifically, reduction reactions are caused between hydrogen and the metal oxide ferroelectrics or the metal oxide high dielectrics, and thus the ferroelectric properties or the high dielectric properties are deteriorated. An upper electrode of a capacitor having a capacitor dielectric comprised of the metal oxide ferroelectrics or the metal oxide high dielectrics is connected to an interconnection layer through a contact hole. In general, after the interconnection layer is formed, an interlayer insulating film is formed above a capacitor and a conductive contact plug is formed in a contact hole that is formed in an interlayer insulation film with the chemical vapor deposition method (the CVD method). In this step, in which the CVD method is conducted, hydrogen that functions as the reducing agent is generated. In other words, hydrogen that functions as the reducing agent is generated in a manufacturing step, such as a step in which the CVD method is conducted, after an interconnection layer that has a contact with the upper electrode of the capacitor is formed.

However, the above described interconnection layer having a contact with the upper electrode is generally comprised of a conductive hydrogen permeable conductive substance, such as titanium nitride (TiN) and aluminum (Al). In addition, the above described upper electrode is comprised of a conductive hydrogen-permeable substance. Therefore, hydrogen penetrates into a capacitor dielectric through the interconnection layer and the upper electrode in a contact hole. Thus, reduction reactions are generated between hydrogen and the metal oxide ferroelectric or the metal oxide high dielectric. As a result, there is a possibility that the ferroelectric properties or the high dielectric properties of the capacitor dielectric will deteriorate. This deterioration makes it difficult for a capacitor to obtain high capacitance. Consequently, it becomes difficult for each memory cell to be miniaturized and further difficult for the degree of integration of the memory cell array to be increased.

SUMMARY OF THE INVENTION

It is therefore an object of the present invention to resolve the above described problems, and to provide a semiconductor memory device without the above described problems.

The present invention provides a memory cell structure comprising a first memory capacitor that is located in a first local area, and is composed of a first lower electrode, a first upper electrode and a first dielectric oxide film interposed between the first lower electrode and the first upper electrode;

a second memory capacitor that is spaced away from the first memory capacitor and located in the first local area, and is composed of a second lower electrode, a second upper electrode and a second dielectric oxide film interposed between the second lower electrode and the second upper electrode; a first local interconnection layer that has electrical conductivity and non-permeability to hydrogen, and extends only within the first local area, the first local interconnection layer including a first contact portion that is in contact with the first upper electrode and spaced from the first dielectric oxide film by the first upper electrode, a second contact portion that is in contact with the second upper electrode and spaced from the second dielectric oxide film by the second upper electrode, and a first non-contact portion that connects the first contact portion to the second contact portion and is spaced away from the first and the second memory capacitors.

The present invention provides a semiconductor memory device comprising a first word line; a first non-inverted bit line; a first inverted bit line; a first global interconnection layer; a first memory capacitor that is composed of a first accumulation electrode, a first counter electrode, and a first dielectric oxide film interposed between the first accumulation electrode and the first counter electrode; a second memory capacitor that is composed of a second accumulation electrode, a second counter electrode, and a second dielectric oxide film interposed between the second accumulation electrode and the second counter electrode; a first local interconnection layer that has electrical conductivity and non-permeability to hydrogen, the first local interconnection layer including a first contact portion that is in contact with the first counter electrode and spaced from the first dielectric oxide film by the first counter electrode, a second contact portion that is in contact with the second counter electrode and spaced from the second dielectric oxide film by the second counter electrode, and a first non-contact portion that connects the first contact portion to the second contact portion and spaced away from the first and the second memory capacitors; a first switching transistor that includes the first gate electrode electrically connected to a first word line, and provides electrical connection between the first non-inverted bit line and the first lower electrode; a second switching transistor that includes a second gate electrode electrically connected to the first word line, and provides electrical connection between the first inverted bit line and the second accumulation electrode; and a third switching transistor that includes a third gate electrode electrically connected to the first word line, and provides electrical connection between the first local interconnection layer and the first global interconnection layer.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of the original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents. Here, the present invention is applied to a metal oxide ferroelectric capacitor in a FeRAM memory cell.

In the present application, the term "local interconnection" means an interconnection that is formed in a specific local area and provides electrical interconnections among a plurality of elements formed within the specific local area. On the other hand, the term "global interconnection" means an interconnection which is formed not only within a specific local area but also other areas and provides electrical interconnections among a plurality of elements which are formed outside the specific local area but not localized in one local area that is different from the specific local area, or electrical interconnections between elements formed within the specific local area and elements formed outside the specific local area.

First Embodiment

This embodiment provides a semiconductor memory device including a two-dimensional matrix array of FeRAM cells having ferroelectric capacitors, and a logic circuit adjacent to this array.

Semiconductor Memory Device Construction

Figure 1:
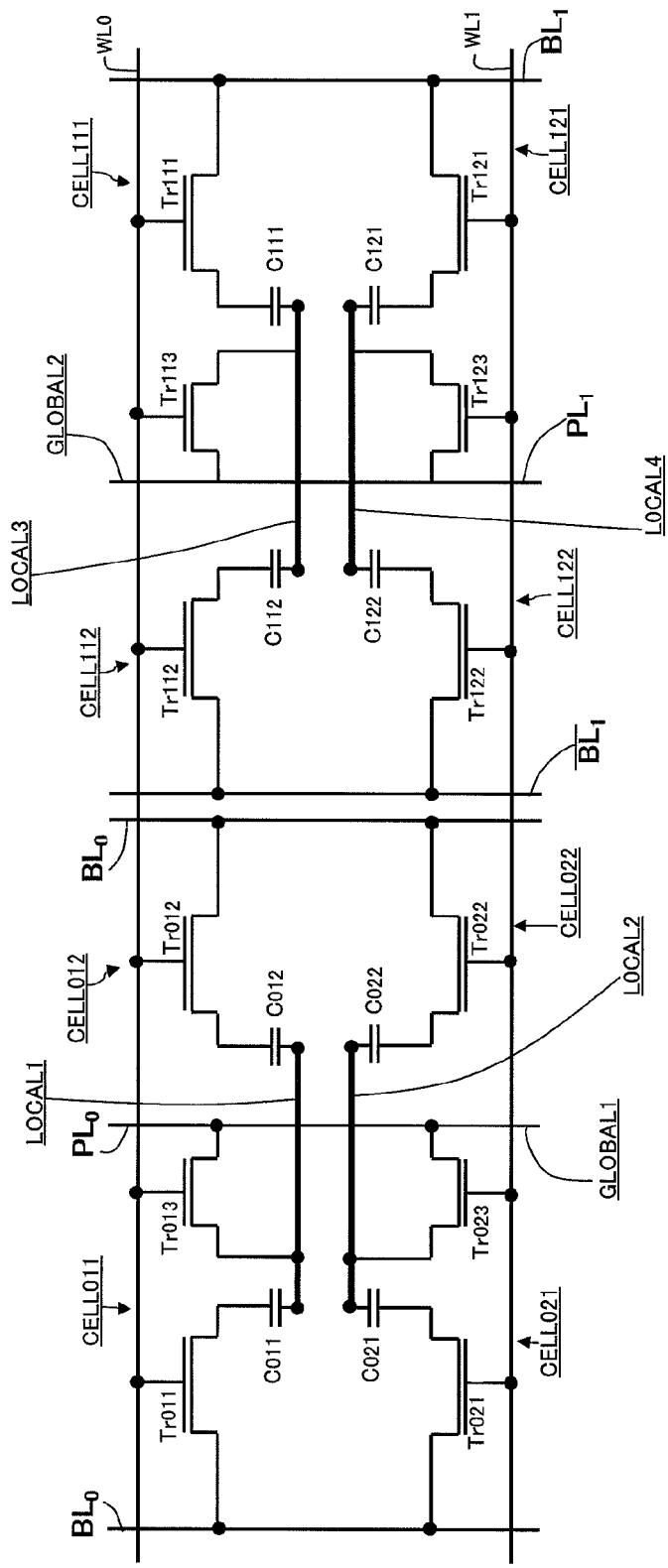
FIG. 1 is a partial equivalent circuit diagram showing a portion of the construction of a two-dimensional matrix array of FeRAM cells included in a semiconductor device according to the present invention.

FIG. 1 is a partial equivalent circuit diagram showing a portion of the construction of a two-dimensional matrix array of FeRAM cells included in a semiconductor memory device according to the present invention. The two-dimensional matrix array of FeRAM cells included in the semiconductor memory device according to this embodiment includes a plurality of bit line pairs, a plurality of word lines, and the FeRAM cells provided at a plurality of intersections of the plurality of bit lines and the plurality of word lines. The FeRAM cell is composed of one switching transistor and one memory capacitor.

Each memory capacitor is composed of an accumulation electrode, a counter electrode, and a capacitor dielectric film that is interposed between the accumulation electrode and the counter electrode. The switching transistor can be composed of a field-effect transistor, typically, a MOS transistor. A control electrode, i.e., a gate electrode of the field-effect transistor is connected to the word line and receives a control signal transmitted through this word line. The aforementioned accumulation electrode of the memory capacitor is connected to the bit line through the switching transistor, and receives and stores data transmitted through this bit line.

One pair of the bit lines is composed of a bit line that transmits data, and an inverted bit line that transmits inverted data inverted from the data. A certain FeRAM cell is connected to a certain bit line, and stores data transmitted by this bit line. Another FeRAM cell is provided adjacent to this FeRAM cell and connected to the inverted bit line that is paired with this bit line, and stores Inverted data transmitted by this inverted bit line. That is, two FeRAM cells connected to two bit lines that are provided adjacent to and paired with each other are provided adjacent to and paired with each other. Respective gate electrodes of the switching transistors included in the FeRAM cells that are paired with each other are connected to a certain common word line, and receive a common control signal transmitted by this common word line.

In this embodiment, one local interconnection is connected to two bit lines that are provided adjacent to and paired with each other, and provides electrical interconnection between the counter electrodes of the memory capacitors included in a pair of FeRAM cells that are provided adjacent to and paired with each other, respectively. That is, the respective counter electrodes of the memory capacitors included in a pair of FeRAM cells are electrically connected to each other through one local interconnection. In addition, this local interconnection is connected to the global interconnection through another switching transistor other than the aforementioned respective switching transistors included in the pair of FeRAM cells. This global interconnection is composed of a plate line. This switching transistor between this plate line as the global interconnection and the aforementioned local interconnection has a gate electrode. This gate electrode is connected to the aforementioned common word line that connects the aforementioned respective gate electrodes of the switching transistors included in the one pair of FeRAM cells, and receives the common control signal transmitted by this common word line. That is, one common word line connects the aforementioned respective gate electrodes of the switching transistors included in the pair of FeRAM cells, and the gate electrode of the switching transistor provided between the plate line as the global interconnection and the local interconnection to each other. Thus, these three switching transistors are controlled based on the common control signal.

Accordingly, the common control signal brings the respective switching transistors included in a pair of FeRAM cells, and the switching transistor provided between the local interconnection and the plate line, to a conductive state. As a result, when non-inverted signal data and inverted signal data are written into the respective accumulation electrodes of the memory capacitors included in a pair of FeRAM cells, or when they are read from these accumulation electrodes, the counter electrodes of these memory capacitors are electrically connected to the plate line as the global interconnection, thus, this plate line has a capacitance that is provided by these memory capacitors. However, except when data is written into the memory capacitors, and except when data is read from the memory capacitors, the memory capacitors are not electrically connected to this plate line as the global interconnection. For this reason, the global interconnection that is composed of a plate line essentially does not have a significant wiring delay problem. On the other hand, two memory capacitors are constantly and electrically connected to each local interconnection. However, since the wiring distance of each local interconnection is very short as compared with the global interconnection, the local interconnection essentially does not have a significant wiring delay problem.

FIG. 1 shows the construction of eight FeRAM cells that are provided adjacent to each other, i.e., first through eighth FeRAM cells of CELL011, CELL012, CELL021, CELL022, CELL111, CELL112, CELLL121, and CELL122.

The first FeRAM cell CELL011 and the second FeRAM cell CELL012 are connected to a pair of bit line BL.sub.0 and inverted bit line /BL.sub.0, respectively, and are commonly connected to a word line WL.sub.0. In addition, the first FeRAM cell CELL011 and the second FeRAM cell CELL012 are commonly connected to a first local interconnection LOCAL1. This first local interconnection LOCAL1 is connected to a first global interconnection GLOBAL1 of a plate line PL.sub.0 through a switching transistor Tr.sub.013. This switching transistor Tr.sub.013 has a gate electrode. This gate electrode is connected to the word line WL.sub.0.

The first FeRAM cell CELL011 is composed of a pair of a switching transistor Tr.sub.011 and a memory capacitor C.sub.011. This switching transistor Tr.sub.011 has a gate electrode. This gate electrode is connected to the word line WL.sub.0, and receives a control signal transmitted through this word line WL.sub.0. This memory capacitor C.sub.011 is composed of an accumulation electrode, a counter electrode, and a capacitor dielectric film that is interposed between the accumulation electrode and the counter electrode. This accumulation electrode of the memory capacitor is connected to the bit line BL.sub.0 through the switching transistor Tr.sub.011, and receives and stores data transmitted through this bit line BL.sub.0. The counter electrode of the memory capacitor C.sub.011 is connected to a counter electrode of a memory capacitor C.sub.012 through the first local interconnection LOCAL1, and is connected to the first global interconnection GLOBAL1 of the plate line $PL_0$ through the first local interconnection LOCAL1 and the switching transistor $Tr_{013}$.

The second FeRAM cell CELL012 is composed of a pair of a switching transistor $Tr_{012}$ and a memory capacitor $C_{012}$. This switching transistor $Tr_{012}$ has a gate electrode. This gate electrode is connected to the word line $WL_0$, and receives a control signal transmitted through this word line $WL_0$. This memory capacitor $C_{012}$ is composed of an accumulation electrode, a counter electrode, and a capacitor dielectric film that is interposed between the accumulation electrode and the counter electrode. This accumulation electrode of the memory capacitor is connected to the inverted bit line $/BL_0$ through the switching transistor $Tr_0$, and receives and stores data transmitted through this inverted bit line $/BL_0$. The counter electrode of the memory capacitor $C_{012}$ is connected to the counter electrode of the memory capacitor $C_{011}$ through the first local interconnection LOCAL1, and is connected to the first global interconnection GLOBAL1 of the plate line $PL_0$ through the first local interconnection LOCAL1 and the switching transistor $Tr_{013}$.

When data of the bit line $BL_0$ and inverted data of the inverted bit line $/BL_0$ are written into the accumulation electrodes of the memory capacitors $C_{011}$ and $C_{012}$, or when they are read from these accumulation electrodes, the counter electrodes of these memory capacitors $C_{011}$ and $C_{012}$ are electrically connected to the plate line $PL_0$ as the first global interconnection GLOBAL1, thus, this plate line $PL_0$ has a capacitance that is provided by these memory capacitors $C_{011}$ and $C_{012}$. However, except when data is written into the memory capacitors $C_{011}$ and $C_{012}$, and except when data is read from the memory capacitors $C_{011}$ and $C_{012}$, the memory capacitors $C_{011}$ and $C_{012}$ are not electrically connected to this plate line $PL_0$ as the first global interconnection GLOBAL1. For this reason, the first global interconnection GLOBAL1 that is composed of the plate line $PL_0$ essentially does not have a significant wiring delay problem. On the other hand, two memory capacitors $C_{011}$ and $C_{012}$ are constantly and electrically connected to the first local interconnection LOCAL1. However, since the wiring distance of the first local interconnection LOCAL1 is very short as compared with the first global interconnection GLOBAL1, the first local interconnection LOCAL1 essentially does not have a significant wiring delay problem.

The third FeRAM cell CELL021 and the fourth FeRAM cell CELL022 are connected to the pair of bit line $BL_0$ and inverted bit line $/BL_0$, respectively, and are commonly connected to a word line $WL_1$. In addition, the third FeRAM cell CELL021 and the fourth FeRAM cell CELL022 are commonly connected to a second local interconnection LOCAL2. This second local interconnection LOCAL2 is connected to the first global interconnection GLOBAL1 of the plate line $PL_0$ through a switching transistor $Tr_{023}$. This switching transistor $Tr_{023}$ has a gate electrode. This gate electrode is connected to the word line $WL_1$.

The third FeRAM cell CELL021 is composed of a pair of a switching transistor $Tr_{021}$ and a memory capacitor $C_{021}$. This switching transistor $Tr_{021}$ has a gate electrode. This gate electrode is connected to the word line $WL_1$, and receives a control signal transmitted through this word line $WL_1$. This memory capacitor $C_{021}$ is composed of an accumulation electrode, a counter electrode, and a capacitor dielectric film that is interposed between the accumulation electrode and the counter electrode. This accumulation electrode of the memory capacitor is connected to the bit line $BL_0$ through the switching transistor $Tr_{021}$, and receives and stores data transmitted through this bit line $BL_0$. The counter electrode of the memory capacitor $C_{021}$ is connected to the counter electrode of the memory capacitor $C_{022}$ through the second local interconnection LOCAL2, and is connected to the first global interconnection GLOBAL1 of the plate line $PL_0$ through the second local interconnection LOCAL2 and the switching transistor $Tr_{023}$.

The fourth FeRAM cell CELL022 is composed of a pair of a switching transistor $Tr_{022}$ and a memory capacitor $C_{022}$. This switching transistor $Tr_{022}$ has a gate electrode. This gate electrode is connected to the word line $WL_1$, and receives a control signal transmitted through this word line $WL_1$. This memory capacitor $C_{022}$ is composed of an accumulation electrode, a counter electrode, and a capacitor dielectric film that is interposed between the accumulation electrode and the counter electrode. This accumulation electrode of the memory capacitor is connected to the inverted bit line $/BL_0$ through the switching transistor $Tr_{022}$, and receives and stores data transmitted through this inverted bit line $/BL_0$. The counter electrode of the memory capacitor $C_{022}$ is connected to the counter electrode of the memory capacitor $C_{021}$ through the second local interconnection LOCAL2, and is connected to the first global interconnection GLOBAL1 of the plate line $PL_0$ through the second local interconnection LOCAL2 and the switching transistor $Tr_{023}$.

When data of the bit line $BL_0$ and inverted data of the inverted bit line $/BL_0$ are written into the accumulation electrodes of the memory capacitors $C_{021}$ and $C_{022}$, or when they are read from these accumulation electrodes, the counter electrodes of these memory capacitors $C_{021}$ and $C_{022}$ are electrically connected to the plate line $PL_0$ as the first global interconnection GLOBAL1, thus, this plate line $PL_0$ has a capacitance that is provided by these memory capacitors $C_{021}$ and $C_{022}$. However, except when data is written into the memory capacitors $C_{021}$ and $C_{022}$, and except when data is read from the memory capacitors $C_{021}$ and $C_{022}$, the memory capacitors $C_{021}$ and $C_{022}$ are not electrically connected to this the plate line $PL_0$ as the first global interconnection GLOBAL1. For this reason, the first global interconnection GLOBAL1 that is composed of the plate line $PL_0$ essentially does not have a significant wiring delay problem. On the other hand, two memory capacitors $C_{021}$ and $C_{022}$ are constantly and electrically connected to the second local interconnection LOCAL2. However, since the wiring distance of the second local interconnection LOCAL2 is very short as compared with the first global interconnection GLOBAL1, the second local interconnection LOCAL2 essentially does not have a significant wiring delay problem.

The fifth FeRAM cell CELL111 and the sixth FeRAM cell CELL112 are connected to a pair of bit line $BL_1$ and inverted bit line $/BL_1$, respectively, and are commonly connected to the word line $WL_0$. In addition, the fifth FeRAM cell CELL111 and the sixth FeRAM cell CELL112 are commonly connected to a third local interconnection LOCAL3. This third local interconnection LOCAL3 is connected to a second global interconnection GLOBAL2 of a plate line $PL_1$ through a switching transistor $Tr_{113}$. This switching transistor $Tr_{113}$ has a gate electrode. This gate electrode is connected to the word line $WL_0$.

The fifth FeRAM cell CELL111 is composed of a pair of a switching transistor $Tr_{111}$ and a memory capacitor $C_{111}$. This switching transistor $Tr_{111}$ has a gate electrode. This gate electrode is connected to the word line $WL_0$ and receives a control signal transmitted through this word line $WL_0$. This memory capacitor $C_{111}$ is composed of an accumulation electrode, a counter electrode, and a capacitor dielectric film that is interposed between the accumulation electrode and the counter electrode. This accumulation electrode of the memory capacitor is connected to the bit line $BL_1$ through the switching transistor $Tr_{111}$, and receives and stores data transmitted through this bit line $BL_1$. The counter electrode of the memory capacitor $C_{111}$ is connected to a counter electrode of a memory capacitor $C_{112}$ through the third local interconnection LOCAL3, and is connected to the second global interconnection GLOBAL2 of the plate line $PL_1$ through the third local interconnection LOCAL3 and the switching transistor $Tr_{113}$.

The sixth FeRAM cell CELL112 is composed of a pair of a switching transistor $Tr_{112}$ and a memory capacitor $C_{112}$. This switching transistor $Tr_{112}$ has a gate electrode. This gate electrode is connected to the word line $WL_0$, and receives a control signal transmitted through this word line $WL_0$. This memory capacitor $C_{112}$ is composed of an accumulation electrode, a counter electrode, and a capacitor dielectric film that is interposed between the accumulation electrode and the counter electrode. This accumulation electrode of the memory capacitor is connected to the inverted bit line $/BL_1$ through the switching transistor $Tr_{112}$, and receives and stores data transmitted through this inverted bit line $/BL_1$. The counter electrode of the memory capacitor $C_{112}$ is connected to the counter electrode of the memory capacitor $C_{111}$ through the third local interconnection LOCAL3, and is connected to the second global interconnection GLOBAL2 of the plate line $PL_1$ through the third local interconnection LOCAL3 and the switching transistor $Tr_{113}$.

When data of the bit line $BL_1$ and inverted data of the inverted bit line $/BL_1$ are written into the accumulation electrodes of the memory capacitors $C_{111}$ and $C_{112}$, or when they are read from these accumulation electrodes, the counter electrodes of these memory capacitors $C_{111}$ and $C_{112}$ are electrically connected to the plate line $PL_1$ as the second global interconnection GLOBAL2, thus, this plate line $PL_1$ has a capacitance that is provided by these memory capacitors $C_{111}$ and $C_{112}$. However, except when data is written into the memory capacitors $C_{111}$ and $C_{112}$, and except when data is read from the memory capacitors $C_{111}$ and $C_{112}$, the memory capacitors $C_{111}$ and $C_{112}$ are not electrically connected to this plate line $PL_1$ as the second global interconnection GLOBAL2. For this reason, the second global interconnection GLOBAL2 that is composed of the plate line $PL_1$ essentially does not have a significant wiring delay problem. On the other hand, two memory capacitors $C_{111}$ and $C_{112}$ are constantly and electrically connected to the third local interconnection LOCAL3. However, since the wiring distance of the third local interconnection LOCAL3 is very short as compared with the second global interconnection GLOBAL2, the third local interconnection LOCAL3 essentially does not have a significant wiring delay problem.

The seventh FeRAM cell CELL121 and the eighth FeRAM cell CELL122 are connected to the pair of bit line $BL_1$ and inverted bit line $/BL_1$, respectively, and are commonly connected to the word line $WL_1$. In addition, the seventh FeRAM cell CELL121 and the eighth FeRAM cell CELL122 are commonly connected to a fourth local interconnection LOCAL4. This fourth local interconnection LOCAL4 is connected to the second global interconnection GLOBAL2 of the plate line $PL_1$ through a switching transistor $Tr_{123}$. This switching transistor $Tr_{123}$ has a gate electrode. This gate electrode is connected to the word line $WL_1$.

The seventh FeRAM cell CELL121 is composed of a pair of a switching transistor $Tr_{121}$ and a memory capacitor $C_{121}$. This switching transistor $Tr_{121}$ has a gate electrode. This gate electrode is connected to the word line $WL_1$, and receives a control signal transmitted through this word line $WL_1$. This memory capacitor $C_{121}$ is composed of an accumulation electrode, a counter electrode, and a capacitor dielectric film that is interposed between the accumulation electrode and the counter electrode. This accumulation electrode of the memory capacitor is connected to the bit line $BL_1$ through the switching transistor $Tr_{121}$, and receives and stores data transmitted through this bit line $BL_1$. The counter electrode of the memory capacitor $C_{121}$ is connected to a counter electrode of a memory capacitor $C_{122}$ through the fourth local interconnection LOCAL4, and is connected to the second global interconnection GLOBAL2 of the plate line $PL_1$ through the fourth local interconnection LOCAL4 and the switching transistor $Tr_{123}$.

The eighth FeRAM cell CELL122 is composed of a pair of a switching transistor $Tr_{122}$ and a memory capacitor $C_{122}$. This switching transistor $Tr_{122}$ has a gate electrode. This gate electrode is connected to the word line $WL_1$, and receives a control signal transmitted through this word line $WL_1$. This memory capacitor $C_{122}$ is composed of an accumulation electrode, a counter electrode, and a capacitor dielectric film that is interposed between the accumulation electrode and the counter electrode. This accumulation electrode of the memory capacitor is connected to the inverted bit line $/BL_1$ through the switching transistor $Tr_{122}$, and receives and stores data transmitted through this inverted bit line $/BL_1$. The counter electrode of the memory capacitor $C_{122}$ is connected to the counter electrode of the memory capacitor $C_{121}$ through the fourth local interconnection LOCAL4, and is connected to the second global interconnection GLOBAL2 of the plate line $PL_1$ through the fourth local interconnection LOCAL4 and the switching transistor $Tr_{123}$.

When data of the bit line $BL_1$ and inverted data of the inverted bit line $/BL_1$ are written into the accumulation electrodes of the memory capacitors $C_{121}$ and $C_{122}$, or when they are read from these accumulation electrodes, the counter electrodes of these memory capacitors $C_{121}$ and $C_{122}$ are electrically connected to the plate line $PL_1$ as the second global interconnection GLOBAL2, thus, this plate line $PL_1$ has a capacitance that is provided by these memory capacitors $C_{121}$ and $C_{122}$. However, except when data is written into the memory capacitors $C_{121}$ and $C_{122}$, and except when data is read from the memory capacitors $C_{121}$ and $C_{122}$, the memory capacitors $C_{121}$ and $C_{122}$ are not electrically connected to this plate line $PL_1$ as the second global interconnection GLOBAL2. For this reason, the second global interconnection GLOBAL2 that is composed of the plate line $PL_1$ essentially does not have a significant wiring delay problem. On the other hand, two memory capacitors $C_{121}$ and $C_{122}$ are constantly and electrically connected to the fourth local interconnection LOCAL4. However, since the wiring distance of the fourth local interconnection LOCAL4 is very short compared to the second global interconnection GLOBAL2, the fourth local interconnection LOCAL4 essentially does not have a significant wiring delay problem.

The above description has described a portion of the construction of a two-dimensional matrix array of FeRAM cells included in the semiconductor device according to the present invention with reference to the partial equivalent circuit diagram shown in FIG. 1. The following description will describe a protection structure that protects a dielectric metal oxide of a ferroelectric capacitor included in a FeRAM cell from reduction by hydrogen with reference to the drawings.

Figure 2:
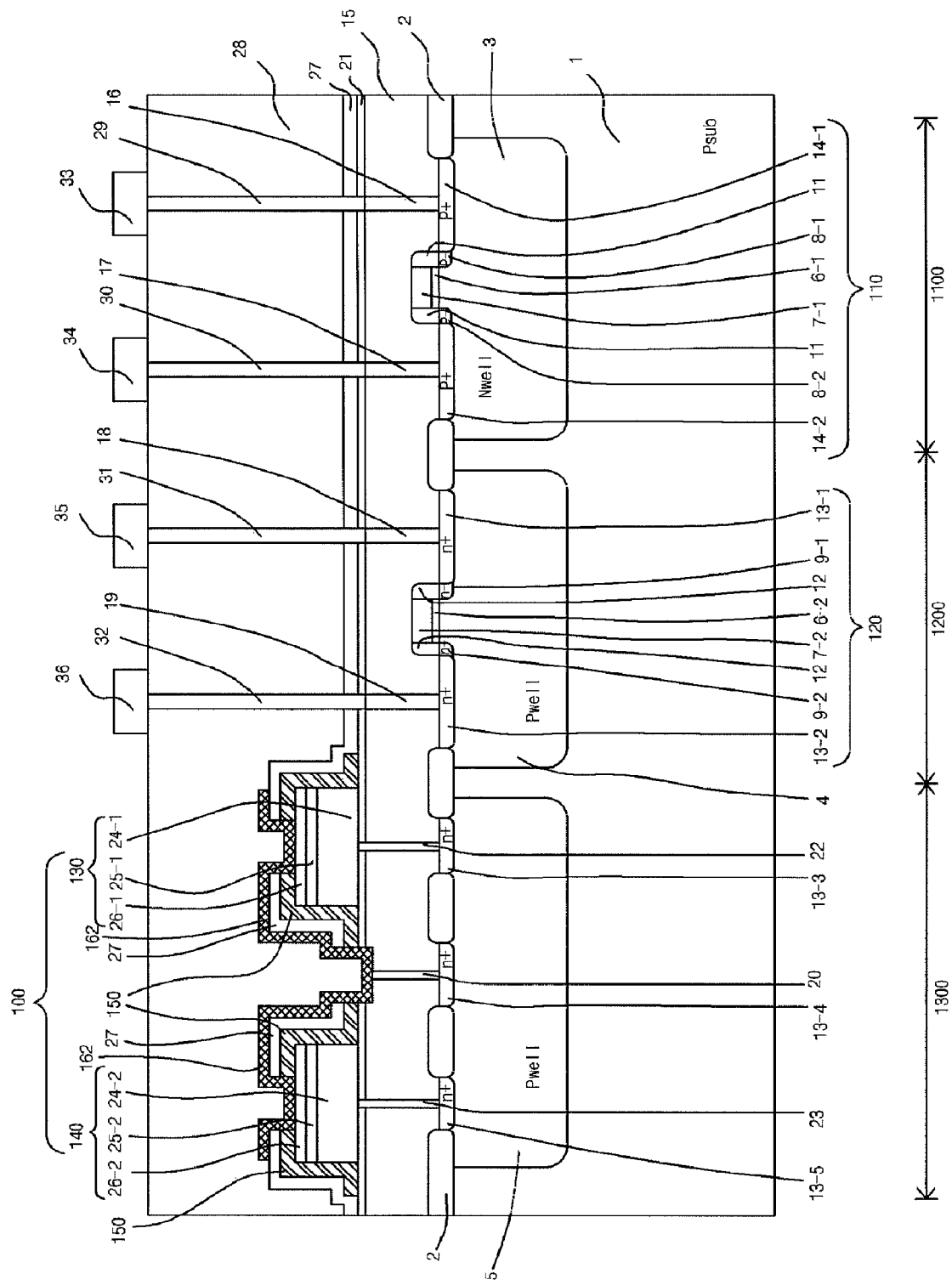
FIG. 2 is a partial vertical cross-sectional view showing a pair of FeRAM cells that have ferroelectric capacitors in FeRAM included in the semiconductor device according to a first embodiment of the present invention, and P-channel and N-channel MOS transistors in a logic circuit included in this semiconductor device.

FIG. 2 is a partial vertical cross-sectional view showing a pair of FeRAM cells that have ferroelectric capacitors included in the semiconductor memory device according to this embodiment, and P-channel and N-channel MOS transistors in a logic circuit included in this semiconductor memory device.

The semiconductor memory device includes the two-dimensional matrix array of FeRAM cells, and the logic circuit adjacent to this array as discussed above. The two-dimensional matrix array of FeRAM cells includes a plurality of pairs of FeRAM cells that are discussed above with reference to FIG. 1. FIG. 2 shows the pair of FeRAM cells, and the P-channel and N-channel MOS transistors in the logic circuit that is provided adjacent to this pair of FeRAM cells.

The semiconductor memory device is provided on a P-type single crystal semiconductor substrate. This P-type single crystal semiconductor substrate includes a first element region 1100, a second element region 1200, and a third element region 1300. The first element region 1100 includes a P-channel MOS transistor 110. The second element region 1200 includes an N-channel MOS transistor 120. The third element region 1300 includes the aforementioned pair of FeRAM cells 100. The pair of FeRAM cells 100 shown in FIG. 2 corresponds to the pair of the first and second FeRAM cells CELL011 and CELL012, the pair of the third and fourth FeRAM cells CELL021 and CELL022, the pair of the fifth and sixth FeRAM cells CELL111 and CELL112, or the pair of the seventh and eighth FeRAM cells CELL121 and CELL122 shown in FIG. 1. Any of the pairs have the same structure. FIG. 2 shows one of the source/drain regions of the switching transistor of the FeRAM cell, and one of the source/drain regions of the switching transistor between the plate line as global interconnection, and the local interconnection.

Figure 3:
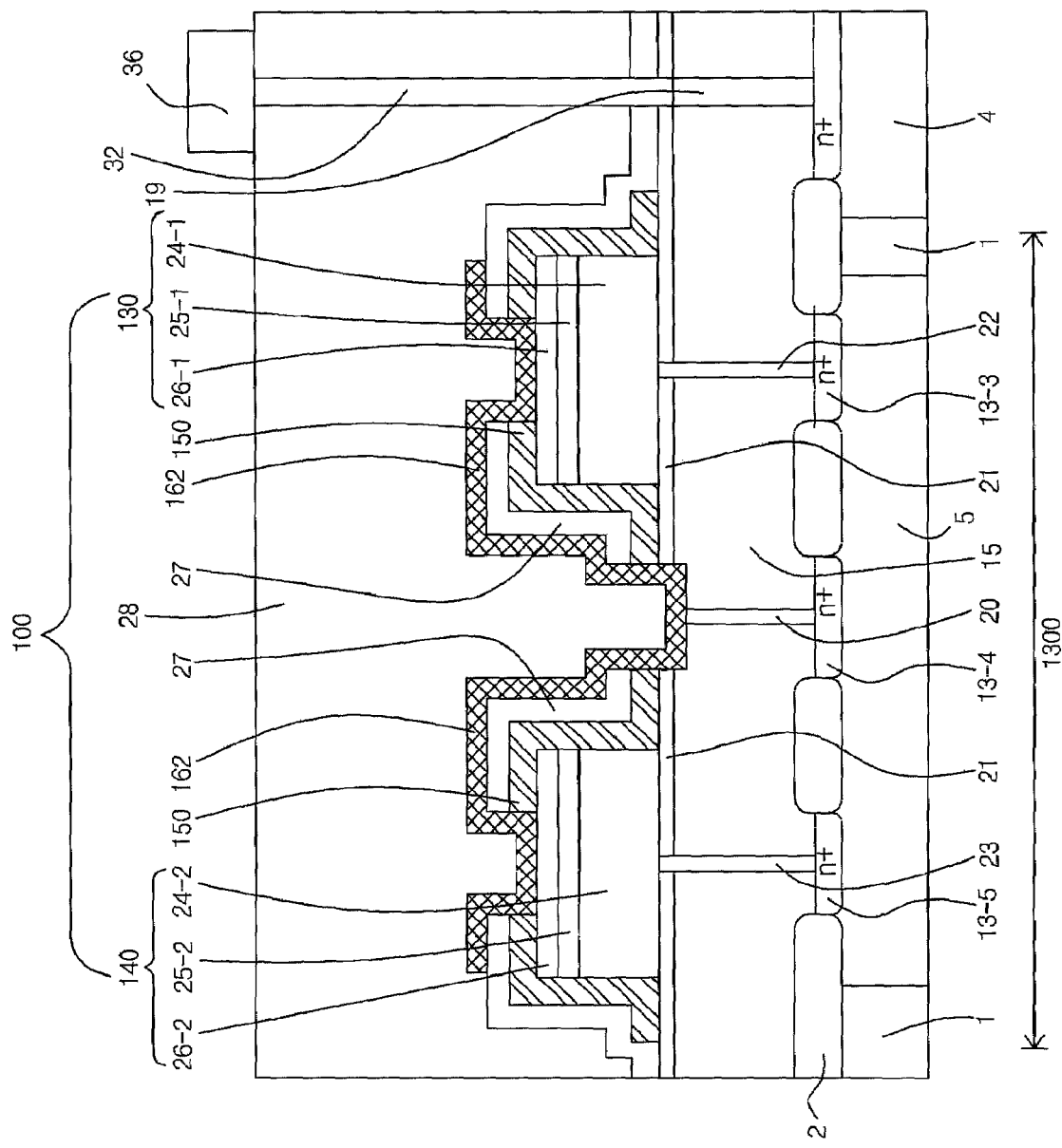
FIG. 3 is a partially enlarged vertical cross-sectional view of the pair of FeRAM cells shown in FIG. 2.

FIG. 3 is a partially enlarged vertical cross-sectional view of the pair of FeRAM cells shown in FIG. 2. The following description will describe a portion of the structure of the semiconductor device according to the first embodiment of the present invention with reference to FIGS. 2 and 3.

The main surface of a P-type single crystal semiconductor substrate 1 includes an element separation region that is composed of a field oxide film 2, and an active region that is defined by this field oxide film 2. The P-type single crystal semiconductor substrate 1 includes the first element region 1100, the second element region 1200, and the third element region 1300 as discussed above. An N-well 3 is provided in the first element region 1100. The P-channel MOS transistor 110 is provided in this N-well 3. A P-well 4 is provided in the second element region 1200. The N-channel MOS transistor 120 is provided in this P-well 4. A P-well 5 is provided in the third element region 1300. The pair of FeRAM cells 100 is provided in this P-well 5. The P-well 4 is spaced away from the N-well 3. The P-well 5 is spaced away from the P-well 4. The P-well 4 is located between the N-well 3 and the P-well 5.

The P-channel MOS transistor 110 includes P.sup.+ high concentration impurity diffusion regions 14-1 and 14-2, P.sup.− low concentration impurity diffusion regions 8-1 and 8-2, a first gate insulating film 6-1, a first gate electrode 7-1, and a first sidewall insulating film 11. The P.sup.+ high concentration impurity diffusion regions 14-1 and 14-2 compose the source/drain regions. The P.sup.+ high concentration impurity diffusion regions 14-1 and 14-2 are spaced away from each other in the N-well 3. The P.sup.− low concentration impurity diffusion regions 8-1 and 8-2 are provided adjacent to the inside of the P.sup.+ high concentration impurity diffusion regions 14-1 and 14-2, and are spaced away from each other in the N-well 3 so as to interpose a channel region between them. The first gate insulating film 6-1 is located on the channel region in the N-well 3 that is defined between the P.sup.− low concentration impurity diffusion regions 8-1 and 8-2. The first gate electrode 7-1 is located on the first gate insulating film 6-1. The first sidewall insulating film 11 is located on the sidewall of the first gate electrode 7-1. The P.sup.− low concentration impurity diffusion regions 8-1 and 8-2 overlap the first sidewall insulating film 11 in a first horizontal direction. Since the P.sup.+ high concentration impurity diffusion regions 14-1 and 14-2 are offset from the first gate electrode 7-1 by the P.sup.− low concentration impurity diffusion regions 8-1 and 8-2 directly under the first sidewall insulating film 11, electric fields at the corners in the bottom of the first gate electrode 7-1 are relieved.

Here, in the present invention, the "first horizontal direction" refers to a direction that is parallel to the main surface of P-type single crystal semiconductor substrate 1, and in which two capacitors of a pair of FeRAM cells 100 move away from each other.

The N-channel MOS transistor 120 includes N.sup.+ high concentration impurity diffusion regions 13-1 and 13-2, N.sup.− low concentration impurity diffusion regions 9-1 and 9-2, a second gate insulating film 6-2, a second gate electrode 7-2, and a second sidewall insulating film 12. The N.sup.+ high concentration impurity diffusion regions 13-1 and 13-2 compose the source/drain regions. The N.sup.+ high concentration impurity diffusion regions 13-1 and 13-2 are spaced away from each other in the P-well 4. The N.sup.− low concentration impurity diffusion regions 9-1 and 9-2 are provided adjacent to the inside of the N.sup.+ high concentration impurity diffusion regions 13-1 and 13-2, and are spaced away from each other in the P-well 4 so as to interpose a channel region between them. The second gate insulating film 6-2 is located on the channel region in the P-well 4 that is defined between N.sup.− low concentration impurity diffusion regions 9-1 and 9-2. The second gate electrode 7-2 is located on the second gate insulating film 6-2. The second sidewall insulating film 12 is located on the sidewall of the second gate electrode 7-2. The N.sup.− low concentration impurity diffusion regions 9-1 and 9-2 overlap the second sidewall insulating film 12 in the first horizontal direction. Since the N.sup.+ high concentration impurity diffusion regions 13-1 and 13-2 are offset from the second gate electrode 7-2 by the N.sup.− low concentration impurity diffusion regions 9-1 and 9-2 directly under the second sidewall insulating film 12, electric fields at the corners in the bottom of the second gate electrode 7-2 are relieved.

A pair of FeRAM cells 100 is provided in the P-well 5. A pair of FeRAM cells 100 is composed of first and second FeRAM cells. The first FeRAM cell is composed of a pair of a switching transistor and a first capacitor 130. The second FeRAM cell is composed of a pair of another switching transistor and a second capacitor 140. The first and second FeRAM cells are stack type memory cells. That is, the first capacitor 130 and the second capacitor 140 are provided above the switching transistors corresponding to them, respectively.

The switching transistors of the first and second FeRAM cells are provided so as to be spaced away from each other in the P-well 5. In addition, a switching transistor between a plate line as a global interconnection and a local interconnection is provided in the P-well 5. The switching transistor between the plate line as the global interconnection and the local interconnection is located between the aforementioned switching transistors of the first and second FeRAM cells, and is separated from both the switching transistors so as to interpose the field oxide film 2 between the switching transistor between the plate line as the global interconnection and the local interconnection, and each of the aforementioned switching transistors of the first and second FeRAM cells. The N.sup.+ high concentration impurity diffusion region 13-3 is provided in the P-well 5, and comprises one of the source/drain regions of the switching transistor of the first FeRAM cell. The N.sup.+ high concentration impurity diffusion region 1013-4 is separated from the aforementioned N.sup.+ high concentration impurity diffusion region 13-3 so as to interpose the field oxide film 2 between them, and is provided in the P-well 5. This N.sup.+ high concentration impurity diffusion region 13-4 comprises one of the source/drain regions of the switching transistor between the plate line as the global interconnection, and the local interconnection. The N.sup.+ high concentration impurity diffusion region 13-5 is separated from the aforementioned N.sup.+ high concentration impurity diffusion region 13-4 so as to interpose the field oxide film 2 between them, and is provided in the P-well 5. This N.sup.+ high concentration impurity diffusion region 13-5 comprises one of the source/drain regions of the switching transistor of the second FeRAM cell.

The first interlayer insulating film 15 continuously extends over the P-type single crystal semiconductor substrate 1, the field oxide film 2, the P-channel and N-channel MOS transistors 110 and 120, the switching transistor of the first and second FeRAM cells, and the switching transistor between the plate line as the global interconnection and the local interconnection.

In addition, a first conductive contact plug 16 is provided in the first interlayer insulating film 15. The first conductive contact plug 16 penetrates the first interlayer insulating film 15, and is in contact with the P.sup.+ high concentration impurity diffusion region 14-1 of the P-channel MOS transistor 110. A second conductive contact plug 17 is provided in the first interlayer insulating film 15. The second conductive contact plug 17 penetrates the first interlayer insulating film 15, and is in contact with the P.sup.+ high concentration impurity diffusion region 14-2 of the P-channel MOS transistor 110. A third conductive contact plug 18 is provided in the first interlayer insulating film 15. The third conductive contact plug 18 penetrates the first interlayer insulating film 15, and is in contact with the N.sup.+ high concentration impurity diffusion region 13-1 of the N-channel MOS transistor 120. A fourth conductive contact plug 19 is provided in the first interlayer insulating film 15. The fourth conductive contact plug 19 penetrates the first interlayer insulating film 15, and is in contact with the N.sup.+ high concentration impurity diffusion region 13-2 of the N-channel MOS transistor 120. A fifth conductive contact plug 20 is provided in the first interlayer insulating film 15. The fifth conductive contact plug 20 penetrates the first interlayer insulating film 15, and is in contact with the N.sup.+ high concentration impurity diffusion region 13-4 of the switching transistor between the plate line as the global interconnection and the local interconnection.

A second interlayer insulating film 21 extends over the first interlayer insulating film 15. A sixth conductive contact plug 22 is provided in a lamination of the first and second interlayer insulating films 15 and 21. The sixth conductive contact plug 22 penetrates the lamination of the first and second interlayer insulating films 15 and 21, and is in contact with the N.sup.+ high concentration impurity diffusion region 13-3 of the switching transistor of the first FeRAM cell. A seventh conductive contact plug 23 is provided in the lamination of the first and second interlayer insulating films 15 and 21. The seventh conductive contact plug 23 penetrates the lamination of the first and second interlayer insulating films 15 and 21, and is in contact with the N.sup.+ high concentration impurity diffusion region 13-5 of the switching transistor of the second FeRAM cell.

The first FeRAM cell includes the first capacitor 130 that is located above the switching transistor. The second FeRAM cell includes the second capacitor 140 that is located above the switching transistor. The first and second capacitors 130 and 140 serve as memory capacitors discussed above with reference to FIG. 1.

The first capacitor 130 is composed of a first lower electrode 24-1, a first upper electrode 26-1, and a first ferroelectric metal oxide film 25-1 that is located between the first lower electrode 24-1 and the first upper electrode 26-1. The first lower electrode 24-1 and the first upper electrode 26-1 serve as the accumulation electrode and the counter electrode discussed above with reference to FIG. 1, respectively. The first lower electrode 24-1 as the accumulation electrode is located on the second interlayer insulating film 21 and the sixth conductive contact plug 22. Here, the first lower electrode 24-1 is in contact with the top of the sixth conductive contact plug 22. The first lower electrode 24-1 is electrically connected to the N.sup.+ high concentration impurity diffusion region 13-3 of the switching transistor of the first FeRAM cell through the sixth conductive contact plug 22. This switching transistor is connected to the bit line discussed above with reference to FIG. 1. In addition, this switching transistor has a gate electrode (not shown). This gate electrode is connected to the word line discussed above with reference to FIG. 1.

The second capacitor 140 is composed of a second lower electrode 24-2, a second upper electrode 26-2, and a second ferroelectric metal oxide film 25-2 that is located between the second lower electrode 24-2 and the second upper electrode 26-2. The second lower electrode 24-2 and the second upper electrode 26-2 serve as the accumulation electrode and the counter electrode discussed above with reference to FIG. 1, respectively. The second lower electrode 24-2 as the accumulation electrode is located on the second interlayer insulating film 21 and the seventh conductive contact plug 23. Here, the second lower electrode 24-2 is in contact with the top of the seventh conductive contact plug 23. The second lower electrode 24-2 is electrically connected to the N.sup.+ high concentration impurity diffusion region 13-5 of the switching transistor of the second FeRAM cell through the seventh conductive contact plug 23. This switching transistor is connected to the bit line discussed above with reference to FIG. 1. In addition, this switching transistor has a gate electrode (not shown). This gate electrode is connected to the word line discussed above with reference to FIG. 1.

The first insulating hydrogen barrier layer 150 is provided. This first insulating hydrogen barrier layer 150 has electrical insulation and non-permeability to hydrogen. The first insulating hydrogen barrier layer 150 extends over the respective sidewalls and top surfaces of the first and second capacitors 130 and 140, and the peripheries of the first and second capacitors 130 and 140 on the second interlayer insulating film 21, and over between them, and thus covers the first and second capacitors 130 and 140. Here, the first insulating hydrogen barrier layer 150 is in contact with the respective sidewalls and top surfaces of the first and second capacitors 130 and 140.

In addition, a third interlayer insulating film 27 is provided. This third interlayer insulating film 27 continuously extends over the first insulating hydrogen barrier layer 150 and the second interlayer insulating film 21. Two contact holes are provided. The two contact holes are located on a portion of the top surface of the first upper electrode 26-1 that serves as the counter electrode of the first capacitor 130, and on a portion of the top surface of the second upper electrode 26-2 that serves as the counter electrode of the second capacitor 140, respectively. The two contact holes penetrate a lamination of the third interlayer insulating film 27 and the first insulating hydrogen barrier layer 150, and reach a portion of the top surface of the first upper electrode 26-1, and a portion of the top surface of the second upper electrode 26-2. One additional contact hole is provided. The one additional contact hole is located between the first and second capacitors 130 and 140, and is located on the aforementioned fifth conductive contact plug 20. The one additional contact holes penetrates a lamination of the third interlayer insulating film 27, the first insulating hydrogen barrier layer 150 and the second interlayer insulating film 21, and reaches inward an upper region of the first interlayer insulating film 15. Thus, the one additional contact hole has the bottom of a level lower than the top surface of the first interlayer insulating film 15.

A first hydrogen non-permeable local interconnection layer 162 is provided. This first hydrogen non-permeable local interconnection layer 162 has electrical conductivity, and non-permeability to hydrogen, i.e., hydrogen barrier characteristics. This first hydrogen non-permeable local interconnection layer 162 extends on the third interlayer insulating film 27 and inside the aforementioned three contact holes in the third element region 1300. Specifically, as shown in FIGS. 2 and 3, the first hydrogen non-permeable local interconnection layer 162 extends over the first and second capacitors 130 and 140, in addition, between the first and second capacitors 130 and 140, and additionally, inside the aforementioned three contact holes. The first hydrogen non-permeable local interconnection layer 162 is electrically in contact with this first upper electrode 26-1 that serves as the counter electrode of the first capacitor 130 through the aforementioned contact hole. Furthermore, the first hydrogen non-permeable local interconnection layer 162 is electrically in contact with this second upper electrode 26-2 that serves as the counter electrode of the second capacitor 140 through the aforementioned contact hole. Moreover, the first hydrogen non-permeable local interconnection layer 162 is electrically in contact with the fifth conductive contact plug 20 through the aforementioned contact hole that is located between the first and second capacitors 130 and 140, and is located on the aforementioned fifth conductive contact plug 20.

As discussed above, this fifth conductive contact plug 20 is in contact with the N.sup.+ high concentration impurity diffusion region 13-4. This N.sup.+ high concentration impurity diffusion region 13-4 comprises one of the source/drain regions of the switching transistor that is provided between the plate line as the global interconnection, and the local interconnection. Thus, the first hydrogen non-permeable local interconnection layer 162 is electrically connected to the plate line as the global interconnection through this fifth conductive contact plug 20 and this switching transistor. That is, the first hydrogen non-permeable local interconnection layer 162 provides electrical connection between the counter electrode that is composed of the first upper electrode 26-1 of the first capacitor 130 and the counter electrode that is composed of the second upper electrode 26-2 of the second capacitor 140, and provides electrical connection among both counter electrodes and this switching transistor. Accordingly, the respective counter electrodes of the first and second capacitors 130 and 140 are electrically connected to the global interconnection that is composed of the plate line through the first hydrogen non-permeable local interconnection layer 162 and this switching transistor.

As discussed above with reference to FIG. 1, the gate electrode of this switching transistor that is provided between the first hydrogen non-permeable local interconnection layer 162 and the global interconnection composed of the plate line is connected to the common word line that connects the gate electrodes of the switching transistors connected to the first and second capacitors 130 and 140, respectively. Thus, the three switching transistors are controlled by the common control signal. Accordingly, in the writing into or reading from the respective first and second lower electrodes 24-1 and 24-2 as the accumulation electrode of the first and second capacitors 130 and 140, the first and second upper electrodes 26-1 and 26-2 as the counter electrode of the first and second capacitors 130 and 140 are electrically connected to the global interconnection composed of the plate line, and at all other times, they are electrically separated. That is, except when data is written into the memory capacitors, and except when data is read from the memory capacitors, the memory capacitors are not electrically connected to the global interconnection composed of the plate line. For this reason, the global interconnection that is composed of a plate line does not have a significant wiring delay problem. On the other hand, the first and second capacitors 130 and 140 are constantly and electrically connected to the first hydrogen non-permeable local interconnection layer 162. However, the wiring of the first hydrogen non-permeable local interconnection layer 162 extends a limited amount in the third element region 1300 that is provided with a pair of FeRAM cells 100, thus, the wiring distance of this first hydrogen non-permeable local interconnection layer 162 is very short as compared with the global interconnection. For this reason, the global interconnection that is composed of a plate line essentially does not have a significant wiring delay problem. This first hydrogen non-permeable local interconnection layer 162 serves as a second hydrogen barrier layer.

A fourth interlayer insulating film 28 is provided. This fourth interlayer insulating film 28 extends over the third interlayer insulating film 27 in the first and second element regions 1100 and 1200, and extends over the first hydrogen non-permeable local interconnection layer 162 in the third element region 1300. That is, the respective side and top surfaces of the first and second capacitors 130 and 140 are completely covered with the first insulating hydrogen barrier layer 150 and the first hydrogen non-permeable local interconnection layer 162. Thus, the first and second capacitors 130 and 140 are completely separated from the fourth interlayer insulating film 28 that acts as a hydrogen diffusion path by the first insulating hydrogen barrier layer 150 and the first hydrogen non-permeable local interconnection layer 162. In addition, the first and second capacitors 130 and 140 are completely separated from the third interlayer insulating film 27 that acts as a hydrogen diffusion path by the first insulating hydrogen barrier layer 150 and the first hydrogen non-permeable local interconnection layer 162.

In the first element region 1100, eighth and ninth conductive contact plugs 29 and 30 are provided. The eighth conductive contact plug 29 penetrates the fourth interlayer insulating film 28, the third interlayer insulating film 27 and the second interlayer insulating film 21, and is in contact with the top of the aforementioned first conductive contact plug 16. The eighth conductive contact plug 29 is electrically connected to the P+ high concentration impurity diffusion region 14-1 of the P-channel MOS transistor 110 through the aforementioned first conductive contact plug 16. The ninth conductive contact plug 30 penetrates the fourth interlayer insulating film 28, the second interlayer insulating film 27 and the second interlayer insulating film 21, and is in contact with the top of the aforementioned second conductive contact plug 17. The ninth conductive contact plug 30 is electrically connected to the P+ high concentration impurity diffusion region 14-2 of the P-channel MOS transistor 110 through the aforementioned second conductive contact plug 17.

In the second element region 1200, tenth and eleventh conductive contact plugs 31 and 32 are provided. The tenth conductive contact plug 31 penetrates the fourth interlayer insulating film 28, the second interlayer insulating film 27 and the second interlayer insulating film 21, and is in contact with the top of the aforementioned third conductive contact plug 18. The tenth conductive contact plug 31 is electrically connected to the N+ high concentration impurity diffusion region 13-1 of the N-channel MOS transistor 120 through the aforementioned third conductive contact plug 18. The eleventh conductive contact plug 32 penetrates the fourth interlayer insulating film 28, the second interlayer insulating film 27 and the second interlayer insulating film 21, and is in contact with the top of the aforementioned fourth conductive contact plug 19. The eleventh conductive contact plug 32 is electrically connected to the N+ high concentration impurity diffusion region 13-2 of the N-channel MOS transistor 120 through the aforementioned fourth conductive contact plug 19.

In the first element region 1100, first and second metal wiring layers 33 and 34 are provided on the fourth interlayer insulating film 28. The first metal wiring layer 33 is in contact with the top of the eighth conductive contact plug 29. The first metal wiring layer 33 is electrically connected to the P+ high concentration impurity diffusion region 14-1 of the P-channel MOS transistor 110 through the eighth conductive contact plug 29 and the aforementioned first conductive contact plug 16. The second metal wiring layer 34 is in contact with the top of the ninth conductive contact plug 30. The second metal wiring layer 34 is electrically connected to the P+ high concentration impurity diffusion region 14-2 of the P-channel MOS transistor 110 through the ninth conductive contact plug 30 and the aforementioned second conductive contact plug 17.

In the second element region 1200, third and fourth metal wiring layers 35 and 36 are provided on the fourth interlayer insulating film 28. The third metal wiring layer 35 is in contact with the top of the tenth conductive contact plug 31. The third metal wiring layer 35 is electrically connected to the N+ high concentration impurity diffusion region 13-1 of the N-channel MOS transistor 120 through the tenth conductive contact plug 31 and the aforementioned third conductive contact plug 18. The fourth metal wiring layer 36 is in contact with the top of the eleventh conductive contact plug 32. The fourth metal wiring layer 36 is electrically connected to the N+ high concentration impurity diffusion region 13-2 of the N-channel MOS transistor 120 through the eleventh conductive contact plug 32 and the aforementioned fourth conductive contact plug 19.

Additionally, a multilayer wiring structure that includes the first, second, third, and fourth metal wiring layers 33, 34, 35, and 36 may be provided as a first level wiring layer.

FeRAM cell Structure

As discussed above, the semiconductor memory device according to this embodiment includes a pair of FeRAM cells 100. The pair of FeRAM cells 100 is composed of first and second FeRAM cells. The first FeRAM cell is composed of a switching transistor and the first capacitor 130. The second FeRAM cell is composed of a switching transistor and the second capacitor 140.

The first capacitor 130 is composed of the first lower electrode 24-1, the first upper electrode 26-1, and the first ferroelectric metal oxide film 25-1 that is interposed between both these electrodes. The first lower electrode 24-1 is electrically connected to the N+ high concentration impurity diffusion region 13-3 that comprises one of the source/drain regions of this switching transistor through the sixth conductive contact plug 22. The first lower electrode 24-1 serves as the accumulation electrode that stores data of the bit line.

The second capacitor 140 is composed of the second lower electrode 24-2, the second upper electrode 26-2, and the second ferroelectric metal oxide film 25-2 that is interposed between both these electrodes. The second lower electrode 24-2 is electrically connected to the N+ high concentration impurity diffusion region 13-5 that comprises one of the source/drain regions of this switching transistor through the seventh conductive contact plug 23. The second lower electrode 24-2 serves as the accumulation electrode that stores data of the bit line.

The first and second capacitors 130 and 140 have the first and second lower electrodes 24-1 and 24-2, respectively. These first and second lower electrodes 24-1 and 24-2 preferably contain a Pt or Ir group material, e.g., at least one of Pt, Ir and $IrO_2$. These first and second lower electrodes 24-1 and 24-2 can have single layer structure or multilayer structure. This single layer structure can be constructed to have a single layer containing at least one of Pt, Ir, and $IrO_2$. This multilayer structure can be constructed to have a first layer that is composed of TiAlN as the lowest layer, a second layer that is composed of Ir and is located on this first layer, a third layer that is composed of $IrO_2$ and is located on this second layer, and a fourth layer that is composed of Pt and is located on this third layer. In this case, the first layer that is composed of TiAlN as the lowest layer serves as a hydrogen barrier film with hydrogen barrier characteristics.

The first and second capacitors 130 and 140 have the first and second upper electrodes 26-1 and 26-2, respectively. These first and second upper electrodes 26-1 and 26-2 preferably contain a Pt or Ir group material, e.g., at least one of Pt, Ir and $IrO_2$.

The first and second capacitors 130 and 140 have the first and second ferroelectric metal oxide films 25-1 and 25-2, respectively. A typical example of a substance that can be used as these first and ferroelectric metal oxide films 25-1 and 25-2 can be composed of any of various types of known ferroelectric metal oxides. A compound group of a series of compounds that are $SrBi_2Ta_2O_9$ as Bi layer-shaped compound, a substance with composition varied from this substance, and a substance that is obtained by substituting an additive such as, typically, Nb for the composition of this substance (hereinafter, the compound group is referred to as SBT), and a compound group of a series of compounds that are $Pb(Zr_{1-x}Ti_x)O_3$, a substance with composition varied from this substance, and a substance that is obtained by substituting an additive such as, typically, La and Ca for the composition of this substance (hereinafter, the compound group is referred to as PZT) can be given as the typical examples. As for materials under study, a material of bismuth titanate added with lanthanum, and a solid solution of the aforementioned ferroelectric material and other dielectric material can be given as other examples. The substances commonly have dielectric characteristics as dielectric oxide crystals. In this embodiment, the ferroelectric metal oxide film is formed by burning spin-coated SBT for crystallization.

The first upper electrode 26-1 of the first capacitor 130 has electrical conductivity and hydrogen permeability. The first upper electrode 26-1 of the first capacitor 130 is in contact with a first contact portion of the first hydrogen non-permeable local interconnection layer 162 in the contact hole. The first upper electrode 26-4 of the second capacitor 140 has electrical conductivity and hydrogen permeability. The first upper electrode 26-4 of the second capacitor 140 is in contact with a second contact portion of the first hydrogen non-permeable local interconnection layer 162 in the contact hole. Thus, the first hydrogen non-permeable local interconnection layer 162 provides electrical interconnection between the first upper electrode 26-1 of the first capacitor 130, and the first upper electrode 26-4 of the second capacitor 140.

The aforementioned first hydrogen non-permeable local interconnection layer 162 is formed of a substance that has electrical conductivity and non-hydrogen permeability. TiAlN can be given as typical example of constituent material of the aforementioned first hydrogen non-permeable local interconnection layer 162, however, the material is not limited to this.

The aforementioned first insulation hydrogen barrier film 150 can be formed of a substance that has electric insulation and non-permeability to hydrogen. Typically, alumina (Al.sub.2O.sub.3), SiN, SiON, TiO.sub.2, and TaO.sub.x (x>0) can be employed, however, the substance is not limited to them. In this embodiment, the first insulation hydrogen barrier film 150 is formed of Al.sub.2O.sub.3. The aforementioned first and second insulation hydrogen barrier films 150 and a second insulating hydrogen barrier layer 172 can be formed of alumina (Al.sub.2O.sub.3) by a CVD method.

The aforementioned first through eleventh conductive plugs 16, 17, 18, 19, 20, 22, 23, 29, 30, 31, and 32 can be formed of various types of conductive material. Typically, tungsten or polysilicon can be employed. These first through eleventh conductive plugs 16, 17, 18, 19, 20, 22, 23, 29, 30, 31, and 32 can be formed by a CVD method. In addition, the third and fourth interlayer insulating films 27 and 28 can be formed by a CVD method.

Hydrogen Barrier Structure

In this embodiment, the third and fourth interlayer insulating films 27 and 28 and eighth through eleventh conductive plugs 29, 30, 31, and 32 are formed by a CVD method after the first and second capacitors 130 and 140 are formed. In addition, the fourth interlayer insulating film 28 and eighth through eleventh conductive plugs 29, 30, 31, and 32 are formed by a CVD method after the first hydrogen non-permeable local interconnection layer 162 is formed. The CVD process is performed in a reducing atmosphere. Accordingly, it is necessary to prevent the first and second ferroelectric metal oxide films 25-1 and 25-2 that are included in the first and second capacitors 130 and 140, respectively, from being reduced by diffusion of hydrogen that serves as a reducing agent supplied in this CVD process. The hydrogen diffusion path, i.e., hydrogen entry path, includes not only the boundary between each of the first and second capacitors 130 and 140, and the external region, but also the aforementioned third interlayer insulating film 27 that has electrical insulation and hydrogen permeability. It is necessary to prevent hydrogen from being diffused in the first and second ferroelectric metal oxide films 25-1 and 25-2 through this diffusion path that is the fourth or third interlayer insulating film 28 or 27, and through the first and second upper electrodes 26-1 and 26-2.

The first hydrogen non-permeable local interconnection layer 162 is a dedicated wiring that extends limitedly in a region of the third element region 1300, and provides interconnection between the respective first upper electrodes 26-1 and 26-2 of the first and second capacitors 130 and 140 included in the first and second FeRAM cells that are paired with each other, as discussed above. In contrast to a general global interconnection, this dedicated wiring provides electrical interconnection limitedly in a specific region. The dedicated wiring that extends limitedly in a specific region also serves as a hydrogen diffusion barrier layer, and thus prevents that hydrogen enters the first and second ferroelectric metal oxide films 25-1 and 25-2.

That is, not only the first insulating hydrogen barrier layer 150 that covers the first and second capacitors 130 and 140 but also the first hydrogen non-permeable local interconnection layer 162 is provided, and this disconnects the hydrogen diffusion path through the third interlayer insulating film 27. Combination of the aforementioned first insulating hydrogen barrier layer 150 and the first hydrogen non-permeable local interconnection layer 162 reliably prevents that hydrogen that serves as a reducing agent is diffused into the first and second ferroelectric metal oxide films 25-1 and 25-2. The first insulating hydrogen barrier layer 150 that has non-permeability of hydrogen, i.e., hydrogen barrier characteristics, extends so as to be in contact with respective upper portions of the first and second capacitors 130 and 140 except contact portions thereof that are in contact with the first hydrogen non-permeable local interconnection layer 162, and the sides of them. On the other hand, in the case where the third, fourth interlayer insulating film 27 and 28, and the eighth through eleventh conductive plugs 29, 30, 31 and 32 are formed outside and above the first and capacitors 130 and 140 by the CVD process that is performed in a reducing atmosphere, hydrogen that serves as a reducing agent is supplied. Existence of the first insulating hydrogen barrier layer 150 with hydrogen barrier characteristics reliably prevents that hydrogen is diffused into the first and second ferroelectric metal oxide films 25-1 and 25-2 through the respective upper portions of the first and second capacitors 130 and 140 except contact portions thereof that are in contact with the first hydrogen non-permeable local interconnection layer 162, and the respective sides of the first and second capacitors 130 and 140.

However, since the third interlayer insulating film 27 has hydrogen permeability as discussed above, it is necessary to prevent hydrogen from being diffused into each of the first and second upper electrodes 26-1 and 26-2 through each contact portion between each of the first and second upper electrodes 26-1 and 26-2, and the local interconnection layer. For this reason, in this embodiment, not only the first insulating hydrogen barrier layer 150 but also the first hydrogen non-permeable local interconnection layer 162 with non-permeability to hydrogen is provided.

The respective side and top surfaces of the first and second capacitors 130 and 140 are completely covered with the first insulating hydrogen barrier layer 150 and the first hydrogen non-permeable local interconnection layer 162. Thus, the first and second capacitors 130 and 140 are completely separated from the fourth interlayer insulating film 28 that acts as a hydrogen diffusion path by the first insulating hydrogen barrier layer 150 and the first hydrogen non-permeable local interconnection layer 162. In addition, the first and second capacitors 130 and 140 are completely separated from the third interlayer insulating film 27 that acts as a hydrogen diffusion path by the first insulating hydrogen barrier layer 150 and the first hydrogen non-permeable local interconnection layer 162. Thus, hydrogen is reliably prevented from diffusing into the first and second upper electrodes 26-1 and 26-2 from the third or fourth interlayer insulating film 27 or 28.

On the other hand, the first and second lower electrodes 24-1 and 24-2 can be constructed in multilayer structure as discussed above. In this case, this multilayer structure includes a first layer that is formed of TiAlN as the lowest layer. TiAlN has electrical conductivity, and impermeability to hydrogen, i.e., hydrogen barrier characteristics. Thus, in the case where the first and second lower electrodes 24-1 and 24-2 have electrical conductivity, and non-permeability to hydrogen, i.e., hydrogen barrier characteristics, hydrogen is reliably prevented from diffusing into the first and second ferroelectric metal oxide films 25-1 and 25-2 from the lower portions of the first and second capacitors 130 and 140.

Accordingly, existence of the first insulating hydrogen barrier layer 150 with hydrogen barrier characteristics and the first hydrogen non-permeable local interconnection layer 162 reliably prevents that hydrogen that is supplied in the aforementioned CVD process and serves as a reducing agent from diffusing into the first and second ferroelectric metal oxide films 25-1 and 25-2. Therefore, it is possible to reliably prevent ferroelectric characteristic deterioration of the first and second ferroelectric metal oxide films 25-1 and 25-2 due to reduction of these films.

In this embodiment, as discussed above, although the aforementioned first insulating hydrogen barrier layer 150 allows the hydrogen diffusion through the contact hole, this first hydrogen non-permeable local interconnection layer 162 prevents diffusion of the hydrogen through each contact portion between this first hydrogen non-permeable local interconnection layer 162 and each of the first and second upper electrodes 26-1 and 26-2.

Modified Embodiment

As discussed above, the first hydrogen non-permeable local interconnection layer 162 is provided to prevent diffusion of hydrogen through each contact portion between this first hydrogen non-permeable local interconnection layer 162 and each of the first and second upper electrodes 26-1 and 26-2. Accordingly, it is not necessary for this first hydrogen non-permeable local interconnection layer 162 to entirely have non-permeability to hydrogen. However, the contact portions in contact with the first and second upper electrodes 26-1 and 26-2 of the first hydrogen non-permeable local interconnection layer 162 necessarily have non-permeability to hydrogen. That is, as discussed above, the whole first hydrogen non-permeable local interconnection layer 162 can be formed of a substance that has electrical conductivity and non-permeability to hydrogen. In addition, while the contact portions in contact with the first and second upper electrodes 26-1 and 26-2 of the first hydrogen non-permeable local interconnection layer 162 can be formed of a substance that has electrical conductivity and non-permeability to hydrogen, the rest of the first hydrogen non-permeable local interconnection layer 162 other than the contact portions can be formed of electrical conductivity and hydrogen permeability. That is, if it is possible to prevent diffusion of hydrogen through each contact portion between the first hydrogen non-permeable local interconnection layer 162 and each of the first and second upper electrodes 26-1 and 26-2, it is not necessary for non-contact portions of the first hydrogen non-permeable local interconnection layer 162 to have non-permeability to hydrogen.

The present invention provides hydrogen barrier structure that prevents or suppresses characteristic deterioration of a dielectric that forms capacitor insulating films of the first and second capacitors 130 and 140 due to reduction by hydrogen. Accordingly, the capacitor insulating films of the first and second capacitors 130 and 140 are not limited to ferroelectric metal oxide. They can be any of ferroelectric oxide and high-dielectric oxide. That is, as long as the capacitor insulating films of the first and second capacitors 130 and 140 are dielectric oxide, there is significance that the hydrogen barrier structure according to the present invention is applied.

Method of Producing Semiconductor Memory Device

FIGS. 4 through 42 are partial vertical cross-sectional views showing production processes of the semiconductor memory device according to the first embodiment of the present invention.

Figure 4:
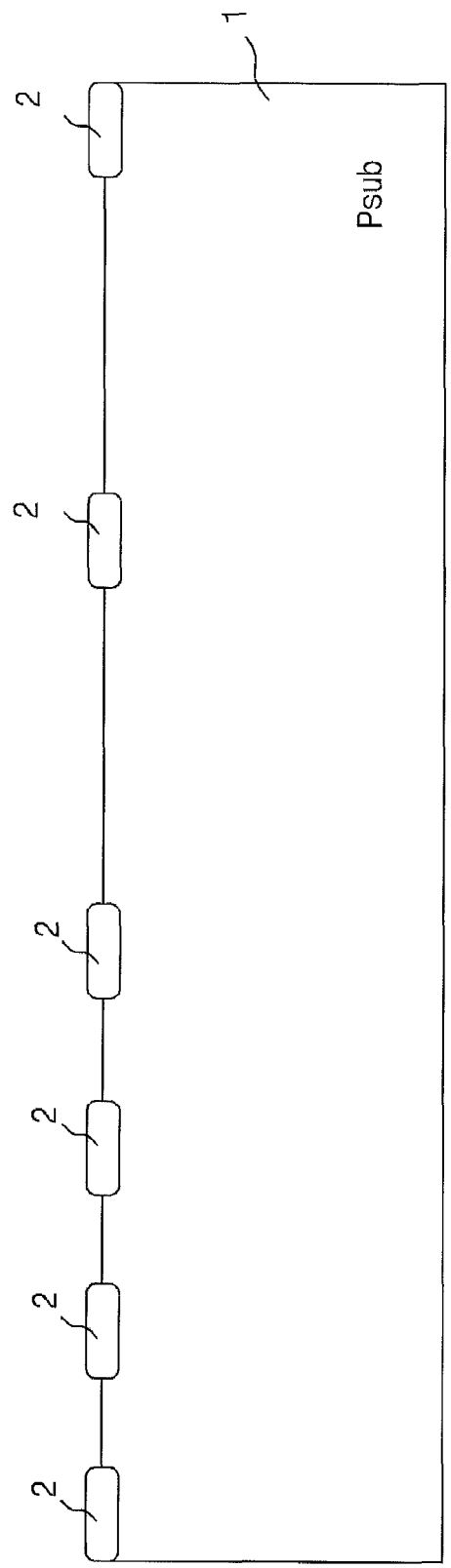
FIG. 4 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 4, the field oxide film 2 is formed in the element separation region of the P-type single crystal silicon substrate 1 by a LOCOS (Local Oxidation Of Silicon) method, thus, the active region is defined by the field oxide film 2. The active region is a region where the semiconductor memory device is formed.

Figure 5:
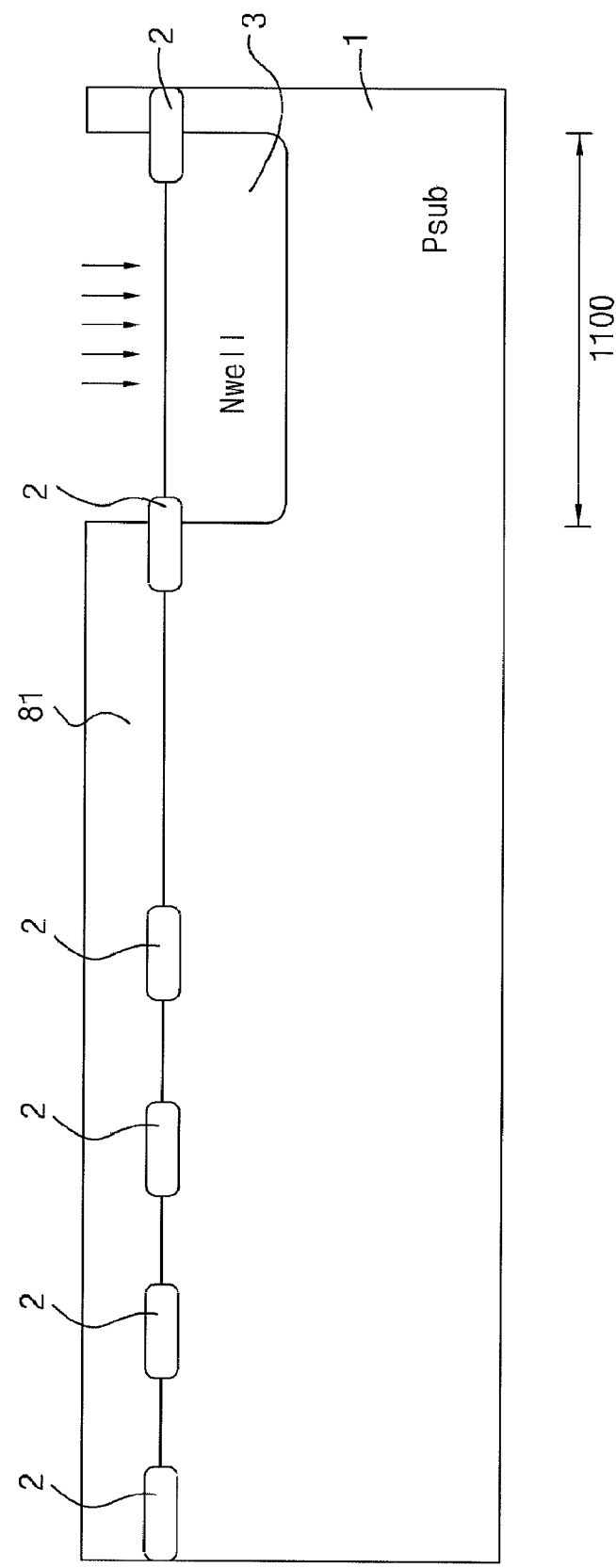
FIG. 5 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 5, a resist pattern 81 is formed over the P-type single crystal silicon substrate 1 and the field oxide film 2 by known lithography technique. This resist pattern 81 has an opening in the first element region 1100. This resist pattern 81 is used as a mask, and phosphorus (P) as N-type impurity is selectively implanted into the P-type single crystal silicon substrate 1 in the vertical direction under conditions of an acceleration energy of 1000 keV and a dose amount of $5.0 \times 10^{12}$ cm$^{-2}$. Thus, the N-well 3 is selectively formed in the first element region 1100.

Figure 6:
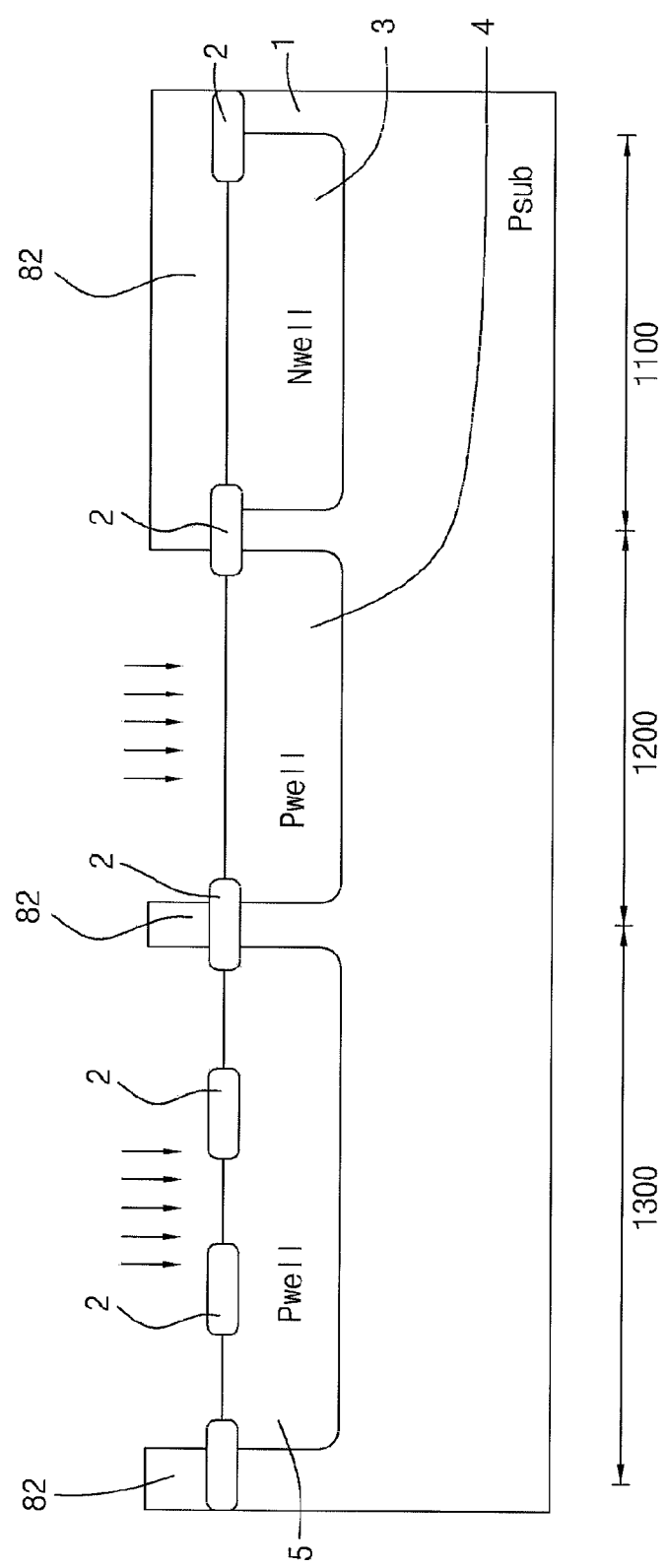
FIG. 6 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 6, the resist pattern 81 is removed by a known method. After that, a resist pattern 82 is formed over the P-type single crystal silicon substrate 1 and the field oxide film 2 by known lithography technique. This resist pattern 82 has openings in the second and third element regions 1200 and 1300. This resist pattern 82 is used as a mask, and boron (B) as P-type impurity is selectively implanted into the P-type single crystal silicon substrate 1 in the vertical direction under conditions of an acceleration energy of 600 keV and a dose amount of $5.0 \times 10^{12}$ cm$^{-2}$. Thus, the P-wells 4 and 5 are selectively formed in the second and third element regions 1200 and 1300, respectively.

Figure 7:
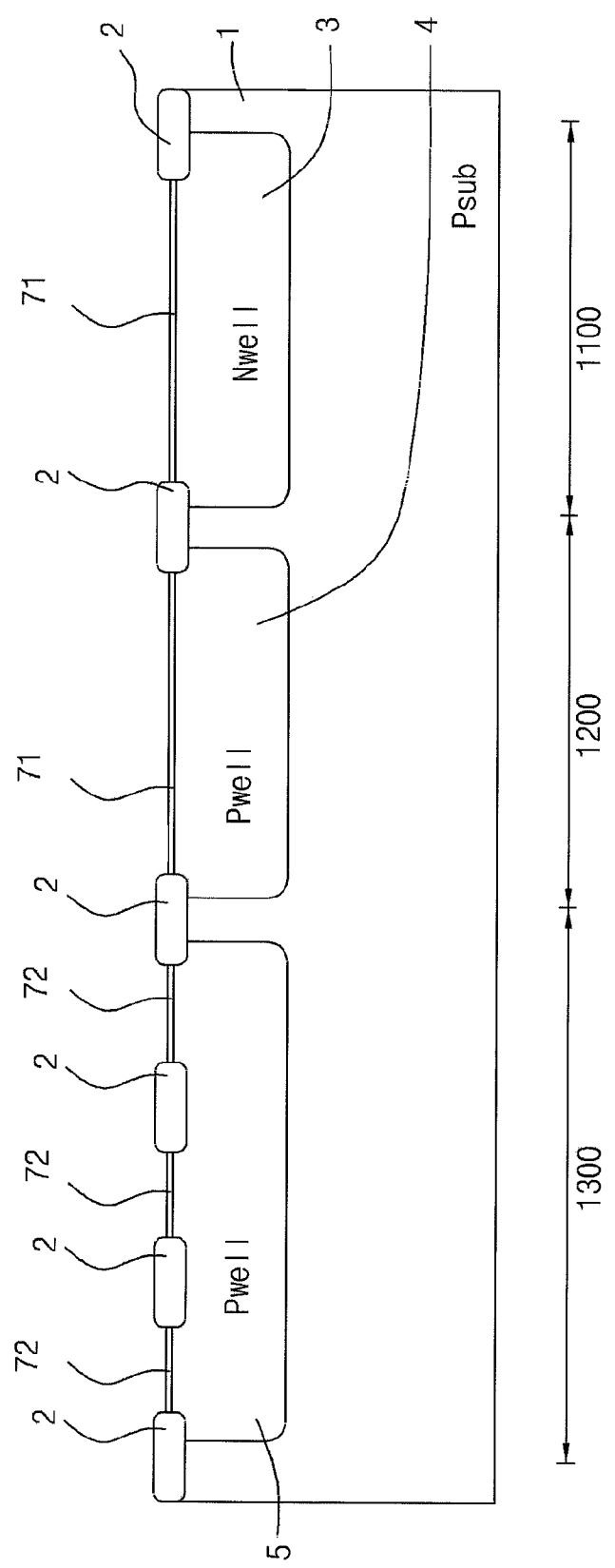
FIG. 7 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 7, the resist pattern 82 is removed by a known method. Subsequently, the first gate insulating film 6-1 with thickness of 60 .ANG. is formed on the surface of each of the N-well 3 and the P-well 4 by a known selective oxidation method. Subsequently, the second gate insulating film 6-2 with thickness of 55 .ANG. is formed on the surface of the P-well 4 by a known selective oxidation method.

Figure 8:
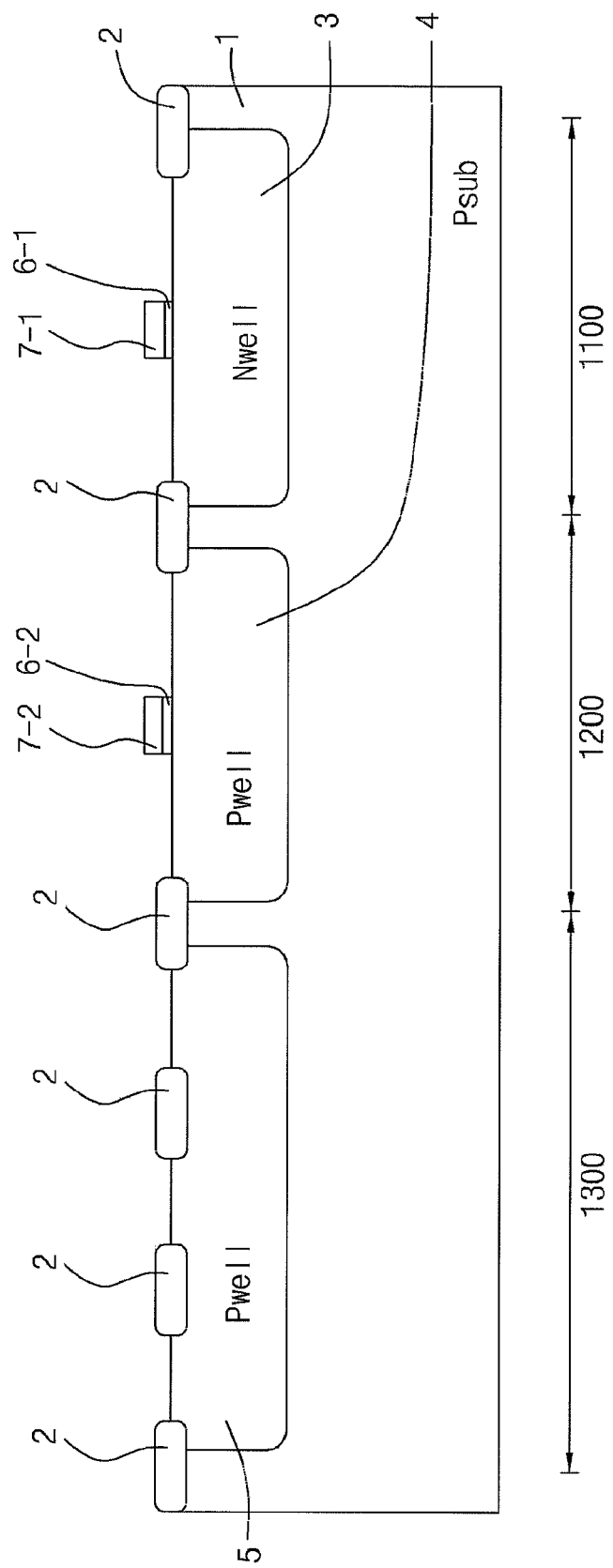
FIG. 8 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 8, an impurity-doped polysilicon film with thickness of 1200 .ANG. is formed over the first and second gate insulating films 6-1 and 6-2, and the field oxide film 2 by a CVD method. As a result, a lamination of the first gate insulating film 6-1 and the polysilicon film, and a lamination of the second gate insulating film 6-2 and the polysilicon film are formed. Subsequently, patterning is performed on the laminations by a known method. Thus, while a first gate structure that is composed of the first gate insulating film 6-1 and the first gate electrode 7-1 is selectively formed on the N-well 3, a second gate structure that is composed of the second gate insulating film 6-2 and the second gate electrode 7-2 is selectively formed on the P-well 4. Furthermore, although a plurality of pairs of the gate insulating films and the gate electrodes are formed also on the P-well 5, they are not located in the position corresponding to the vertical cross-sectional view of FIG. 8. Accordingly, they are not shown in the figure.

Figure 9:
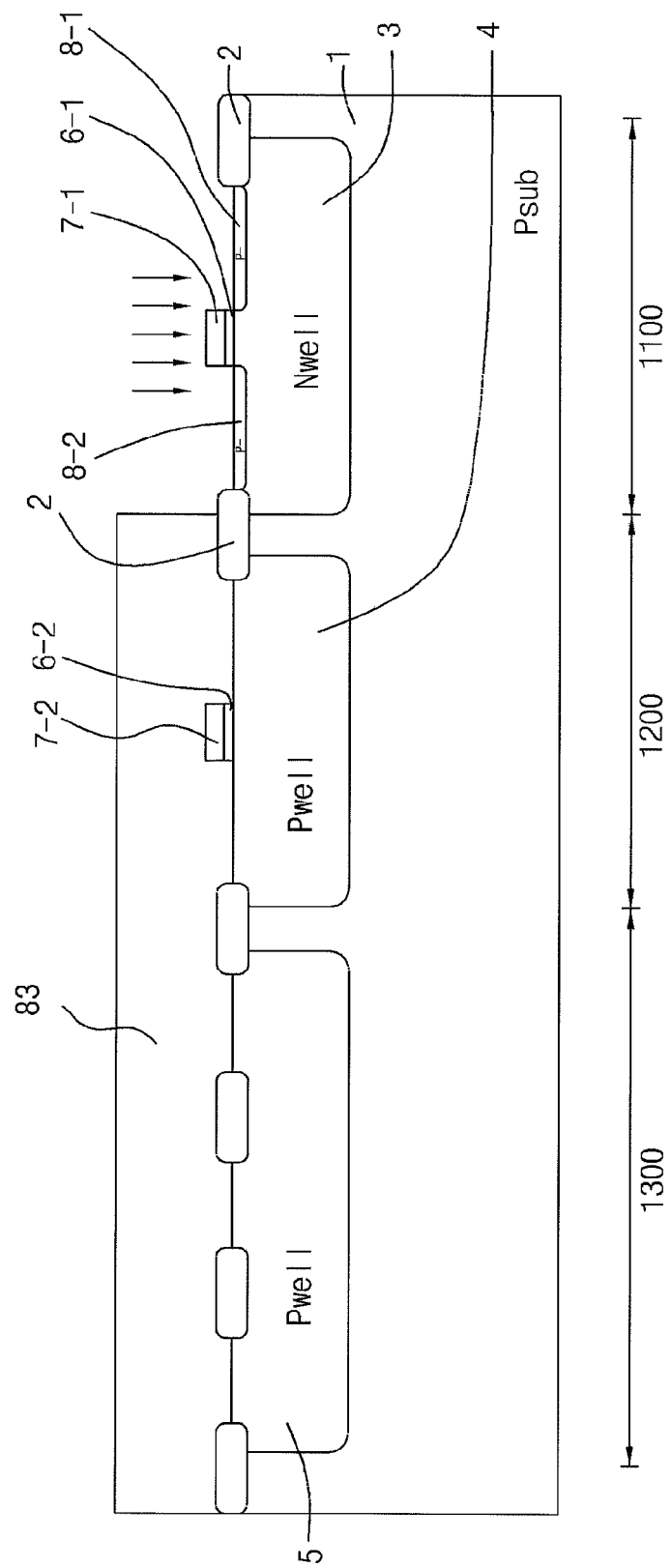
FIG. 9 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 9, a resist pattern 83 is formed over the P-type single crystal silicon substrate 1, the first gate structure, and the field oxide film 2 by known lithography technique. This resist pattern 83 has an opening in the first element region 1100. This resist pattern 83, the field oxidation film 2 and the first gate electrode 7-1 are used as masks, and boron difluoride ($BF_2^+$) as P-type impurity is selectively implanted into the N-well 3 in the vertical direction under conditions of an acceleration energy of 15 keV and a dose amount of $3.0 \times 10^{13}$ cm$^{-2}$. Thus, the P$^-$ low concentration impurity diffusion regions 8-1 and 8-2 are selectively formed in the N-well 3. The P$^-$ low concentration impurity diffusion regions 8-1 and 8-2 self-align with the first gate electrode 7-1.

Figure 10:
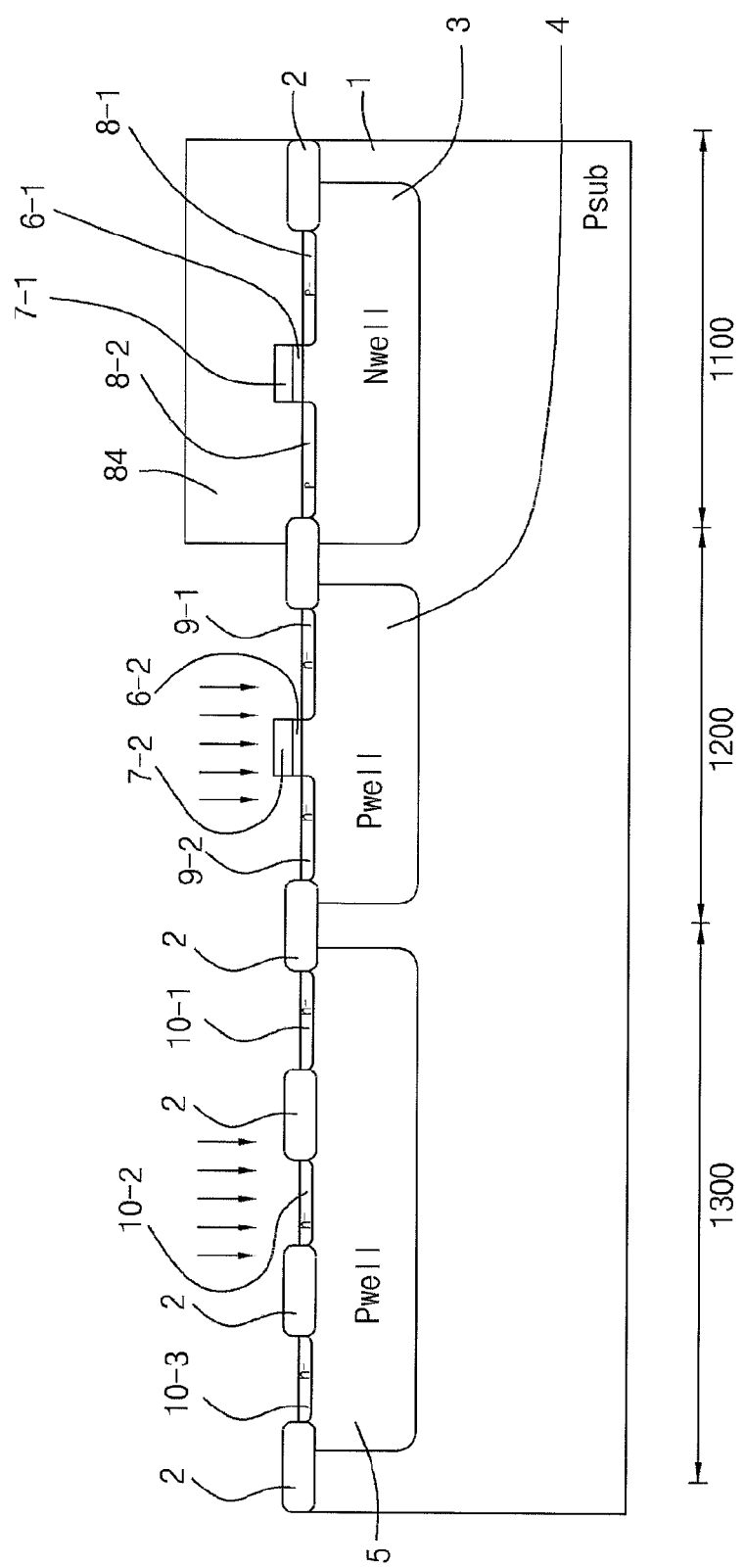
FIG. 10 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 10, the resist pattern 83 is removed by a known method. Subsequently, a resist pattern 84 is formed over the P-type single crystal silicon substrate 1, the second gate structure, and the field oxide film 2 by known lithography technique. This resist pattern 84 has an opening over the second and third element regions 1200 and 1300. This resist pattern 84, the field oxidation film 2 and the second gate electrode 7-2 are used as masks, and arsenic (As$^+$) as P-type impurity is selectively implanted into the P-wells 4 and 5 in the vertical direction under conditions of an acceleration energy of 30 keV and a dose amount of $4.0 \times 10^{13}$ cm$^{-2}$. Thus, the N$^-$ low concentration impurity diffusion regions 9-1 and 9-2 are selectively formed in the P-well 4, and the N$^-$ low concentration impurity diffusion regions 10-1, 10-2 and 10-3 are selectively formed in the P-well 5. The N$^-$ low concentration impurity diffusion regions 9-1 and 9-2 self-align with the second gate electrode 7-2.

Figure 11:
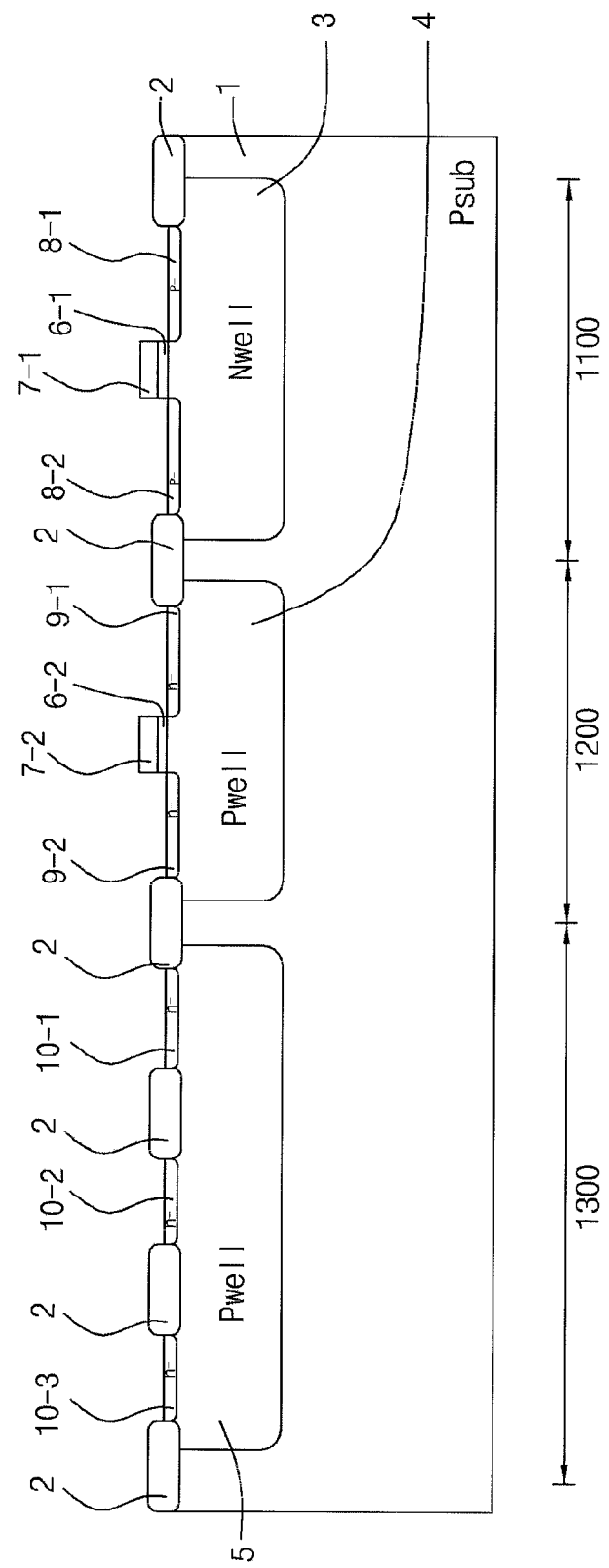
FIG. 11 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 11, the resist pattern 84 is removed by a known method.

Figure 12:
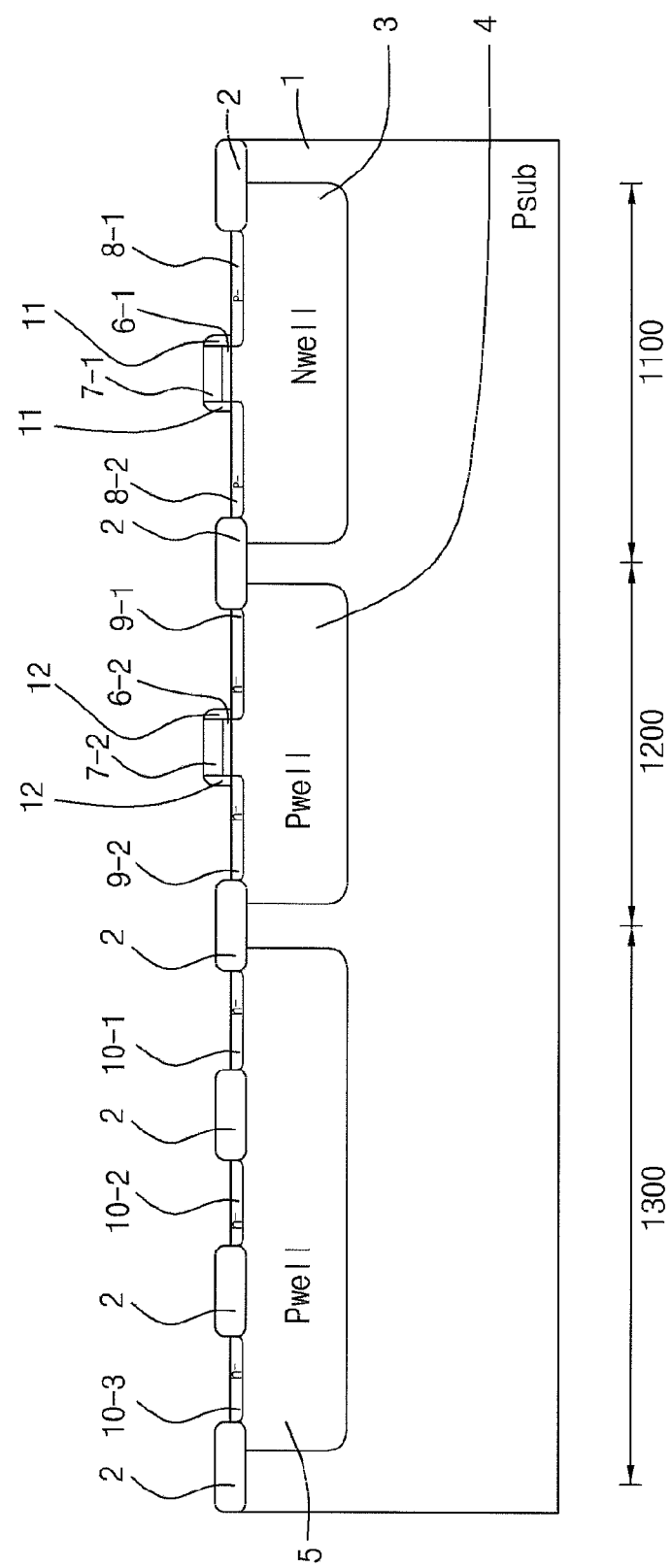
FIG. 12 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 12, the first and second sidewall insulating films 11 and 12 are formed on the sidewalls of the aforementioned first and second gate structures, respectively, by a known method. Thus, while the third gate structure that is composed of the first gate insulating film 6-1, the first gate electrode 7-1, and the first sidewall insulating film 11 is formed on the N-well 3, the fourth gate structure that is composed of the second gate insulating film 6-2, the second gate electrode 7-2, and the second sidewall insulating film 12 is formed on the P-well 4.

Figure 13:
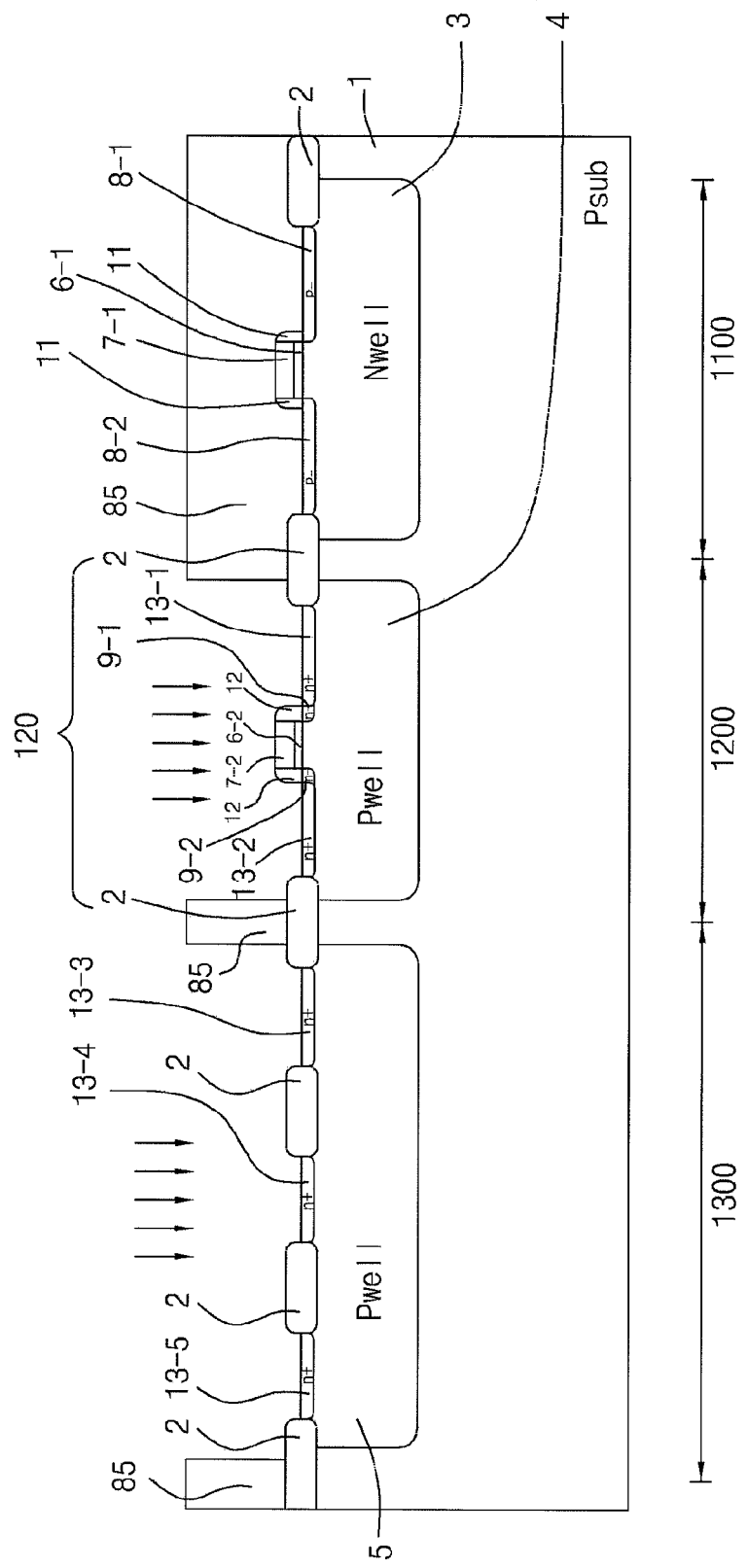
FIG. 13 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 13, a resist pattern 85 is formed over the P-type single crystal silicon substrate 1, the third gate structure, and the field oxide film 2 by known lithography technique. This resist pattern 85 has openings in the second and third element regions 1200 and 1300. This resist pattern 85, the field oxidation film 2, and the aforementioned fourth gate structure that is composed of the second gate insulating film 6-2, the second gate electrode 7-2 and the second sidewall insulating film 12 are used as masks, and arsenic (As$^+$) as P-type impurity is selectively implanted into the P-wells 4 and 5 in the vertical direction under conditions of an acceleration energy of 50 keV and a dose amount of $3.0 \times 10^{15}$ cm$^{-2}$. Thus, the N$^+$ high concentration impurity diffusion regions 13-1 and 13-2 are selectively formed in the P-well 4, and the N$^+$ high concentration impurity diffusion regions 13-3, 13-4 and 13-5 are selectively formed in the P-well 5. The N$^+$ high concentration impurity diffusion regions 13-1 and 13-2 self-align with the fourth gate structure.

Figure 14:
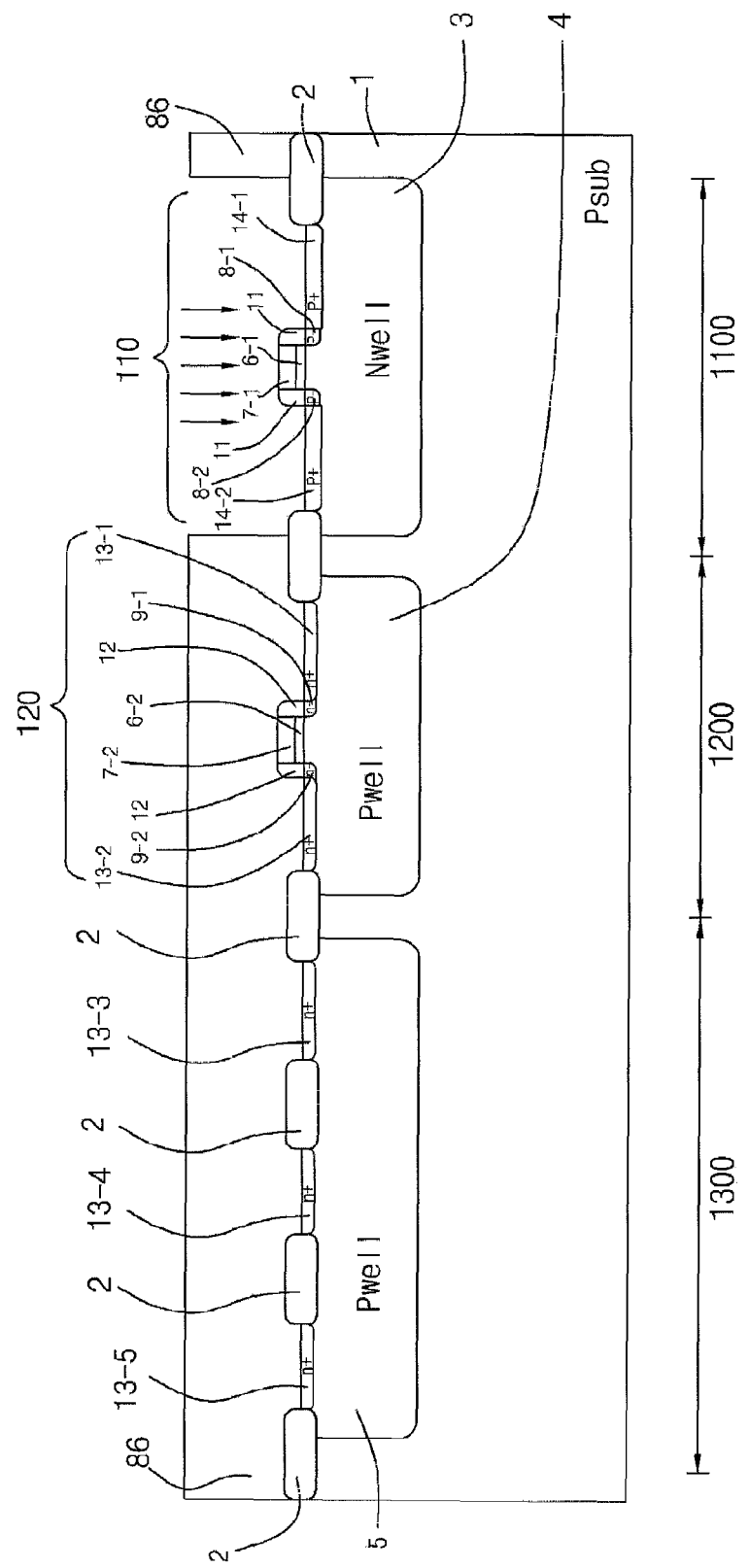
FIG. 14 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 14, the resist pattern 85 is removed by a known method. Subsequently, a resist pattern 86 is formed over the P-type single crystal silicon substrate 1, the fourth gate structure, and the field oxide film 2 by known lithography technique. This resist pattern 86 has an opening in the first element region 1200. This resist pattern 86, the field oxidation film 2 and the aforementioned first gate structure hat is composed of the first gate insulating film 6-1 and the first gate electrode 7-1 are used as masks, and boron difluoride ($BF_2^+$) as P-type impurity is selectively implanted into the N-well 3 in the vertical direction under conditions of an acceleration energy of 40 keV and a dose amount of $4.0 \times 10^{15}$ cm$^{-2}$. Thus, the P$^+$ high concentration impurity diffusion regions 14-1 and 14-2 are selectively formed in the N-well 3. The P$^+$ high concentration impurity diffusion regions 14-1 and 14-2 self-align with the third gate structure. After that, rapid thermal annealing (RTA) is performed in a nitrogen ($N_2$) atmosphere at temperature of 1050.degree. C. for 10 seconds, and thus activates the P-type impurity of the P$^-$ low concentration impurity diffusion regions 8-1 and 8-2, and the P$^+$ high concentration impurity diffusion regions 14-1 and 14-2 in the N-well 3, the N-type impurity of the N$^-$ low concentration impurity diffusion regions 9-1 and 9-2, and the N+ high concentration impurity diffusion region 13-1 and 13-2 in the P-well 4, and the N-type impurity of N$^+$ high concentration impurity diffusion region 13-3, 13-4 and 13-5 in the P-well 5.

Figure 15:
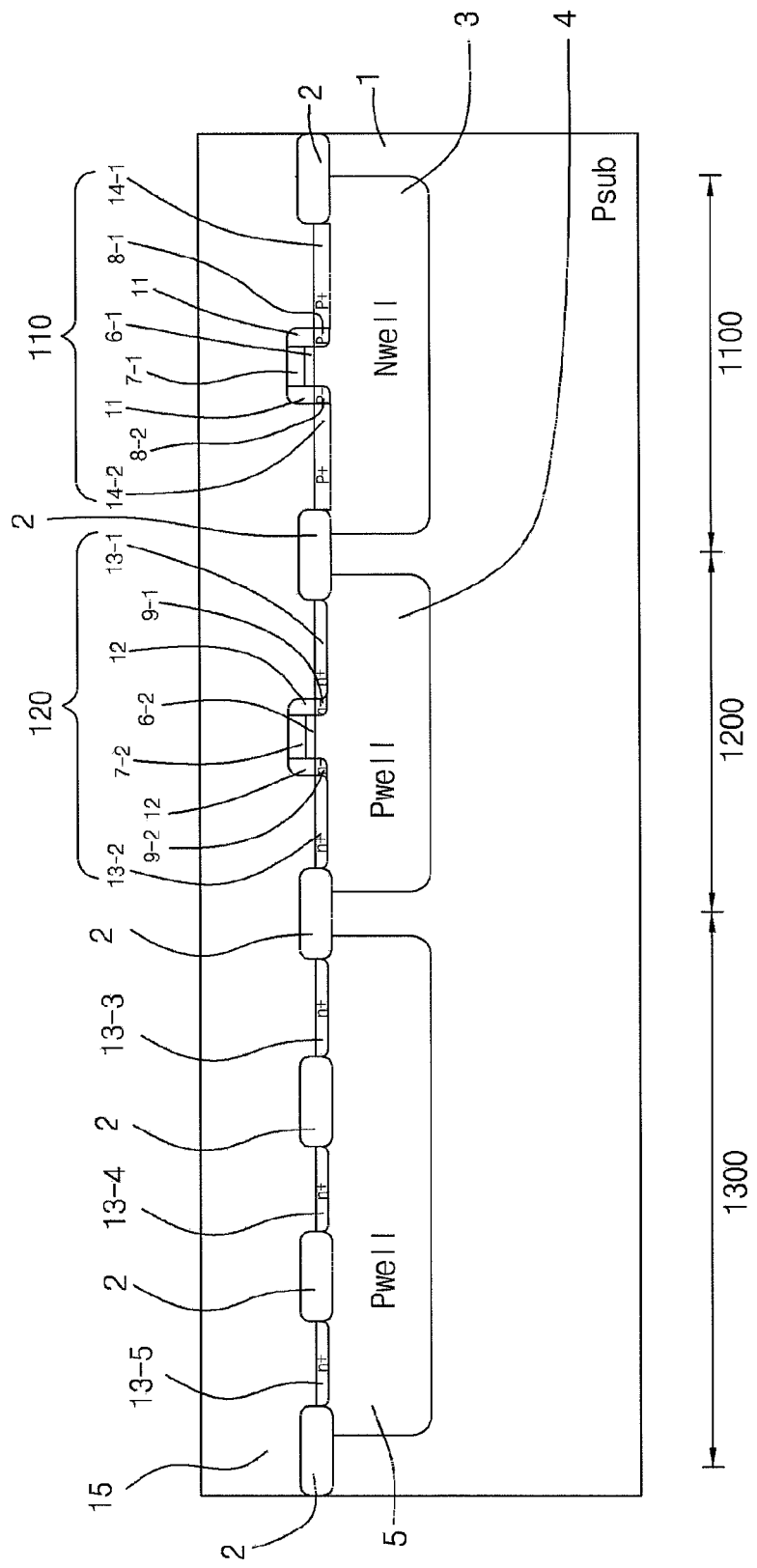
FIG. 15 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 15, the resist pattern 86 is removed by a known method. Subsequently, the first interlayer insulating film 15 is formed by a CVD method above the P-type single crystal semiconductor substrate 1, that is, over the field oxide film 2, the third and fourth gate structures, the N$^+$ high concentration impurity diffusion regions 13-1, 13-2, 13-3, 13-4 and 13-5, and the P$^+$ high concentration impurity diffusion regions 14-1 and 14-2. The surface of this first interlayer insulating film 15 is flattened by a CMP (Chemical Mechanical Polishing) method. Although this first interlayer insulating film 15 can be formed of various known interlayer insulating film materials, typically, it can be formed of non-doped silicate glass (NSG).

Figure 16:
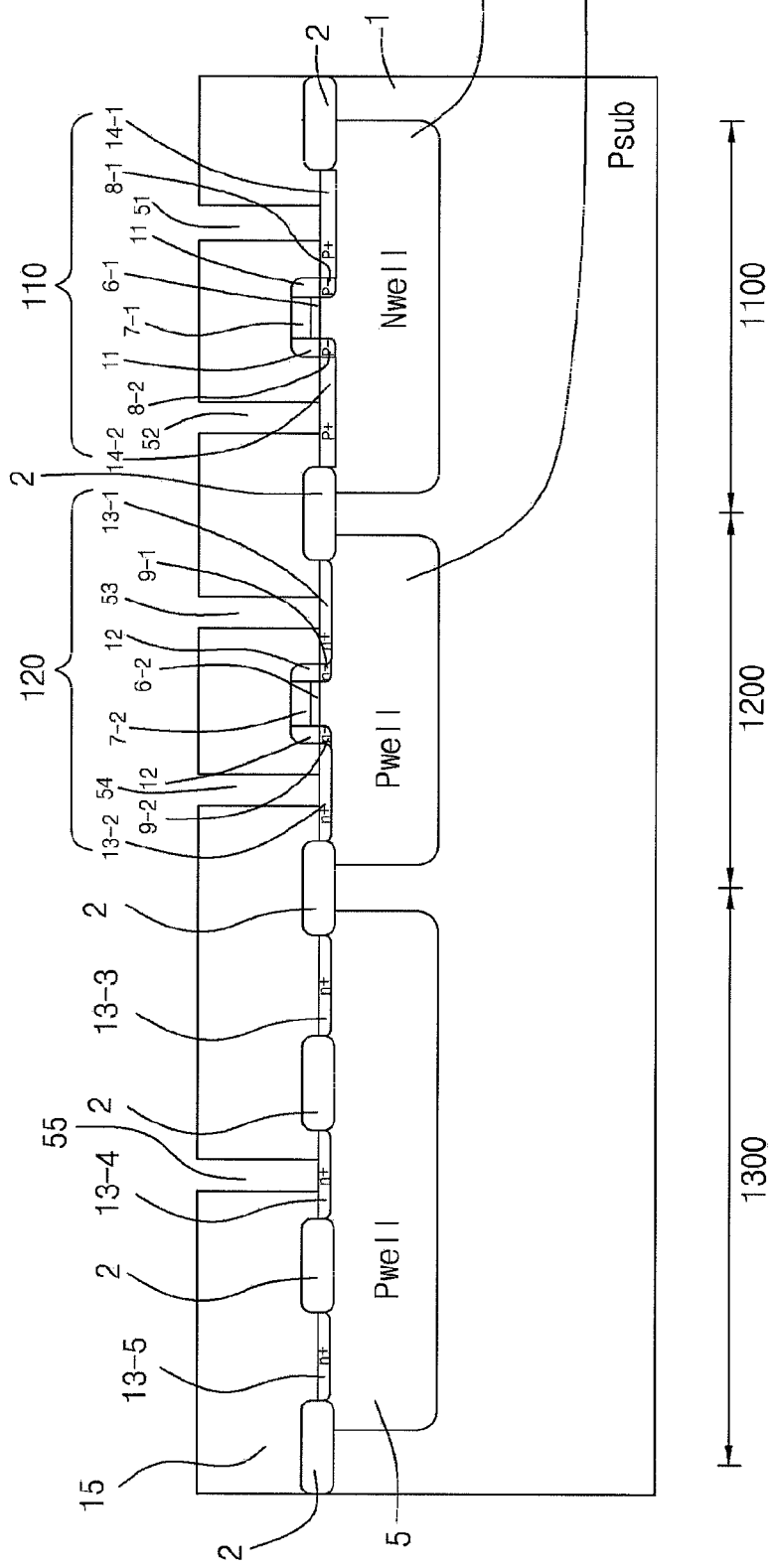
FIG. 16 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 16, a resist pattern is formed on the first interlayer film 15 by known lithography technique. This resist pattern has openings at positions above the P$^+$ high concentration impurity diffusion regions 14-1 and 14-2, and at positions above the N$^+$ high concentration impurity diffusion regions 13-1, 13-2 and 13-4. This resist pattern is used as a mask, and the first interlayer insulating film 15 is etched to selectively remove the first interlayer insulating film 15. Thus, the first, second, third, fourth and fifth contact holes 51, 52, 52, 54 and 55 are formed in the first interlayer insulating film 15. The first contact hole 51 reaches the surface of the P$^+$ high concentration impurity diffusion region 14-1. The second contact hole 52 reaches the surface of the P$^+$ high concentration impurity diffusion region 14-2. The third contact hole 53 reaches the surface of the N$^+$ high concentration impurity diffusion region 13-1. The fourth contact hole 54 reaches the surface of the N$^+$ high concentration impurity diffusion region 13-2. The fifth contact hole 55 reaches the surface of the N$^+$ high concentration impurity diffusion region 13-4.

Figure 17:
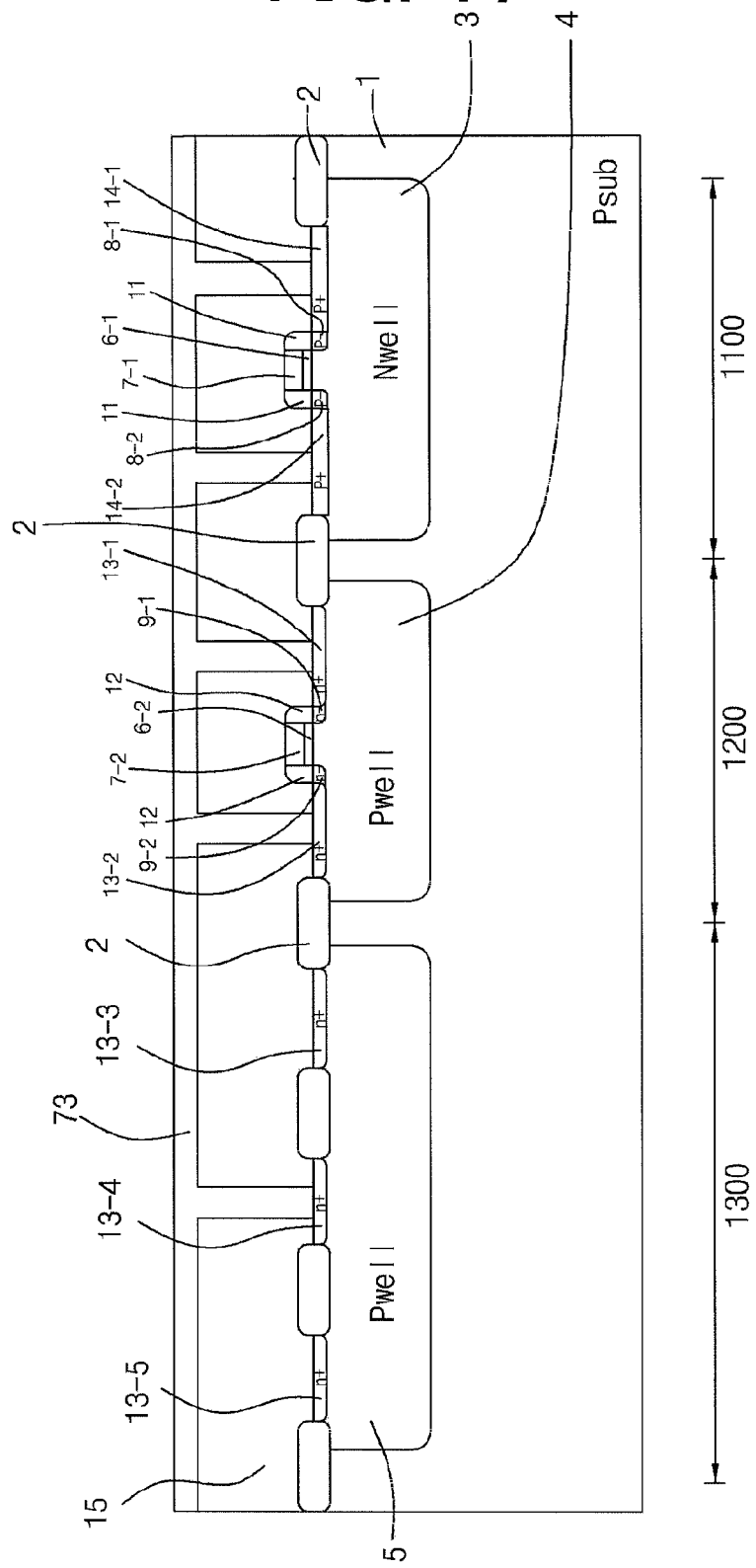
FIG. 17 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 17, this resist pattern is removed by a known method. Subsequently, a first conductive film 73 is formed inside the first through fifth contact holes 51, 52, 53, 54 and 55, and on the first interlayer insulating film 15. The first conductive film 73 is completely embedded inside the first through fifth contact holes 51, 52, 53, 54 and 55. The first conductive film 73 can be formed of known layer structure and a known material. For example, the first conductive film 73 can be composed of a lamination of a titanium layer that has a thickness of 150 .ANG. and is formed by a CVD method, a titanium nitride layer that has a thickness of 200 .ANG. and is formed on this titanium layer by a CVD method, and a the tungsten layer that has a thickness of 4000 .ANG. and is formed on this titanium nitride layer by a CVD method.

Figure 18:
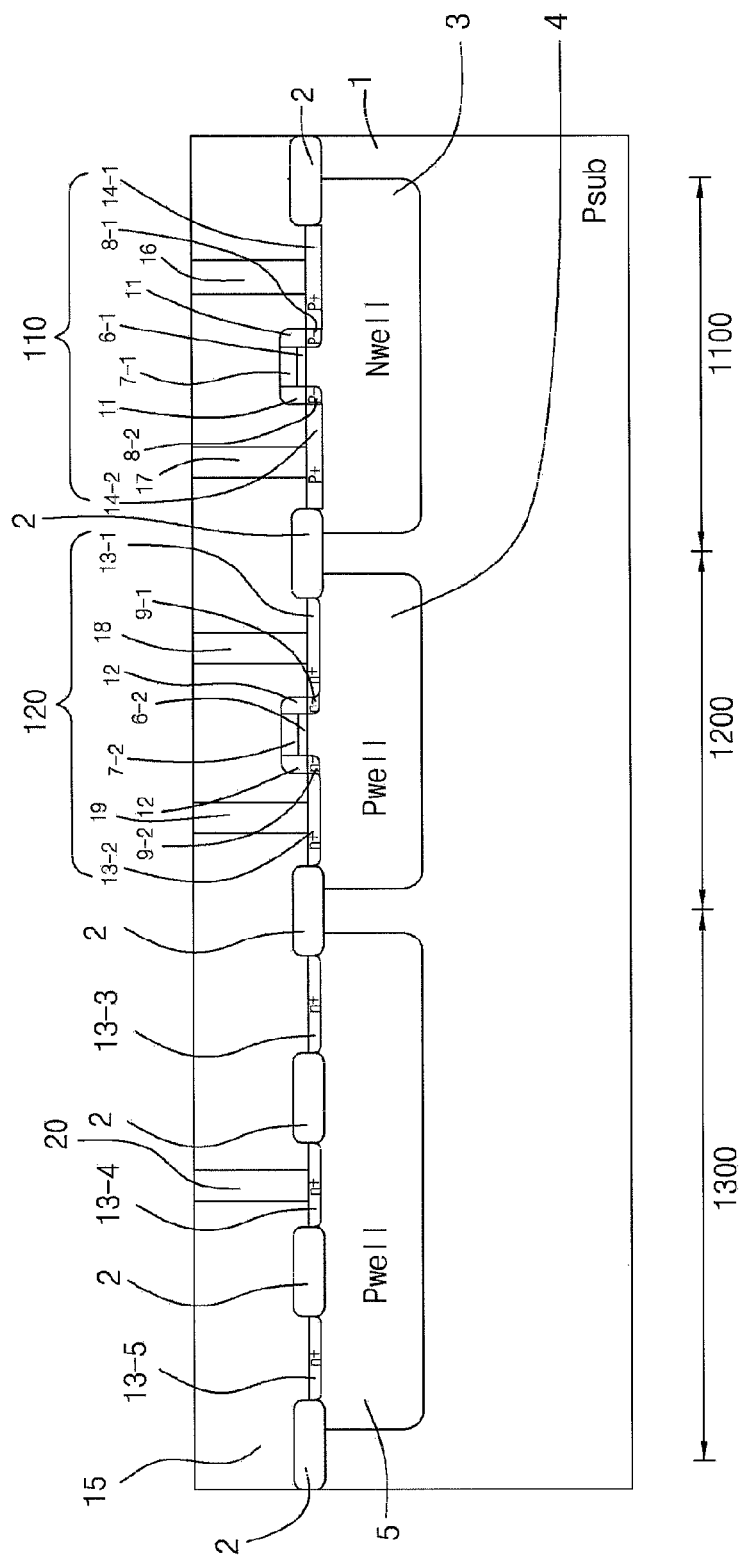
FIG. 18 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 18, the first conductive film 73 is etched back by CMP, thus, a portion of the first conductive film 73 that extends on the surface of the first interlayer insulating film 15 is removed. On the other hand, portions of the first conductive film 73 inside the first through fifth contact holes 51, 52, 53, and 54 and 55 remain, thus, the first through fifth conductive contact plugs 16, 17, 18, 19 and 20 are formed inside the first through fifth contact holes 51, 52, 53, 54 and 55, respectively. The first conductive film 16 is in electrical contact with the P.sup.+ high concentration impurity diffusion region 14-1. The second conductive film 17 is in electrical contact with the P.sup.+ high concentration impurity diffusion region 14-2. The third conductive film 18 is in electrical contact with the N.sup.+ high concentration impurity diffusion region 13-1. The fourth conductive film 19 is in electrical contact with the N.sup.+ high concentration impurity diffusion region 13-2. The fifth conductive film 20 is in electrical contact with the N.sup.+ high concentration impurity diffusion region 13-4. The top surfaces of the first through fifth conductive contact plugs 16, 17, 18, 19 and 20, and the top surface of the first interlayer insulating film 15 define one flat surface.

Figure 19:
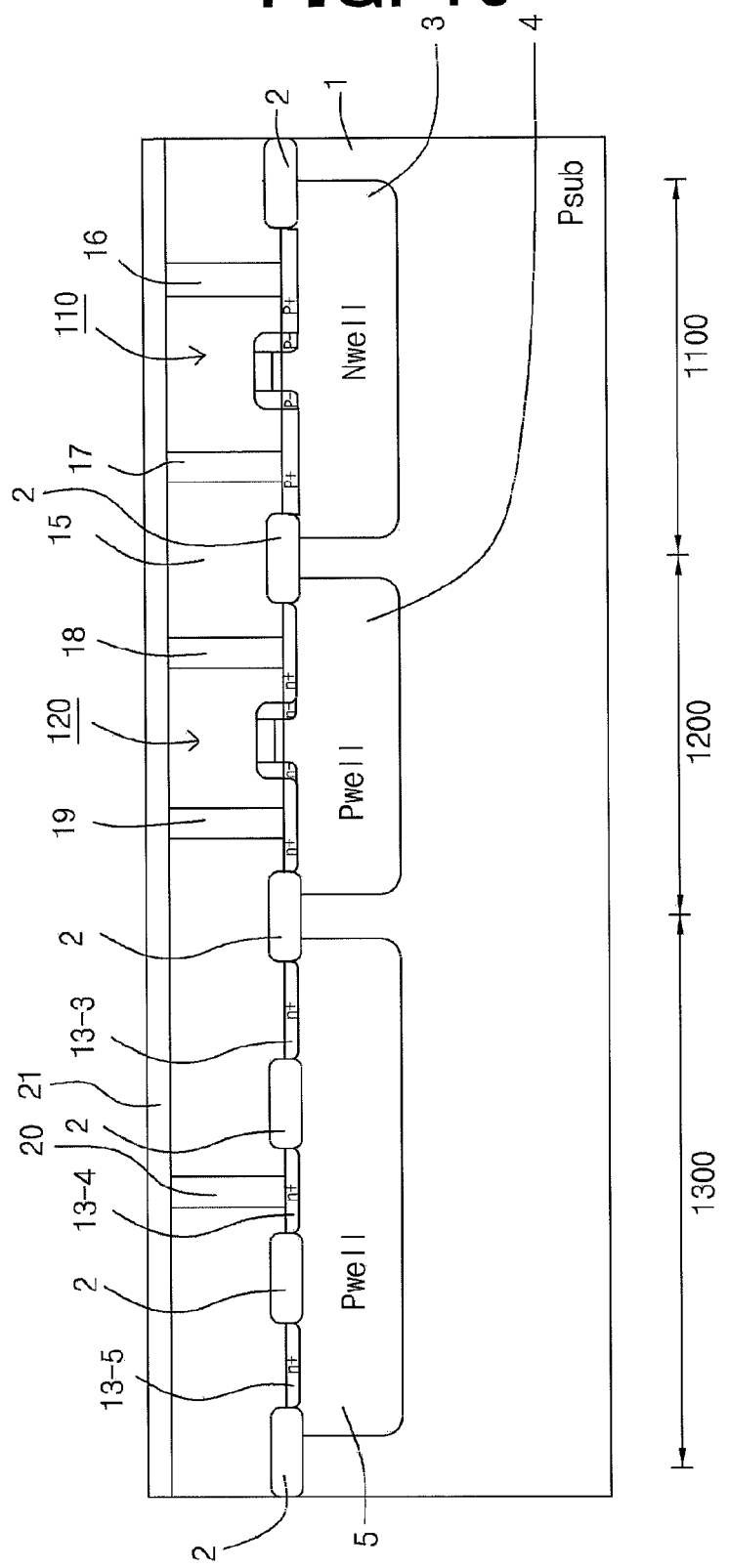
FIG. 19 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 19, the second interlayer insulating film 21 is formed over the first through fifth conductive contact plugs 16, 17, 18, 19 and 20, and the first interlayer insulating film 15, by a plasma CVD (Plasma Enhanced Chemical Vapor Deposition) method. This second interlayer insulating film 21 can have multilayer structure, or single-layer structure. The multilayer structure can be composed of a TEOS-NSG (Tetraethoxysilane Non-Doped Silicate Glass) film that has a thickness of 1500 .ANG. and is formed by plasma CVD, a silicon nitride layer has a thickness of 1000 .ANG. and is formed on this TEOS-NSG film by plasma CVD, an O3-TEOS-NSG film that has a thickness of 1500 .ANG. and is formed on this silicon nitride layer by low pressure CVD, and, on this O3-TEOS-NSG film, an O3-TEOS-NSG film that has a thickness of 1500 .ANG. and is formed by high pressure CVD. The aforementioned single layer structure can be formed of a TEOS-NSG film that has a thickness of 4000 .ANG. and is formed by plasma CVD. Subsequently, this NSG film may be annealed at 700.degree. C. in a nitrogen atmosphere for 30 minutes.

Figure 20:
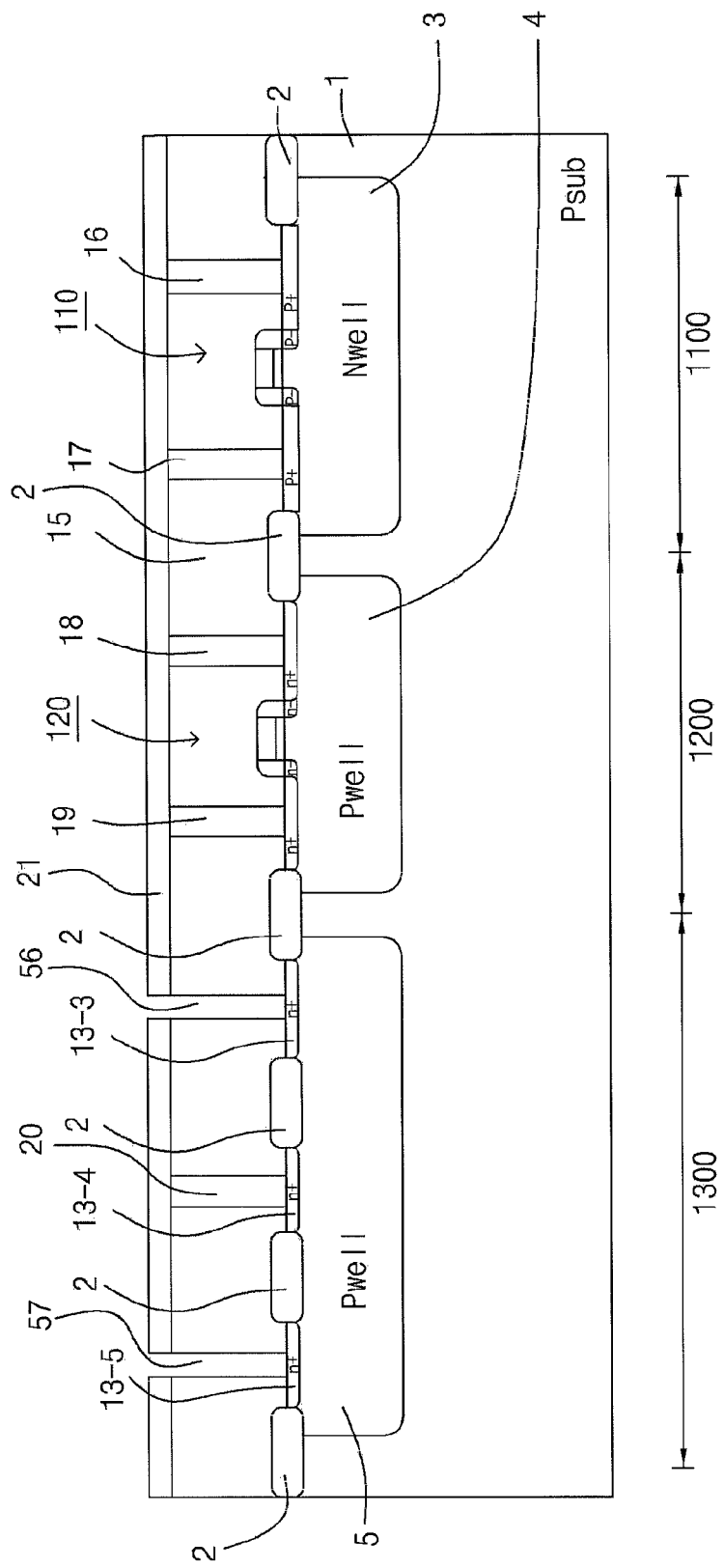
FIG. 20 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 20, a resist pattern is formed on the second interlayer film 21 by known lithography technique. This resist pattern has openings at positions above the N.sup.+ high concentration impurity diffusion regions 13-3 and 13-5. This resist pattern is used as a mask, and the second interlayer insulating film 21 and the first interlayer insulating film 15 are etched to selectively remove the second interlayer insulating film 21 and the first interlayer insulating film 15. Thus, the sixth and seventh contact holes 56 and 57 are formed in the second interlayer insulating film 21 and the first interlayer insulating film 15. The sixth contact hole 56 reaches the surface of the N.sup.+ high concentration impurity diffusion region 13-3. The seventh contact hole 57 reaches the surface of the N.sup.+ high concentration impurity diffusion region 13-5.

Figure 21:
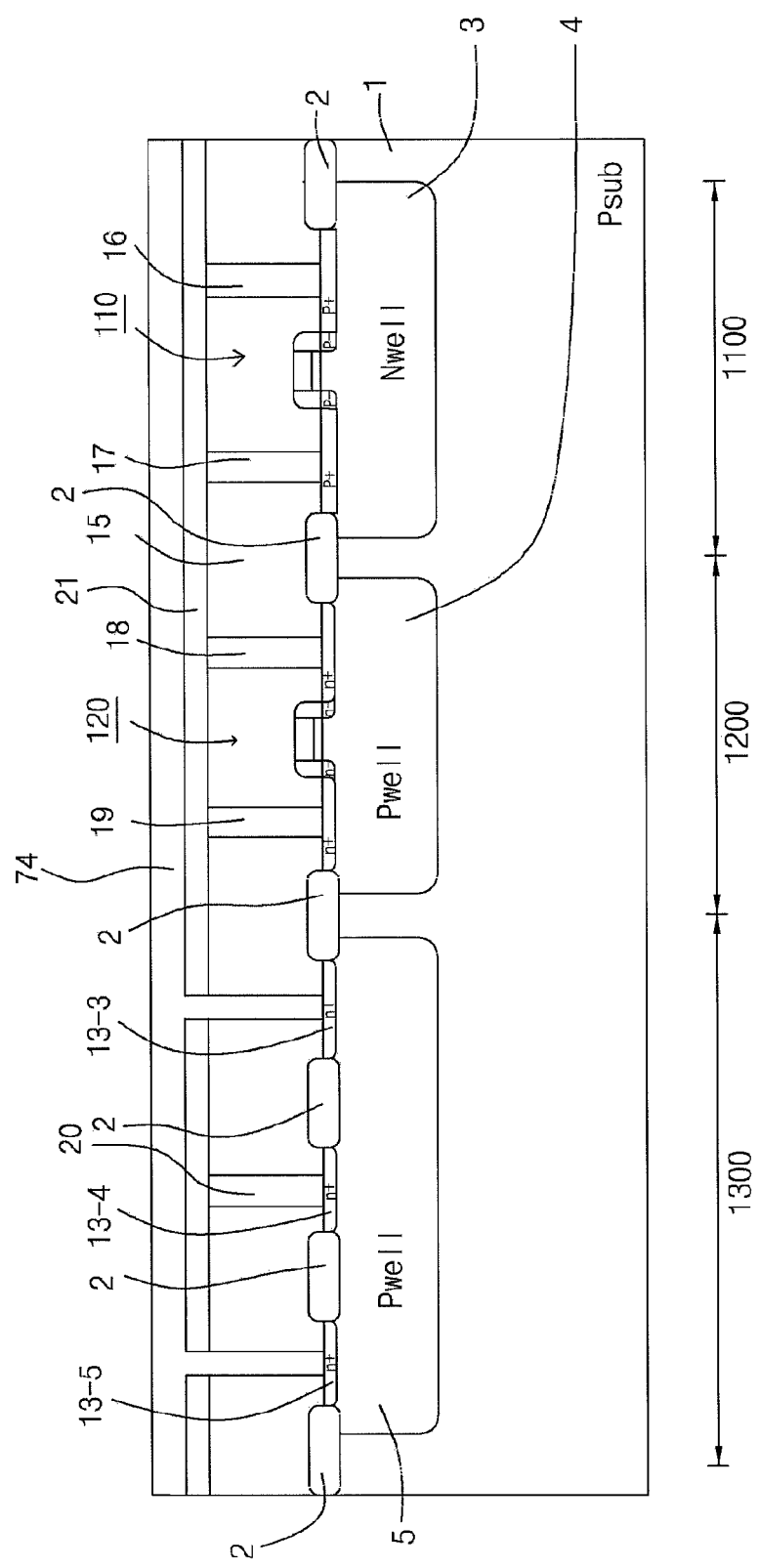
FIG. 21 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 21, this resist pattern is removed by a known method. Subsequently, a second conductive film 74 is formed inside the sixth and seventh contact holes 56 and 57, on the second interlayer insulating film 21. The second conductive film 74 is completely embedded inside the sixth and seventh contact holes 56 and 57. The second conductive film 74 can be formed of known layer structure and a known material. For example, the second conductive film 74 can be composed of a lamination of a titanium layer that has a thickness of 150 .ANG. and formed by a CVD method, a titanium nitride layer that has a thickness of 200 .ANG. and formed on this titanium layer by a CVD method, and a tungsten layer that has a thickness of 6000 .ANG. and formed on this titanium nitride layer by a CVD method.

Figure 22:
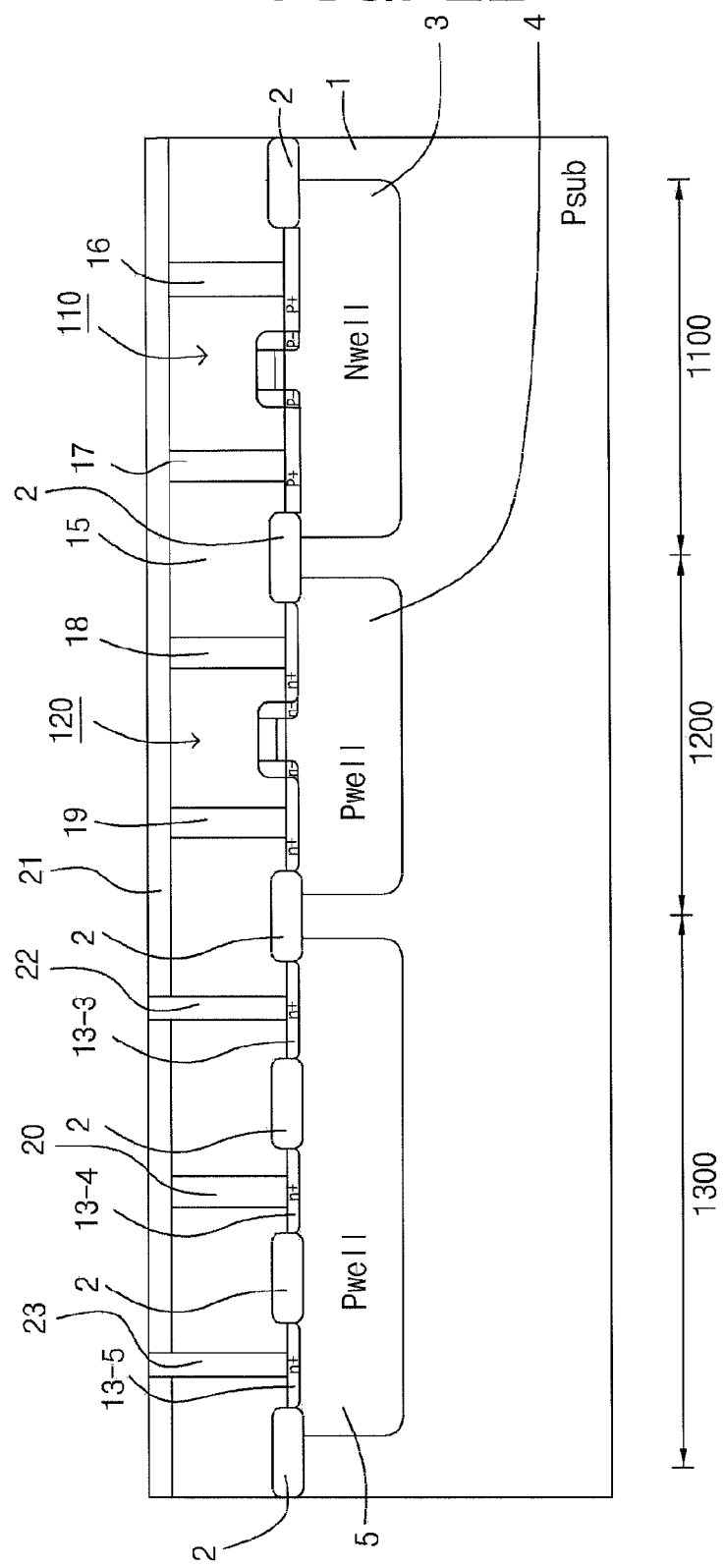
FIG. 22 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 22, the second conductive film 74 is etched back by CMP, thus, a portion of the second conductive film 74 that extends on the surface of the second interlayer insulating film 21 is removed. On the other hand, portions of the second conductive film 74 inside the sixth and seventh contact holes 56 and 57 remain, thus, the sixth and seventh conductive contact plugs 22 and 23 are formed inside the sixth and seventh conductive contact plugs 22 and 23, respectively. The sixth conductive film 22 is in electrical contact with the N.sup.+ high concentration impurity diffusion region 13-3. The seventh conductive film 23 is in electrical contact with the N.sup.+ high concentration impurity diffusion region 13-5. The top surfaces of the sixth and seventh conductive contact plugs 22 and 23, and the top surface of the second interlayer insulating film 21 define one flat surface.

Figure 23:
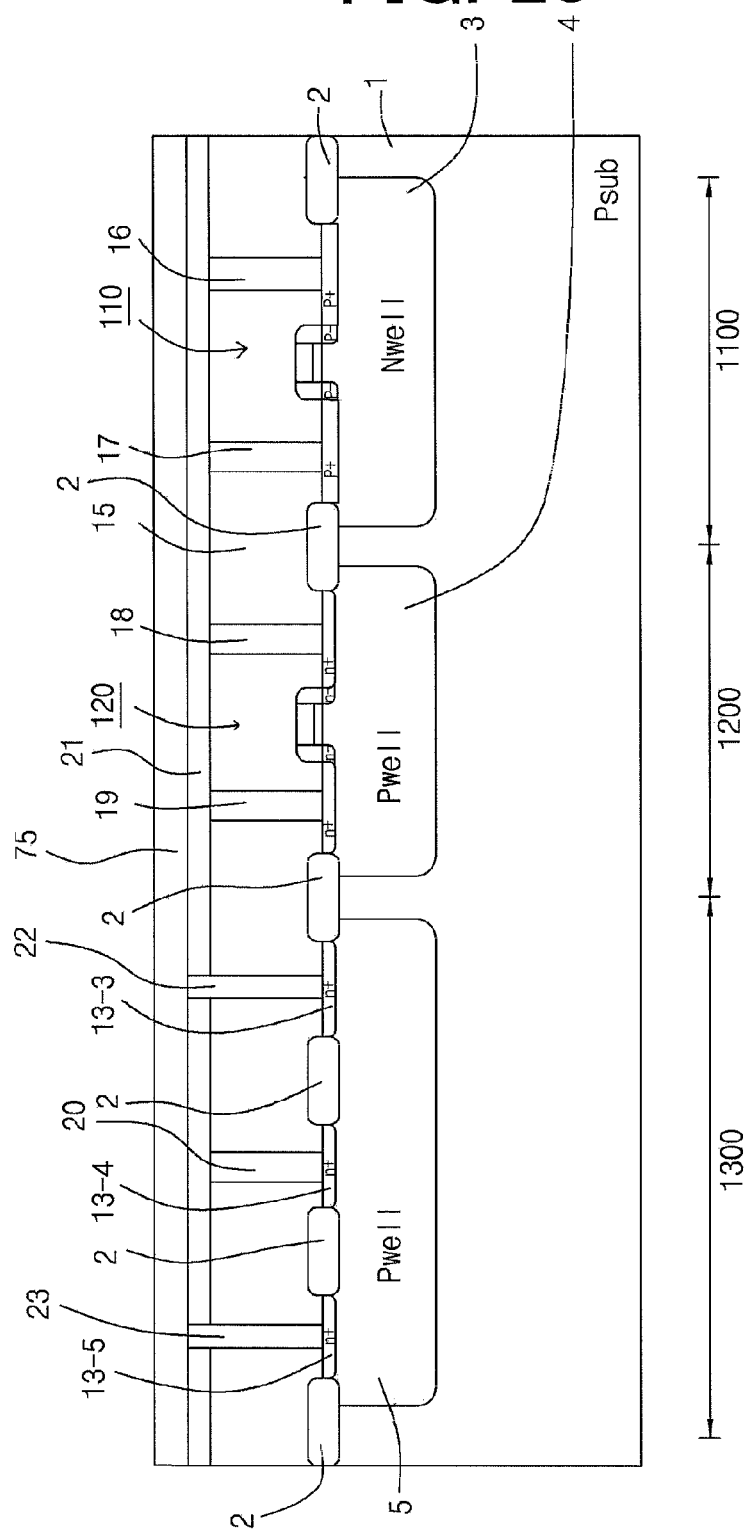
FIG. 23 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 23, a third conductive film 75 is formed over the sixth and seventh conductive contact plug 22, 23, and second interlayer insulating film 21 by a sputtering method. A CVD method may be used instead of this sputtering method. This third conductive film 75 can be composed of a known layer structure for lower electrode of capacitor. Specifically, it can have multilayer structure, or single-layer structure. This multilayer structure can have a TiAN layer that has a thickness of 500 .ANG. and is formed by a sputtering method, an Ir layer that has a thickness of 1000 .ANG. and is formed on this TiAN layer by a the sputtering method, an IrO.sub.2 layer that has a thickness of 1000 .ANG. and is formed on this Ir layer by a sputtering method, and a Pt layer that has a thickness of 500 .ANG. and is formed on this IrO.sub.2 layer by a sputtering method. In this structure, the TiAN layer comprises a conductive oxidation barrier layer. In order to prevent reaction between Ir of the Ir layer and Pt of the Pt layer, the IrO.sub.2 layer is interposed between both these layers. The aforementioned single layer structure can be composed of a Pt layer that is formed by a sputtering method.

Figure 24:
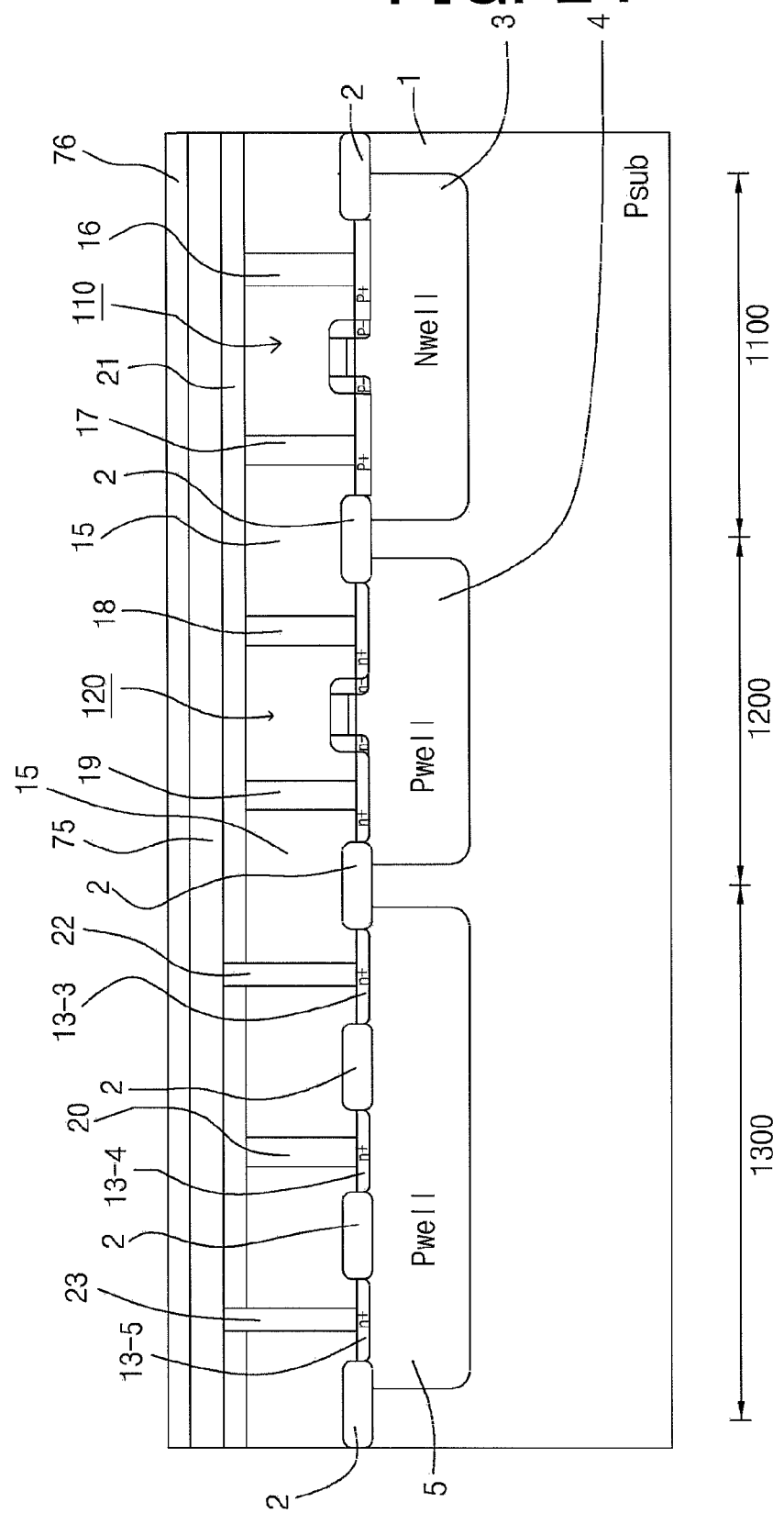
FIG. 24 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 24, a first dielectric film 76 is formed on the aforementioned third conductive film 75. This first dielectric film 76 may be formed by annealing a dielectric film at a temperature of 700 to 750.degree. C. after the dielectric film is formed by a spin coating method. A CVD method can be used instead of the spin coating method. The first dielectric film 76 is preferably formed of a ferroelectric metal oxide film. More specifically, the first dielectric film 76 is preferably formed of SBT with thickness of 1200 .ANG. However, the first dielectric film 76 may be formed of a high dielectric instead of the ferroelectric.

Figure 25:
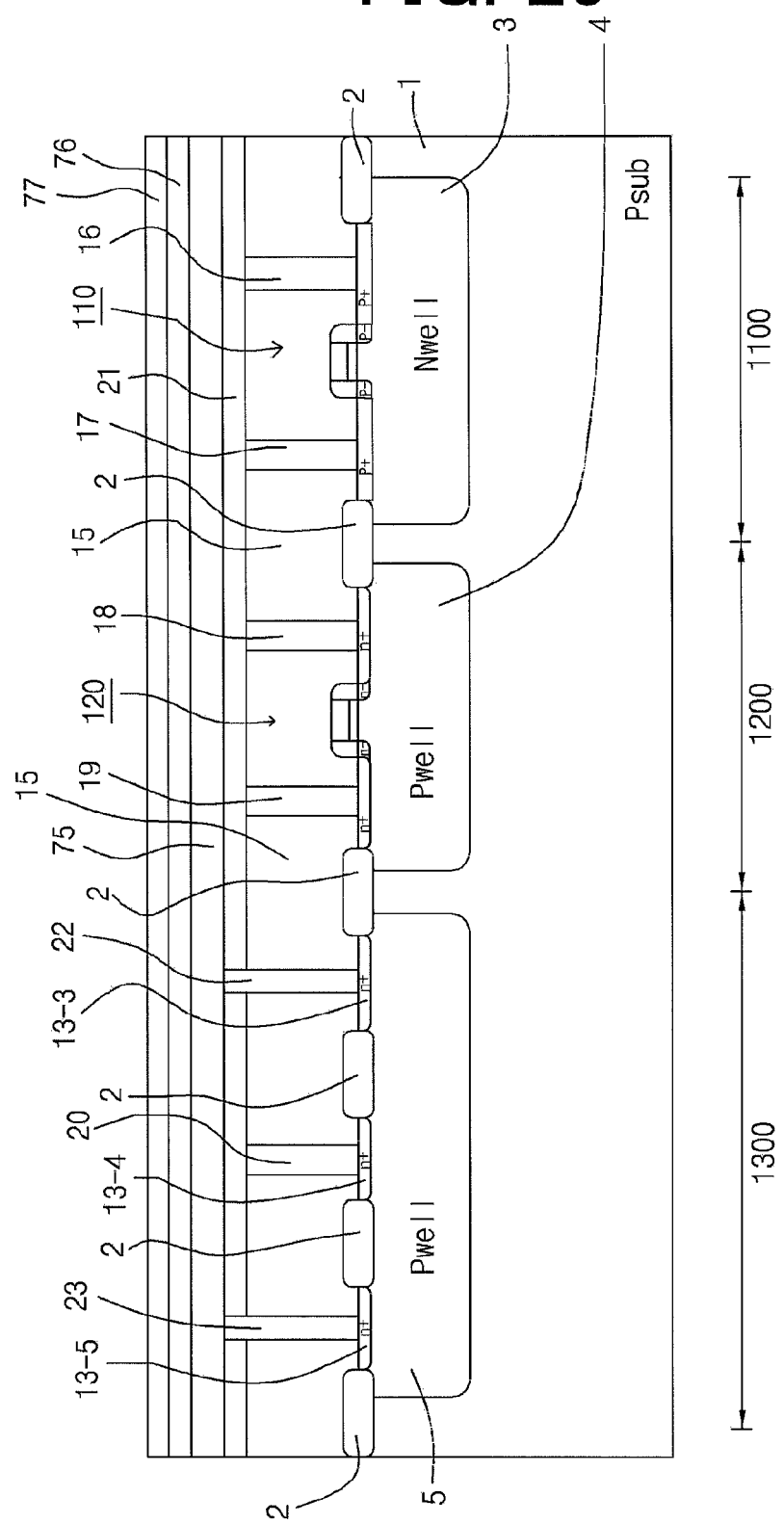
FIG. 25 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 25, a fourth dielectric film 77 is formed on the aforementioned first conductive film 76 by a sputtering method. A CVD method may be used instead of this sputtering method. This fourth conductive film 77 can be composed of a known layer structure for upper electrode of capacitor. Typically, the fourth dielectric film 77 is preferably formed of a Pt film with thickness of 1500 .ANG. A laminated structure of the third conductive film 75, the first dielectric film 76, and the fourth conductive film 77 has stress. Particularly, since the Pt film that is formed on the ferroelectric metal oxide film has relatively large stress, it is preferable to relieve the stress by thermal treatment. For this reason, annealing is performed at a temperature of 700.degree. C. in an oxygen atmosphere for one minute, thus, it is possible to relieve stress.

Figure 26:
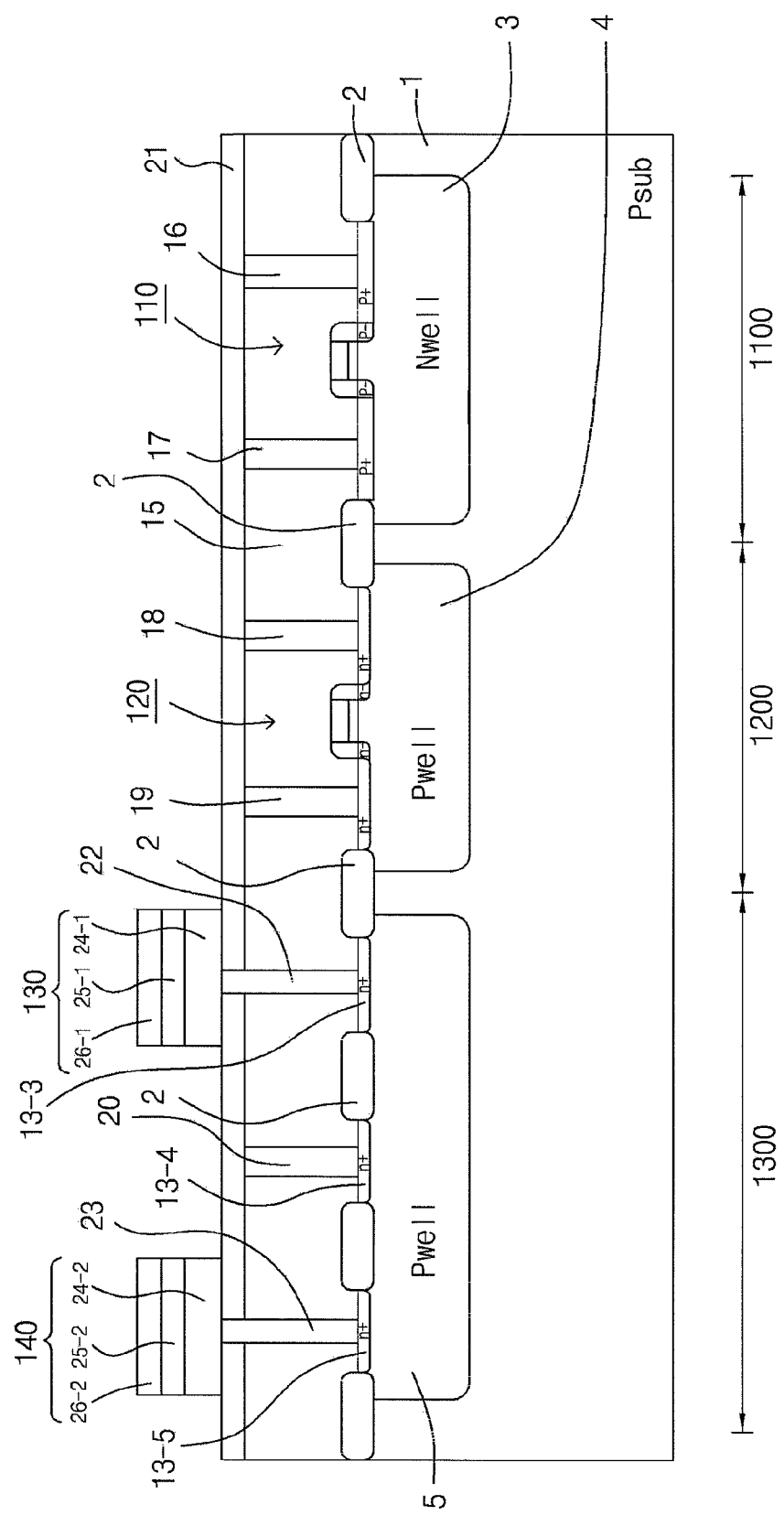
FIG. 26 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.
Figure 27:
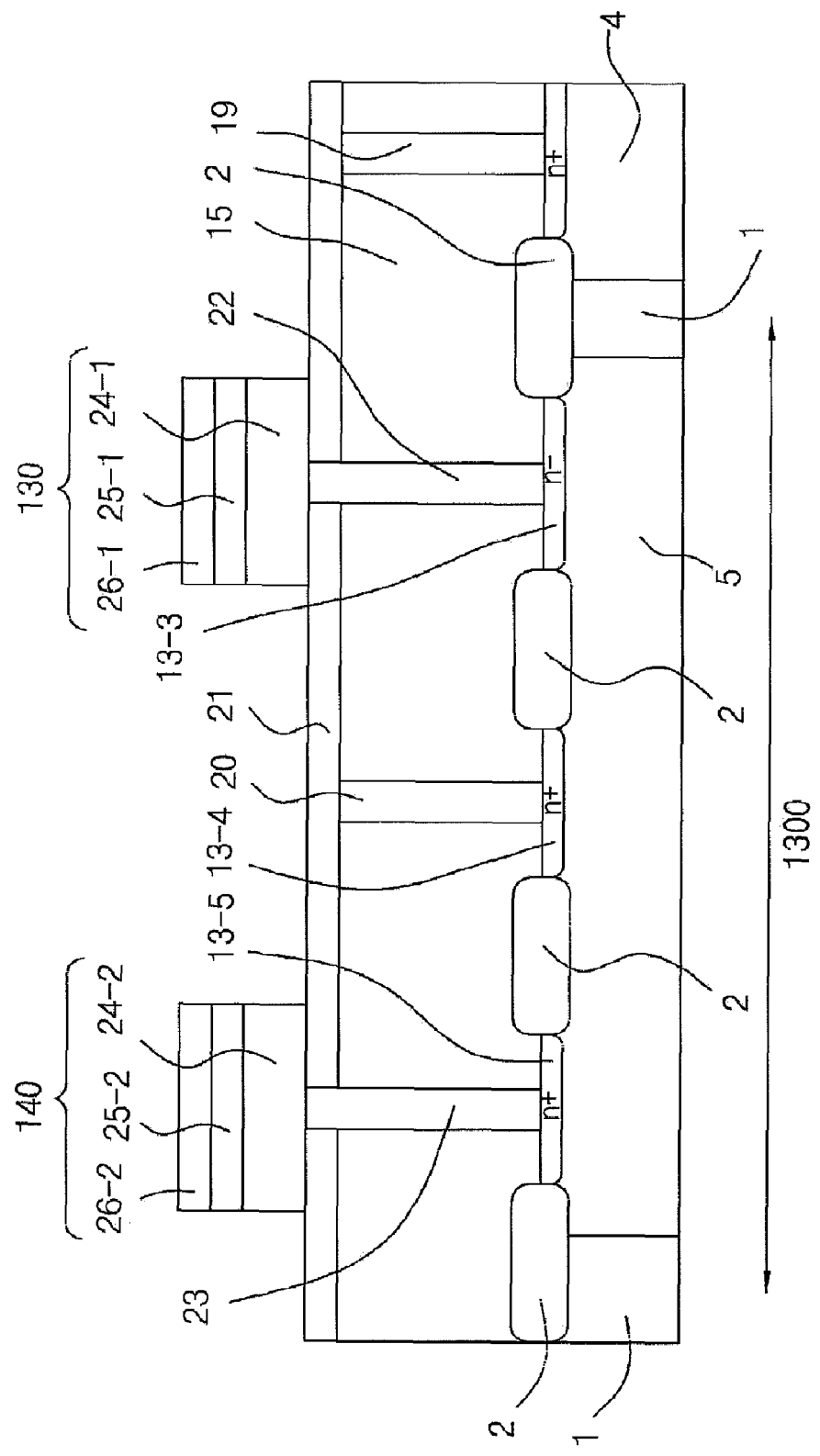
FIG. 27 is a partially enlarged vertical cross-sectional view of the pair of FeRAM cells shown in FIG. 26.

As shown in FIG. 26, a layer that serves as a hard mask is formed on the fourth conductive film 77. Specifically, a TiN film with thickness of 1000 .ANG. is formed on the fourth conductive film 77. In addition, a TEOS (Tetraethoxysilane) film with thickness of 4000 .ANG. is formed on this TiN film by Plasma CVD. Additionally, a TiN film with thickness of 1000 .ANG. is formed on this TEOS film, thus, three-layer structure is formed. This three-layer structure forms a layer that serves as a hard mask. Furthermore, a resist pattern is formed on the three-layer structure by known lithography technique. This resist pattern is used as a mask, and this three-layer structure is etched, thus, a hard mask is formed. Subsequently, the resist pattern is removed by a known method. After that, the formed hard mask is used, and the laminated structure that is composed of the third conductive film 75, the first dielectric film 76 and the fourth conductive film 77 is selectively etched. Thus, the first and second capacitors 130 and 140 are formed.

The first capacitor 130 is composed of the first lower electrode 24-1, the first ferroelectric metal oxide film 25-1 on this first lower electrode 24-1, and the first upper electrode 26-1 on the first ferroelectric metal oxide film 25-1. The first lower electrode 24-1 is electrically connected to the N.sup.+ high concentration impurity diffusion region 13-3 through the sixth conductive contact plug 22. The first lower electrode 24-1 serves as the accumulation electrode. The first ferroelectric metal oxide film 25-1 serves as the capacitor insulating film. The first upper electrode 26-1 serves as the counter electrode.

The second capacitor 140 is composed of the first lower electrode 24-2, the second ferroelectric metal oxide film 25-2 on this first lower electrode 24-2, and the second upper electrode 26-2 on the second ferroelectric metal oxide film 25-2. The second lower electrode 24-2 is electrically connected to the N.sup.+ high concentration impurity diffusion region 13-5 through the seventh conductive contact plug 23. The second lower electrode 24-2 serves as the accumulation electrode. The second ferroelectric metal oxide film 25-2 serves as the capacitor insulating film. The second upper electrode 26-2 serves as the counter electrode. After that, the spent hard mask is removed by a known method.

Figure 28:
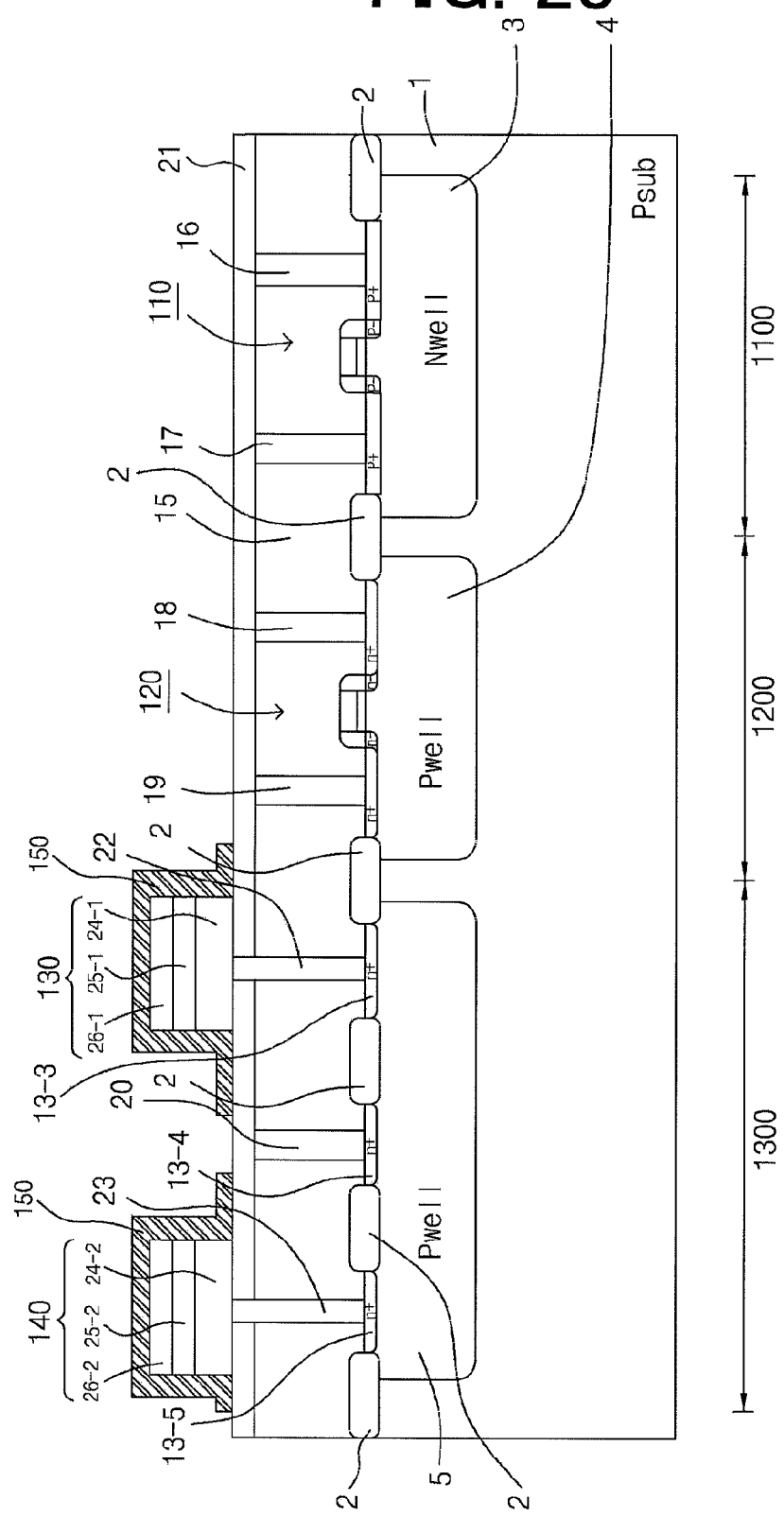
FIG. 28 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.
Figure 29:
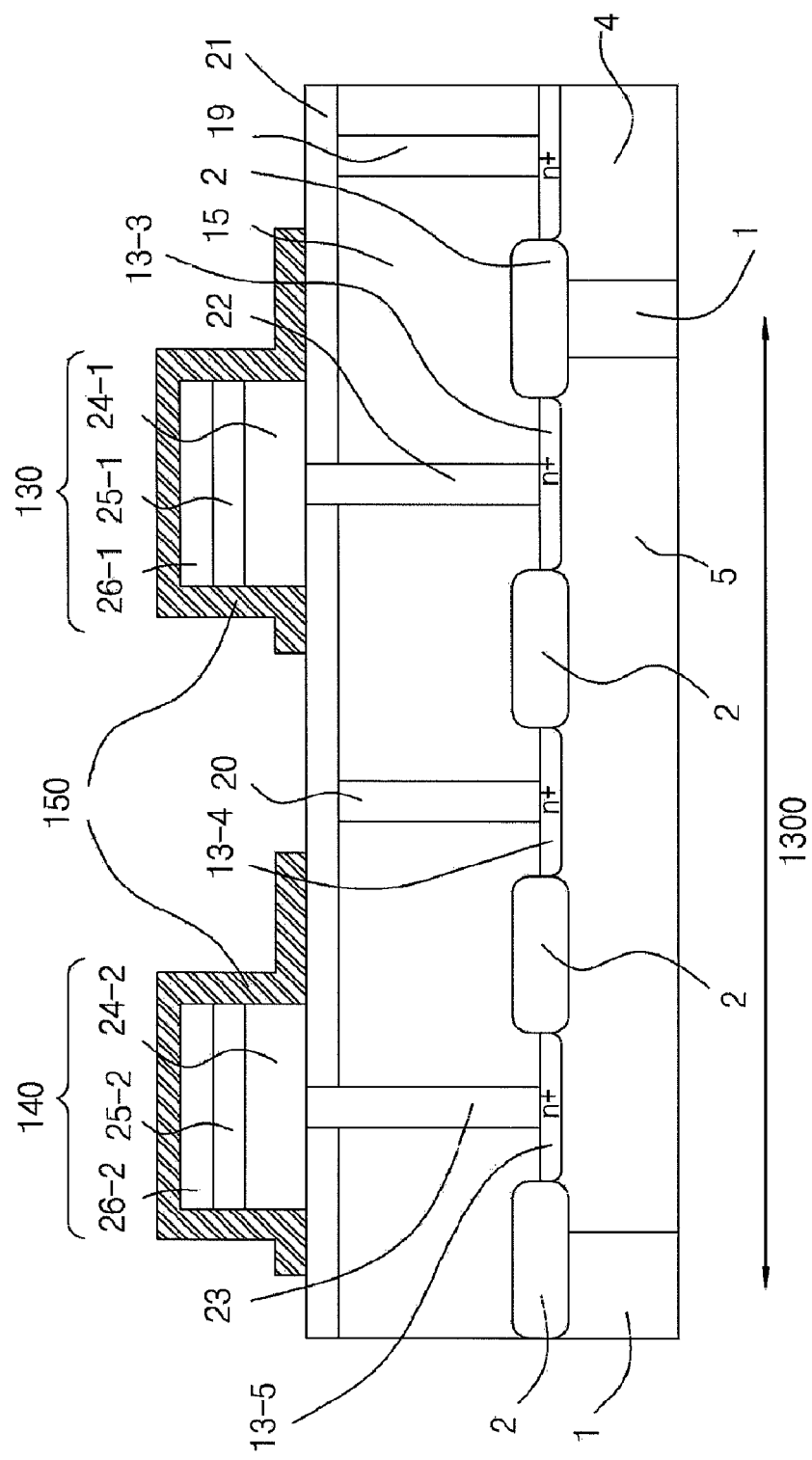
FIG. 29 is a partially enlarged vertical cross-sectional view of the pair of FeRAM cells shown in FIG. 28.

As shown in FIGS. 28 and 29, the insulating hydrogen barrier film that has electrical insulation and non-permeability to hydrogen is formed on the second interlayer insulating film 21, and the respective surfaces of the first and second capacitors 130 and 140 by CVD. This insulating hydrogen barrier film is preferably composed of an alumina (Al.sub.2O.sub.3) or STO (SrTiO.sub.3) film. For example, this insulating hydrogen barrier film can be formed of alumina (Al.sub.2O.3) with thickness of 500 .ANG. In addition, a TEOS film with thickness of 500 .ANG. is formed on this insulating hydrogen barrier film by Plasma CVD. Additionally, a resist pattern is formed on the TEOS film by known lithography technique. This resist pattern is used as a mask, and this TEOS film is etched, thus, a hard mask is formed. Subsequently, the resist pattern is removed by a known method. After that, the formed hard mask is used, and the alumina film is selectively etched. Thus, the first insulating hydrogen barrier layer 150 is formed. This first insulating hydrogen barrier layer 150 covers each surface of the first and second capacitors 130 and 140, and covers a portion of the second interlayer insulating film 21 in the proximity of each outer periphery of the first and second capacitors 130 and 140. After that, the spent hard mask is removed by a known method.

Figure 30:
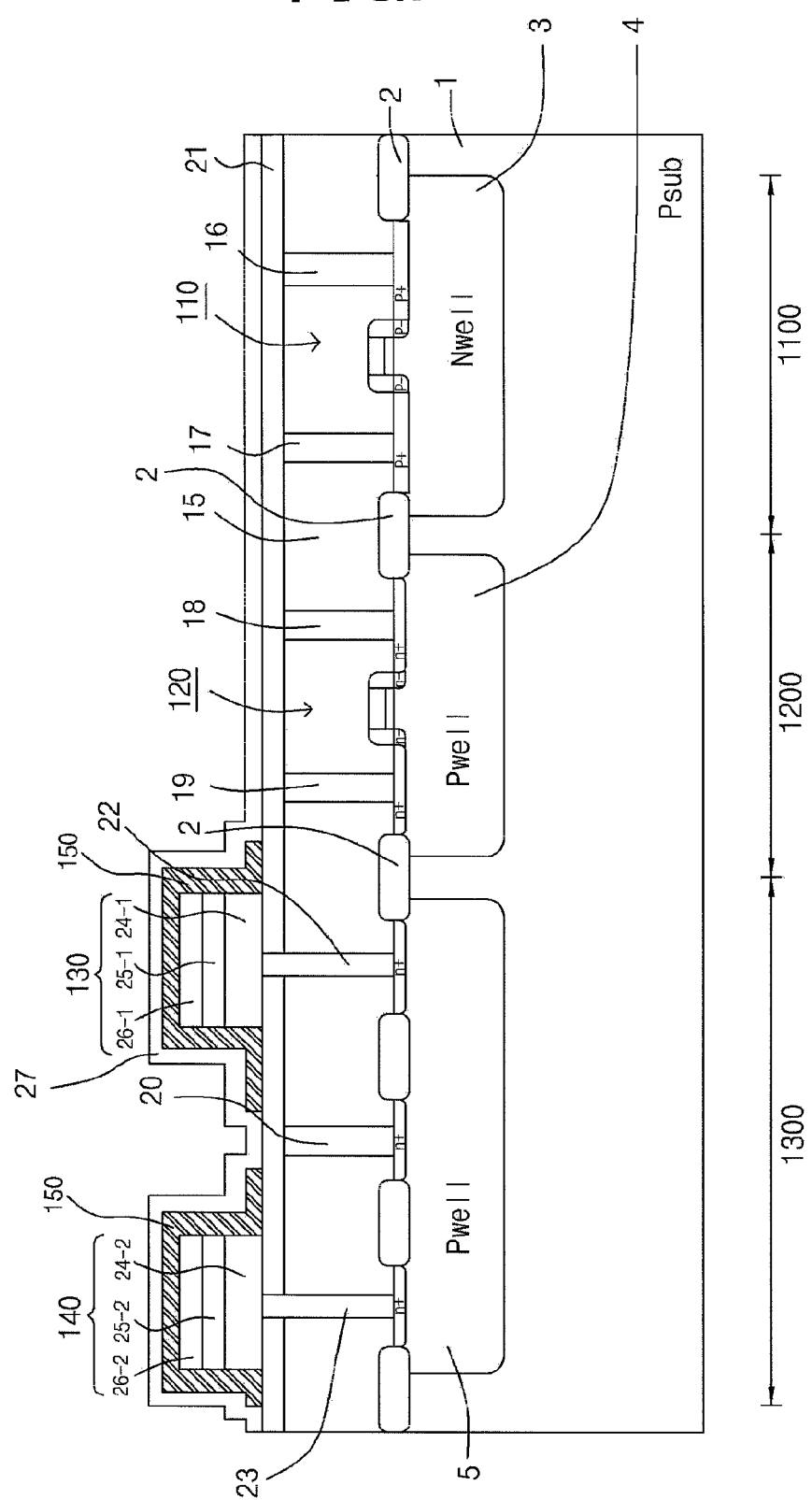
FIG. 30 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 30, the third interlayer insulating film 27 is formed on the first insulating hydrogen barrier layer 150 and the second interlayer insulating film 21. This third interlayer insulating film 27 can be formed of a TEOS film that has a thickness 2500 .ANG. and is formed by plasma CVD.

Figure 31:
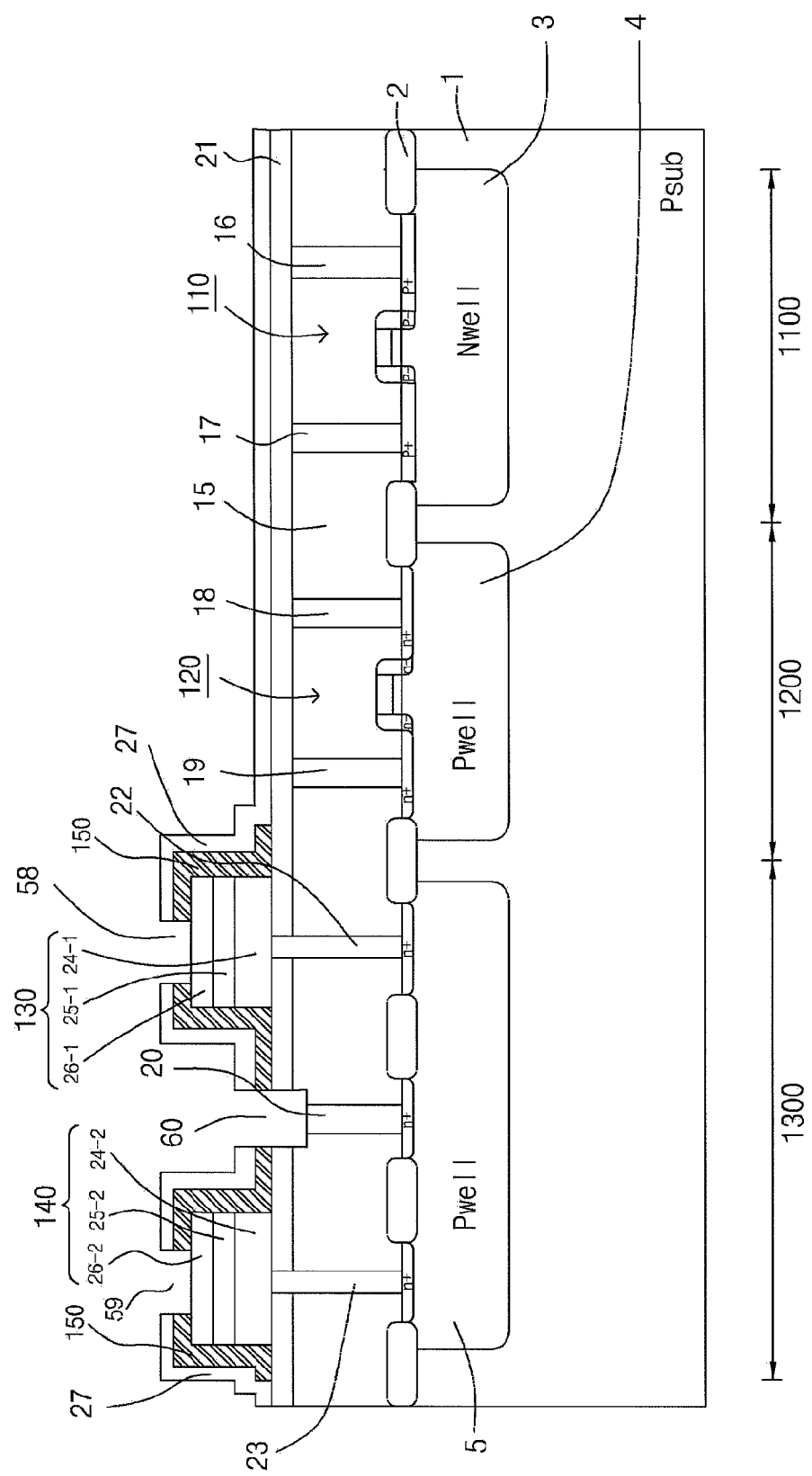
FIG. 31 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.
Figure 32:
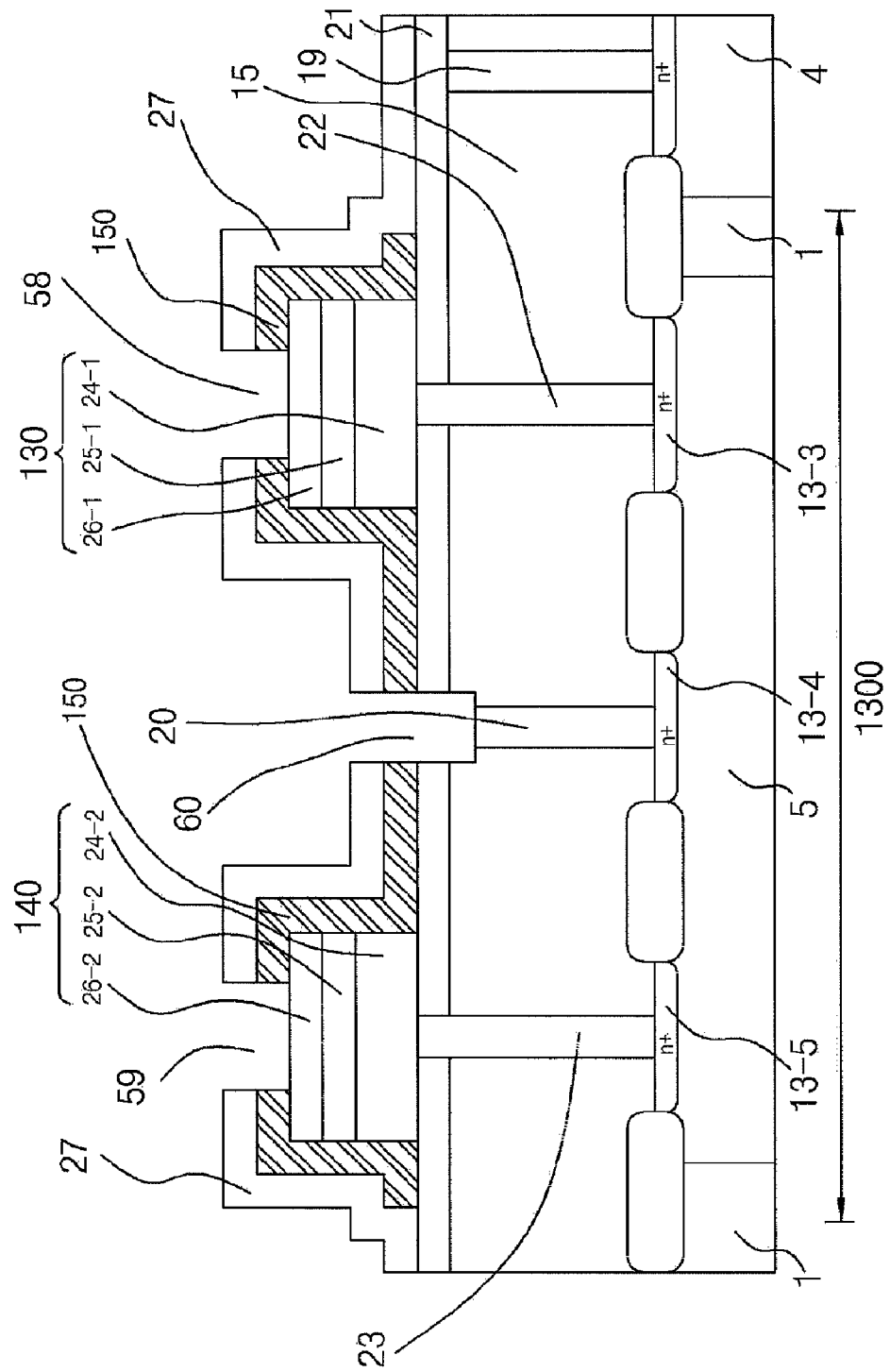
FIG. 32 is a partially enlarged vertical cross-sectional view of the pair of FeRAM cells shown in FIG. 31.

As shown in FIGS. 31 and 32, a resist pattern is formed on the third interlayer film 27 by known lithography technique. This resist pattern has openings above the first and second upper electrode 26-1 and 26-2, and above the fifth conductive contact plug 20. This resist pattern is used as a mask, and the third interlayer insulating film 27 and the upper first insulating hydrogen barrier layer 150 above the first and second upper electrodes 26-1 and 26-2 are selectively etched. In addition, the third interlayer insulating film 27, the upper first insulating hydrogen barrier layer 150 and upper second interlayer insulating film 21 above the fifth conductive contact plug 20 and the periphery thereof are selectively etched. Additionally, an upper portion of the first insulating hydrogen barrier layer 150 above the fifth conductive contact plug 20 and the periphery thereof is selectively etched. Thus, the eighth contact hole 58 that penetrates the third interlayer insulating film 27 and is formed above the first upper electrode 26-1. In addition, the ninth contact hole 59 that penetrates the third interlayer insulating film 27 and the first insulating hydrogen barrier layer 150 is formed above the second upper electrode 26-2. Additionally, the tenth contact hole 60 that penetrates the third interlayer insulating film 27, the first insulating hydrogen barrier layer 150 and the second interlayer insulating film 21, and reaches the top of the fifth conductive contact plug 20 and the periphery of the first interlayer insulating film 15 is formed above fifth conductive contact plug 20. As a result, the upper surface of the first upper electrode 26-1 is partially exposed through the eighth contact hole 58. The upper surface of the second upper electrode 26-2 is partially exposed through the ninth contact hole 59. Moreover, the upper portion of the fifth contact plug 20 is exposed through the tenth contact hole 60. After that, the resist pattern is removed by a known method.

Figure 33:
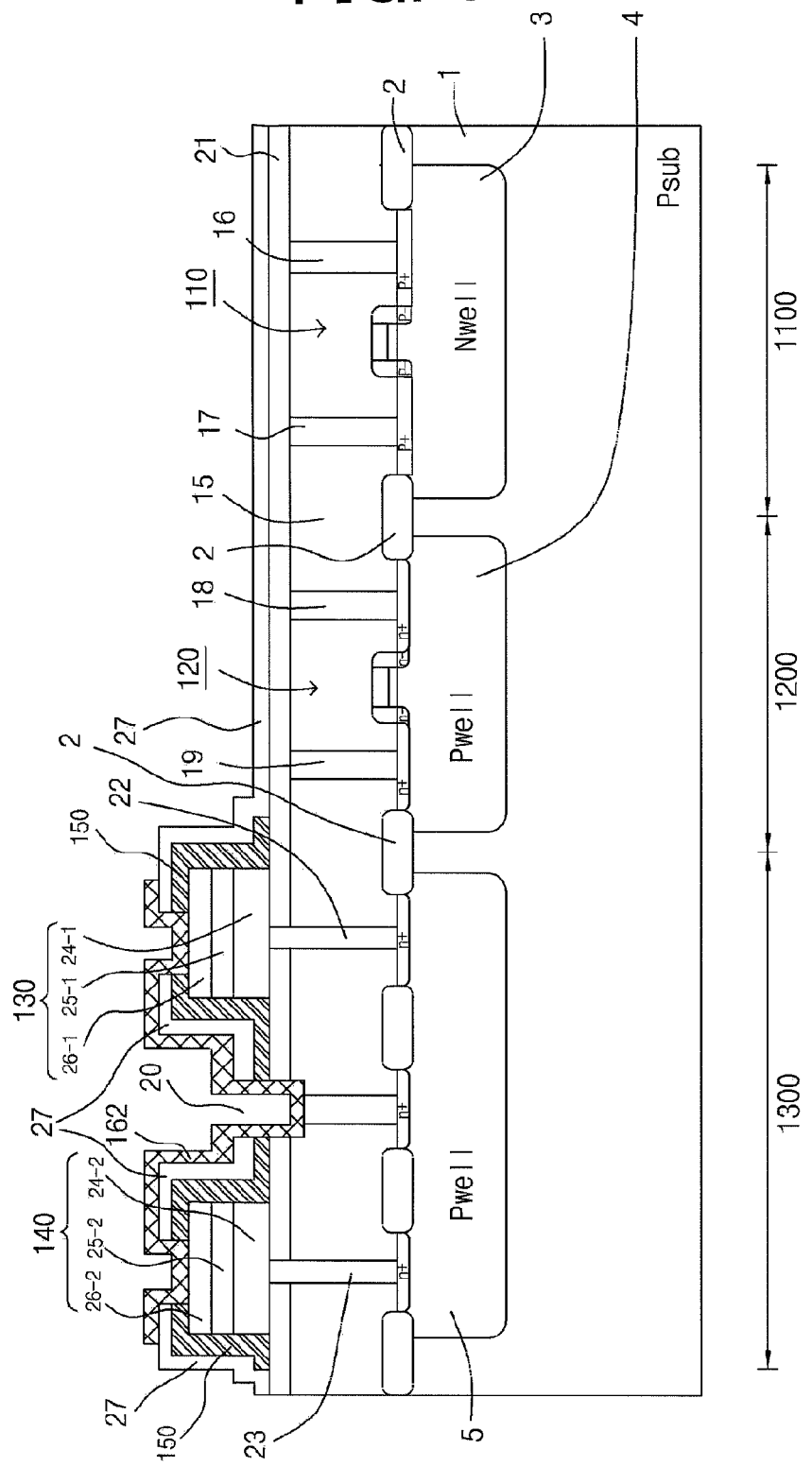
FIG. 33 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.
Figure 34:
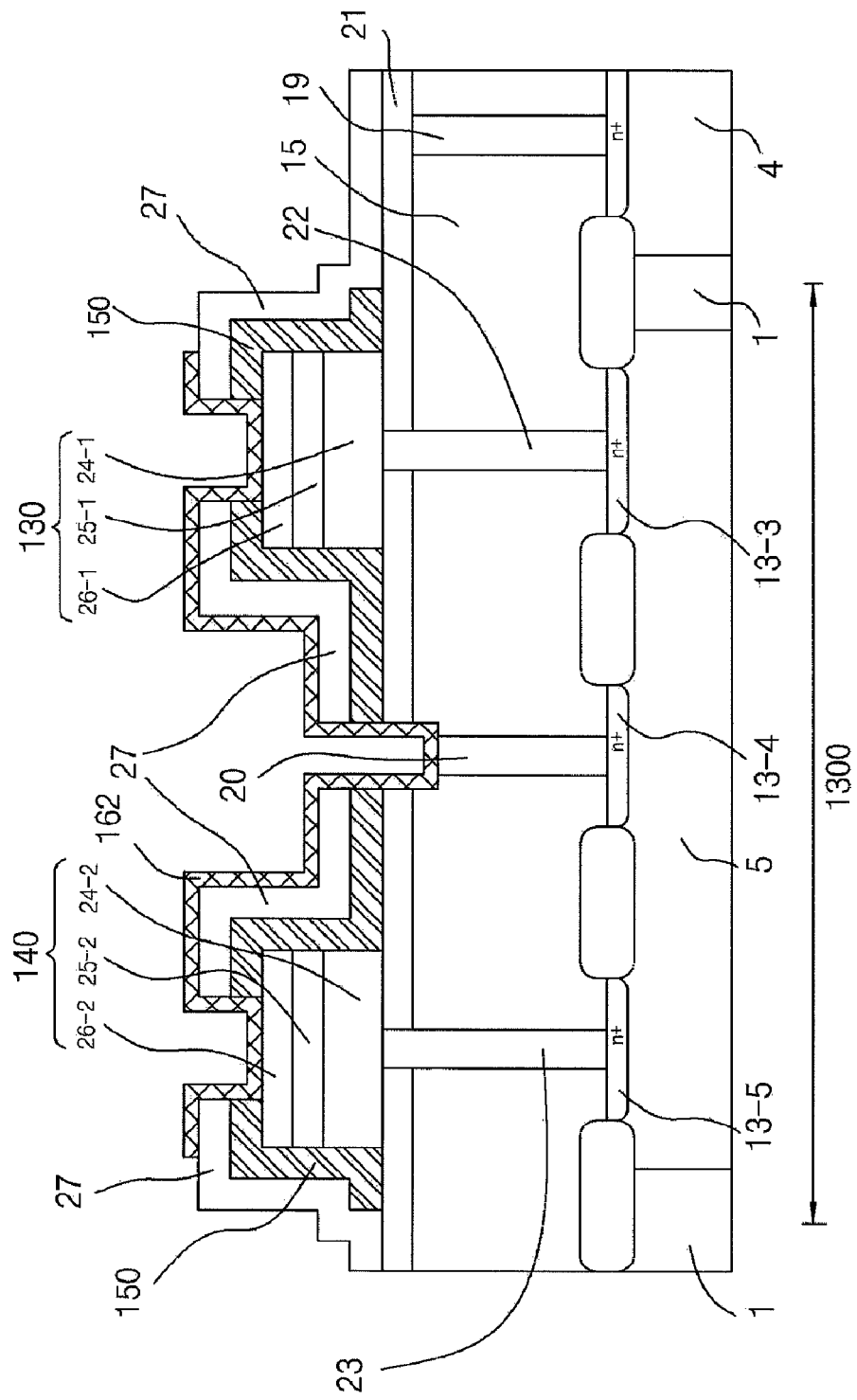
FIG. 34 is a partially enlarged vertical cross-sectional view of the pair of FeRAM cells shown in FIG. 33.

As shown in FIGS. 33 and 34, a layer that has non-permeability to hydrogen and conductivity is formed over the third interlayer insulating film 27, and the inside of the eighth, ninth and tenth contact holes 58, 59 and 60. Since this layer is a layer for local interconnection, this layer often has electrical conductivity lower than a layer for global interconnection. In other words, it may be formed of a substance with high electrical resistivity. This layer can be composed of a TiAlN layer with thickness of 2000 .ANG., for example. In the case where this layer is formed in a reducing atmosphere, hydrogen that is supplied from this reducing atmosphere is diffused into the upper parts of the first and second upper electrodes 26-1 and 26-2 through the aforementioned eighth and ninth contact holes 58 and 59. A CVD method is performed in a reducing atmosphere. Accordingly, if this layer is formed by a CVD method, hydrogen that is supplied from a reducing atmosphere is diffused into the upper parts of the first and second upper electrodes 26-1 and 26-2 through the aforementioned eighth and ninth contact holes 58 and 59. For this reason, this layer is formed by a method that does not use a reducing atmosphere, for example, by a sputtering method.

A resist pattern is formed on the TiAlN layer for local interconnection by a known lithography technique. This resist pattern has an opening over the first and second upper electrode 26-1 and 26-2, and a region the first and second upper electrode 26-1 and 26-2. This resist pattern is used as a mask, and the TiAlN layer for local interconnection is selectively etched. Thus, the first hydrogen non-permeable local interconnection layer 162 is formed. the first hydrogen non-permeable local interconnection layer 162 extends over the first and second upper electrode 26-1 and 26-2, and the region the first and second upper electrode 26-1 and 26-2, and extends inside the eighth, ninth and tenth contact holes 58, 59 and 60. This first hydrogen non-permeable local interconnection layer 162 is in contact with the first upper electrode 26-1 of the first capacitor 130 in the eighth contact hole 58. This first hydrogen non-permeable local interconnection layer 162 is in contact with the second upper electrode 26-2 of the second capacitor 140 in the ninth contact hole 59. This first hydrogen non-permeable local interconnection layer 162 is in contact with the fifth conductive contact plug 20 in the tenth contact hole 60. In addition, the first hydrogen non-permeable local interconnection layer 162 is electrically connected to the N.sup.+ high concentration impurity diffusion region 13-4 through the fifth conductive contact plug 20.

As discussed above, this N.sup.+ high concentration impurity diffusion region 13-4 comprises one of the source/drain regions of the switching transistor that is provided between the plate line as the global interconnection, and the local interconnection. Thus, the first hydrogen non-permeable local interconnection layer 162 is electrically connected to this switching transistor through this fifth conductive contact plug 20. That is, the first hydrogen non-permeable local interconnection layer 162 provides electrical connection between the counter electrode that is composed of the first upper electrode 26-1 of the first capacitor 130, and the counter electrode that is composed of the second upper electrode 26-2 of the second capacitor 140, and provides electrical connection among both counter electrodes and this switching transistor. Accordingly, the respective counter electrodes of the first and second capacitors 130 and 140 are electrically connected to this switching transistor through the first hydrogen non-permeable local interconnection layer 162.

Figure 35:
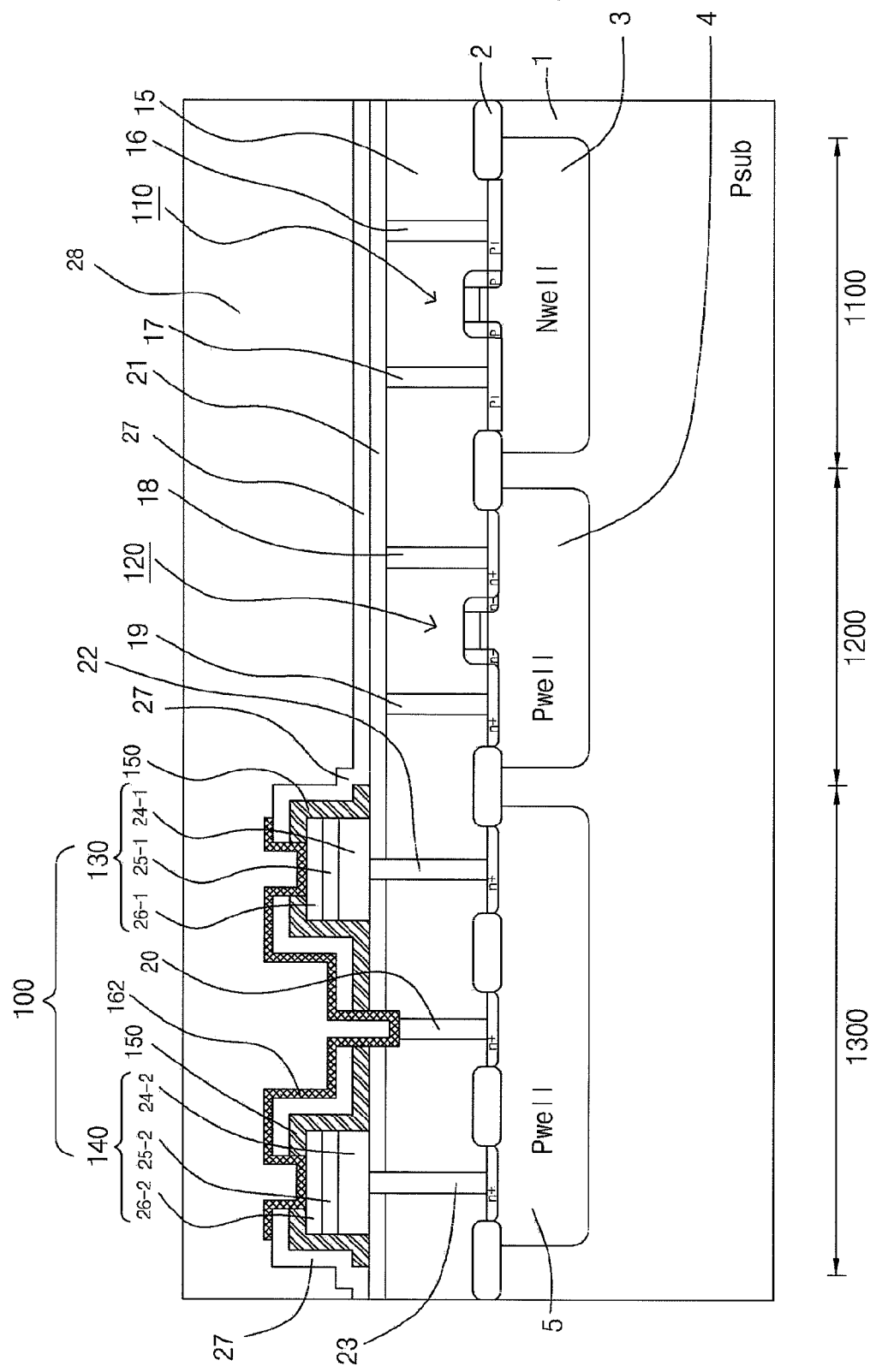
FIG. 35 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 35, the fourth interlayer insulating film 28 is formed on the first hydrogen non-permeable local interconnection layer 162 and the third interlayer insulating film 27. The fourth interlayer insulating film 28 can be formed of a known interlayer insulating film. For example, this fourth interlayer insulating film 28 can be composed of a TEOS film that is formed by plasma CVD and CMP after that.

Figure 36:
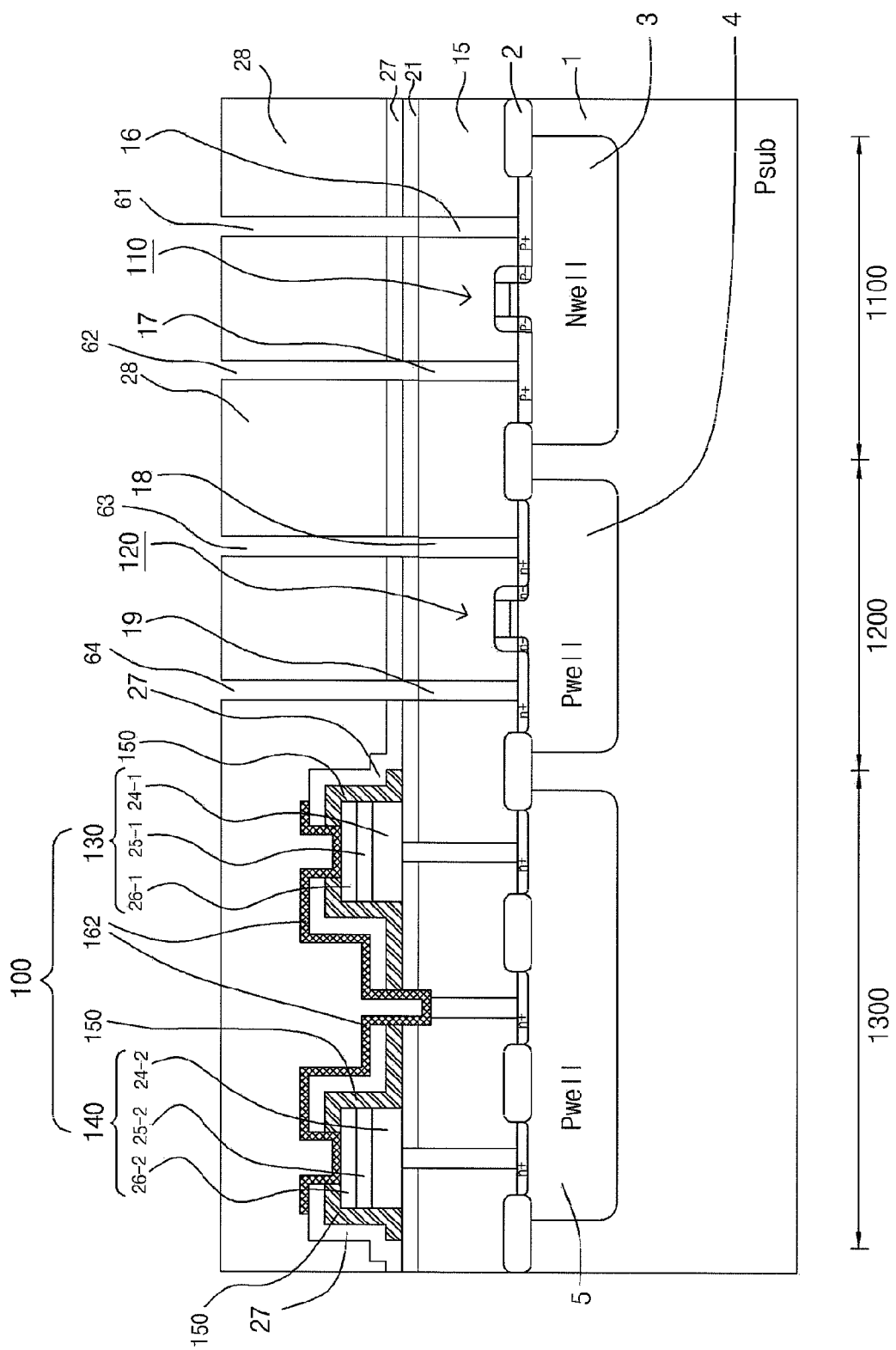
FIG. 36 is a partially enlarged vertical cross-sectional view of the pair of FeRAM cells shown in FIG. 35.

As shown in FIG. 36, a resist pattern is formed on the fourth interlayer film 28 by known lithography technique. This resist pattern has openings at positions above the first second, third and fourth conductive contact plugs 16, 17, 18 and 19. This resist pattern is used as a mask, and the fourth interlayer insulating film 28, the third interlayer insulating film 27, and the second interlayer insulating film 21 are selectively etched to remove the fourth interlayer insulating film 28, the third interlayer insulating film 27, and the second interlayer insulating film 21. Thus, the eleventh, twelfth, thirteenth and fourteenth contact holes 61, 62, 63 and 64 are formed in the fourth interlayer insulating film 28, the third interlayer insulating film 27, and the second interlayer insulating film 21. The eleventh contact hole 61 reaches the top of the first conductive contact plug 16. The twelfth contact hole 62 reaches the top of the second conductive contact plug 17. The thirteenth contact hole 63 reaches the top of the third conductive contact plug 18. The fourteenth contact hole 64 reaches the top of the fourth conductive contact plug 19.

Figure 37:
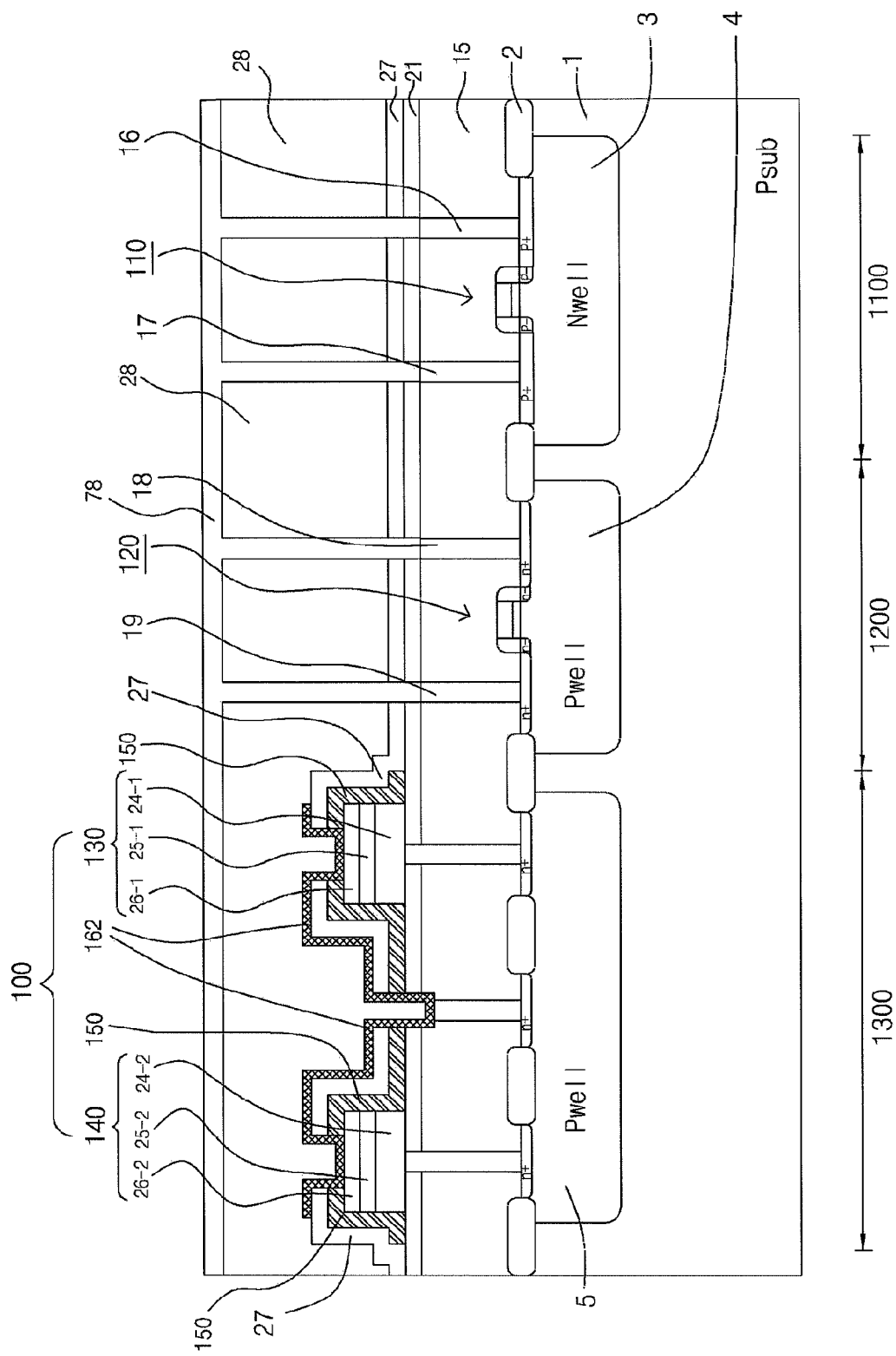
FIG. 37 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 37, a fifth conductive film 78 is formed inside the eleventh through fourteenth contact holes 61, 62, 63 and 64, and on the fourth interlayer insulating film 28. The fifth conductive film 78 is completely embedded inside the eleventh through fourteenth contact holes 61, 62, 63 and 64. The fifth conductive film 78 can be formed of known layer structure and a known material. For example, the fifth conductive film 78 may be composed of a tungsten layer that is formed by a CVD method.

Figure 38:
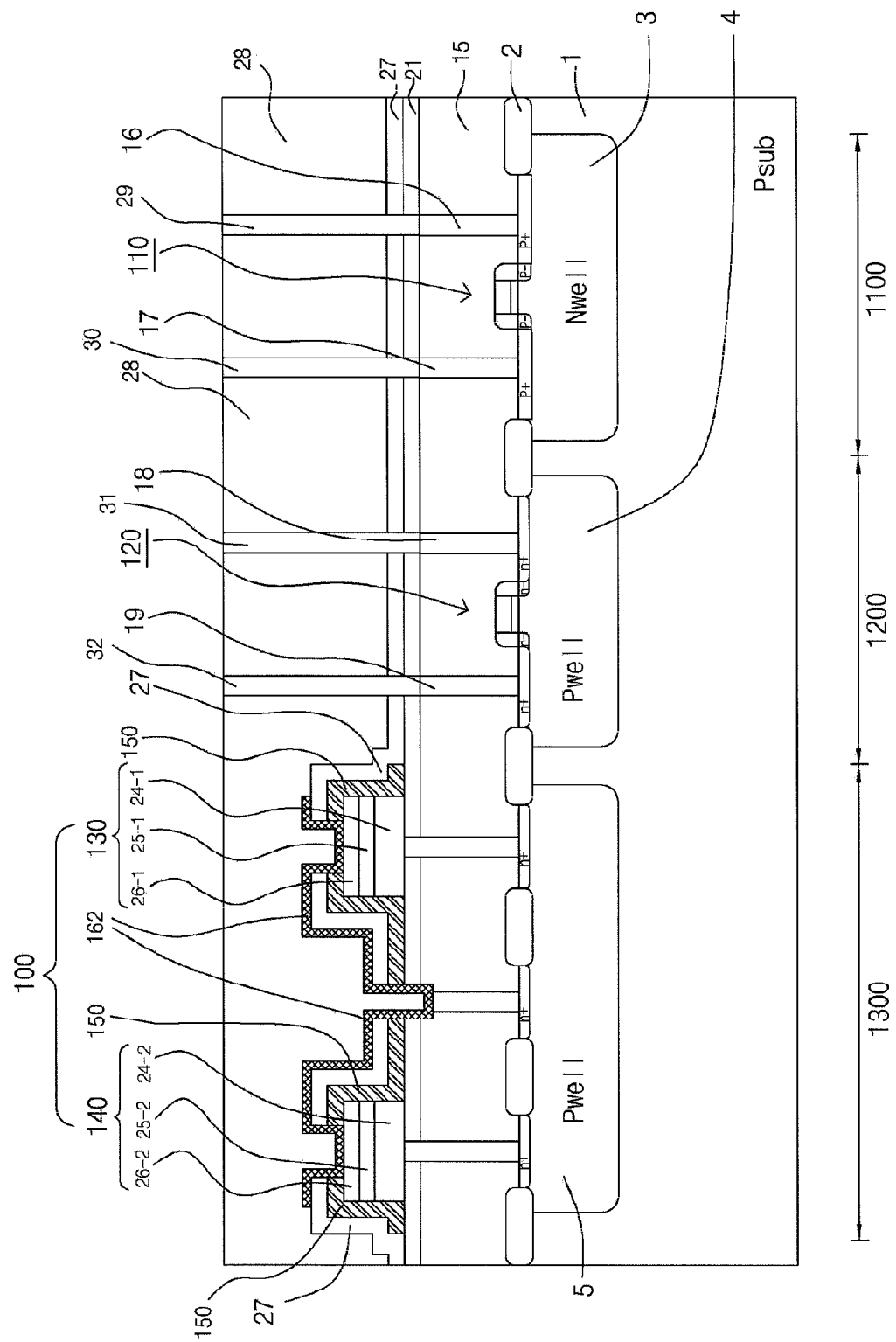
FIG. 38 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 38, the fifth conductive film 78 is etched back by CMP, thus, a portion of the fifth conductive film 78 that extends on the surface of the fourth interlayer insulating film 28 is removed. On the other hand, portions of the fifth conductive film 78 inside the eleventh through fourteenth contact holes 61, 62, 63 and 64 remain, thus, the eighth through eleventh conductive contact plugs 29, 30, 31 and 32 are formed inside the eleventh through fourteenth contact holes 61, 62, 63 and 64, respectively. The eighth conductive contact plug 29 is electrically connected to the P.sup.+ high concentration impurity diffusion region 14-1 through the first conductive contact plug 16. The ninth conductive contact plug 30 is electrically connected to the P.sup.+ high concentration impurity diffusion region 14-2 through the second conductive contact plug 17. The tenth conductive contact plug 31 is electrically connected to the N.sup.+ high concentration impurity diffusion region 13-1 through the third conductive contact plug 18. The eleventh conductive contact plug 32 is electrically connected to the N.sup.+ high concentration impurity diffusion region 13-2 through the fourth conductive contact plug 19. The top surfaces of the eighth through eleventh conductive contact plugs 29, 30, 31 and 32, and the top surface of the fourth interlayer insulating film 28 define one flat surface.

Figure 39:
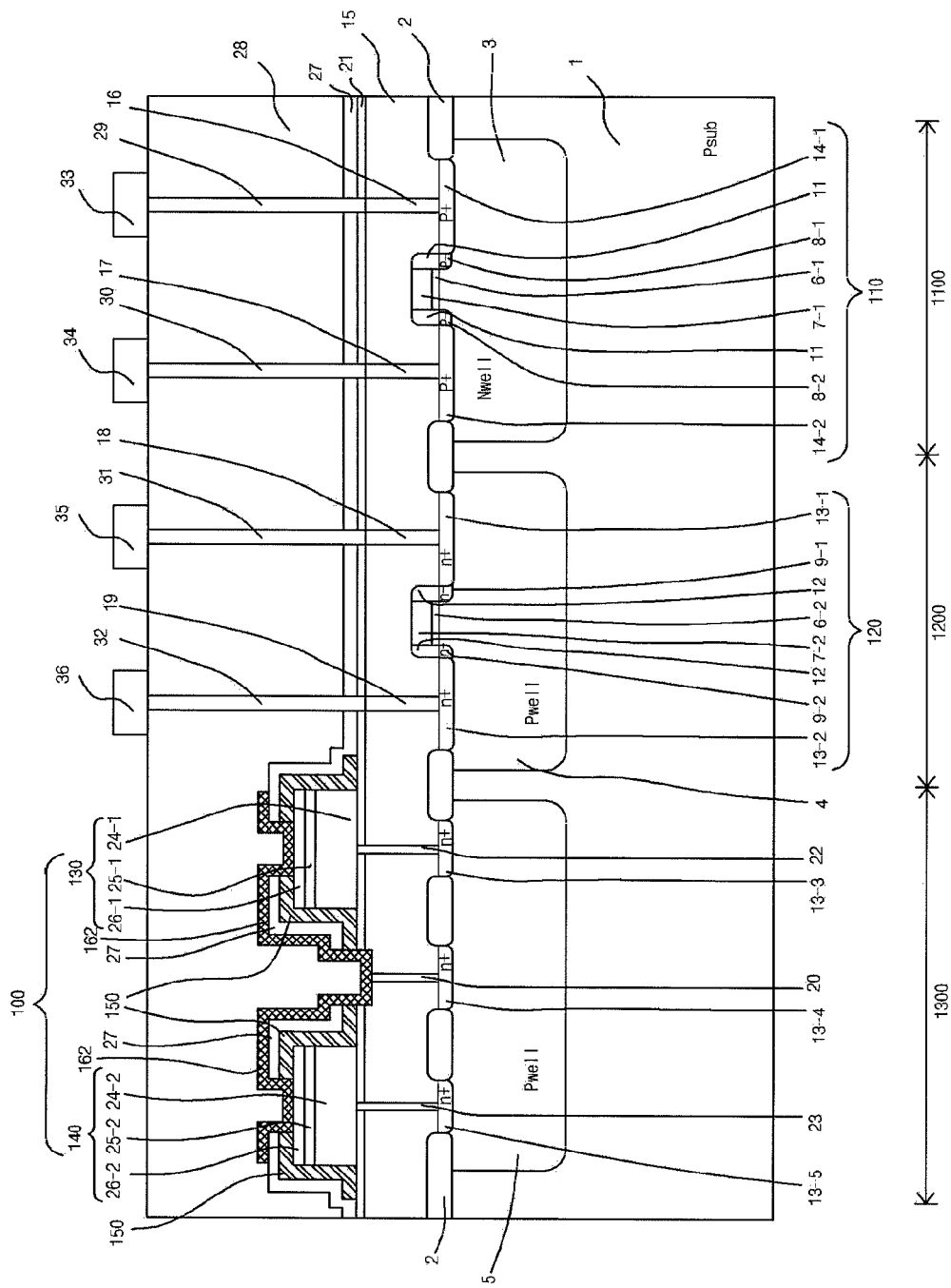
FIG. 39 is a partial vertical cross-sectional view showing one of a series of processes for producing the semiconductor memory device, according to the first embodiment of the present invention, including the pair of FeRAM cells that have the ferroelectric capacitors, and the P-channel and N-channel MOS transistors in the logic circuit.

As shown in FIG. 39, the first, second, third and fourth metal wiring layers 33, 34, 35 and 36 as the first level wiring layer are formed on the fourth interlayer insulating film 28 by a known method. The first metal wiring layer 33 extends on the fourth interlayer insulating film 28 and is in contact with the eighth conductive contact plug 29. The second metal wiring layer 34 extends on the fourth interlayer insulating film 28 and is in contact with the ninth conductive contact plug 30. The third metal wiring layer 35 extends on the fourth interlayer insulating film 28 and is in contact with the tenth conductive contact plug 31. The fourth metal wiring layer 36 extends on the fourth interlayer insulating film 28 and is in contact with the eleventh conductive contact plug 32. The first metal wiring layer 33 is electrically connected to the P.sup.+ high concentration impurity diffusion region 14-1 through the eighth conductive contact plug 29 and the first conductive contact plug 16. The second metal wiring layer 34 is electrically connected to the P.sup.+ high concentration impurity diffusion region 14-2 through the ninth conductive contact plug 30 and the second conductive contact plug 17. The third metal wiring layer 35 is electrically connected to the N.sup.+ high concentration impurity diffusion region 13-1 through the tenth conductive contact plug 31 and the third conductive contact plug 18. The fourth metal wiring layer 36 is electrically connected to the N.sup.+ high concentration impurity diffusion region 13-2 through the eleventh conductive contact plug 32 and the fourth conductive contact plug 19. After that, multilayer wiring structure is formed by a known method. Finally, a passivation film is formed, thus, the semiconductor memory device is produced.

Figure 40:
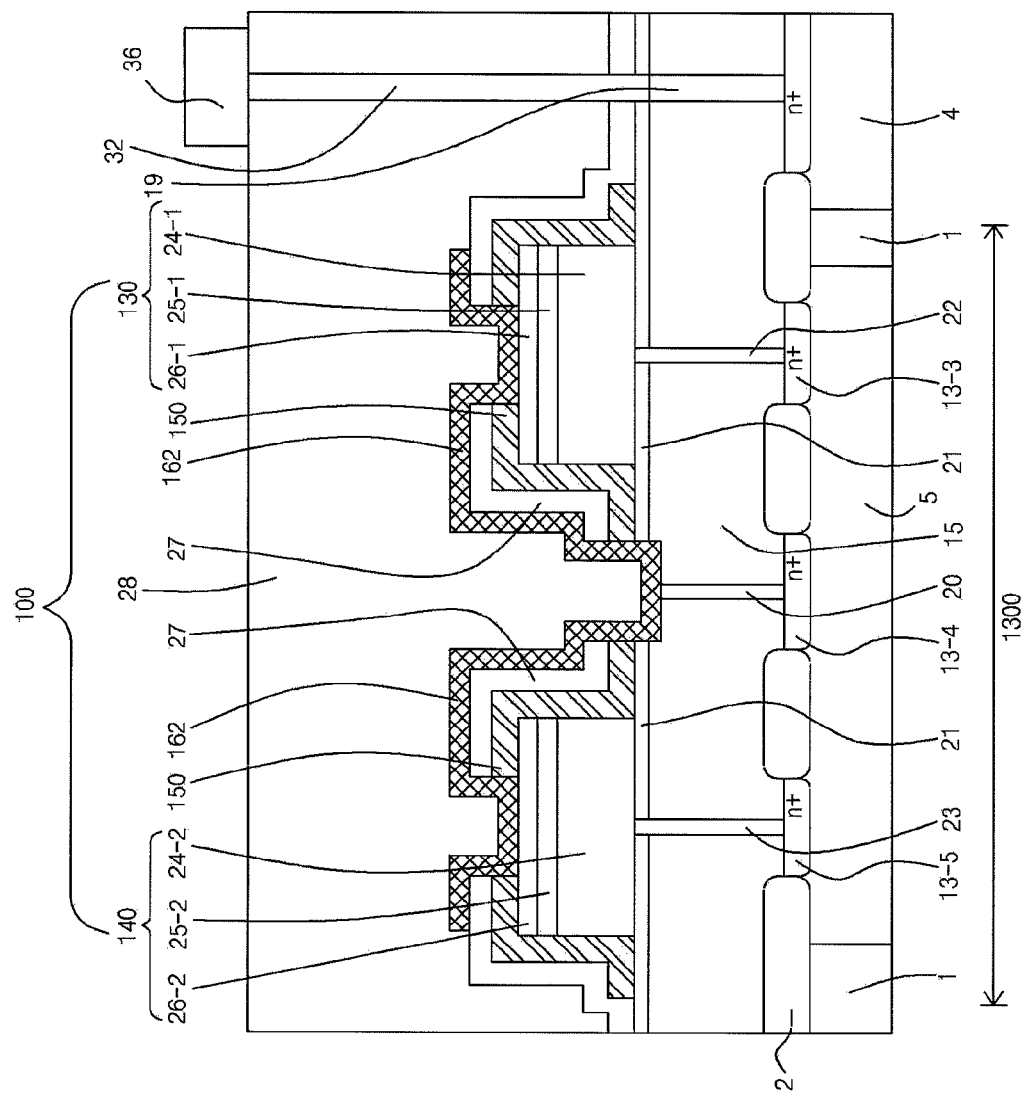
FIG. 40 is a partially enlarged vertical cross-sectional view of the pair of FeRAM cells shown in FIG. 39.

As shown in FIGS. 1 and 40, a pair of FeRAM cells 100 that is included in the semiconductor memory device according to this embodiment discussed above has a hydrogen barrier structure that prevents or suppresses exposure of the first and second ferroelectric metal oxide films 25-1 and 25-2 that are included in the first and the second capacitors 130 and 140, respectively, to hydrogen that is supplied from a reducing atmosphere and is diffused.

As discussed above, in this embodiment, the third and fourth interlayer insulating films 27 and 28 and eighth through eleventh conductive plugs 29, 30, 31, and 32 are formed by a CVD method after the first and second capacitors 130 and 140 are formed. In addition, the fourth interlayer insulating film 28 and eighth through eleventh conductive plugs 29, 30, 31, and 32 are formed by a CVD method after the first hydrogen non-permeable local interconnection layer 162 is formed. The CVD process is performed in a reducing atmosphere. Accordingly, it is necessary to prevent the first and second ferroelectric metal oxide films 25-1 and 25-2 that are included in the first and second capacitors 130 and 140, respectively, from being reduced by the diffusion of hydrogen that serves as a reducing agent supplied in this CVD process. Since the first and second upper electrodes 26-1 and 26-2 are formed of a substance that have electrical conductivity and hydrogen permeability, e.g., Pt, once hydrogen is diffused into the first and second upper electrodes 26-1 and 26-2, it may be also diffused into the first and second ferroelectric metal oxide films 25-1 and 25-2. Accordingly, it is necessary to prevent the hydrogen from being diffused into the first and second upper electrodes 26-1 and 26-2. In addition, it is necessary to prevent hydrogen from directly entering the first and second ferroelectric metal oxide films 25-1 and 25-2 through respective side surfaces of the first and second ferroelectric metal oxide films 25-1 and 25-2. Additionally, it is preferable that the first and second lower electrodes 24-1 and 24-2 have multilayer structure that includes the lowest layer with electrical conductivity and non-permeability to hydrogen. However, it is necessary to prevent hydrogen from directly entering the first and second ferroelectric metal oxide films 25-1 and 25-2 from the side surfaces of layers of the multilayer structure other than the lowest layer. The aforementioned first insulating hydrogen barrier layer 150 cuts off a plurality of hydrogen diffusion paths.

However, the third interlayer insulating film 27 that has electrical insulation and hydrogen permeability provides a hydrogen diffusion path.

Accordingly, in this embodiment, not only the first insulating hydrogen barrier layer 150 that covers the first and second capacitors 130 and 140 but also the first hydrogen non-permeable local interconnection layer 162 is provided, the hydrogen diffusion path into the first and second ferroelectric metal oxide films 25-1 and 25-2 will be disconnected. Combination of the aforementioned first insulating hydrogen barrier layer 150 and the first hydrogen non-permeable local interconnection layer 162 reliably prevents that hydrogen that serves as a reducing agent is diffused into the first and second ferroelectric metal oxide films 25-1 and 25-2.

Combination of the first insulating hydrogen barrier layer 150 and the first hydrogen non-permeable local interconnection layer 162 completely cuts off the hydrogen diffusion path into the first and second ferroelectric metal oxide films 25-1 and 25-2, and prevents that hydrogen is diffused into the first and second ferroelectric metal oxide films 25-1 and 25-2. Therefore, this combination can reliably prevent ferroelectric characteristic deterioration of the first and second ferroelectric metal oxide films 25-1 and 25-2 due to reduction reaction by hydrogen.

Modified Embodiment

As discussed above, the first hydrogen non-permeable local interconnection layer 162 is provided to prevent diffusion of hydrogen through each contact portion between this first hydrogen non-permeable local interconnection layer 162 and each of the first and second upper electrodes 26-1 and 26-2. Accordingly, it is not necessary for this first hydrogen non-permeable local interconnection layer 162 to entirely have non-permeability to hydrogen. However, the contact portions in contact with the first and second upper electrodes 26-1 and 26-2 of the first hydrogen non-permeable local interconnection layer 162 necessarily have non-permeability to hydrogen. That is, as discussed above, the whole first hydrogen non-permeable local interconnection layer 162 can be formed of a substance that has electrical conductivity and non-permeability to hydrogen. In addition, while the contact portions in contact with the first and second upper electrodes 26-1 and 26-2 of the first hydrogen non-permeable local interconnection layer 162 can be formed of a substance that has electrical conductivity and non-permeability to hydrogen, the rest of the first hydrogen non-permeable local interconnection layer 162 other than the contact portions can be formed of electrical conductivity and hydrogen permeability. That is, if it is possible to prevent diffusion of hydrogen through each contact portion between the first hydrogen non-permeable local interconnection layer 162 and each of the first and second upper electrodes 26-1 and 26-2, it is not necessary for non-contact portions of the first hydrogen non-permeable local interconnection layer 162 to have non-permeability to hydrogen.

The present invention provides hydrogen barrier structure that prevents or suppresses characteristic deterioration of a dielectric that forms capacitor insulating films of the first and second capacitors 130 and 140 due to reduction by hydrogen. Accordingly, the capacitor insulating films of the first and second capacitors 130 and 140 are not limited to ferroelectric metal oxide. They can be any of ferroelectric oxide and high-dielectric oxide. That is, as long as the capacitor insulating films of the first and second capacitors 130 and 140 are dielectric oxide, there is significance that the hydrogen barrier structure according to the present invention is applied.

Figure 41:
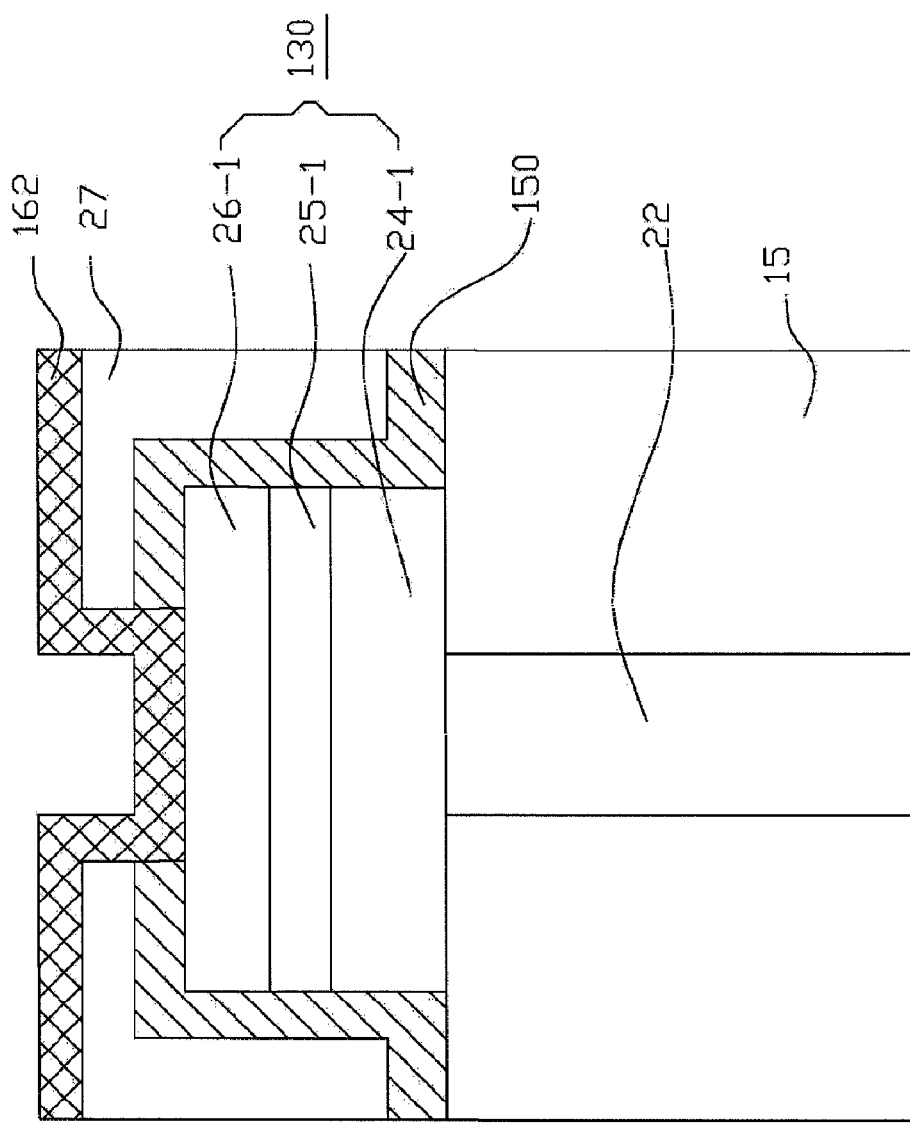
FIG. 41 is a partial vertical cross-sectional view showing a ferroelectric capacitor, and a contact portion of a first hydrogen non-permeable local interconnection layer according to the first embodiment of the present invention.
Figure 42:
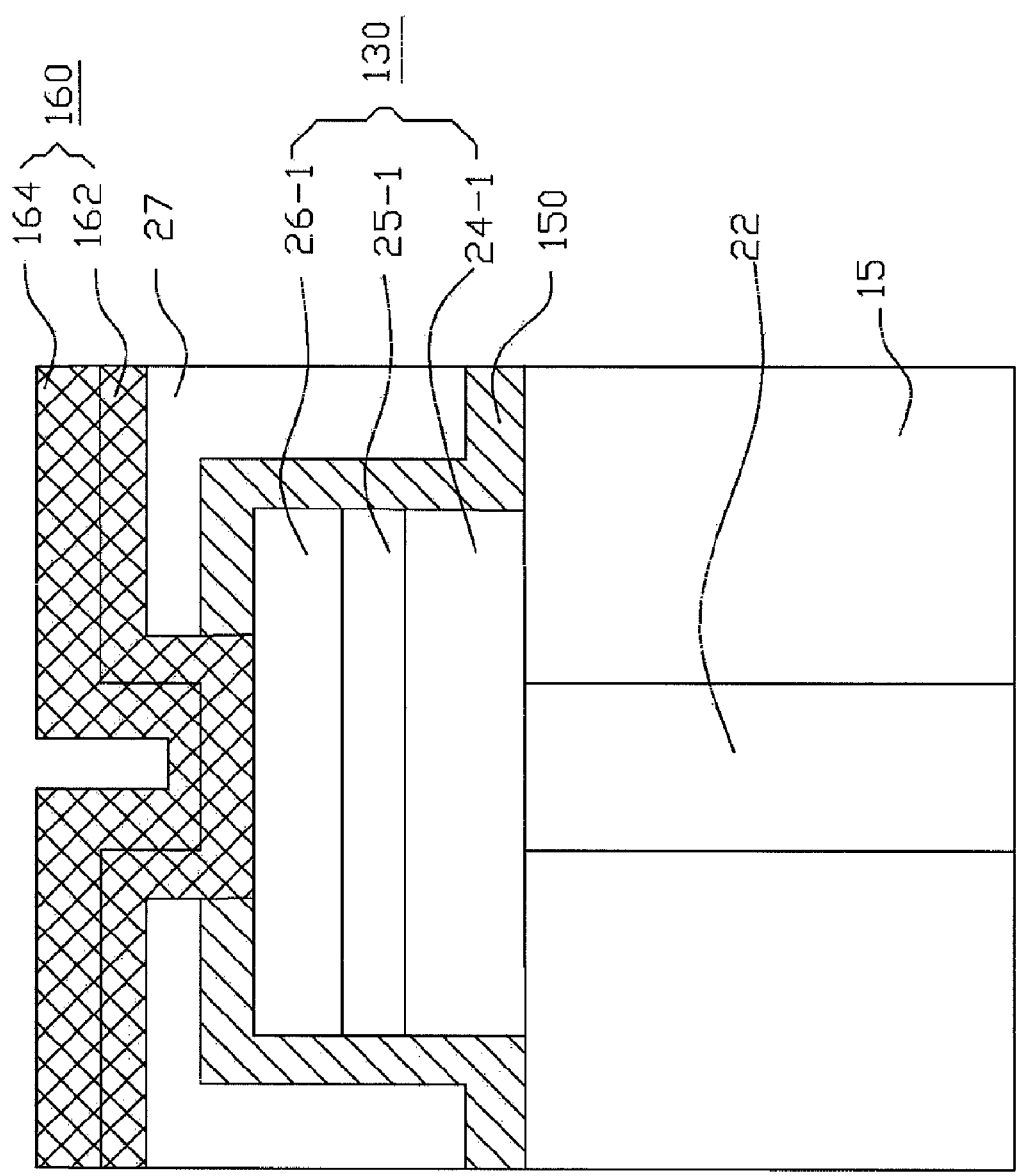
FIG. 42 is a partial vertical cross-sectional view showing a ferroelectric capacitor, and a contact portion of a first local interconnection multilayer structure portion that is composed of a first hydrogen non-permeable local interconnection layer and a first hydrogen permeable local interconnection layer according to a modified example of the first embodiment of the present invention.
Figure 43:
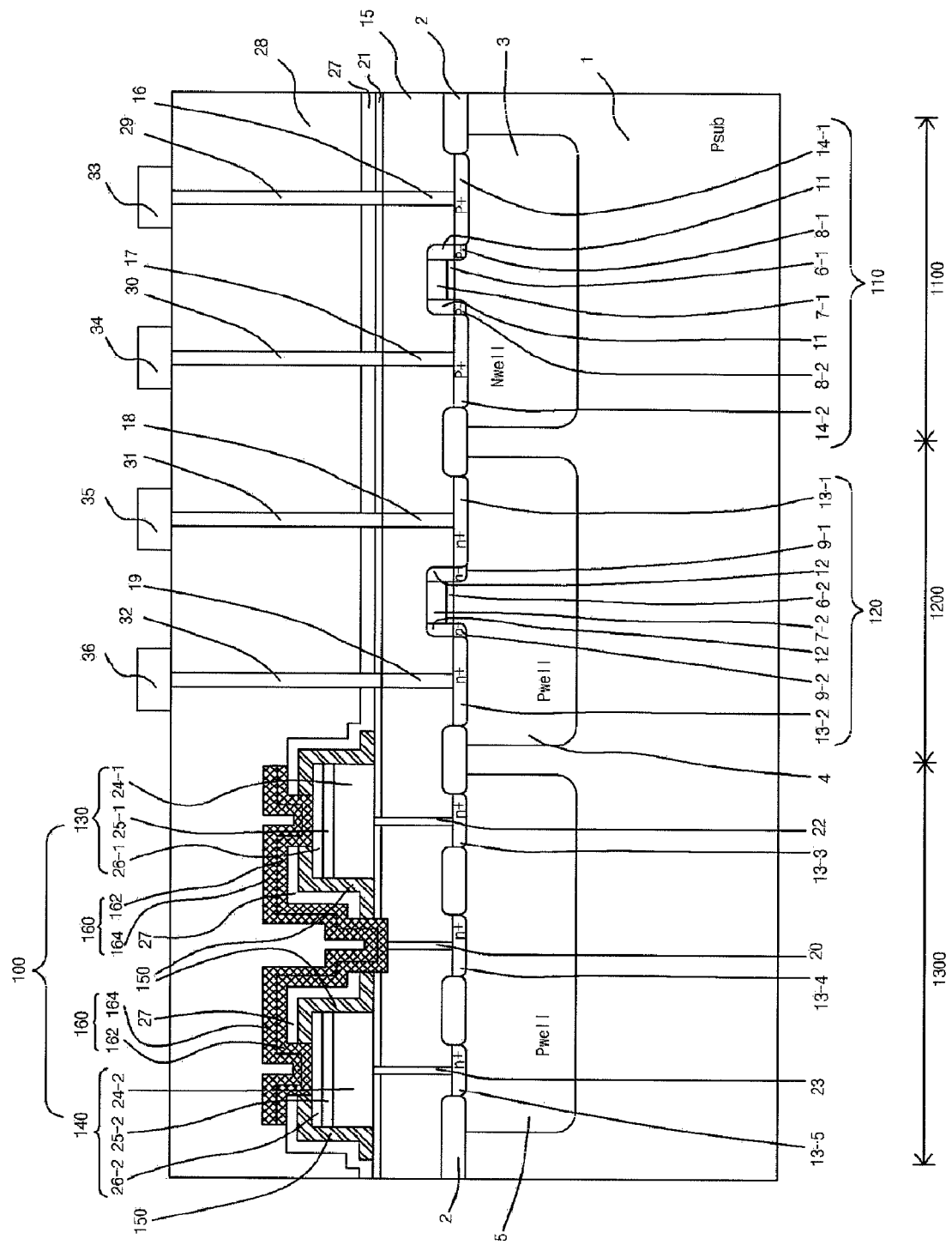
FIG. 43 is a partial vertical cross-sectional view showing a pair of FeRAM cells that have ferroelectric capacitors in FeRAM included in the semiconductor device according to the modified example of the first embodiment of the present invention, and P-channel and N-channel MOS transistors in a logic circuit included in this semiconductor device.
Figure 44:
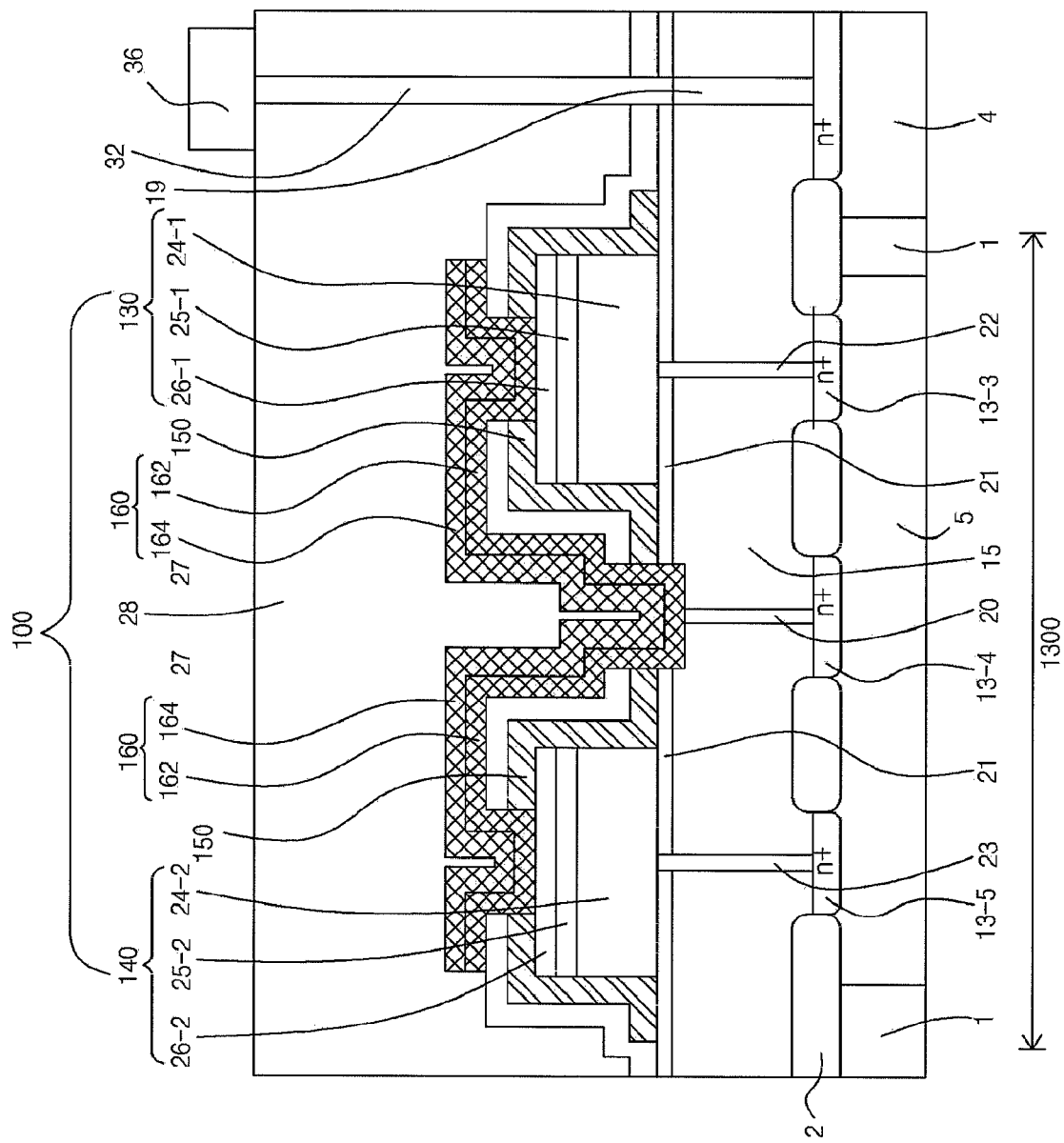
FIG. 44 is a partially enlarged vertical cross-sectional view of the pair of FeRAM cells shown in FIG. 43.

As shown in FIG. 41, typically, the aforementioned first hydrogen non-permeable local interconnection layer 162 has single layer structure that is formed of a substance with electrical conductivity and non-permeability to hydrogen. However, TiAlN that is a substance with electrical conductivity and permeability of hydrogen has conductivity lower than a conductive substance that is used for the wiring layer. That is, its electrical resistivity is high. Since the distance of local interconnection is short as compared with global interconnection, there is less possibility that high electrical resistivity of conductive substance of local interconnection as compared with global interconnection causes a remarkable wiring delay problem. However, in the case where resistance reduction of the local interconnection layer is required, as shown in FIGS. 42, 43, and 44, a first local interconnection layer structure 160 may be composed of the aforementioned first hydrogen non-permeable local interconnection layer 162 and a first hydrogen permeable local interconnection layer 164 that is laminated on this first hydrogen non-permeable local interconnection layer 162. When this first hydrogen permeable local interconnection layer 164 is formed of a substance with lower resistivity, i.e., higher conductivity, as compared with the first hydrogen non-permeable local interconnection layer 162, a current mainly flows through this first hydrogen permeable local interconnection layer 164 with lower electrical resistivity. Therefore, it is possible to reduce effective resistivity of the first local interconnection layer structure 160. On the other hand, the aforementioned first hydrogen non-permeable local interconnection layer 162 mainly serves as a hydrogen barrier film.

Second Embodiment

Referring now to the drawings, a second embodiment of the present invention will be described in detail. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

Figure 45:
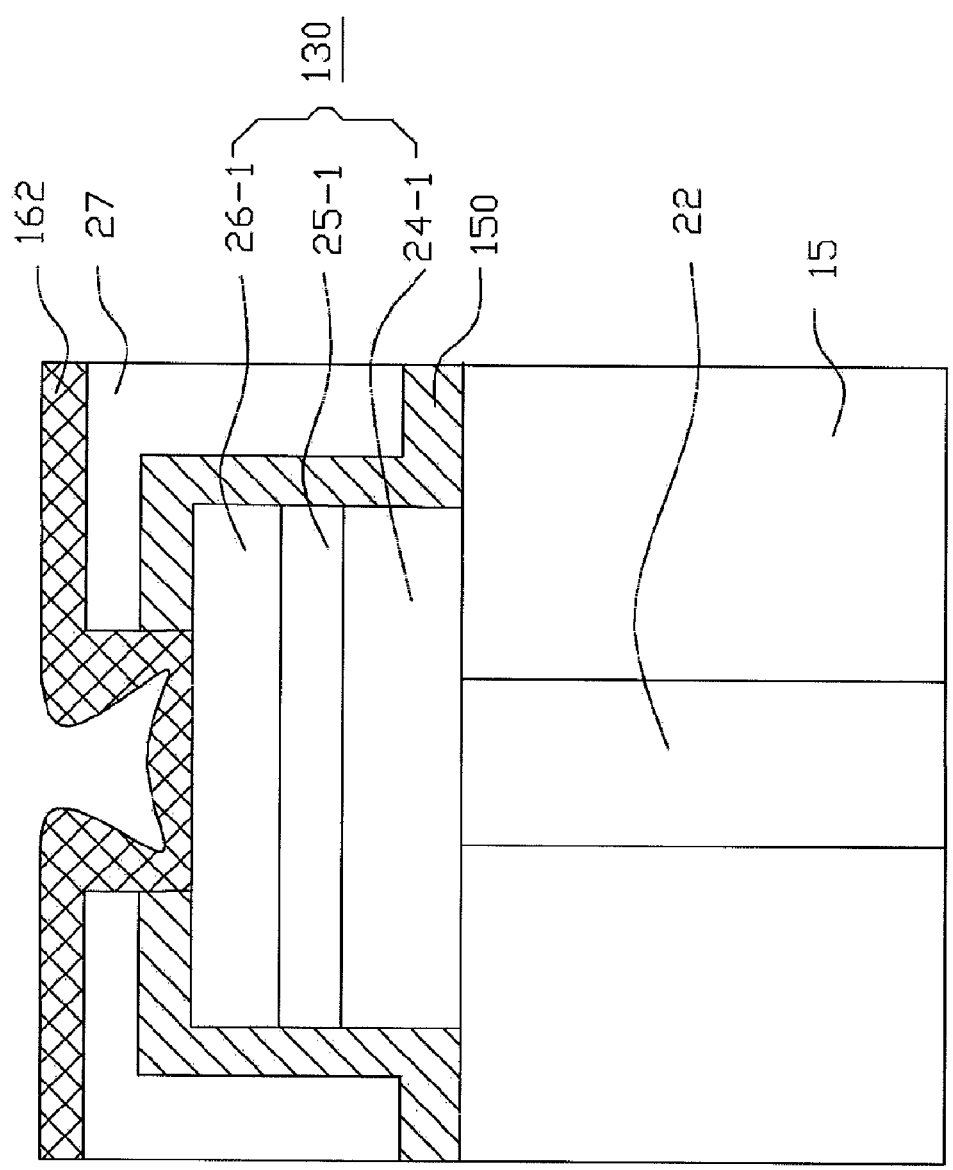
FIG. 45 is a partial vertical cross-sectional view showing a ferroelectric capacitor, and an overhang-shaped contact portion of a first hydrogen non-permeable local interconnection layer inside a contact hole with a large aspect ratio according to the first embodiment of the present invention.
Figure 46:
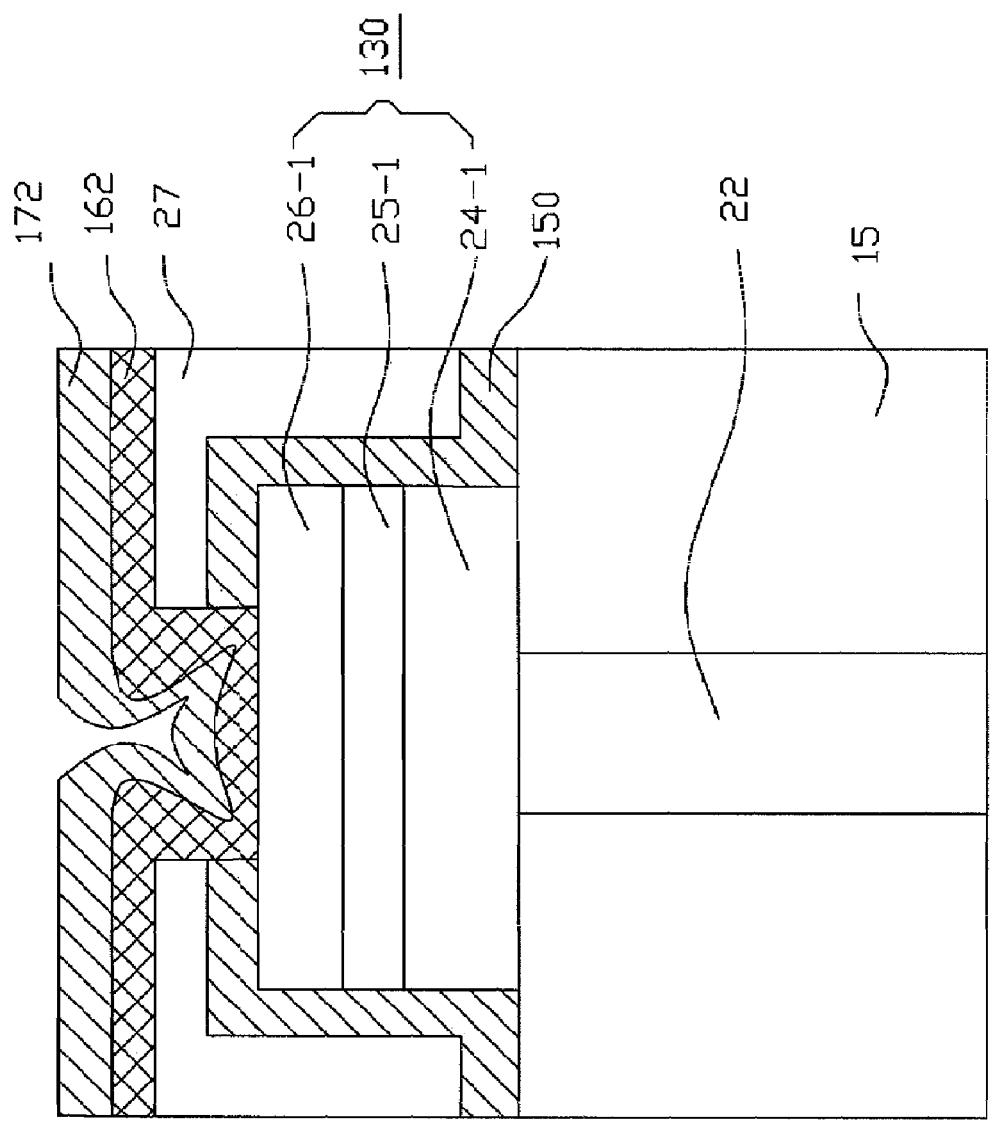
FIG. 46 is a partial vertical cross-sectional view showing a ferroelectric capacitor, and a contact portion of a lamination of a first hydrogen non-permeable local interconnection layer and a second insulating hydrogen barrier layer according to a second embodiment of the present invention.

As discussed above, the first hydrogen non-permeable local interconnection layer 162 is formed by a formation method that employs a non-reducing atmosphere. Specifically, a sputtering method is used. Accordingly, in the case where the aspect ratio of contact hole is large, as shown in FIG. 45, the aforementioned first hydrogen non-permeable local interconnection layer 162 in this contact hole will have an overhang shape. For this reason, the aforementioned contact portion of this first hydrogen non-permeable local interconnection layer 162 that extends at the bottom of this contact hole will have an uneven thickness. Specifically, the thickness of this contact portion increases as closer to a central region in the bottom of this contact hole, and the thickness decreases as closer to the peripheral region in the bottom of this contact hole. For this reason, in peripheral region in the bottom of this contact hole, the thickness of this contact portion may not be sufficient to serve as a hydrogen diffusion barrier. In this case, as shown in FIG. 46, in order to ensure that this contact portion has a sufficient thickness even in the peripheral region in the bottom of this contact hole to serve as a hydrogen diffusion barrier, it is effective that the second insulating hydrogen barrier layer 172 is laminated on the first hydrogen non-permeable local interconnection layer 162.

This embodiment is substantially similar to the aforementioned first embodiment except that the second insulating hydrogen barrier layer 172 is laminated on the first hydrogen non-permeable local interconnection layer 162, in contrast to the aforementioned first embodiment. That is, this embodiment provides a semiconductor memory device including a two-dimensional matrix array of FeRAM cells having ferroelectric capacitors, and a logic circuit adjacent to this array.

Semiconductor Memory Device Construction

FIG. 1 is a partial equivalent circuit diagram showing a portion of the construction of a two-dimensional matrix array of FeRAM cells included in the semiconductor memory device according to the present invention. The two-dimensional matrix array of FeRAM cells included in the semiconductor memory device according to this embodiment includes a plurality of bit line pairs, a plurality of word lines, and the FeRAM cells provided at a plurality of intersections of the plurality of bit lines and the plurality of word lines. The FeRAM cell is composed of one switching transistor and one memory capacitor.

Each memory capacitor is composed of an accumulation electrode, a counter electrode, and a capacitor dielectric film that is interposed between the accumulation electrode and the counter electrode. The switching transistor can be composed of a field-effect transistor, typically, a MOS transistor. A control electrode, i.e., a gate electrode of the field-effect transistor is connected to the word line and receives a control signal transmitted through this word line. The aforementioned accumulation electrode of the memory capacitor is connected to the bit line through the switching transistor, and receives and stores data transmitted through this bit line.

One pair of the bit lines is composed of a bit line that transmits data, and an inverted bit line that transmits inverted data inverted from the data. A certain FeRAM cell is connected to a certain bit line, and stores data transmitted by this bit line. Another FeRAM cell is provided adjacent to this FeRAM cell and connected to the inverted bit line that is paired with this bit line, and stores Inverted data transmitted by this inverted bit line. That is, two FeRAM cells connected to two bit lines that are provided adjacent to and paired with each other are provided adjacent to and paired with each other. Respective gate electrodes of the switching transistors included in the FeRAM cells that are paired with each other are connected to a certain common word line, and receive a common control signal transmitted by this common word line.

In this embodiment, one local interconnection is connected to two bit lines that are provided adjacent to and paired with each other, and provides electrical interconnection between the counter electrodes of the memory capacitors included in a pair of FeRAM cells that are provided adjacent to and paired with each other, respectively. That is, the respective counter electrodes of the memory capacitors included in a pair of FeRAM cells are electrically connected to each other through one local interconnection. In addition, this local interconnection is connected to the global interconnection through another switching transistor other than the aforementioned respective switching transistors included in the pair of FeRAM cells. This global interconnection is composed of a plate line. This switching transistor between this plate line as the global interconnection and the aforementioned local interconnection has a gate electrode. This gate electrode is, connected to the aforementioned common word line that connects the aforementioned respective gate electrodes of the switching transistors included in the one pair of FeRAM cells, abd and receives the common control signal transmitted by this common word line. That is, one common word line connects the aforementioned respective gate electrodes of the switching transistors included in the pair of FeRAM cells, and the gate electrode of the switching transistor provided between the plate line as the global interconnection and the local interconnection to each other. Thus, these three switching transistors are controlled based on the common control signal.

Accordingly, the common control signal brings the respective switching transistors included in a pair of FeRAM cells, and the switching transistor provided between the local interconnection and the plate line to a conductive state. As a result, when non-inverted signal data and inverted signal data are written into the respective accumulation electrodes of the memory capacitors included in a pair of FeRAM cells, or when they are read from these accumulation electrodes, the counter electrodes of these memory capacitors are electrically connected to the plate line as the global interconnection, thus, this plate line has a capacitance that is provided by these memory capacitors. However, except when data is written into the memory capacitors, and except when data is read from the memory capacitors, the memory capacitors are not electrically connected to this plate line as the global interconnection. For this reason, the global interconnection that is composed of a plate line essentially does not have a significant wiring delay problem. On the other hand, two memory capacitors are constantly and electrically connected to each local interconnection. However, since the wiring distance of each local interconnection is very short as compared with the global interconnection, the local interconnection essentially does not have a significant wiring delay problem.

FIG. 1 shows the construction of eight FeRAM cells that are provided adjacent to each other, i.e., first through eighth FeRAM cells of CELL011, CELL012, CELL021, CELL022, CELL111, CELL112, CELL121, and CELL122.

The first FeRAM cell CELL011 and the second FeRAM cell CELL012 are connected to a pair of bit line BL.sub.0 and inverted bit line /BL.sub.0, respectively, and are commonly connected to a word line WL.sub.0. In addition, the first FeRAM cell CELL011 and the second FeRAM cell CELL012 are commonly connected to a first local interconnection LOCAL1. This first local interconnection LOCAL1 is connected to a first global interconnection GLOBAL1 of a plate line PL.sub.0 through a switching transistor Tr.sub.013. This switching transistor Tr.sub.013 has a gate electrode. This gate electrode is connected to the word line WL.sub.0.

The first FeRAM cell CELL011 is composed of a pair of a switching transistor Tr.sub.011 and a memory capacitor C.sub.011. This switching transistor Tr.sub.011 has a gate electrode. This gate electrode is connected to the word line WL.sub.0, and receives a control signal transmitted through this word line WL.sub.0. This memory capacitor C.sub.011 is composed of an accumulation electrode, a counter electrode, and a capacitor dielectric film that is interposed between the accumulation electrode and the counter electrode. This accumulation electrode of the memory capacitor is connected to the bit line BL.sub.0 through the switching transistor Tr.sub.011, and receives and stores data transmitted through this bit line BL.sub.0. The counter electrode of the memory capacitor C.sub.011 is connected to a counter electrode of a memory capacitor C.sub.012 through the first local interconnection LOCAL1, and is connected to the first global interconnection GLOBAL1 of the plate line PL.sub.0 through the first local interconnection LOCAL1 and the switching transistor Tr.sub.013.

The second FeRAM cell CELL012 is composed of a pair of a switching transistor Tr.sub.012 and a memory capacitor C.sub.012. This switching transistor Tr.sub.012 has a gate electrode. This gate electrode is connected to the word line WL.sub.0, and receives a control signal transmitted through this word line WL.sub.0. This memory capacitor C.sub.012 is composed of an accumulation electrode, a counter electrode, and a capacitor dielectric film that is interposed between the accumulation electrode and the counter electrode. This accumulation electrode of the memory capacitor is connected to the inverted bit line /BL.sub.0 through the switching transistor Tr.sub.012, and receives and stores data transmitted through this inverted bit line /BL.sub.0. The counter electrode of the memory capacitor C.sub.012 is connected to the counter electrode of the memory capacitor C.sub.011 through the first local interconnection LOCAL1, and is connected to the first global interconnection GLOBAL1 of the plate line PL.sub.0 through the first local interconnection LOCAL1 and the switching transistor Tr.sub.013.

When data of the bit line BL.sub.0 and inverted data of the inverted bit line /BL.sub.0 are written into the accumulation electrodes of the memory capacitors C.sub.011 and C.sub.012, or when they are read from these accumulation electrodes, the counter electrodes of these memory capacitors C.sub.011 and C.sub.012 are electrically connected to the plate line PL.sub.0 as the first global interconnection GLOBAL1, thus, this plate line PL.sub.0 has a capacitance that is provided by these memory capacitors C.sub.011 and C.sub.012. However, except when data is written into the memory capacitors C.sub.011 and C.sub.012, and except when data is read from the memory capacitors C.sub.011 and C.sub.012, the memory capacitors C.sub.011 and C.sub.012 are not electrically connected to this plate line PL.sub.0 as the first global interconnection GLOBAL1. For this reason, the first global interconnection GLOBAL1 that is composed of the plate line PL.sub.0 essentially does not have a significant wiring delay problem. On the other hand, two memory capacitors C.sub.011 and C.sub.012 are constantly and electrically connected to the first local interconnection LOCAL1. However, since the wiring distance of the first local interconnection LOCAL1 is very short as compared with the first global interconnection GLOBAL1, the first local interconnection LOCAL1 essentially does not have a significant wiring delay problem.

The third FeRAM cell CELL021 and the fourth FeRAM cell CELL022 are connected to the pair of bit line BL.sub.0 and inverted bit line /BL.sub.0, respectively, and are commonly connected to a word line WL.sub.1. In addition, the third FeRAM cell CELL021 and the fourth FeRAM cell CELL022 are commonly connected to a second local interconnection LOCAL2. This second local interconnection LOCAL2 is connected to the first global interconnection GLOBAL1 of the plate line PL.sub.0 through a switching transistor Tr.sub.023. This switching transistor Tr.sub.023 has a gate electrode. This gate electrode is connected to the word line WL.sub.1.

The third FeRAM cell CELL021 is composed of a pair of a switching transistor Tr.sub.021 and a memory capacitor C.sub.021. This switching transistor Tr.sub.021 has a gate electrode. This gate electrode is connected to the word line WL.sub.1, and receives a control signal transmitted through this word line WL.sub.1. This memory capacitor C.sub.021 is composed of an accumulation electrode, a counter electrode, and a capacitor dielectric film that is interposed between the accumulation electrode and the counter electrode. This accumulation electrode of the memory capacitor is connected to the bit line BL.sub.0 through the switching transistor Tr.sub.021, and receives and stores data transmitted through this bit line BL.sub.0. The counter electrode of the memory capacitor C.sub.021 is connected to the counter electrode of the memory capacitor C.sub.022 through the second local interconnection LOCAL2, and is connected to the first global interconnection GLOBAL1 of the plate line PL.sub.0 through the second local interconnection LOCAL2 and the switching transistor Tr.sub.023.

The fourth FeRAM cell CELL022 is composed of a pair of a switching transistor Tr.sub.022 and a memory capacitor C.sub.022. This switching transistor Tr.sub.022 has a gate electrode. This gate electrode is connected to the word line WL.sub.1, and receives a control signal transmitted through this word line WL.sub.1. This memory capacitor C.sub.022 is composed of an accumulation electrode, a counter electrode, and a capacitor dielectric film that is interposed between the accumulation electrode and the counter electrode. This accumulation electrode of the memory capacitor is connected to the inverted bit line /BL.sub.0 through the switching transistor Tr.sub.022, and receives and stores data transmitted through this inverted bit line /BL.sub.0. The counter electrode of the memory capacitor C.sub.022 is connected to the counter electrode of the memory capacitor C.sub.021 through the second local interconnection LOCAL2, and is connected to the first global interconnection GLOBAL1 of the plate line PL.sub.0 through the second local interconnection LOCAL2 and the switching transistor Tr.sub.023.

When data of the bit line BL.sub.0 and inverted data of the inverted bit line /BL.sub.0 are written into the accumulation electrodes of the memory capacitors C.sub.021 and C.sub.022, or when they are read from these accumulation electrodes, the counter electrodes of these memory capacitors $C_{021}$ and $C_{022}$ are electrically connected to the plate line $PL_0$ as the first global interconnection GLOBAL1, thus, this plate line $PL_0$ has a capacitance that is provided by these memory capacitors $C_{021}$ and $C_{022}$. However, except when data is written into the memory capacitors $C_{021}$ and $C_{022}$, and except when data is read from the memory capacitors $C_{021}$ and $C_{022}$, the memory capacitors $C_{021}$ and $C_{022}$ are not electrically connected to this the plate line $PL_0$ as the first global interconnection GLOBAL1. For this reason, the first global interconnection GLOBAL1 that is composed of the plate line $PL_0$ essentially does not have a significant wiring delay problem. On the other hand, two memory capacitors $C_{021}$ and $C_{022}$ are constantly and electrically connected to the second local interconnection LOCAL2. However, since the wiring distance of the second local interconnection LOCAL2 is very short as compared with the first global interconnection GLOBAL1, the second local interconnection LOCAL2 essentially does not have a significant wiring delay problem.

The fifth FeRAM cell CELL111 and the sixth FeRAM cell CELL112 are connected to a pair of bit line $BL_1$ and inverted bit line $/BL_1$, respectively, and are commonly connected to the word line $WL_0$. In addition, the fifth FeRAM cell CELL111 and the sixth FeRAM cell CELL112 are commonly connected to a third local interconnection LOCAL3. This third local interconnection LOCAL3 is connected to a second global interconnection GLOBAL2 of a plate line $PL_1$ through a switching transistor $Tr_{113}$. This switching transistor $Tr_{113}$ has a gate electrode. This gate electrode is connected to the word line $WL_0$.

The fifth FeRAM cell CELL111 is composed of a pair of a switching transistor $Tr_{111}$ and a memory capacitor $C_{111}$. This switching transistor $Tr_{111}$ has a gate electrode. This gate electrode is connected to the word line $WL_0$, and receives a control signal transmitted through this word line $WL_0$. This memory capacitor $C_{111}$ is composed of an accumulation electrode, a counter electrode, and a capacitor dielectric film that is interposed between the accumulation electrode and the counter electrode. This accumulation electrode of the memory capacitor is connected to the bit line $BL_1$ through the switching transistor $Tr_{111}$, and receives and stores data transmitted through this bit line $BL_1$. The counter electrode of the memory capacitor $C_{111}$ is connected to a counter electrode of a memory capacitor $C_{112}$ through the third local interconnection LOCAL3, and is connected to the second global interconnection GLOBAL2 of the plate line $PL_1$ through the third local interconnection LOCAL3 and the switching transistor $Tr_{113}$.

The sixth FeRAM cell CELL112 is composed of a pair of a switching transistor $Tr_{112}$ and a memory capacitor $C_{112}$. This switching transistor $Tr_{112}$ has a gate electrode. This gate electrode is connected to the word line $WL_0$, and receives a control signal transmitted through this word line $WL_0$. This memory capacitor $C_{112}$ is composed of an accumulation electrode, a counter electrode, and a capacitor dielectric film that is interposed between the accumulation electrode and the counter electrode. This accumulation electrode of the memory capacitor is connected to the inverted bit line $/BL_1$ through the switching transistor $Tr_{112}$, and receives and stores data transmitted through this inverted bit line $/BL_1$. The counter electrode of the memory capacitor $C_{112}$ is connected to a counter electrode of a memory capacitor $C_{111}$ through the third local interconnection LOCAL3, and is connected to the second global interconnection GLOBAL2 of the plate line $PL_1$ through the third local interconnection LOCAL3 and the switching transistor $Tr_{113}$.

When data of the bit line $BL_1$ and inverted data of the inverted bit line $/BL_1$ are written into the accumulation electrodes of the memory capacitors $C_{111}$ and $C_{112}$, or when they are read from these accumulation electrodes, the counter electrodes of these memory capacitors $C_{111}$ and $C_{112}$ are electrically connected to the plate line $PL_1$ as the second global interconnection GLOBAL2, thus, this plate line $PL_1$ has a capacitance that is provided by these memory capacitors $C_{111}$ and $C_{112}$. However, except when data is written into the memory capacitors $C_{111}$ and $C_{112}$, and except when data is read from the memory capacitors $C_{111}$ and $C_{112}$, the memory capacitors $C_{111}$ and $C_{112}$ are not electrically connected to this the plate line $PL_1$ as the second global interconnection GLOBAL2. For this reason, the second global interconnection GLOBAL2 that is composed of the plate line $PL_1$ essentially does not have a significant wiring delay problem. On the other hand, two memory capacitors $C_{111}$ and $C_{112}$ are constantly and electrically connected to the third local interconnection LOCAL3. However, since the wiring distance of the third local interconnection LOCAL3 is very short as compared with the second global interconnection GLOBAL2, the third local interconnection LOCAL3 essentially does not have a significant wiring delay problem.

The seventh FeRAM cell CELL121 and the eighth FeRAM cell CELL122 are connected to the pair of bit line $BL_1$ and inverted bit line $/BL_1$, respectively, and are commonly connected to the word line $WL_1$. In addition, the seventh FeRAM cell CELL121 and the eighth FeRAM cell CELL122 are commonly connected to a fourth local interconnection LOCAL4. This fourth local interconnection LOCAL4 is connected to the second global interconnection GLOBAL2 of the plate line $PL_1$ through a switching transistor $Tr_{123}$. This switching transistor $Tr_{123}$ has a gate electrode. This gate electrode is connected to the word line $WL_1$.

The seventh FeRAM cell CELL121 is composed of a pair of a switching transistor $Tr_{121}$ and a memory capacitor $C_{121}$. This switching transistor $Tr_{121}$ has a gate electrode. This gate electrode is connected to the word line $WL_1$, and receives a control signal transmitted through this word line $WL_1$. This memory capacitor $C_{121}$ is composed of an accumulation electrode, a counter electrode, and a capacitor dielectric film that is interposed between the accumulation electrode and the counter electrode. This accumulation electrode of the memory capacitor is connected to the bit line $BL_1$ through the switching transistor $Tr_{121}$, and receives and stores data transmitted through this bit line $BL_1$. The counter electrode of the memory capacitor $C_{121}$ is connected to a counter electrode of a memory capacitor $C_{122}$ through the fourth local interconnection LOCAL4, and is connected to the second global interconnection GLOBAL2 of the plate line $PL_1$ through the fourth local interconnection LOCAL4 and the switching transistor $Tr_{123}$.

The eighth FeRAM cell CELL122 is composed of a pair of a switching transistor $Tr_{122}$ and a memory capacitor $C_{122}$. This switching transistor $Tr_{122}$ has a gate electrode. This gate electrode is connected to the word line $WL_1$, and receives a control signal transmitted through this word line $WL_1$. This memory capacitor $C_{112}$ is composed of an accumulation electrode, a counter electrode, and a capacitor dielectric film that is interposed between the accumulation electrode and the counter electrode. This accumulation electrode of the memory capacitor is connected to the inverted bit line /BL$_1$ through the switching transistor Tr$_{122}$, and receives and stores data transmitted through this inverted bit line /BL$_1$. The counter electrode of the memory capacitor C$_{122}$ is connected to the counter electrode of the memory capacitor C$_{121}$ through the fourth local interconnection LOCAL4, and is connected to the second global interconnection GLOBAL2 of the plate line PL$_1$ through the fourth local interconnection LOCAL4 and the switching transistor Tr$_{123}$.

When data of the bit line BL$_1$ and inverted data of the inverted bit line /BL$_1$ are written into the accumulation electrodes of the memory capacitors C$_{121}$ and C$_{122}$, or when they are read from these accumulation electrodes, the counter electrodes of these memory capacitors C$_{121}$ and C$_{122}$ are electrically connected to the plate line PL$_1$ as the second global interconnection GLOBAL2, thus, this plate line PL$_1$ has a capacitance that is provided by these memory capacitors C$_{121}$ and C$_{122}$. However, except when data is written into the memory capacitors C$_{121}$ and C$_{122}$, and except when data is read from the memory capacitors C$_{121}$ and C$_{122}$, the memory capacitors C$_{121}$ and C$_{122}$ are not electrically connected to this plate line PL$_1$ as the second global interconnection GLOBAL2. For this reason, the second global interconnection GLOBAL2 that is composed of the plate line PL$_1$ essentially does not have a significant wiring delay problem. On the other hand, two memory capacitors C$_{121}$ and C$_{122}$ are constantly and electrically connected to the fourth local interconnection LOCAL4. However, since the wiring distance of the fourth local interconnection LOCAL4 is very short as compared with the second global interconnection GLOBAL2, the fourth local interconnection LOCAL4 essentially does not have a significant wiring delay problem.

The above description has described a portion of the construction of a two-dimensional matrix array of FeRAM cells included in the semiconductor device according to the present invention with reference to the partial equivalent circuit diagram shown in FIG. 1. The following description will describe a protection structure that protects a dielectric metal oxide of a ferroelectric capacitor included in a FeRAM cell from reduction by hydrogen with reference to the drawings.

Figure 47:
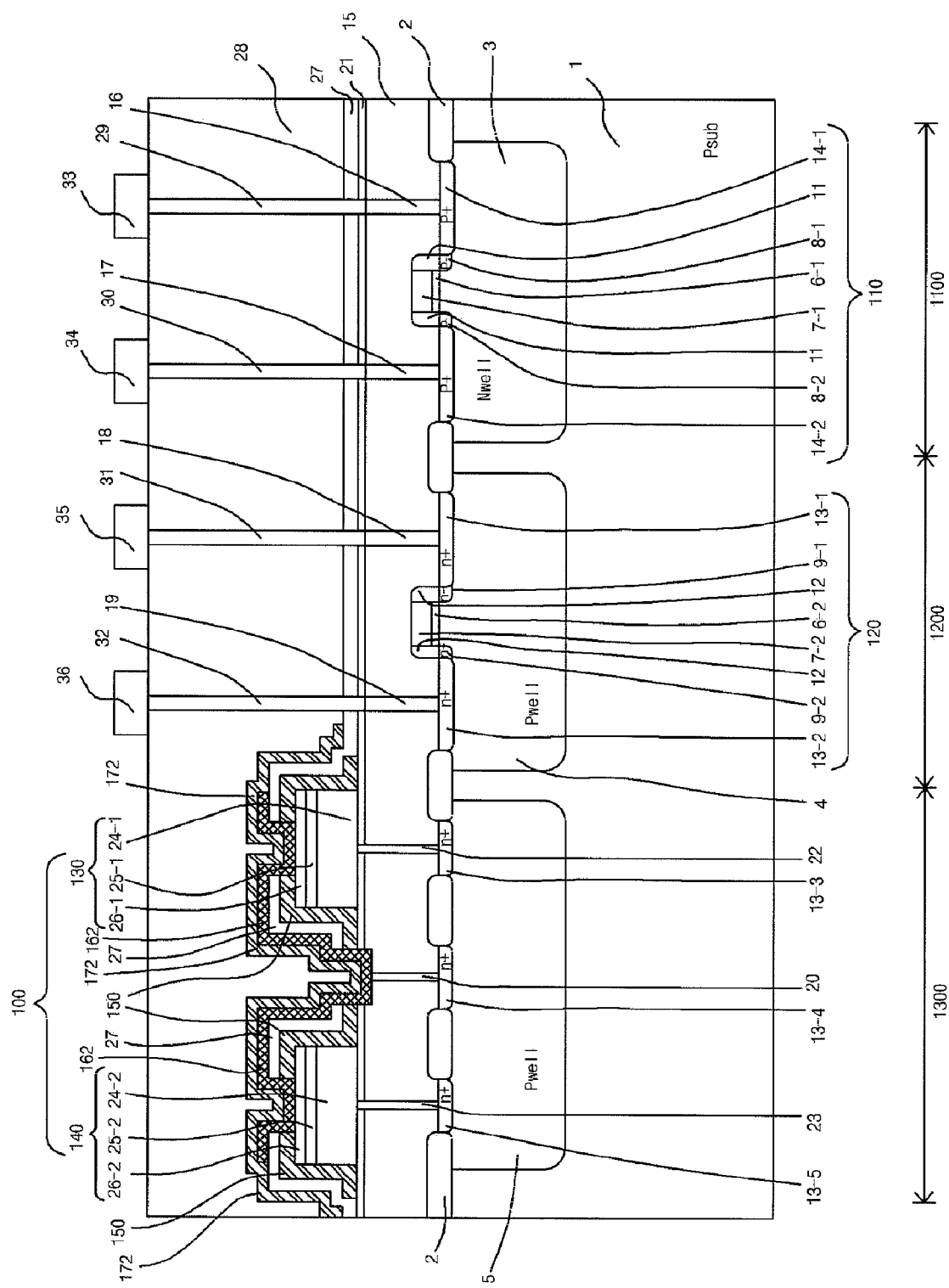
FIG. 47 is a partial vertical cross-sectional view showing a pair of FeRAM cells that have ferroelectric capacitors in FeRAM included in a semiconductor device according to the second embodiment of the present invention, and P-channel and N-channel MOS transistors in a logic circuit included in this semiconductor device.

FIG. 47 is a partial vertical cross-sectional view showing a pair of FeRAM cells that have ferroelectric capacitors included in the semiconductor memory device according to this embodiment, and P-channel and N-channel MOS transistors in a logic circuit included in this semiconductor memory device.

The semiconductor memory device includes the two-dimensional matrix array of FeRAM cells, and the logic circuit adjacent to this array as discussed above. The two-dimensional matrix array of FeRAM cells includes a plurality of pairs of FeRAM cells that are discussed above with reference to FIG. 1. FIG. 47 shows the pair of FeRAM cells, and the P channel and N channel MOS transistors in the logic circuit that is provided adjacent to this pair of FeRAM cells.

The semiconductor memory device is provided on a P-type single crystal semiconductor substrate. This P-type single crystal semiconductor substrate includes a first element region 1100, a second element region 1200, and a third element region 1300. The first element region 1100 includes a P-channel MOS transistor 110. The second element region 1200 includes an N-channel MOS transistor 120. The third element region 1300 includes the aforementioned pair of FeRAM cells 100. The pair of FeRAM cells 100 shown in FIG. 2 corresponds to the pair of the first and second FeRAM cells CELL011 and CELL012, the pair of the third and fourth FeRAM cells CELL021 and CELL022, the pair of the fifth and sixth FeRAM cells CELL111 and CELL112, or the pair of the seventh and eighth FeRAM cells CELL121 and CELL122 shown in FIG. 1. Any of the pairs have the same structure. FIG. 47 shows one of the source/drain regions of the switching transistor of the FeRAM cell, and one of the source/drain regions of the switching transistor between the plate line as global interconnection, and the local interconnection.

Figure 48:
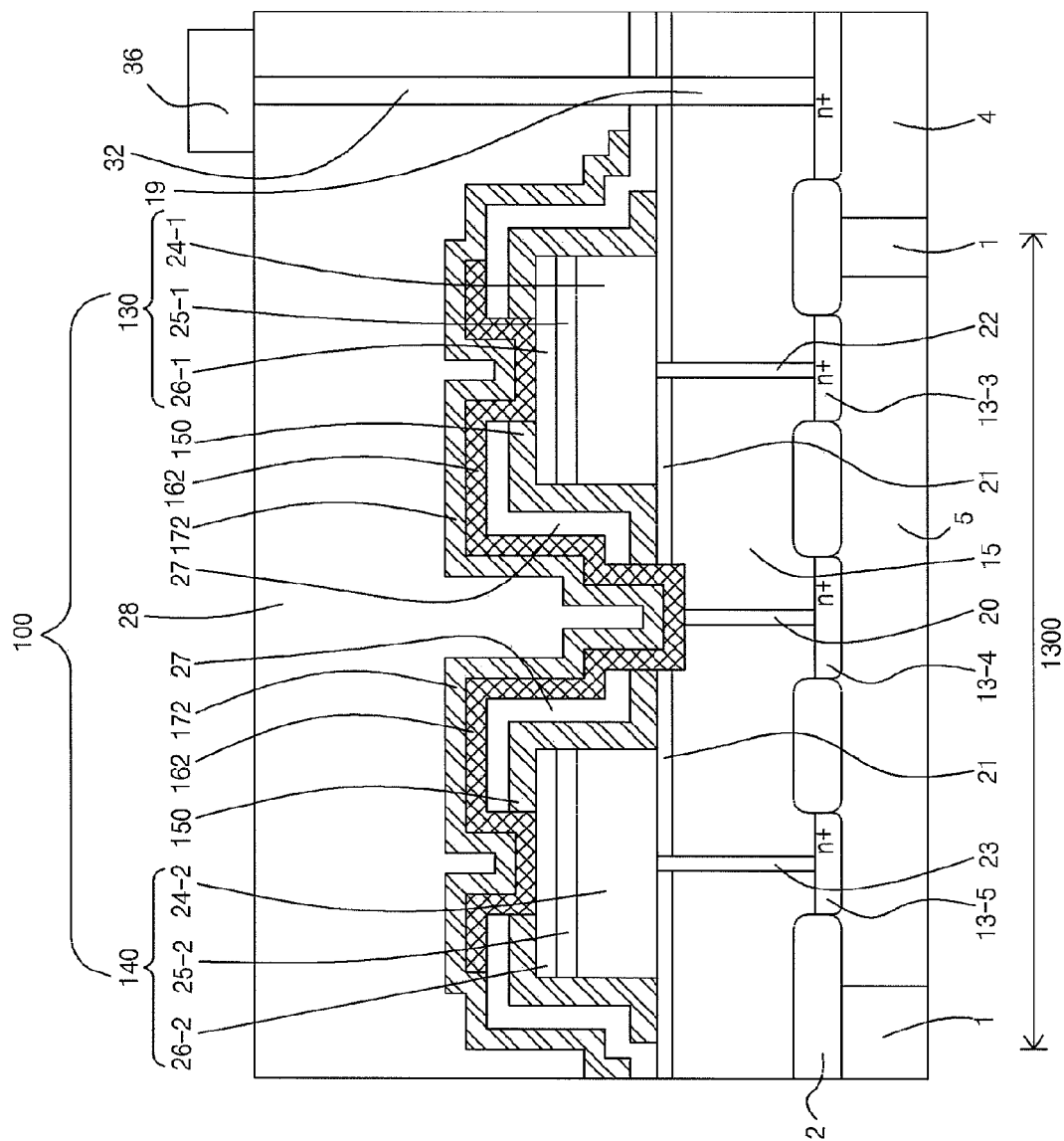
FIG. 48 is a partially enlarged vertical cross-sectional view of the pair of FeRAM cells shown in FIG. 47.

FIG. 48 is a partially enlarged vertical cross-sectional view of the pair of FeRAM cells shown in FIG. 47. The following description will describe a portion of the structure of the semiconductor device according to the second embodiment of the present invention with reference to FIGS. 47 and 48.

The main surface of a P-type single crystal semiconductor substrate 1 includes an element separation region that is composed of a field oxide film 2, and an active region that is defined by this field oxide film 2. The P-type single crystal semiconductor substrate 1 includes the first element region 1100, the second element region 1200, and the third element region 1300 as discussed above. An N-well 3 is provided in the first element region 1100. The P-channel MOS transistor 110 is provided in this N-well 3. A P-well 4 is provided in the second element region 1200. The N-channel MOS transistor 120 is provided in this P-well 4. A P-well 5 is provided in the third element region 1300. The pair of FeRAM cells 100 is provided in this P-well 5. The P-well 4 is spaced away from the N-well 3. The P-well 5 is spaced away from the P-well 4. The P-well 4 is located between the N-well 3 and the P-well 5.

The P-channel MOS transistor 110 includes P$^+$ high concentration impurity diffusion regions 14-1 and 14-2, P$^-$ low concentration impurity diffusion regions 8-1 and 8-2, a first gate insulating film 6-1, a first gate electrode 7-1, and a first sidewall insulating film 11. The P$^+$ high concentration impurity diffusion regions 14-1 and 14-2 compose the source/drain regions. The P$^+$ high concentration impurity diffusion regions 14-1 and 14-2 are spaced away from each other in the N-well 3. The P$^-$ low concentration impurity diffusion regions 8-1 and 8-2 are provided adjacent to the inside of the P$^+$ high concentration impurity diffusion regions 14-1 and 14-2, and are spaced away from each other in the N-well 3 so as to interpose a channel region between them. The first gate insulating film 6-1 is located on the channel region in the N-well 3 that is defined between P$^-$ low concentration impurity diffusion regions 8-1 and 8-2. The first gate electrode 7-1 is located on the first gate insulating film 6-1. The first sidewall insulating film 11 is located on the sidewall of the first gate electrode 7-1. The P$^-$ low concentration impurity diffusion regions 8-1 and 8-2 overlap the first sidewall insulating film 11 in a first horizontal direction. Since the P$^+$ high concentration impurity diffusion regions 14-1 and 14-2 are offset from the first gate electrode 7-1 by the P$^-$ low concentration impurity diffusion regions 8-1 and 8-2 directly under the first sidewall insulating film 11, electric fields at the corners in the bottom of the first gate electrode 7-1 are relieved.

Here, in the present invention, the "first horizontal direction" refers to a direction that is parallel to the main surface of P-type single crystal semiconductor substrate 1, and in which two capacitors of a pair of FeRAM cells 100 move away from each other.

The N-channel MOS transistor 120 includes N$^+$ high concentration impurity diffusion regions 13-1 and 13-2, N$^-$ low concentration impurity diffusion regions 9-1 and 9-2, a second gate insulating film 6-2, a second gate electrode 7-2, and a second sidewall insulating film 12. The N.sup.+ high concentration impurity diffusion regions 13-1 and 13-2 compose the source/drain regions. The N.sup.+ high concentration impurity diffusion regions 13-1 and 13-2 are spaced away from each other in the P-well 4. The N.sup.− low concentration impurity diffusion regions 9-1 and 9-2 are provided adjacent to the inside of the N.sup.+ high concentration impurity diffusion regions 13-1 and 13-2, and are spaced away from each other in the P-well 4 so as to interpose a channel region between them. The second gate insulating film 6-2 is located on the channel region in the P-well 4 that is defined between N.sup.− low concentration impurity diffusion regions 9-1 and 9-2. The second gate electrode 7-2 is located on the second gate insulating film 6-2. The second sidewall insulating film 12 is located on the sidewall of the second gate electrode 7-2. The N.sup.− low concentration impurity diffusion regions 9-1 and 9-2 overlap the second sidewall insulating film 12 in the first horizontal direction. Since the N.sup.+ high concentration impurity diffusion regions 13-1 and 13-2 are offset from the second gate electrode 7-2 by the N.sup.− low concentration impurity diffusion regions 9-1 and 9-2 directly under the second sidewall insulating film 12, electric fields at the corners in the bottom of the second gate electrode 7-2 are relieved.

A pair of FeRAM cells 100 is provided in the P-well 5. A pair of FeRAM cells 100 is composed of first and second FeRAM cells. The first FeRAM cell is composed of a pair of a switching transistor and a first capacitor 130. The second FeRAM cell is composed of a pair of another switching transistor and a second capacitor 140. The first and second FeRAM cells are stack type memory cells. That is, the first capacitor 130 and the second capacitor 140 are provided above the switching transistors corresponding to them, respectively.

The switching transistors of the first and second FeRAM cells are provided so as to be spaced away from each other in the P-well 5. In addition, a switching transistor between a plate line as a global interconnection and a local interconnection is provided in the P-well 5. The switching transistor between the plate line as the global interconnection and the local interconnection, is located between the aforementioned switching transistors of the first and second FeRAM cells, and is separated from both the switching transistors so as to interpose the field oxide film 2 between the switching transistor between the plate line as the global interconnection and the local interconnection, and each of the aforementioned switching transistors of the first and second FeRAM cells. The N.sup.+ high concentration impurity diffusion region 13-3 is provided in the P-well 5, and comprises one of the source/drain regions of the switching transistor of the first FeRAM cell. The N.sup.+ high concentration impurity diffusion region 13-4 is separated from the aforementioned N.sup.+ high concentration impurity diffusion region 13-3 by the field oxide film 2 between them, and is provided in the P-well 5. This N.sup.+ high concentration impurity diffusion region 13-4 comprises one of the source/drain regions of the switching transistor between the plate line as the global interconnection, and the local interconnection. The N.sup.+ high concentration impurity diffusion region 13-5 is separated from the aforementioned N.sup.+ high concentration impurity diffusion region 13-4 so as to interpose the field oxide film 2 between them, and is provided in the P-well 5. This N.sup.+ high concentration impurity diffusion region 13-5 comprises one of the source/drain regions of the switching transistor of the second FeRAM cell.

The first interlayer insulating film 15 continuously extends over the P-type single crystal semiconductor substrate 1, the field oxide film 2, the P-channel and N-channel MOS transistors 110 and 120, the switching transistor of the first and second FeRAM cells, and the switching transistor between the plate line as the global interconnection and the local interconnection.

In addition, a first conductive contact plug 16 is provided in the first interlayer insulating film 15. The first conductive contact plug 16 penetrates the first interlayer insulating film 15, and is in contact with the P.sup.+ high concentration impurity diffusion region 14-1 of the P-channel MOS transistor 110. A second conductive contact plug 17 is provided in the first interlayer insulating film 15. The second conductive contact plug 17 penetrates the first interlayer insulating film 15, and is in contact with the P.sup.+ high concentration impurity diffusion region 14-2 of the P-channel MOS transistor 110. A third conductive contact plug 18 is provided in the first interlayer insulating film 15. The third conductive contact plug 18 penetrates the first interlayer insulating film 15, and is in contact with the N.sup.+ high concentration impurity diffusion region 13-1 of the N-channel MOS transistor 120. A fourth conductive contact plug 19 is provided in the first interlayer insulating film 15. The fourth conductive contact plug 19 penetrates the first interlayer insulating film 15, and is in contact with the N.sup.+ high concentration impurity diffusion region 13-2 of the N-channel MOS transistor 120. A fifth conductive contact plug 20 is provided in the first interlayer insulating film 15. The fifth conductive contact plug 20 penetrates the first interlayer insulating film 15, and is in contact with the N.sup.+ high concentration impurity diffusion region 13-4 of the switching transistor between the plate line as the global interconnection and the local interconnection.

A second interlayer insulating film 21 extends over the first interlayer insulating film 15. A sixth conductive contact plug 22 is provided in a lamination of the first and second interlayer insulating films 15 and 21. The sixth conductive contact plug 22 penetrates the lamination of the first and second interlayer insulating films 15 and 21, and is in contact with the N.sup.+ high concentration impurity diffusion region 13-3 of the switching transistor of the first FeRAM cell. A seventh conductive contact plug 23 is provided in the lamination of the first and second interlayer insulating films 15 and 21. The seventh conductive contact plug 23 penetrates the lamination of the first and second interlayer insulating films 15 and 21, and is in contact with the N.sup.+ high concentration impurity diffusion region 13-5 of the switching transistor of the second FeRAM cell.

The first FeRAM cell includes the first capacitor 130 that is located above the switching transistor. The second FeRAM cell includes the second capacitor 140 located above the switching transistor. The first and second capacitors 130 and 140 serve as memory capacitors discussed above with reference to FIG. 1.

The first capacitor 130 is composed of a first lower electrode 24-1, a first upper electrode 26-1, and a first ferroelectric metal oxide film 25-1 that is located between the first lower electrode 24-1 and the first upper electrode 26-1. The first lower electrode 24-1 and the first upper electrode 26-1 serve as the accumulation electrode and the counter electrode discussed above with reference to FIG. 1, respectively. The first lower electrode 24-1 as the accumulation electrode is located on the second interlayer insulating film 21 and the sixth conductive contact plug 22. Here, the first lower electrode 24-1 is in contact with the top of the sixth conductive contact plug 22. The first lower electrode 24-1 is electrically connected to the N.sup.+ high concentration impurity diffusion region 13-3 of the switching transistor of the first FeRAM cell through the sixth conductive contact plug 22. This switching transistor is connected to the bit line discussed above with reference to FIG. 1. In addition, this switching transistor has a gate electrode (not shown). This gate electrode is connected to the word line discussed above with reference to FIG. 1.

The second capacitor 140 is composed of a second lower electrode 24-2, a second upper electrode 26-2, and a second ferroelectric metal oxide film 25-2 that is located between the second lower electrode 24-2 and the second upper electrode 26-2. The second lower electrode 24-2 and the second upper electrode 26-2 serve as the accumulation electrode and the counter electrode discussed above with reference to FIG. 1, respectively. The second lower electrode 24-2 as the accumulation electrode is located on the second interlayer insulating film 21 and the seventh conductive contact plug 23. Here, the second lower electrode 24-2 is in contact with the top of the seventh conductive contact plug 23. The second lower electrode 24-2 is electrically connected to the N.sup.+ high concentration impurity diffusion region 13-5 of the switching transistor of the second FeRAM cell through the seventh conductive contact plug 23. This switching transistor is connected to the bit line discussed above with reference to FIG. 1. In addition, this switching transistor has a gate electrode (not shown). This gate electrode is connected to the word line discussed above with reference to FIG. 1.

A first insulating hydrogen barrier layer 150 is provided. This first insulating hydrogen barrier layer 150 has electrical insulation and non-permeability to hydrogen. The first insulating hydrogen barrier layer 150 extends over the respective sidewalls and top surfaces of the first and second capacitors 130 and 140, and the peripheries of the first and second capacitors 130 and 140 on the second interlayer insulating film 21, and over between them, and thus covers the first and second capacitors 130 and 140. Here, the first insulating hydrogen barrier layer 150 is in contact with the respective sidewalls and top surfaces of the first and second capacitors 130 and 140.

In addition, a third interlayer insulating film 27 is provided. This third interlayer insulating film 27 continuously extends over the first insulating hydrogen barrier layer 150 and the second interlayer insulating film 21. Two contact holes are provided. The two contact holes are located on a portion of the top surface of the first upper electrode 26-1 that serves as the counter electrode of the first capacitor 130, and on a portion of the top surface of the second upper electrode 26-2 that serves as the counter electrode of the second capacitor 140, respectively. The two contact holes penetrate a lamination of the third interlayer insulating film 27 and the first insulating hydrogen barrier layer 150, and reach a portion of the top surface of the first upper electrode 26-1, and a portion of the top surface of the second upper electrode 26-2. One additional contact hole is provided. The one additional contact hole is located between the first and second capacitors 130 and 140, and is located on the aforementioned fifth conductive contact plug 20. The one additional contact holes penetrates a lamination of the third interlayer insulating film 27, the first insulating hydrogen barrier layer 150 and the second interlayer insulating film 21, and reaches inward an upper region of the first interlayer insulating film 15. Thus, the one additional contact hole has the bottom of a level lower than the top surface of the first interlayer insulating film 15.

The first hydrogen non-permeable local interconnection layer 162 is provided. This first hydrogen non-permeable local interconnection layer 162 has electrical conductivity, and non-permeability to hydrogen. This first hydrogen non-permeable local interconnection layer 162 extends on the third interlayer insulating film 27 and inside the aforementioned three contact holes in the third element region 1300. Specifically, as shown in FIGS. 47 and 48, the first hydrogen non-permeable local interconnection layer 162 extends over the first and second capacitors 130 and 140, in addition, between the first and second capacitors 130 and 140, and additionally, inside the aforementioned three contact holes. The first hydrogen non-permeable local interconnection layer 162 is electrically in contact with this first upper electrode 26-1 that serves as the counter electrode of the first capacitor 130 through the aforementioned contact hole. Furthermore, the first hydrogen non-permeable local interconnection layer 162 is electrically in contact with this second upper electrode 26-2 that serves as the counter electrode of the second capacitor 140 through the aforementioned contact hole. Moreover, the first hydrogen non-permeable local interconnection layer 162 is electrically in contact with the fifth conductive contact plug 20 through the aforementioned contact hole that is located between the first and second capacitors 130 and 140, and is located on the aforementioned fifth conductive contact plug 20.

As discussed above, this fifth conductive contact plug 20 is in contact with the N.sup.+ high concentration impurity diffusion region 13-4. This N.sup.+ high concentration impurity diffusion region 13-4 comprises one of the source/drain regions of the switching transistor that is provided between the plate line as the global interconnection, and the local interconnection. Thus, the first hydrogen non-permeable local interconnection layer 162 is electrically connected to the plate line as the global interconnection through this fifth conductive contact plug 20 and this switching transistor. That is, the first hydrogen non-permeable local interconnection layer 162 provides electrical connection between the counter electrode that is composed of the first upper electrode 26-1 of the first capacitor 130, and the counter electrode that is composed of the second upper electrode 26-2 of the second capacitor 140, and provides electrical connection among both counter electrodes and this switching transistor. Accordingly, the respective counter electrodes of the first and second capacitors 130 and 140 are electrically connected to the global interconnection that is composed of the plate line through the first hydrogen non-permeable local interconnection layer 162 and this switching transistor.

As discussed above with reference to FIG. 1, the gate electrode of this switching transistor that is provided between the first hydrogen non-permeable local interconnection layer 162 and the global interconnection composed of the plate line is connected to the common word line that connects the gate electrodes of the switching transistors connected to the first and second capacitors 130 and 140, respectively. Thus, the three switching transistors are controlled by the common control signal. Accordingly, in the writing into or reading from the respective first and second lower electrodes 24-1 and 24-2 as the accumulation electrode of the first and second capacitors 130 and 140, the first and second upper electrodes 26-1 and 26-2 as the counter electrode of the first and second capacitors 130 and 140 are electrically connected to the global interconnection composed of the plate line, and at all other times, they are electrically separated. That is, except when data is written into the memory capacitors, and except when data is read from the memory capacitors, the memory capacitors are not electrically connected to the global interconnection composed of the plate line. For this reason, the global interconnection that is composed of a plate line essentially does not have a significant wiring delay problem. On the other hand, the first and second capacitors 130 and 140 are constantly and electrically connected to the first hydrogen non-permeable local interconnection layer 162. However, the wiring distance of the first hydrogen non-permeable local interconnection layer 162 is limited in the third element region 1300 that is provided with a pair of FeRAM cells 100, thus, it is very short as compared with the global interconnection. For this reason, the global interconnection that is composed of a plate line essentially does not have a wiring delay problem.

This second insulating hydrogen barrier layer 172 has electric insulation and non-permeability to hydrogen. This second insulating hydrogen barrier layer 172 extends over the first hydrogen non-permeable local interconnection layer 162 and the third interlayer insulating film 2, and the whole third element region 1300. Thus, this second insulating hydrogen barrier layer 172 completely covers the whole first hydrogen non-permeable local interconnection layer 162. That is, the whole first hydrogen non-permeable local interconnection layer 162 is covered by the second insulating hydrogen barrier layer 172. In addition, the second insulating hydrogen barrier layer 172 covers a portion of the third interlayer insulating film 27 that is not covered by the first hydrogen non-permeable local interconnection layer 162, and is located adjacent to first insulating hydrogen barrier layer 150.

A fourth interlayer insulating film 28 is provided. This fourth interlayer insulating film 28 extends over the third interlayer insulating film 27 in the first and second element regions 1100 and 1200, and extends over the second insulating hydrogen barrier layer 172 in the third element region 1300. The whole first hydrogen non-permeable local interconnection layer 162 is completely separated from the fourth interlayer insulating film 28 by the second insulating hydrogen barrier layer 172. In addition, the second insulating hydrogen barrier layer 172 completely separates the portion of the third interlayer insulating film 27 that is not covered by the first hydrogen non-permeable local interconnection layer 162, and is located adjacent to first insulating hydrogen barrier layer 150 from the fourth interlayer insulating film 28.

In the first element region 1100, eighth and ninth conductive contact plugs 29 and 30 are provided. The eighth conductive contact plug 29 penetrates the fourth interlayer insulating film 28, the third interlayer insulating film 27 and the second interlayer insulating film 21, and is in contact with the top of the aforementioned first conductive contact plug 16. The eighth conductive contact plug 29 is electrically connected to the P.sup.+ high concentration impurity diffusion region 14-1 of the P-channel MOS transistor 110 through the aforementioned first conductive contact plug 16. The ninth conductive contact plug 30 penetrates the fourth interlayer insulating film 28, the second interlayer insulating film 27 and the second interlayer insulating film 21, and is in contact with the top of the aforementioned second conductive contact plug 17. The ninth conductive contact plug 30 is electrically connected to the P.sup.+ high concentration impurity diffusion region 14-2 of the P-channel MOS transistor 110 through the aforementioned second conductive contact plug 17.

In the second element region 1200, tenth and eleventh conductive contact plugs 31 and 32 are provided. The tenth conductive contact plug 31 penetrates the fourth interlayer insulating film 28, the second interlayer insulating film 27 and the second interlayer insulating film 21, and is in contact with the top of the aforementioned third conductive contact plug 18. The tenth conductive contact plug 31 is electrically connected to the N.sup.+ high concentration impurity diffusion region 13-1 of the N-channel MOS transistor 120 through the aforementioned third conductive contact plug 18. The eleventh conductive contact plug 32 penetrates the fourth interlayer insulating film 28, the second interlayer insulating film 27 and the second interlayer insulating film 21, and is in contact with the top of the aforementioned fourth conductive contact plug 19. The eleventh conductive contact plug 32 is electrically connected to the N.sup.+ high concentration impurity diffusion region 13-2 of the N-channel MOS transistor 120 through the aforementioned fourth conductive contact plug 19.

In the first element region 1100, first and second metal wiring layers 33 and 34 are provided on the fourth interlayer insulating film 28. The first metal wiring layer 33 is in contact with the top of the eighth conductive contact plug 29. The first metal wiring layer 33 is electrically connected to the P.sup.+ high concentration impurity diffusion region 14-1 of the P-channel MOS transistor 110 through the eighth conductive contact plug 29 and the aforementioned first conductive contact plug 16. The second metal wiring layer 34 is in contact with the top of the ninth conductive contact plug 30. The second metal wiring layer 34 is electrically connected to the P.sup.+ high concentration impurity diffusion region 14-2 of the P-channel MOS transistor 110 through the ninth conductive contact plug 30 and the aforementioned second conductive contact plug 17.

In the second element region 1200, third and fourth metal wiring layers 35 and 36 are provided on the fourth interlayer insulating film 28. The third metal wiring layer 35 is in contact with the top of the tenth conductive contact plug 31. The third metal wiring layer 35 is electrically connected to the N.sup.+ high concentration impurity diffusion region 13-1 of the N-channel MOS transistor 120 through the tenth conductive contact plug 31 and the aforementioned third conductive contact plug 18. The fourth metal wiring layer 36 is in contact with the top of the eleventh conductive contact plug 32. The fourth metal wiring layer 36 is electrically connected to the N.sup.+ high concentration impurity diffusion region 13-2 of the N-channel MOS transistor 120 through the eleventh conductive contact plug 32 and the aforementioned fourth conductive contact plug 19.

Additionally, a multilayer wiring structure that includes the first, second, third, and fourth metal wiring layers 33, 34, 35, and 36 may be provided as a first level wiring layer.

FeRAM Structure

As discussed above, the semiconductor memory device according to this embodiment includes a pair of FeRAM cells 100. The pair of FeRAM cells 100 is composed of first and second FeRAM cells. The first FeRAM cell is composed of a switching transistor and the first capacitor 130. The second FeRAM cell is composed of a switching transistor and the second capacitor 140.

The first capacitor 130 is composed of the first lower electrode 24-1, the first upper electrode 26-1, and the first ferroelectric metal oxide film 25-1 that is interposed between both these electrodes. The first lower electrode 24-1 is electrically connected to the N.sup.+ high concentration impurity diffusion region 13-3 that comprises one of the source/drain regions of this switching transistor through the sixth conductive contact plug 22. The first lower electrode 24-1 serves as the accumulation electrode that stores data of the bit line.

The second capacitor 140 is composed of the second lower electrode 24-2, the second upper electrode 26-2, and the second ferroelectric metal oxide film 25-2 that is interposed between both these electrodes. The second lower electrode 24-2 is electrically connected to the N.sup.+ high concentration impurity diffusion region 13-5 that comprises one of the source/drain regions of this switching transistor through the seventh conductive contact plug 23. The second lower electrode 24-2 serves as the accumulation electrode that stores data of the bit line.

The first and second capacitors 130 and 140 have the first and second lower electrodes 24-1 and 24-2, respectively. These first and second lower electrodes 24-1 and 24-2 preferably contain a Pt or Ir group material, e.g., at least one of Pt, Ir and $IrO_2$. These first and second lower electrodes 24-1 and 24-2 can have single layer structure or multilayer structure. This single layer structure can be constructed to have a single layer containing at least one of Pt, Ir, and $IrO_2$. This multilayer structure can be constructed to have a first layer that is composed of TiAlN as the lowest layer, a second layer that is composed of Ir and is located on this first layer, a third layer that is composed of $IrO_2$ and is located on this second layer, and a fourth layer that is composed of Pt and is located on this third layer. In this case, the first layer that is composed of TiAlN as the lowest layer serves as a hydrogen barrier film with hydrogen barrier characteristics.

The first and second capacitors 130 and 140 have the first and second upper electrodes 26-1 and 26-2, respectively. These first and second upper electrodes 26-1 and 26-2 preferably contain a Pt or Ir group material, e.g., at least one of Pt, Ir and $IrO_2$.

The first and second capacitors 130 and 140 have the first and second ferroelectric metal oxide films 25-1 and 25-2, respectively. A typical example of a substance that can be used as these first and ferroelectric metal oxide films 25-1 and 25-2 can be composed of any of various types of known ferroelectric metal oxides. A compound group of a series of compounds that are $SrBi_2Ta_2O_9$ as Bi layer-shaped compound, a substance with composition varied from this substance, and a substance that is obtained by substituting an additive such as, typically, Nb for the composition of this substance (hereinafter, the compound group is referred to as SBT), and a compound group of a series of compounds that are $Pb(Zr_{1-x}, Ti_x)O_3$, a substance with composition varied from this substance, and a substance that is obtained by substituting an additive such as, typically, La and Ca for the composition of this substance (hereinafter, the compound group is referred to as PZT) can be given as the typical examples. As for materials under study, a material of bismuth titanate added with lanthanum, and a solid solution of the aforementioned ferroelectric material and other dielectric material can be given as other examples. The substances commonly have dielectric characteristics as dielectric oxide crystals. In this embodiment, the ferroelectric metal oxide film is formed by burning spin-coated SBT for crystallization.

The first upper electrode 26-1 of the first capacitor 130 has electrical conductivity and hydrogen permeability. The first upper electrode 26-1 of the first capacitor 130 is in contact with the first hydrogen non-permeable local interconnection layer 162 through the contact hole. The first upper electrode 26-4 of the second capacitor 140 has electrical conductivity and hydrogen permeability. The first upper electrode 26-4 of the second capacitor 140 is in contact with the first hydrogen non-permeable local interconnection layer 162 through the contact hole. Thus, the first hydrogen non-permeable local interconnection layer 162 provides interconnection between the first upper electrode 26-1 of the first capacitor 130, and the first upper electrode 26-4 of the second capacitor 140.

The aforementioned first hydrogen non-permeable local interconnection layer 162 is formed of a substance that has electrical conductivity and non-permeability to hydrogen. TiAlN can be given as typical example of constituent material of the aforementioned first hydrogen non-permeable local interconnection layer 162, ; however, the material is not limited to this.

The aforementioned first and second insulation hydrogen barrier films 150 and 172 can be formed of a substance that has electrical insulation and non-permeability to hydrogen. Typically, alumina ($Al_2O_3$), SiN, SiON, $TiO_2$, and $TaO_x$ (x>0) can be employed, however, the substance is not limited to them. In this embodiment, the first and second insulation hydrogen barrier films 150 and 172 are formed of $Al_2O_3$. The aforementioned first insulation hydrogen barrier film 150 and the second insulating hydrogen barrier layer 172 can be formed of alumina ($Al_2O_3$) by a CVD method.

The aforementioned first through eleventh conductive plugs 16, 17, 18, 19, 20, 22, 23, 29, 30, 31, and 32 can be formed of various types of conductive material. Typically, tungsten (W) or polysilicon can be employed. These first through eleventh conductive plugs 16, 17, 18, 19, 20, 22, 23, 29, 30, 31, and 32 can be formed by a CVD method. In addition, the third and fourth interlayer insulating films 27 and 28 can be formed by a CVD method.

Hydrogen Barrier Structure

In this embodiment, the third and fourth interlayer insulating films 27 and 28 and eighth through eleventh conductive plugs 29, 30, 31, and 32 are formed by a CVD method after the first and second capacitors 130 and 140 are formed. In addition, the fourth interlayer insulating film 28 and eighth through eleventh conductive plugs 29, 30, 31, and 32 are formed by a CVD method after the first hydrogen non-permeable local interconnection layer 162 and the second insulating hydrogen barrier layer 172 are formed. The CVD process is performed in a reducing atmosphere. Accordingly, it is necessary to prevent the first and second ferroelectric metal oxide films 25-1 and 25-2 that are included in the first and second capacitors 130 and 140, respectively, from being reduced by the diffusion of hydrogen that serves as a reducing agent supplied in this CVD process. The hydrogen diffusion path, i.e., hydrogen entry path, includes not only the boundary between each of the first and second capacitors 130 and 140, and the external region, but also the aforementioned third interlayer insulating film 27 that has electrical insulation and hydrogen permeability. It is necessary to prevent hydrogen from being diffused in the first and second ferroelectric metal oxide films 25-1 and 25-2 through this diffusion path that is the fourth or third interlayer insulating film 28 or 27, and through the first and second upper electrodes 26-1 and 26-2.

The first hydrogen non-permeable local interconnection layer 162 is a dedicated wiring that extends only within the third element region 1300, and provides interconnection between the respective first upper electrodes 26-1 and 26-2 of the first and second capacitors 130 and 140 included in the first and second FeRAM cells that are paired with each other, as discussed above. In contrast to a general global interconnection, this dedicated wiring provides electrical interconnection only within a specific region. It is necessary to prevent the dedicated wiring that extends only within the specific region from acting as a hydrogen diffusion path.

That is, not only the first insulating hydrogen barrier layer 150 that covers the first and second capacitors 130 and 140 but also the first hydrogen non-permeable local interconnection layer 162 and the second insulating hydrogen barrier layer 172 are provided, the hydrogen diffusion path through the third interlayer insulating film 27 will be disconnected. Combination of the aforementioned first insulating hydrogen barrier layer 150, the first hydrogen non-permeable local interconnection layer 162 and the second insulating hydrogen barrier layer 172 reliably prevents the hydrogen that serves as a reducing agent from diffusing into the first and second ferroelectric metal oxide films 25-1 and 25-2. The first insulating hydrogen barrier layer 150 that has impermeability to hydrogen, i.e., hydrogen barrier characteristics, extends so as to be in contact with respective upper parts of the first and second capacitors 130 and 140 except contact portions thereof that are in contact with the first hydrogen non-permeable local interconnection layer 162, and the sides of them. On the other hand, in the case where the third, fourth interlayer insulating film 27 and 28, and the eighth through eleventh conductive plugs 29, 30, 31 and 32 are formed outside and above the first and capacitors 130 and 140 by the CVD process that is performed in a reducing atmosphere, hydrogen that serves as a reducing agent is supplied. Existence of the first insulating hydrogen barrier layer 150 with hydrogen barrier characteristics will prevent hydrogen from diffusing into the first and second ferroelectric metal oxide films 25-1 and 25-2 through the respective upper parts of the first and second capacitors 130 and 140 except contact portions thereof that are in contact with the first hydrogen non-permeable local interconnection layer 162, and the respective sides of them.

However, since the third interlayer insulating film 27 has hydrogen permeability as discussed above, it is necessary to prevent hydrogen from diffusing into each of the first and second upper electrodes 26-1 and 26-2 through each contact portion between each of the first and second upper electrodes 26-1 and 26-2, and the first hydrogen non-permeable local interconnection layer 162. For this reason, in this embodiment, not only the first insulating hydrogen barrier layer 150 but also the first hydrogen non-permeable local interconnection layer 162 with impermeability to hydrogen is provided.

The respective side and top surfaces of the first and second capacitors 130 and 140 are completely covered with the first insulating hydrogen barrier layer 150 and the first hydrogen non-permeable local interconnection layer 162. Thus, the first and second capacitors 130 and 140 are completely separated from the fourth interlayer insulating film 28 that acts as a hydrogen diffusion path by the first insulating hydrogen barrier layer 150 and the first hydrogen non-permeable local interconnection layer 162. In addition, the first and second capacitors 130 and 140 are completely separated from the third interlayer insulating film 27 that acts as a hydrogen diffusion path by the first insulating hydrogen barrier layer 150 and the first hydrogen non-permeable local interconnection layer 162. Thus, hydrogen is reliably prevented from diffusing into the first and second upper electrodes 26-1 and 26-2 from the third or fourth interlayer insulating film 27 or 28.

In addition, the first hydrogen non-permeable local interconnection layer 162 is formed by a formation method that employs a non-reducing atmosphere. Specifically, a sputtering method is used. Accordingly, in the case where the aspect ratio of contact hole is large, as shown in FIG. 45, the aforementioned first hydrogen non-permeable local interconnection layer 162 in this contact hole will have an overhang shape. For this reason, the aforementioned contact portion of this first hydrogen non-permeable local interconnection layer 162 that extends at the bottom of this contact hole will have an uneven thickness. Specifically, the thickness of this contact portion increases as closer to a central region in the bottom of this contact hole, and the thickness decreases as closer to the peripheral region in the bottom of this contact hole. For this reason, in peripheral region in the bottom of this contact hole, the thickness of this contact portion may not be sufficient to serve as a hydrogen diffusion barrier. Accordingly, in this embodiment, as shown in FIG. 46, in order to ensure that this contact portion has a sufficient thickness even in the peripheral region in the bottom of this contact hole to serve as a hydrogen diffusion barrier, it is effective that the second insulating hydrogen barrier layer 172 is laminated on the first hydrogen non-permeable local interconnection layer 162.

On the other hand, the first and second lower electrodes 24-1 and 24-2 can be constructed in multilayer structure as discussed above. In this case, this multilayer structure includes a first layer that is formed of TiAlN as the lowest layer. TiAlN has electrical conductivity, and impermeability to hydrogen, i.e., hydrogen barrier characteristics. Accordingly, in the case where the first and second lower electrodes 24-1 and 24-2 have electrical conductivity, and impermeability to hydrogen, i.e., hydrogen barrier characteristics, hydrogen is reliably prevented from diffusing into the first and second ferroelectric metal oxide films 25-1 and 25-2 from the lower parts of the first and second capacitors 130 and 140.

Accordingly, existence of the first insulating hydrogen barrier layer 150 with hydrogen barrier characteristics, the first hydrogen non-permeable local interconnection layer 162, and the second insulating hydrogen barrier layer 172 reliably prevent hydrogen supplied in the aforementioned CVD process and serves as a reducing agent from diffusing into the first and second ferroelectric metal oxide films 25-1 and 25-2. Therefore, it is possible to reliably prevent ferroelectric characteristic deterioration of the first and second ferroelectric metal oxide films 25-1 and 25-2 due to reduction of these films.

In this embodiment, as discussed above, the second insulating hydrogen barrier layer 172 covers the whole first hydrogen non-permeable local interconnection layer 162, and covers the portion of the third interlayer insulating film 27 that is not covered by the first hydrogen non-permeable local interconnection layer 162 and is located adjacent to first insulating hydrogen barrier layer 150. Accordingly, although the aforementioned first insulating hydrogen barrier layer 150 allows the hydrogen diffusion through the contact hole, this first hydrogen non-permeable local interconnection layer 162 and the second insulating hydrogen barrier layer 172 prevent diffusion of the hydrogen through each contact portion between this first hydrogen non-permeable local interconnection layer 162 and each of the first and second upper electrodes 26-1 and 26-2.

Modified Embodiment

As discussed above, the first hydrogen non-permeable local interconnection layer 162 is provided to prevent diffusion of hydrogen through each contact portion between this first hydrogen non-permeable local interconnection layer 162 and each of the first and second upper electrodes 26-1 and 26-2. Accordingly, it is not necessary for this first hydrogen non-permeable local interconnection layer 162 to entirely have impermeability to hydrogen. However, the contact portions in contact with the first and second upper electrodes 26-1 and 26-2 of the first hydrogen non-permeable local interconnection layer 162 must have the characteristic of hydrogen non-permeability. That is, as discussed above, the whole first hydrogen non-permeable local interconnection layer 162 can be formed of a substance that has electrical conductivity and non-permeability to hydrogen. In addition, while the contact portions in contact with the first and second upper electrodes 26-1 and 26-2 of the first hydrogen non-permeable local interconnection layer 162 can be formed of a substance that has electrical conductivity and impermeability to hydrogen, the rest of the first hydrogen non-permeable local interconnection layer 162 other than the contact portions can be formed of electrical conductivity and hydrogen permeability. That is, if it is possible to prevent diffusion of hydrogen through each contact portion between the first hydrogen non-permeable local interconnection layer 162 and each of the first and second upper electrodes 26-1 and 26-2, it is not necessary for non-contact portions of the first hydrogen non-permeable local interconnection layer 162 to have impermeability to hydrogen.

The present invention provides hydrogen barrier structure that prevents or suppresses characteristic deterioration of a dielectric that forms capacitor insulating films of the first and second capacitors 130 and 140 due to reduction by hydrogen. Accordingly, the capacitor insulating films of the first and second capacitors 130 and 140 are not limited to ferroelectric metal oxide. They can be any of ferroelectric oxide and high-dielectric oxide. That is, as long as the capacitor insulating films of the first and second capacitors 130 and 140 are dielectric oxide, there is significance that the hydrogen barrier structure according to the present invention is applied.

Method of Producing Semiconductor Memory Device

FIGS. 49 through 65 are partial vertical cross-sectional views showing production processes of the semiconductor memory device according to the second embodiment of the present invention. Here, until a process that forms the capacitors, processes are completely the same as the aforementioned first embodiment. The following description will describe the processes again with reference to FIGS. 4 through 25.

As shown in FIG. 4, the field oxide film 2 is formed in the element separation region of the P-type single crystal silicon substrate 1 by a LOCOS (Local Oxidation Of Silicon) method, thus, the active region is defined by the field oxide film 2. The active region is a region where the semiconductor memory device is formed.

As shown in FIG. 5, a resist pattern 81 is formed over the P-type single crystal silicon substrate 1 and the field oxide film 2 by known lithography technique. This resist pattern 81 has an opening in the first element region 1100. This resist pattern 81 is used as a mask, and phosphorus (P) as N-type impurity is selectively implanted into the P-type single crystal silicon substrate 1 in the vertical direction under conditions of an acceleration energy of 1000 keV and a dose amount of $5.0 \times 10^{12}$ cm.$-2$. Thus, the N-well 3 is selectively formed in the first element region 1100.

As shown in FIG. 6, the resist pattern 81 is removed by a known method. After that, a resist pattern 82 is formed over the P-type single crystal silicon substrate 1 and the field oxide film 2 by known lithography technique. This resist pattern 82 has openings in the second and third element regions 1200 and 1300. This resist pattern 82 is used as a mask, and boron (B) as P-type impurity is selectively implanted into the P-type single crystal silicon substrate 1 in the vertical direction under conditions of an acceleration energy of 600 keV and a dose amount of $5.0 \times 10^{12}$ cm.$-2$. Thus, the P-wells 4 and 5 are selectively formed in the second and third element regions 1200 and 1300, respectively.

As shown in FIG. 7, the resist pattern 82 is removed by a known method. Subsequently, the first gate insulating film 6-1 with thickness of 60 .ANG. is formed on the surface of each of the N-well 3 and the P-well 4 by a known selective oxidation method. Subsequently, the second gate insulating film 6-2 with thickness of 55 .ANG. is formed on the surface of the P-well 4 by a known selective oxidation method.

As shown in FIG. 8, an impurity-doped polysilicon film with thickness of 1200 .ANG. is formed over the first and second gate insulating films 6-1 and 6-2, and the field oxide film 2 by a CVD method. As a result, a lamination of the first gate insulating film 6-1 and the polysilicon film, and a lamination of the second gate insulating film 6-2 and the polysilicon film are formed. Subsequently, patterning is performed on the laminations by a known method. Thus, while a first gate structure that is composed of the first gate insulating film 6-1 and the first gate electrode 7-1 is selectively formed on the N-well 3, a second gate structure that is composed of the second gate insulating film 6-2 and the second gate electrode 7-2 is selectively formed on the P-well 4. Furthermore, although a plurality of pairs of the gate insulating films and the gate electrodes are formed also on the P-well 5, they are not located in the position corresponding to the vertical cross-sectional view of FIG. 8. Accordingly, they are not shown in the figure.

As shown in FIG. 9, a resist pattern 83 is formed over the P-type single crystal silicon substrate 1, the first gate structure, and the field oxide film 2 by known lithography technique. This resist pattern 83 has an opening in the first element region 1100. This resist pattern 83, the field oxidation film 2 and the first gate electrode 7-1 are used as masks, and boron difluoride (BF$_2^+$) as P-type impurity is selectively implanted into the N-well 3 in the vertical direction under conditions of an acceleration energy of 15 keV and a dose amount of $3.0 \times 10^{13}$ cm.$-2$. Thus, the P.sup.− low concentration impurity diffusion regions 8-1 and 8-2 are selectively formed in the N-well 3. The P.sup.− low concentration impurity diffusion regions 8-1 and 8-2 self-align with the first gate electrode 7-1.

As shown in FIG. 10, the resist pattern 83 is removed by a known method. Subsequently, a resist pattern 84 is formed over the P-type single crystal silicon substrate 1, the second gate structure, and the field oxide film 2 by known lithography technique. This resist pattern 84 has an opening over the second and third element regions 1200 and 1300. This resist pattern 84, the field oxidation film 2 and the second gate electrode 7-2 are used as masks, and arsenic (As.sup.+) as P-type impurity is selectively implanted into the P-wells 4 and 5 in the vertical direction under conditions of an acceleration energy of 30 keV and a dose amount of $4.0 \times 10^{13}$ cm.$-2$. Thus, the N.sup.− low concentration impurity diffusion regions 9-1 and 9-2 are selectively formed in the P-well 4, and the N.sup.− low concentration impurity diffusion regions 10-1, 10-2 and 10-3 are selectively formed in the P-well 5. The N.sup.− low concentration impurity diffusion regions 9-1 and 9-2 self-align with the second gate electrode 7-2.

As shown in FIG. 11, the resist pattern 84 is removed by a known method.

As shown in FIG. 12, the first and second sidewall insulating film 11 and 12 are formed on the sidewalls of the aforementioned first and second gate structures, respectively, by a known method. Thus, while the third gate structure that is composed of the first gate insulating film 6-1, the first gate electrode 7-1, and the first sidewall insulating film 11 is formed on the N-well 3, the fourth gate structure that is composed of the second gate insulating film 6-2, the second gate electrode 7-2, and the second sidewall insulating film 12 is formed on the P-well 4.

As shown in FIG. 13, a resist pattern 85 is formed over the P-type single crystal silicon substrate 1, the third gate structure, and the field oxide film 2 by known lithography technique. This resist pattern 85 has openings in the second and third element regions 1200 and 1300. This resist pattern 85, the field oxidation film 2, and the fourth gate structure that is composed of the second gate insulating film 6-2, the second gate electrode 7-2 and the second sidewall insulating film 12 are used as masks, and arsenic (As.sup.+) as P-type impurity is selectively implanted into the P-wells 4 and 5 in the vertical direction under conditions of an acceleration energy of 50 keV and a dose amount of 3.0.times.10.sup.15 cm.sup.−2. Thus, the N.sup.+ high concentration impurity diffusion regions 13-1 and 13-2 are selectively formed in the P-well 4, and the N.sup.+ high concentration impurity diffusion regions 13-3, 13-4 and 13-5 are selectively formed in the P-well 5. The N.sup.+ high concentration impurity diffusion regions 13-1 and 13-2 self-align with the fourth gate structure.

As shown in FIG. 14, the resist pattern 85 is removed by a known method. Subsequently, a resist pattern 86 is formed over the P-type single crystal silicon substrate 1, the second gate structure, and the field oxide film 2 by known lithography technique. This resist pattern 86 has an opening in the first element region 1200. This resist pattern 86, the field oxidation film 2 and the aforementioned first gate structure that is composed of the first gate insulating film 6-1 and the first gate electrode 7-1 are used as masks, and boron difluoride (BF.sub.2sup.+) as P-type impurity is selectively implanted into the N-well 3 in the vertical direction under conditions of an acceleration energy of 40 keV and a dose amount of 4.0.times.10.sup.15 cm.sup.−2. Thus, the P.sup.+ high concentration impurity diffusion regions 14-1 and 14-2 are selectively formed in the N-well 3. The P.sup.+ high concentration impurity diffusion regions 14-1 and 14-2 self-align with the third gate structure. After that, rapid thermal annealing (RTA) is performed in a nitrogen (N.sub.2) atmosphere at temperature of 1050.degree. C. for 10 seconds, and thus activates the P-type impurity of the P.sup.− low concentration impurity diffusion regions 8-1 and 8-2, and the P.sup.+ high concentration impurity diffusion regions 14-1 and 14-2 in the N-well 3, the N-type impurity of the N− low concentration impurity diffusion regions 9-1 and 9-2, and the N+ high concentration impurity diffusion region 13-1 and 13-2 in the P-well 4, and the N-type impurity of N.sup.+ high concentration impurity diffusion region 13-3, 13-4 and 13-5 in the P-well 5.

As shown in FIG. 15, the resist pattern 86 is removed by a known method. Subsequently, the first interlayer insulating film 15 is formed by a CVD method above the P-type single crystal semiconductor substrate 1, that is, over the field oxide film 2, the third and fourth gate structures, the N.sup.+ high concentration impurity diffusion regions 13-1, 13-2, 13-3, 13-4 and 13-5, and the P.sup.+ high concentration impurity diffusion regions 14-1 and 14-2. The surface of this first interlayer insulating film 15 is flattened by a CMP (Chemical Mechanical Polishing) method. Although this first interlayer insulating film 15 can be formed of various known interlayer insulating film materials, typically, it can be formed of non-doped silicate glass (NSG).

As shown in FIG. 16, a resist pattern is formed on the first interlayer film 15 by known lithography technique. This resist pattern has openings at positions above the P.sup.+ high concentration impurity diffusion regions 14-1 and 14-2, and at positions above the N.sup.+ high concentration impurity diffusion regions 13-1, 13-2 and 13-4. This resist pattern is used as a mask, and the first interlayer insulating film 15 is etched to selectively remove the first interlayer insulating film 15. Thus, the first, second, third, fourth and fifth contact holes 51, 52, 53, 54 and 55 are formed in the first interlayer insulating film 15. The first contact hole 51 reaches the surface of the P.sup.+ high concentration impurity diffusion region 14-1. The second contact hole 52 reaches the surface of the P.sup.+ high concentration impurity diffusion region 14-2. The third contact hole 53 reaches the surface of the N.sup.+ high concentration impurity diffusion region 13-1. The fourth contact hole 54 reaches the surface of the N.sup.+ high concentration impurity diffusion region 13-2. The fifth contact hole 55 reaches the surface of the N.sup.+ high concentration impurity diffusion region 13-4.

As shown in FIG. 17, this resist pattern is removed by a known method. Subsequently, a first conductive film 73 is formed inside the first through fifth contact holes 51, 52, 53, 54 and 55, and on the first interlayer insulating film 15. The first conductive film 73 is completely embedded inside the first through fifth contact holes 51, 52, 53, 54 and 55. The first conductive film 73 can be formed of known layer structure and a known material. For example, the first conductive film 73 can be composed of a lamination of a titanium layer that has a thickness of 150 .ANG. and formed by a CVD method, a titanium nitride layer that has a thickness of 200 .ANG. and formed on this titanium layer by a CVD method, and a tungsten layer that has a thickness of 4000 .ANG. and formed on this titanium nitride layer by a CVD method.

As shown in FIG. 18, the first conductive film 73 is etched back by CMP, thus, a portion of the first conductive film 73 that extends on the surface of the first interlayer insulating film 15 is removed. On the other hand, portions of the first conductive film 73 inside the first through fifth contact holes 51, 52, 53, and 54 and 55 remain, thus, the first through fifth conductive contact plugs 16, 17, 18, 19 and 20 are formed inside the first through fifth contact holes 51, 52, 53, 54 and 55, respectively. The first conductive film 16 is in electrical contact with the P.sup.+ high concentration impurity diffusion region 14-1. The second conductive film 17 is in electrical contact with the P.sup.+ high concentration impurity diffusion region 14-2. The third conductive film 18 is in electrical contact with the N.sup.+ high concentration impurity diffusion region 13-1. The fourth conductive film 19 is in electrical contact with the N.sup.+ high concentration impurity diffusion region 13-2. The fifth conductive film 20 is in electrical contact with the N.sup.+ high concentration impurity diffusion region 13-4. The top surfaces of the first through fifth conductive contact plugs 16, 17, 18, 19 and 20, and the top surface of the first interlayer insulating film 15 define one flat surface.

As shown in FIG. 19, the second interlayer insulating film 21 is formed over the first through fifth conductive contact plugs 16, 17, 18, 19 and 20, and the first interlayer insulating film 15, by a plasma CVD (Plasma Enhanced Chemical Vapor Deposition) method. This second interlayer insulating film 21 can have a multilayer structure, or a single-layer structure. The multilayer structure can be composed of a TEOS-NSG (Tetraethoxysilane Non-Doped Silicate Glass) film that has a thickness of 1500 .ANG. and is formed by plasma CVD, a silicon nitride layer has a thickness of 1000 .ANG. and is formed on this TEOS-NSG film by plasma CVD, an O3-TEOS-NSG film that has a thickness of 1500 .ANG. and is formed on this silicon nitride layer by low pressure CVD, and, on this O3-TEOS-NSG film, an O3-TEOS-NSG film that has a thickness of 1500 .ANG. and is formed by high pressure CVD. The aforementioned single layer structure can be formed of a TEOS-NSG film that has a thickness of 4000 .ANG. and is formed by plasma CVD. Subsequently, this NSG film may be annealed at 700.degree. C. in a nitrogen atmosphere for 30 minutes.

As shown in FIG. 20, a resist pattern is formed on the second interlayer film 21 by known lithography technique. This resist pattern has openings at positions above the N.sup.+ high concentration impurity diffusion regions 13-3 and 13-5. This resist pattern is used as a mask, and the second interlayer insulating film 21 and the first interlayer insulating film 15 are etched to selectively remove the second interlayer insulating film 21 and the first interlayer insulating film 15. Thus, the sixth and seventh contact holes 56 and 57 are formed in the second interlayer insulating film 21 and the first interlayer insulating film 15. The sixth contact hole 56 reaches the surface of the N.sup.+ high concentration impurity diffusion region 13-3. The seventh contact hole 57 reaches the surface of the N.sup.+ high concentration impurity diffusion region 13-5.

As shown in FIG. 21, this resist pattern is removed by a known method. Subsequently, a second conductive film 74 is formed inside the sixth and seventh contact holes 56 and 57, on the second interlayer insulating film 21. The second conductive film 74 is completely embedded inside the sixth and seventh contact holes 56 and 57. The second conductive film 74 can be formed of known layer structure and a known material. For example, the second conductive film 74 can be composed of a lamination of a titanium layer that has a thickness of 150 .ANG. and formed by a CVD method, a titanium nitride layer that has a thickness of 200 .ANG. and formed on this titanium layer by a CVD method, and a tungsten layer that has a thickness of 6000 .ANG. and formed on this titanium nitride layer by a CVD method.

As shown in FIG. 22, the second conductive film 74 is etched back by CMP, thus, a portion of the second conductive film 74 that extends on the surface of the second interlayer insulating film 21 is removed. On the other hand, portions of the second conductive film 74 inside the sixth and seventh contact holes 56 and 57 remain, thus, the sixth and seventh conductive contact plugs 22 and 23 are formed inside the sixth and seventh conductive contact plugs 22 and 23, respectively. The sixth conductive film 22 is in electrical contact with the N.sup.+ high concentration impurity diffusion region 13-3. The seventh conductive film 23 is in electrical contact with the N.sup.+ high concentration impurity diffusion region 13-5. The top surfaces of the sixth and seventh conductive contact plugs 22 and 23, and the top surface of the second interlayer insulating film 21 define one flat surface.

As shown in FIG. 23, a third conductive film 75 is formed over the sixth and seventh conductive contact plug 22, 23, and second interlayer insulating film 21 by a sputtering method. A CVD method may be used instead of this sputtering method. This third conductive film 75 can be composed of a known layer structure for lower electrode of capacitor. Specifically, it can have a multilayer structure, or a single-layer structure. This multilayer structure can have a TiAN layer that has a thickness of 500 .ANG. and is formed by a sputtering method, an Ir layer that has a thickness of 1000 .ANG. and is formed on this TiAN layer by a the sputtering method, an IrO.sub.2 layer that has a thickness of 1000 .ANG. and is formed on this Ir layer by a sputtering method, and a Pt layer that has a thickness of 500 .ANG. and is formed on this IrO.sub.2 layer by a sputtering method. In this structure, the TiAN layer comprises a conductive oxidation barrier layer. In order to prevent reaction between Ir of the Ir layer and Pt of the Pt layer, the IrO.sub.2 layer is interposed between both these layers. The aforementioned single layer structure can be composed of a Pt layer that is formed by a sputtering method.

As shown in FIG. 24, a first dielectric film 76 is formed on the aforementioned third conductive film 75. This first dielectric film 76 may be formed by annealing a dielectric film at a temperature of 700 to 750.degree. C. after the dielectric film is formed by a spin coating method. A CVD method can be used instead of the spin coating method. The first dielectric film 76 is preferably formed of a ferroelectric metal oxide film. More specifically, the first dielectric film 76 is preferably formed of SBT with thickness of 1200 .ANG. However, the first dielectric film 76 may be formed of a high dielectric instead of the ferroelectric.

As shown in FIG. 25, a fourth dielectric film 77 is formed on the aforementioned first conductive film 76 by a sputtering method. A CVD method may be used instead of this sputtering method. This fourth conductive film 77 can be composed of a known layer structure for upper electrode of capacitor. Typically, the fourth dielectric film 77 is preferably formed of a Pt film with thickness of 1500 .ANG. A laminated structure of the third conductive film 75, the first dielectric film 76, and the fourth conductive film 77 has stress. Particularly, since the Pt film that is formed on the ferroelectric metal oxide film has relatively large stress, it is preferable to relieve the stress by thermal treatment. For this reason, annealing is performed at temperature of 700.degree. C. in an oxygen atmosphere for one minute, thus, it is possible to relieve stress.

The above processes are the same as the aforementioned first embodiment, and thus have been described again with reference to the drawings in the aforementioned first embodiment. On the other hand, the following processes are partially different, and thus will be described again with reference to the drawings in this embodiment.

Figure 49:
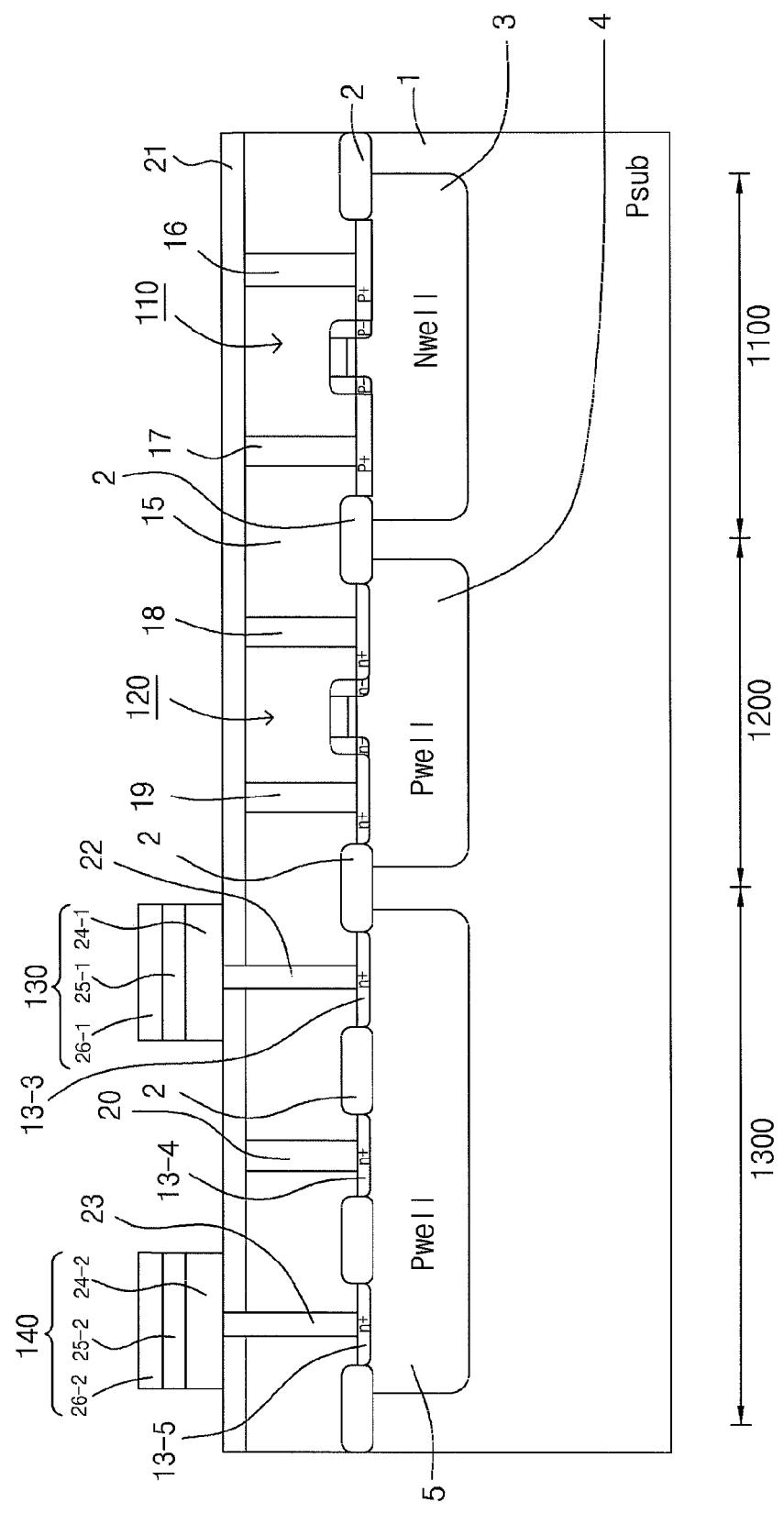
FIG. 49 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.
Figure 50:
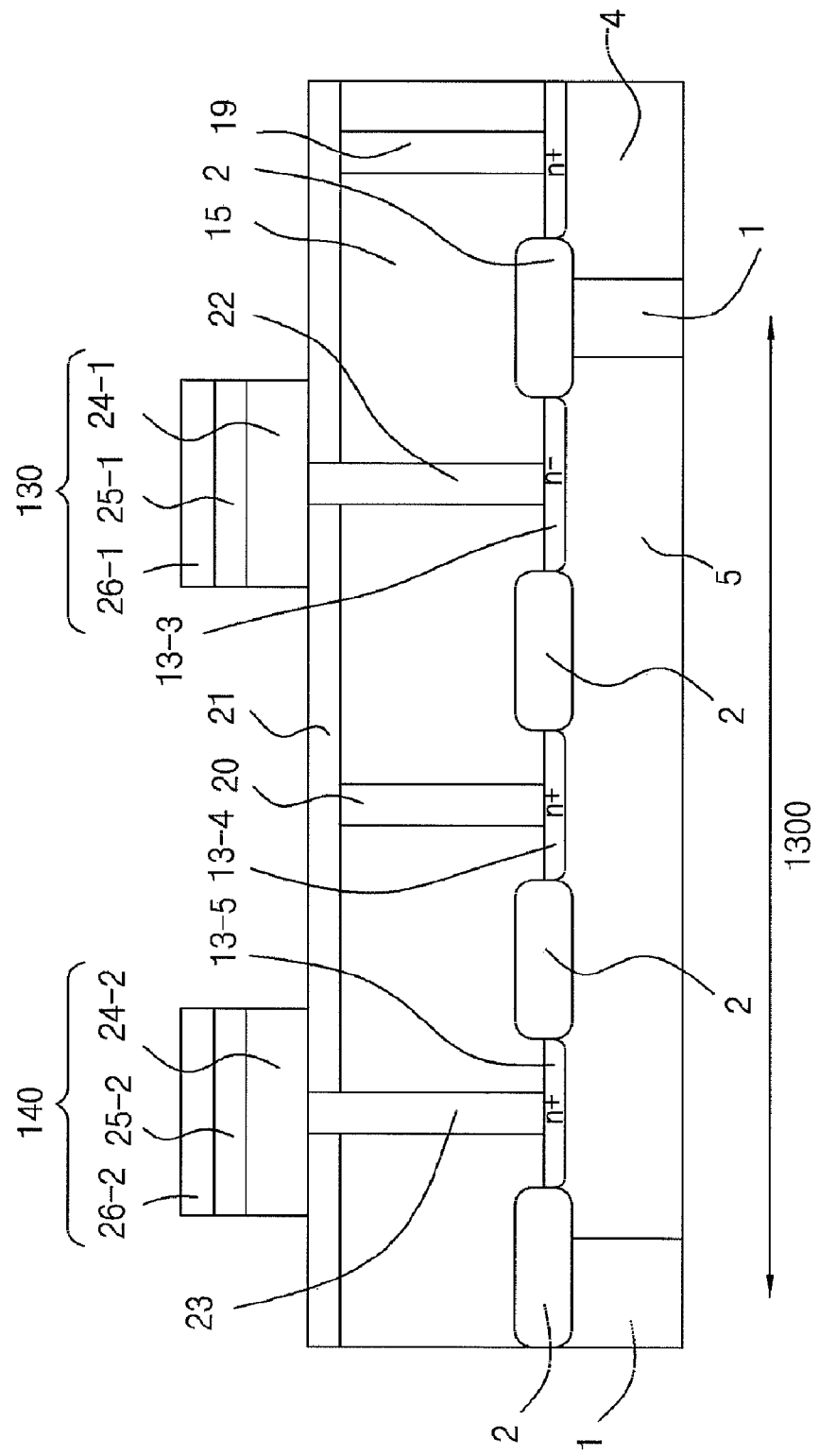
FIG. 50 is a partially enlarged vertical cross-sectional view of the pair of FeRAM cells shown in FIG. 49.

As shown in FIGS. 49 and 50, a layer that serves as a hard mask is formed on the fourth conductive film 77. Specifically, a TiN film with thickness of 1000 .ANG. is formed on the fourth conductive film 77. In addition, a TEOS (Tetraethoxysilane) film with thickness of 4000 .ANG. is formed on this TiN film by Plasma CVD. Additionally, a TiN film with thickness of 1000 .ANG. is formed on this TEOS film, thus, a three-layer structure is formed. This three-layer structure forms a layer that serves as a hard mask. Furthermore, a resist pattern is formed on the three-layer structure by known lithography technique. This resist pattern is used as a mask, and this three-layer structure is etched, thus, a hard mask is formed. Subsequently, the resist pattern is removed by a known method. After that, the formed hard mask is used, and the laminated structure that is composed of the third conductive film 75, the first dielectric film 76 and the fourth conductive film 77 is selectively etched. Thus, the first and second capacitors 130 and 140 are formed.

The first capacitor 130 is composed of the first lower electrode 24-1, the first ferroelectric metal oxide film 25-1 on this first lower electrode 24-1, and the first upper electrode 26-1 on the first ferroelectric metal oxide film 25-1. The first lower electrode 24-1 is electrically connected to the N.sup.+ high concentration impurity diffusion region 13-3 through the sixth conductive contact plug 22. The first lower electrode 24-1 serves as the accumulation electrode. The first ferroelectric metal oxide film 25-1 serves as the capacitor insulating film. The first upper electrode 26-1 serves as the counter electrode.

The second capacitor 140 is composed of the first lower electrode 24-2, the second ferroelectric metal oxide film 25-2 on this first lower electrode 24-2, and the second upper electrode 26-2 on the second ferroelectric metal oxide film 25-2. The second lower electrode 24-2 is electrically connected to the N.sup.+ high concentration impurity diffusion region 13-5 through the seventh conductive contact plug 23. The second lower electrode 24-2 serves as the accumulation electrode. The second ferroelectric metal oxide film 25-2 serves as the capacitor insulating film. The second upper electrode 26-2 serves as the counter electrode. After that, the spent hard mask is removed by a known method.

Figure 51:
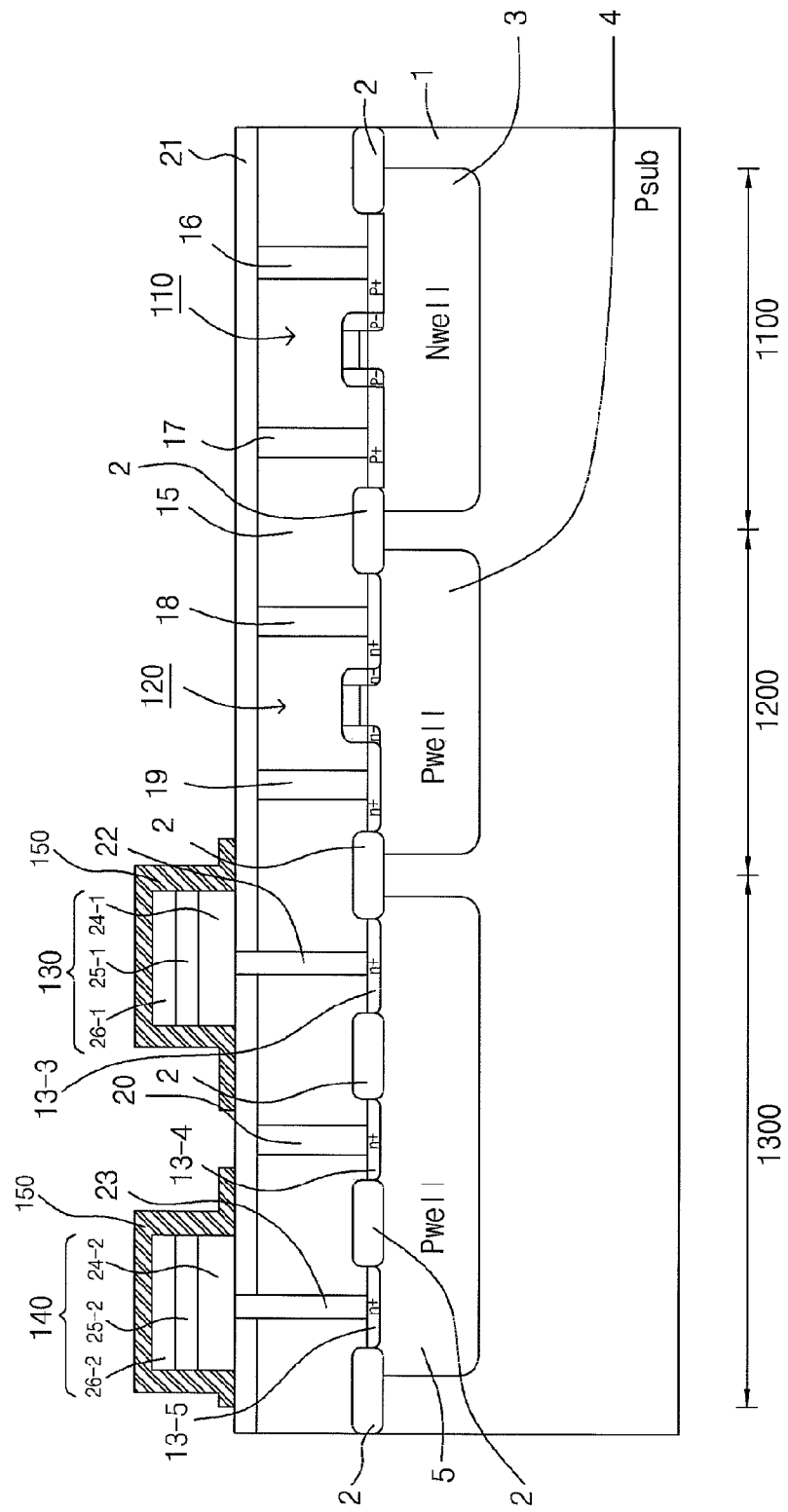
FIG. 51 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.
Figure 52:
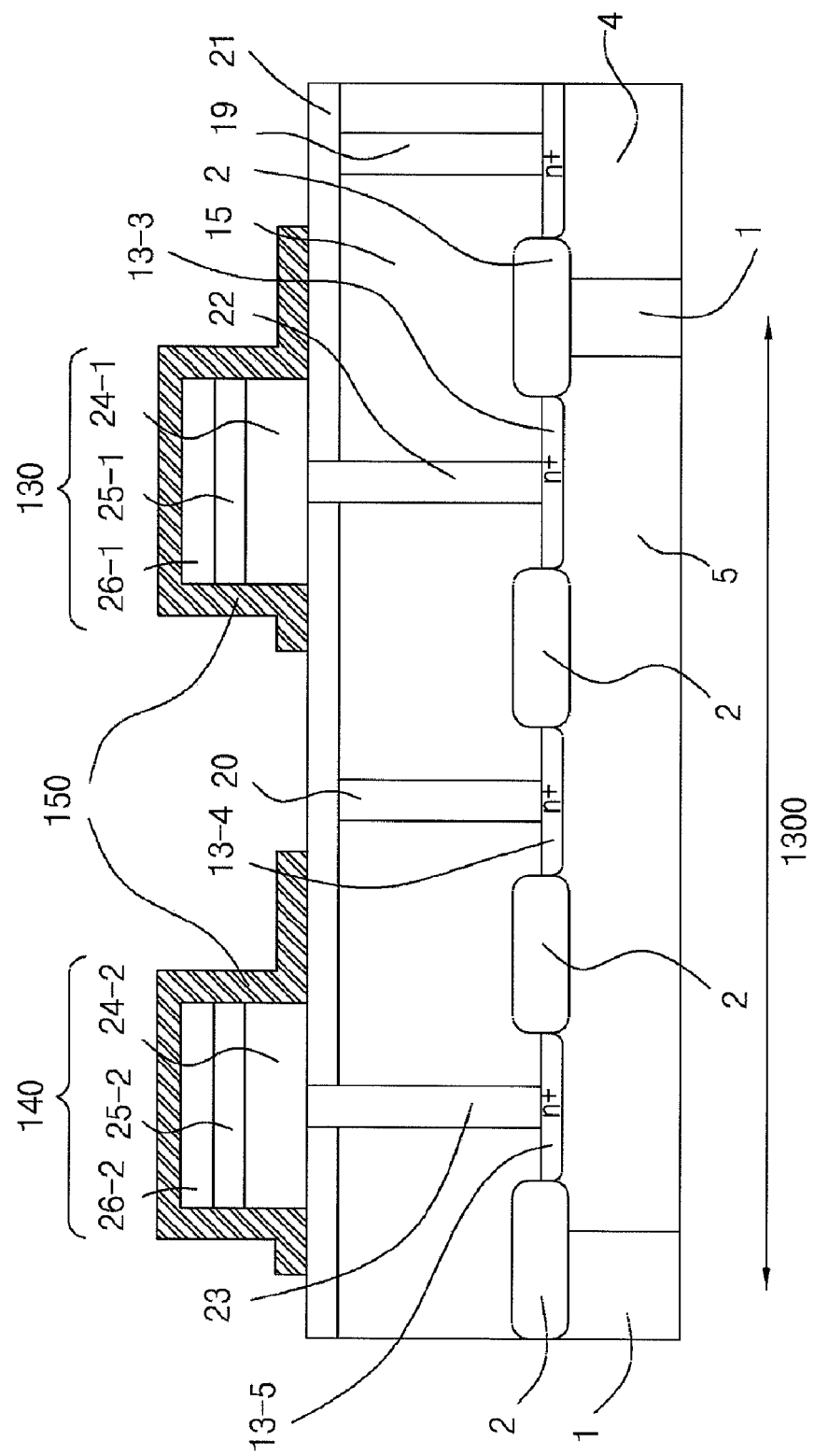
FIG. 52 is a partially enlarged vertical cross-sectional view of the pair of FeRAM cells shown in FIG. 51.

As shown in FIGS. 51 and 52, the insulating hydrogen barrier film that has electrical insulation and impermeability to hydrogen is formed on the second interlayer insulating film 21, and the respective surfaces of the first and second capacitors 130 and 140 by CVD. This insulating hydrogen barrier film is preferably composed of an alumina ($Al_2O_3$) or STO ($SrTiO_3$) film. For example, this insulating hydrogen barrier film can be formed of alumina ($Al_2O_3$) with thickness of 500 .ANG. In addition, a TEOS film with thickness of 500 .ANG. is formed on this insulating hydrogen barrier film by Plasma CVD. Additionally, a resist pattern is formed on the TEOS film by known lithography technique. This resist pattern is used as a mask, and this TEOS film is etched, thus, a hard mask is formed. Subsequently, the resist pattern is removed by a known method. After that, the formed hard mask is used, and the alumina film is selectively etched. Thus, the first insulating hydrogen barrier layer 150 is formed. This first insulating hydrogen barrier layer 150 covers each surface of the first and second capacitors 130 and 140, and covers a portion of the second interlayer insulating film 21 in the proximity of each outer periphery of the first and second capacitors 130 and 140. After that, the spent hard mask is removed by a known method.

Figure 53:
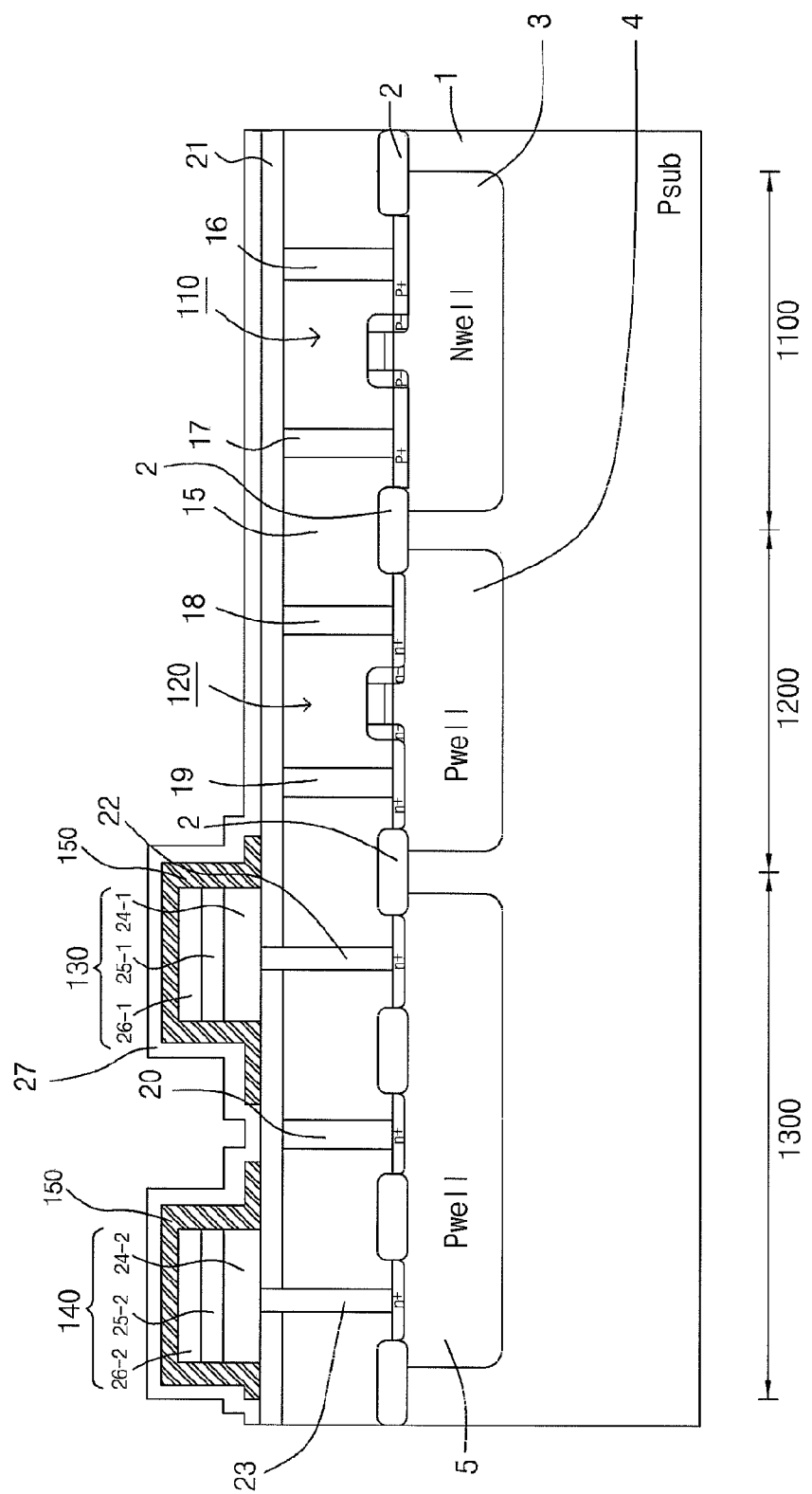
FIG. 53 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.

As shown in FIG. 53, the third interlayer insulating film 27 is formed on the first insulating hydrogen barrier layer 150 and the second interlayer insulating film 21. This third interlayer insulating film 27 can be formed of a TEOS film that has a thickness 2500 .ANG. and is formed by plasma CVD.

Figure 54:
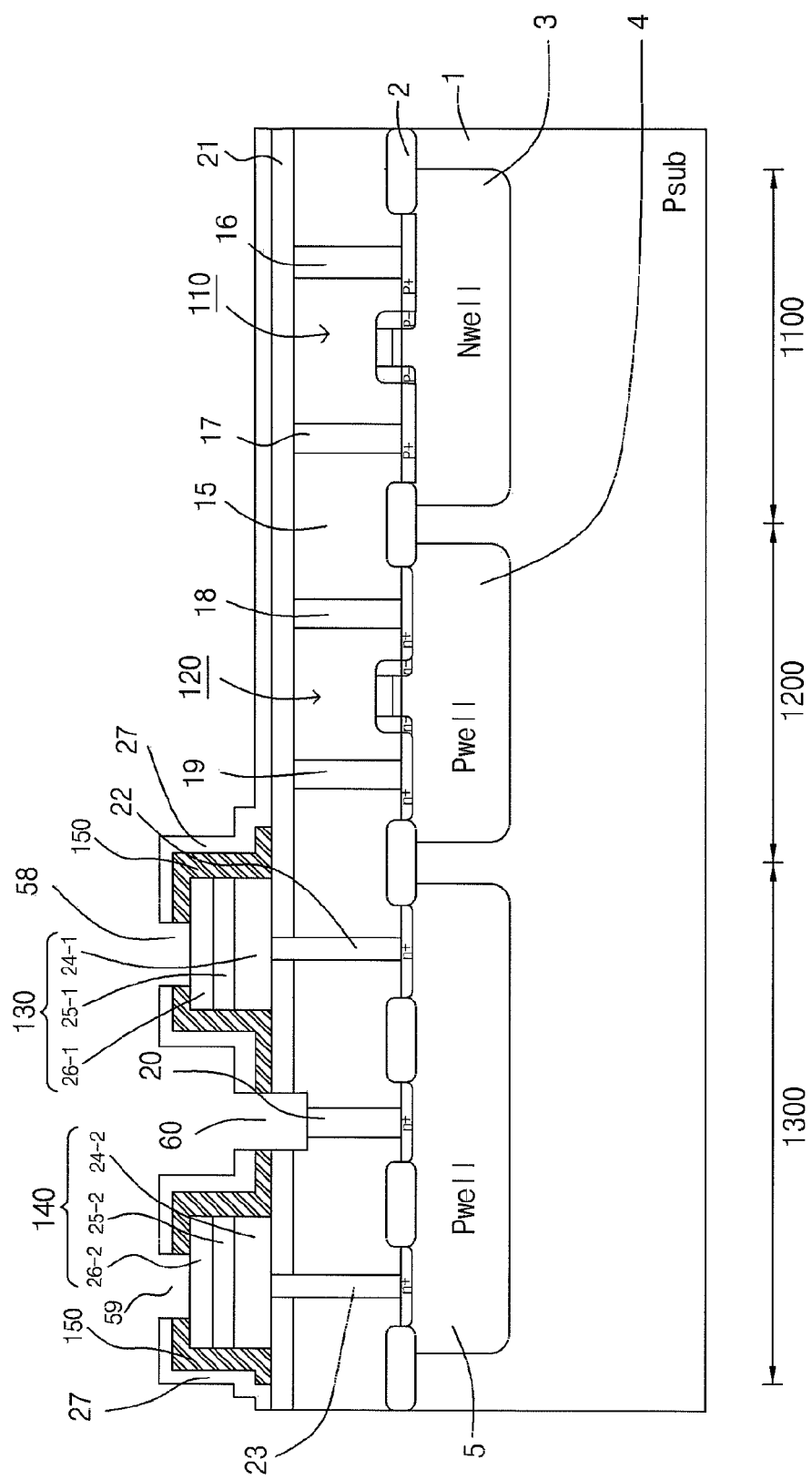
FIG. 54 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.
Figure 55:
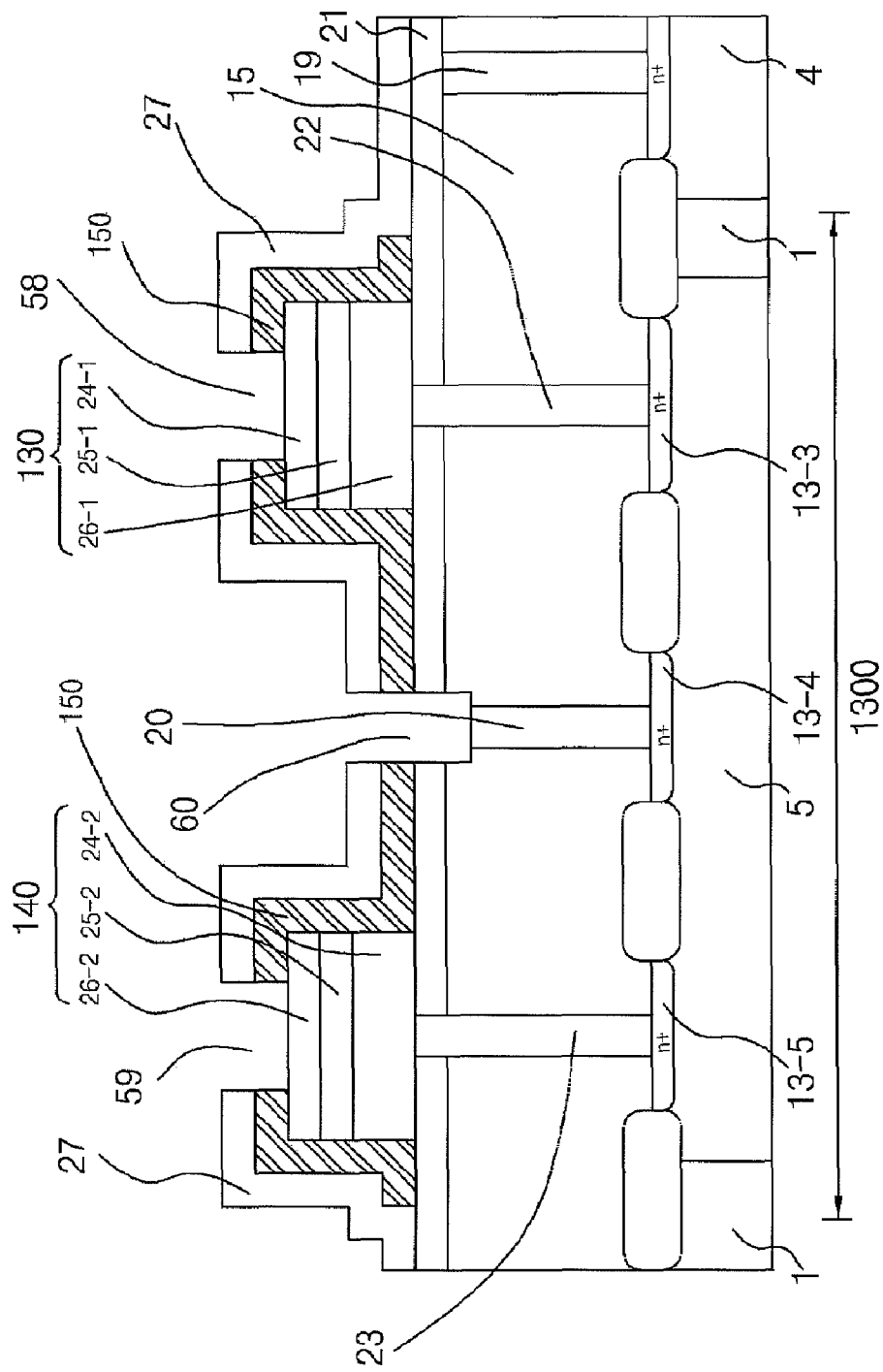
FIG. 55 is a partially enlarged vertical cross-sectional view of the pair of FeRAM cells shown in FIG. 54.

As shown in FIGS. 54 and 55, a resist pattern is formed on the third interlayer film 27 by known lithography technique. This resist pattern has openings above the first and second upper electrode 26-1 and 26-2, and above the fifth conductive contact plug 20. This resist pattern is used as a mask, and the third interlayer insulating film 27 and the upper first insulating hydrogen barrier layer 150 above the first and second upper electrodes 26-1 and 26-2 are selectively etched. In addition, the third interlayer insulating film 27, the upper first insulating hydrogen barrier layer 150 and upper second interlayer insulating film 21 above the fifth conductive contact plug 20 and the periphery thereof are selectively etched. Additionally, an upper portion of the first insulating hydrogen barrier layer 150 above the fifth conductive contact plug 20 and the periphery thereof is selectively etched. Thus, the eighth contact hole 58 that penetrates the third interlayer insulating film 27 and is formed above the first upper electrode 26-1. In addition, the ninth contact hole 59 that penetrates the third interlayer insulating film 27 and the first insulating hydrogen barrier layer 150 is formed above the second upper electrode 26-2. Additionally, the tenth contact hole 60 that penetrates the third interlayer insulating film 27, the first insulating hydrogen barrier layer 150 and the second interlayer insulating film 21, and reaches the top of the fifth conductive contact plug 20 and the periphery of the first interlayer insulating film 15 is formed above fifth conductive contact plug 20. As a result, the upper surface of the first upper electrode 26-1 is partially exposed through the eighth contact hole 58. The upper surface of the second upper electrode 26-2 is partially exposed through the ninth contact hole 59. Moreover, the upper portion of the fifth contact plug 20 is exposed through the tenth contact hole 60. Subsequently, the resist pattern is removed by a known method.

Figure 56:
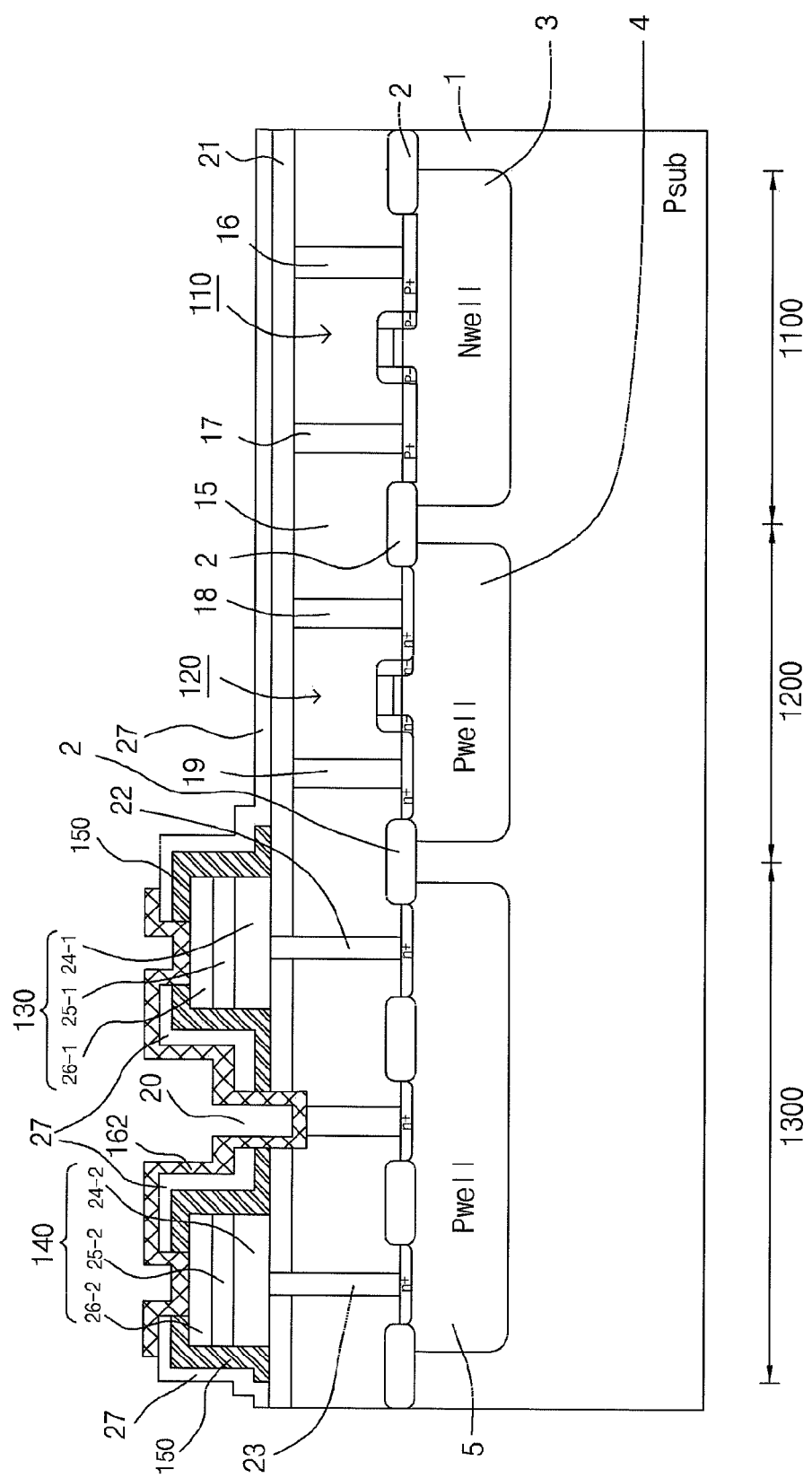
FIG. 56 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.
Figure 57:
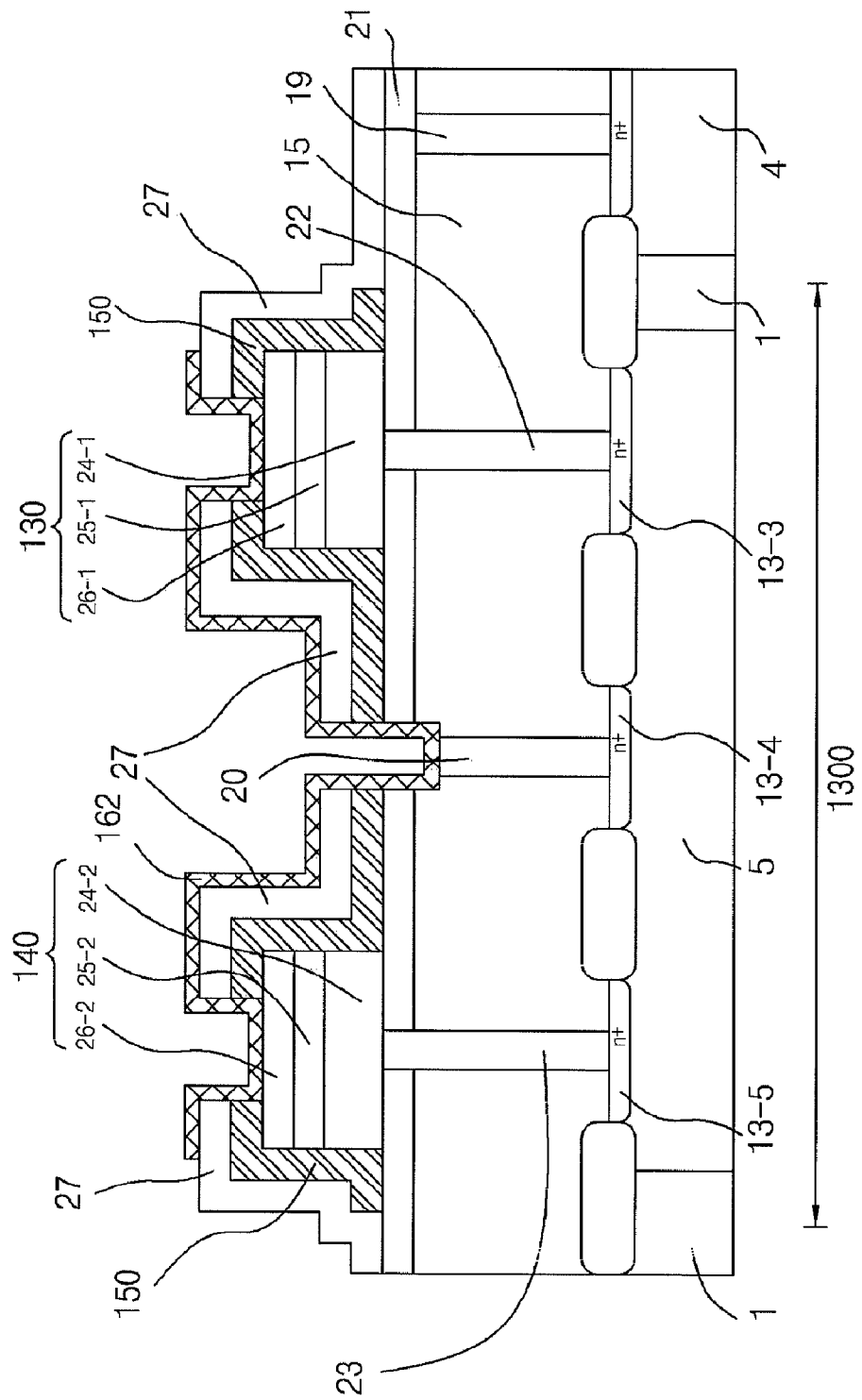
FIG. 57 is a partially enlarged vertical cross-sectional view of the pair of FeRAM cells shown in FIG. 56.

As shown in FIGS. 56 and 57, a layer that has impermeability to hydrogen and conductivity is formed over the third interlayer insulating film 27, and the inside of the eighth, ninth and tenth contact holes 58, 59 and 60. Since this layer is a layer for local interconnection, this layer often has electrical conductivity lower than a layer for global interconnection. In other words, it may be formed of a substance with high electrical resistivity. This layer can be composed of a TiAlN layer with thickness of 2000 .ANG., for example. In the case where this layer is formed in a reducing atmosphere, hydrogen that is supplied from this reducing atmosphere is diffused into the upper parts of the first and second upper electrodes 26-1 and 26-2 through the aforementioned eighth and ninth contact holes 58 and 59. A CVD method is performed in a reducing atmosphere. Accordingly, in the case where this layer is formed by a CVD method, hydrogen that is supplied from a reducing atmosphere is diffused into the upper parts of the first and second upper electrodes 26-1 and 26-2 through the aforementioned eighth and ninth contact holes 58 and 59. For this reason, this layer is formed by a method that does not use a reducing atmosphere, for example, by a sputtering method.

A resist pattern is formed on the TiAlN layer for local interconnection by a known lithography technique. This resist pattern has an opening over the first and second upper electrode 26-1 and 26-2, and a region the first and second upper electrode 26-1 and 26-2. This resist pattern is used as a mask, and the TiAlN layer for local interconnection is selectively etched. Thus, the first hydrogen non-permeable local interconnection layer 162 is formed. the first hydrogen non-permeable local interconnection layer 162 extends over the first and second upper electrode 26-1 and 26-2, and the region the first and second upper electrode 26-1 and 26-2, and extends inside the eighth, ninth and tenth contact holes 58, 59 and 60. This first hydrogen non-permeable local interconnection layer 162 is in contact with the first upper electrode 26-1 of the first capacitor 130 in the eighth contact hole 58. This first hydrogen non-permeable local interconnection layer 162 is in contact with the second upper electrode 26-2 of the second capacitor 140 in the ninth contact hole 59. This first hydrogen non-permeable local interconnection layer 162 is in contact with the fifth conductive contact plug 20 in the tenth contact hole 60. In addition, the first hydrogen non-permeable local interconnection layer 162 is electrically connected to the $N^+$ high concentration impurity diffusion region 13-4 through the fifth conductive contact plug 20.

As discussed above, this $N^+$ high concentration impurity diffusion region 13-4 comprises one of the source/drain regions of the switching transistor that is provided between the plate line as the global interconnection, and the local interconnection. Thus, the first hydrogen non-permeable local interconnection layer 162 is electrically connected to this switching transistor through this fifth conductive contact plug 20. That is, the first hydrogen non-permeable local interconnection layer 162 provides electrical connection between the counter electrode composed of the first upper electrode 26-1 of the first capacitor 130, and the counter electrode composed of the second upper electrode 26-2 of the second capacitor 140, and provides electrical connection among both counter electrodes and this switching transistor. Accordingly, the respective counter electrodes of the first and second capacitors 130 and 140 are electrically connected to this switching transistor through the first hydrogen non-permeable local interconnection layer 162.

Figure 58:
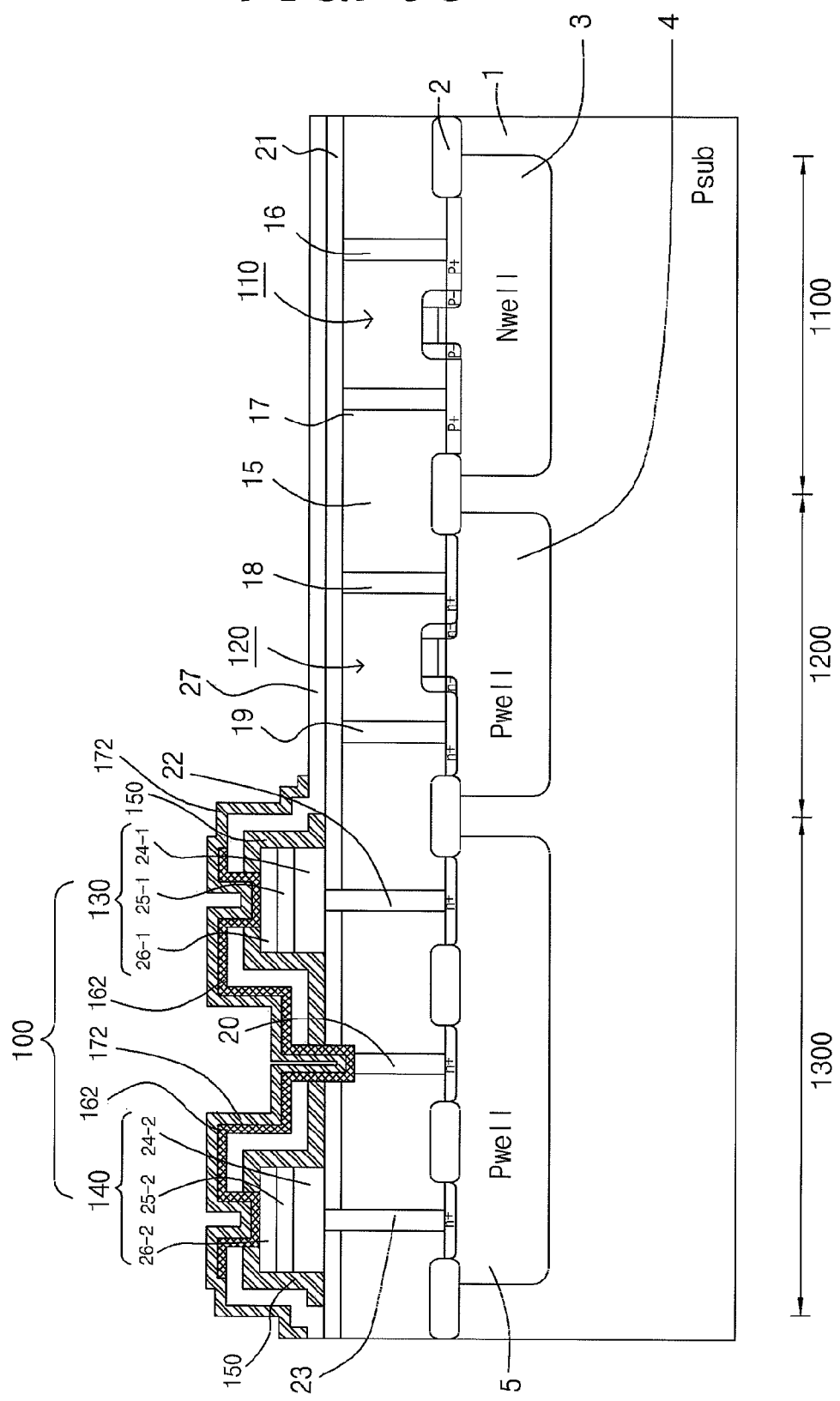
FIG. 58 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.
Figure 59:
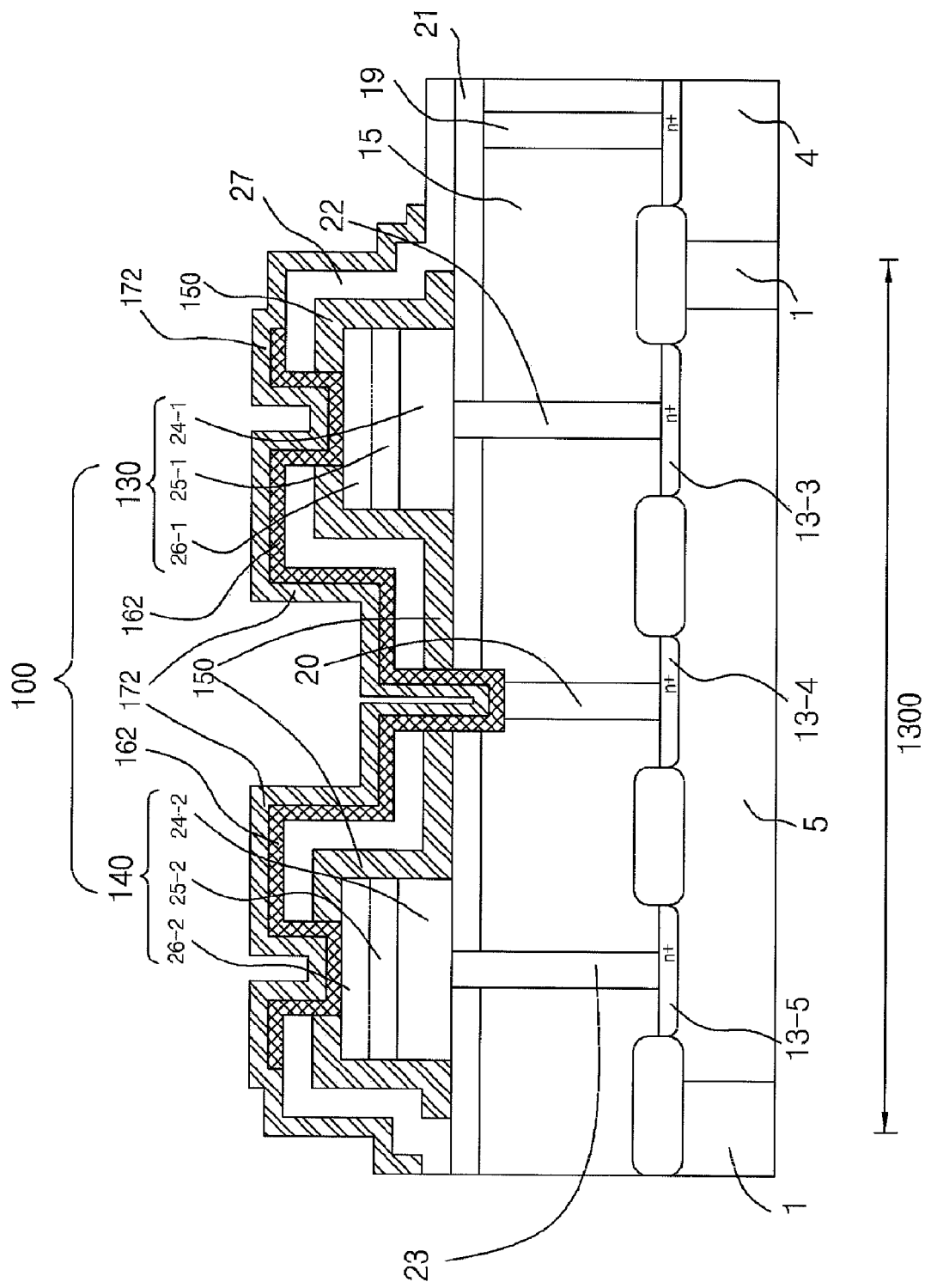
FIG. 59 is a partially enlarged vertical cross-sectional view of the pair of FeRAM cells shown in FIG. 58.

As shown in FIGS. 58 and 59, the insulating hydrogen barrier film that has electrical insulation and impermeability to hydrogen is formed on the first hydrogen non-permeable local interconnection layer 162 and the third interlayer insulating film 27 by CVD. This insulating hydrogen barrier film is preferably composed of an alumina ($Al_2O_3$) or STO ($SrTiO_3$.) film. For example, this insulating hydrogen barrier film can be formed of alumina ($Al_2O_3$) with thickness of 500 .ANG. In addition, a TEOS film with thickness of 500 .ANG. is formed on this insulating hydrogen barrier film by Plasma CVD. Additionally, a resist pattern is formed on the TEOS film by known lithography technique. This resist pattern is used as a mask, and this TEOS film is etched, thus, a hard mask is formed. Subsequently, the resist pattern is removed by a known method. After that, the formed hard mask is used, and the alumina film is selectively etched. Thus, the second insulating hydrogen barrier layer 172 is formed. This second insulating hydrogen barrier layer 172 covers the whole surface of the first hydrogen non-permeable local interconnection layers 162, and covers a portion of the third interlayer insulating film 27 in proximity of the outside of the first hydrogen non-permeable local interconnection layers 162. Accordingly, this second insulating hydrogen barrier layer 172 extends within the third element region 1300, on the first hydrogen non-permeable local interconnection layer 162, and on the portion of the third interlayer insulating film 27 in proximity of the outside of the first hydrogen non-permeable local interconnection layers 162. After that, the spent hard mask is removed by a known method.

As discussed above, this second insulating hydrogen barrier layer 172 has electrical insulation and impermeability to hydrogen. This second insulating hydrogen barrier layer 172 extends over the first hydrogen non-permeable local interconnection layer 162 and the third interlayer insulating film 2, and the whole third element region 1300. Thus, this second insulating hydrogen barrier layer 172 completely covers the whole first hydrogen non-permeable local interconnection layer 162. That is, the whole first hydrogen non-permeable local interconnection layer 162 is covered by the second insulating hydrogen barrier layer 172. In addition, the second insulating hydrogen barrier layer 172 covers a portion of the third interlayer insulating film 27 that is not covered by the first hydrogen non-permeable local interconnection layer 162, and is located adjacent to first insulating hydrogen barrier layer 150.

Figure 60:
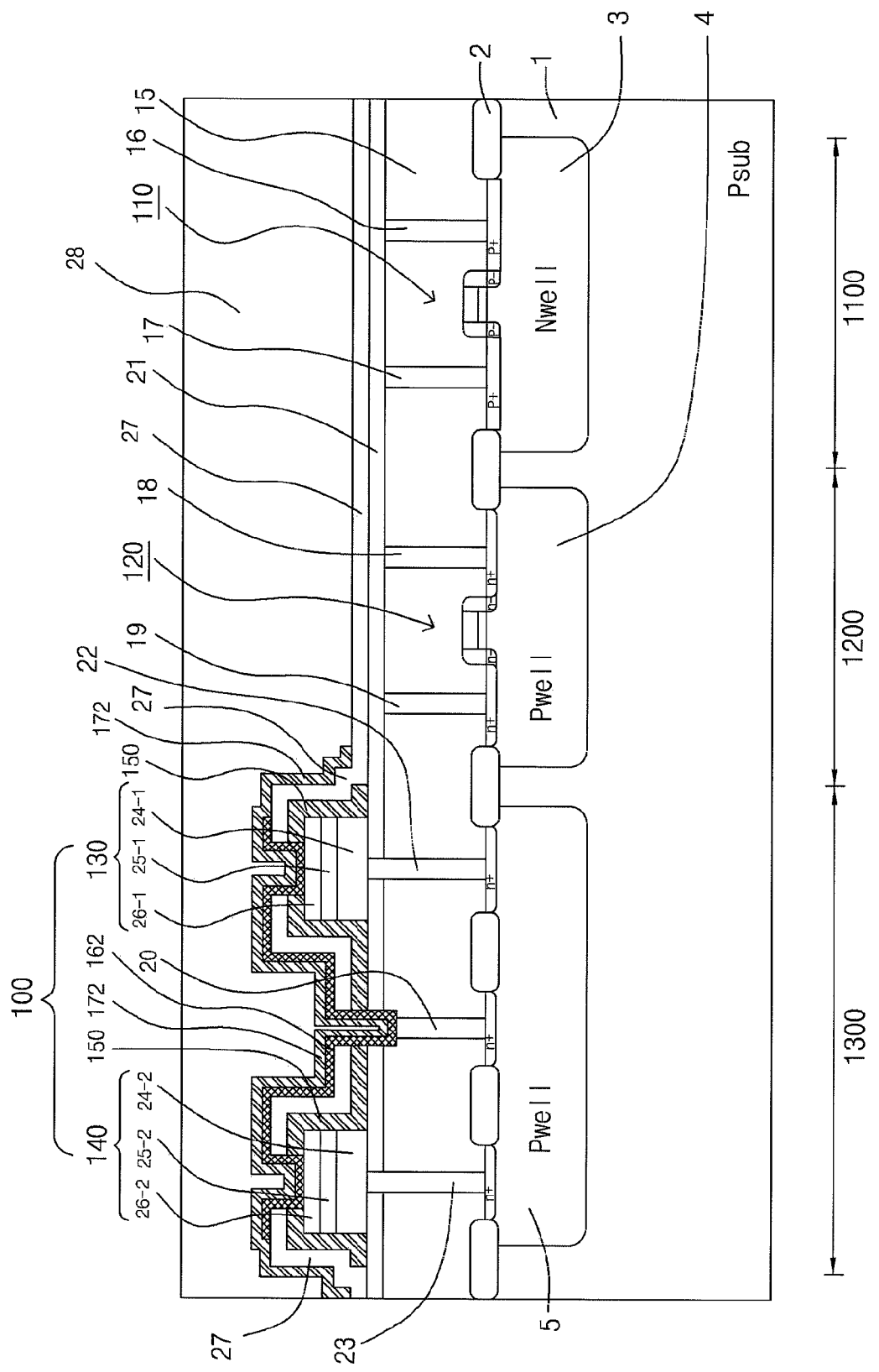
FIG. 60 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.

As shown in FIG. 60, the fourth interlayer insulating film 28 is formed on the second insulating hydrogen barrier layer 172 and the third interlayer insulating film 27. The fourth interlayer insulating film 28 can be formed of a known interlayer insulating film. For example, this fourth interlayer insulating film 28 can be composed of a TEOS film that is formed by plasma CVD and CMP after that.

Figure 61:
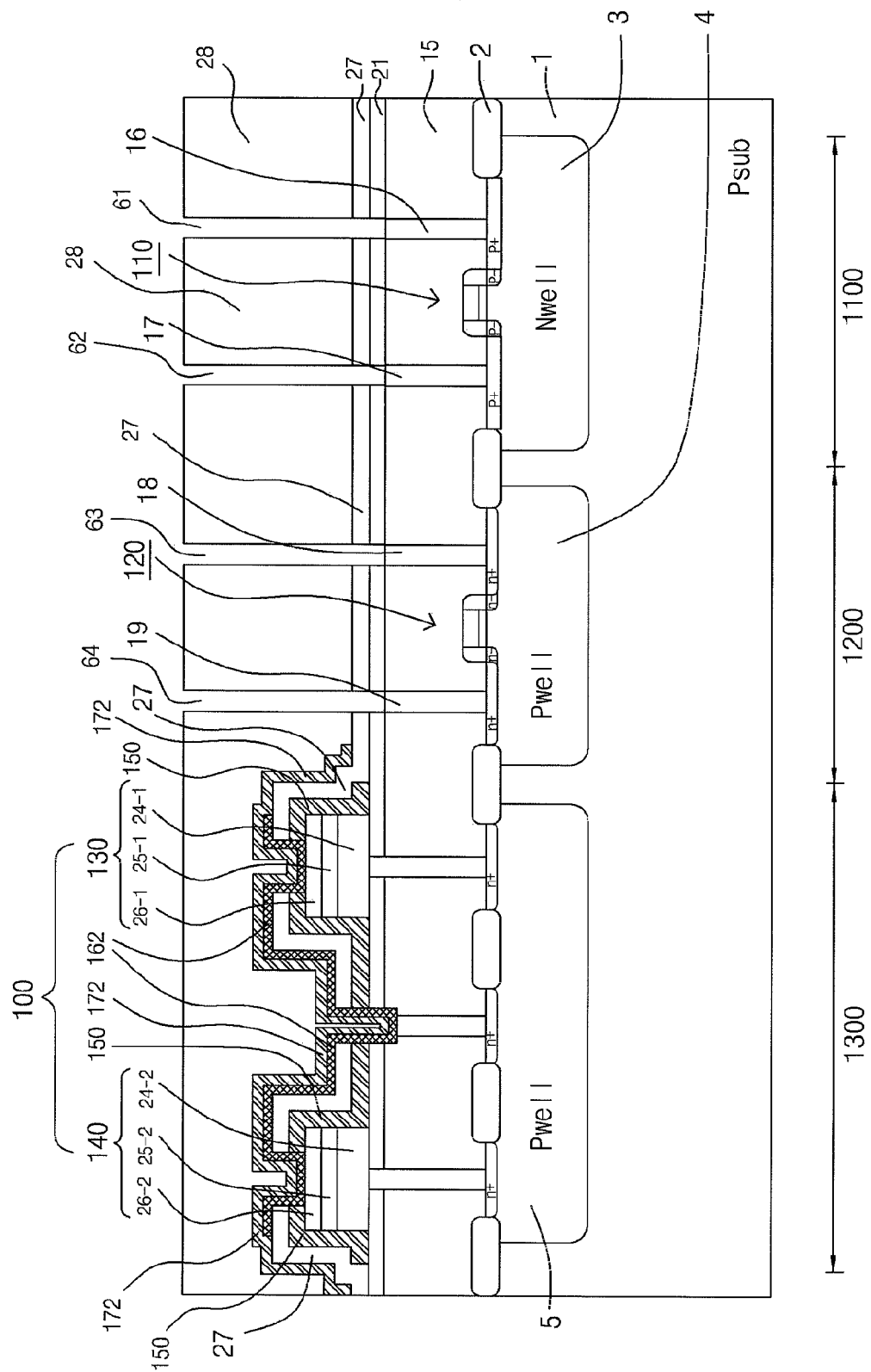
FIG. 61 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.

As shown in FIG. 61, a resist pattern is formed on the fourth interlayer film 28 by known lithography technique. This resist pattern has openings at positions above the first second, third and fourth conductive contact plugs 16, 17, 18 and 19. This resist pattern is used as a mask, and the fourth interlayer insulating film 28, the third interlayer insulating film 27, and the second interlayer insulating film 21 are selectively etched to remove the fourth interlayer insulating film 28, the third interlayer insulating film 27, and the second interlayer insulating film 21. Thus, the eleventh, twelfth, thirteenth and fourteenth contact holes 61, 62, 63 and 64 are formed in the fourth interlayer insulating film 28, the third interlayer insulating film 27, and the second interlayer insulating film 21. The eleventh contact hole 61 reaches the top of the first conductive contact plug 16. The twelfth contact hole 62 reaches the top of the second conductive contact plug 17. The thirteenth contact hole 63 reaches the top of the third conductive contact plug 18. The fourteenth contact hole 64 reaches the top of the fourth conductive contact plug 19.

Figure 62:
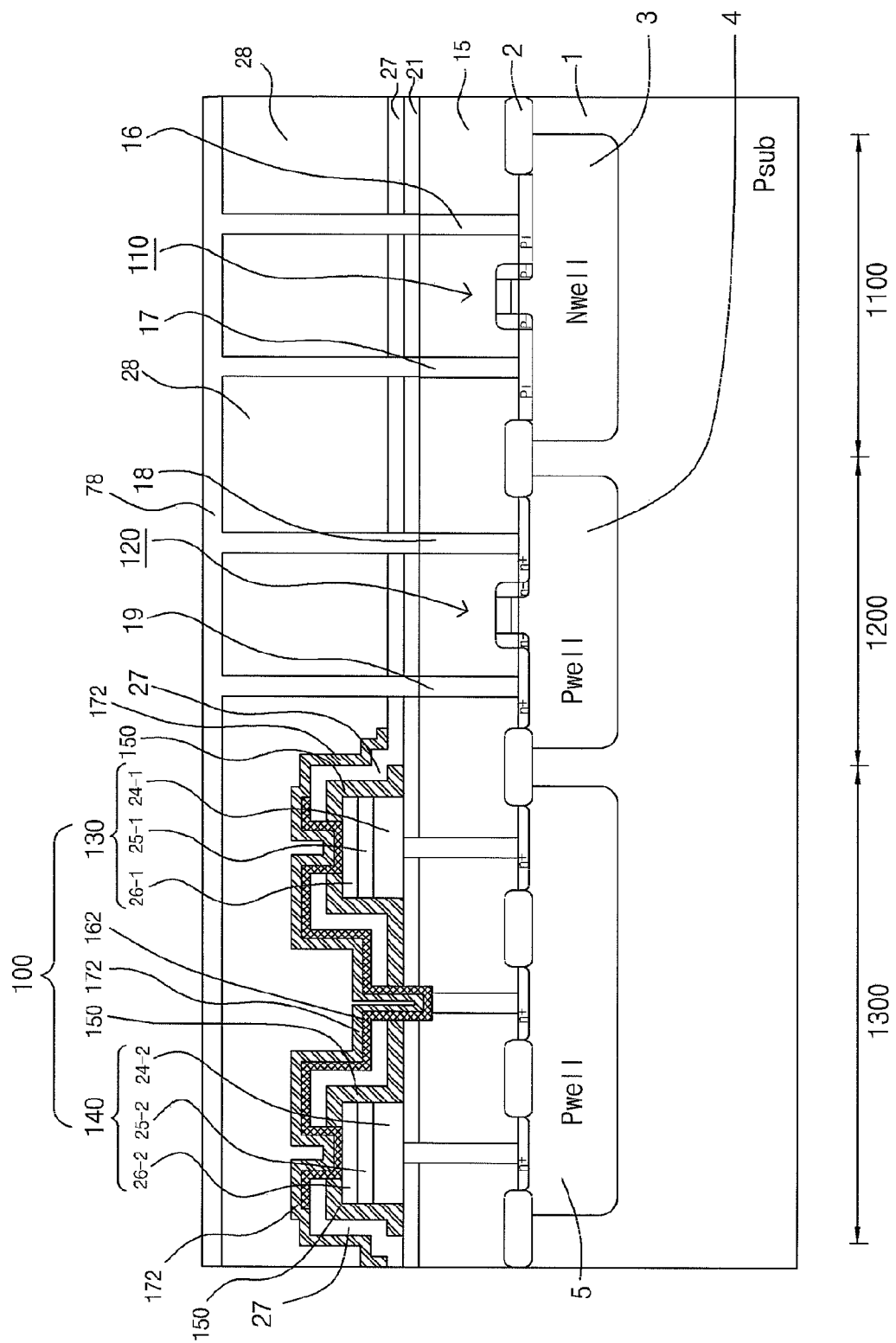
FIG. 62 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.

As shown in FIG. 62, a fifth conductive film 78 is formed inside the eleventh through fourteenth contact holes 61, 62, 63 and 64, and on the fourth interlayer insulating film 28. The fifth conductive film 78 is completely embedded inside the eleventh through fourteenth contact holes 61, 62, 63 and 64. The fifth conductive film 78 can be formed of known layer structure and a known material. For example, the fifth conductive film 78 may be composed of a tungsten layer that is formed by a CVD method.

Figure 63:
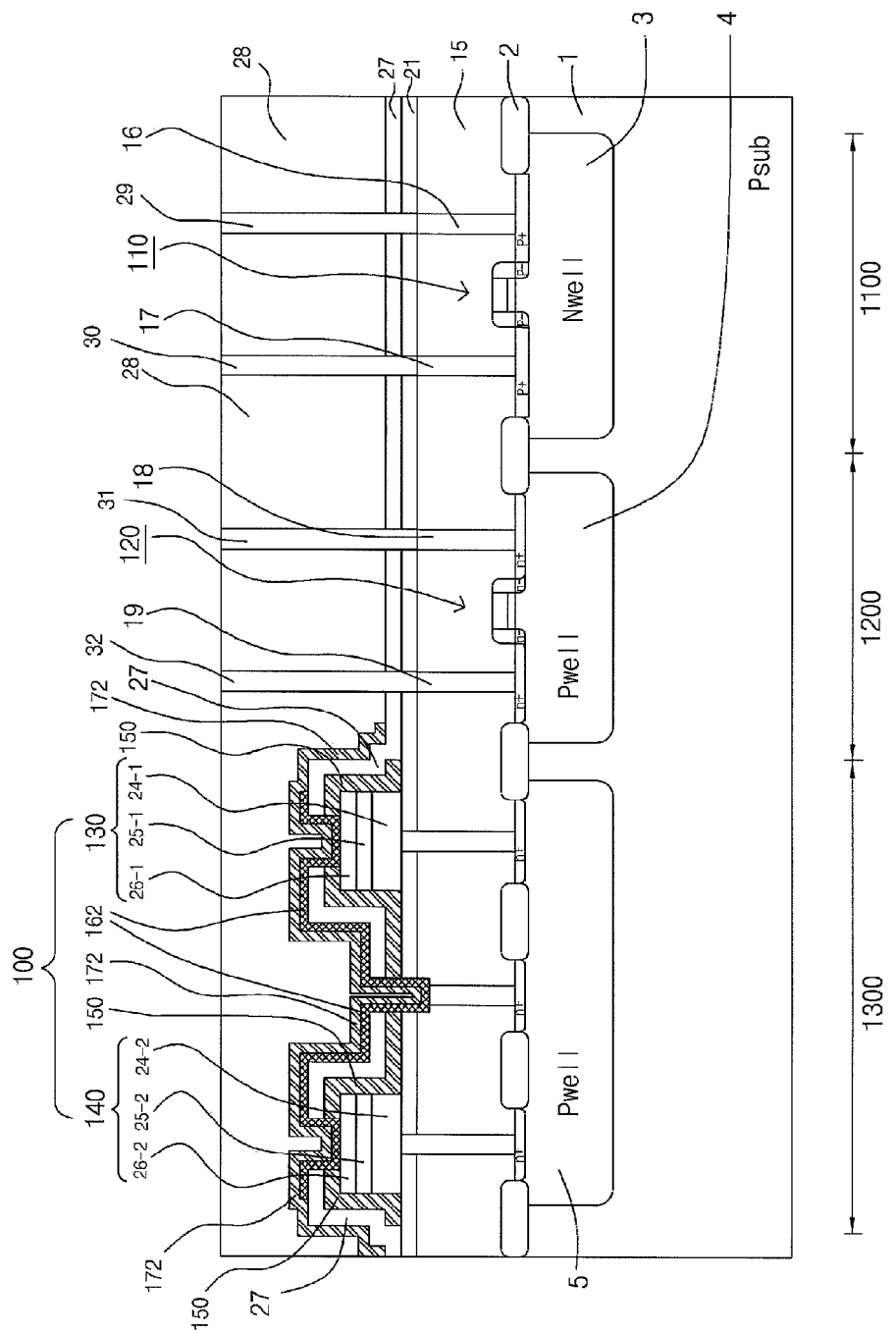
FIG. 63 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.

As shown in FIG. 63, the fifth conductive film 78 is etched back by CMP, thus, a portion of the fifth conductive film 78 that extends on the surface of the fourth interlayer insulating film 28 is removed. On the other hand, portions of the fifth conductive film 78 inside the eleventh through fourteenth contact holes 61, 62, 63 and 64 remain, thus, the eighth through eleventh conductive contact plugs 29, 30, 31 and 32 are formed inside the eleventh through fourteenth contact holes 61, 62, 63 and 64, respectively. The eighth conductive contact plug 29 is electrically connected to the P.sup.+ high concentration impurity diffusion region 14-1 through the first conductive contact plug 16. The ninth conductive contact plug 30 is electrically connected to the P.sup.+ high concentration impurity diffusion region 14-2 through the second conductive contact plug 17. The tenth conductive contact plug 31 is electrically connected to the N.sup.+ high concentration impurity diffusion region 13-1 through the third conductive contact plug 18. The eleventh conductive contact plug 32 is electrically connected to the N.sup.+ high concentration impurity diffusion region 13-2 through the fourth conductive contact plug 19. The top surfaces of the eighth through eleventh conductive contact plugs 29, 30, 31 and 32, and the top surface of the fourth interlayer insulating film 28 define one flat surface.

Figure 64:
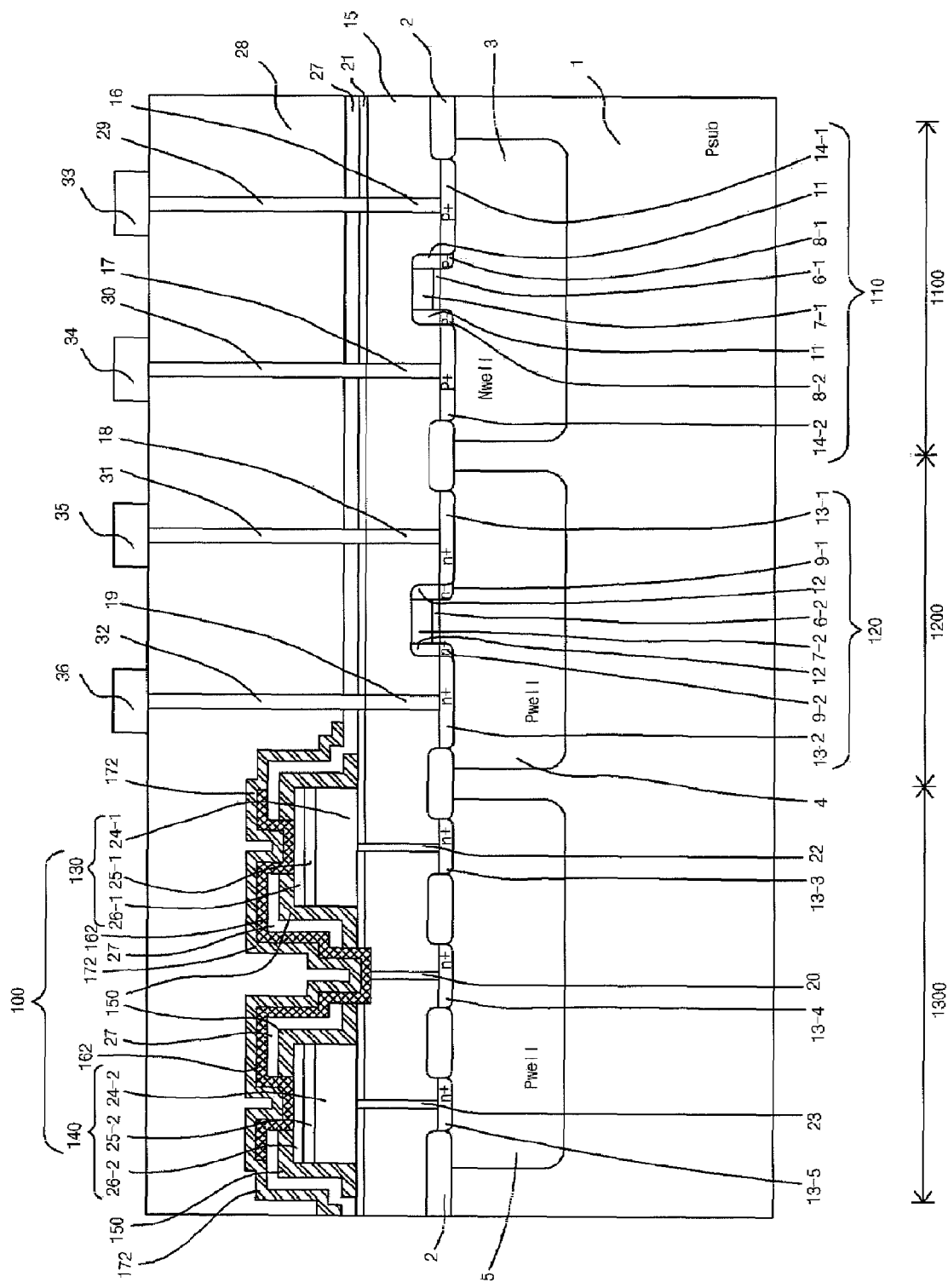
FIG. 64 is a partial vertical cross-sectional view showing one of a series of processes for producing the semiconductor memory device, according to the second embodiment of the present invention, including the pair of FeRAM cells that have the ferroelectric capacitors, and the P-channel and N-channel MOS transistors in the logic circuit.

As shown in FIG. 64, the first, second, third and fourth metal wiring layers 33, 34, 35 and 36 as the first level wiring layer are formed on the fourth interlayer insulating film 28 by a known method. The first metal wiring layer 33 extends on the fourth interlayer insulating film 28 and is in contact with the eighth conductive contact plug 29. The second metal wiring layer 34 extends on the fourth interlayer insulating film 28 and is in contact with the ninth conductive contact plug 30. The third metal wiring layer 35 extends on the fourth interlayer insulating film 28 and is in contact with the tenth conductive contact plug 31. The fourth metal wiring layer 36 extends on the fourth interlayer insulating film 28 and is in contact with the eleventh conductive contact plug 32. The first metal wiring layer 33 is electrically connected to the P.sup.+ high concentration impurity diffusion region 14-1 through the eighth conductive contact plug 29 and the first conductive contact plug 16. The second metal wiring layer 34 is electrically connected to the P.sup.+ high concentration impurity diffusion region 14-2 through the ninth conductive contact plug 30 and the second conductive contact plug 17. The third metal wiring layer 35 is electrically connected to the N.sup.+ high concentration impurity diffusion region 13-1 through the tenth conductive contact plug 31 and the third conductive contact plug 18. The fourth metal wiring layer 36 is electrically connected to the N.sup.+ high concentration impurity diffusion region 13-2 through the eleventh conductive contact plug 32 and the fourth conductive contact plug 19. After that, multilayer wiring structure is formed by a known method. Finally, a passivation film is formed, thus, the semiconductor memory device is produced.

Figure 65:
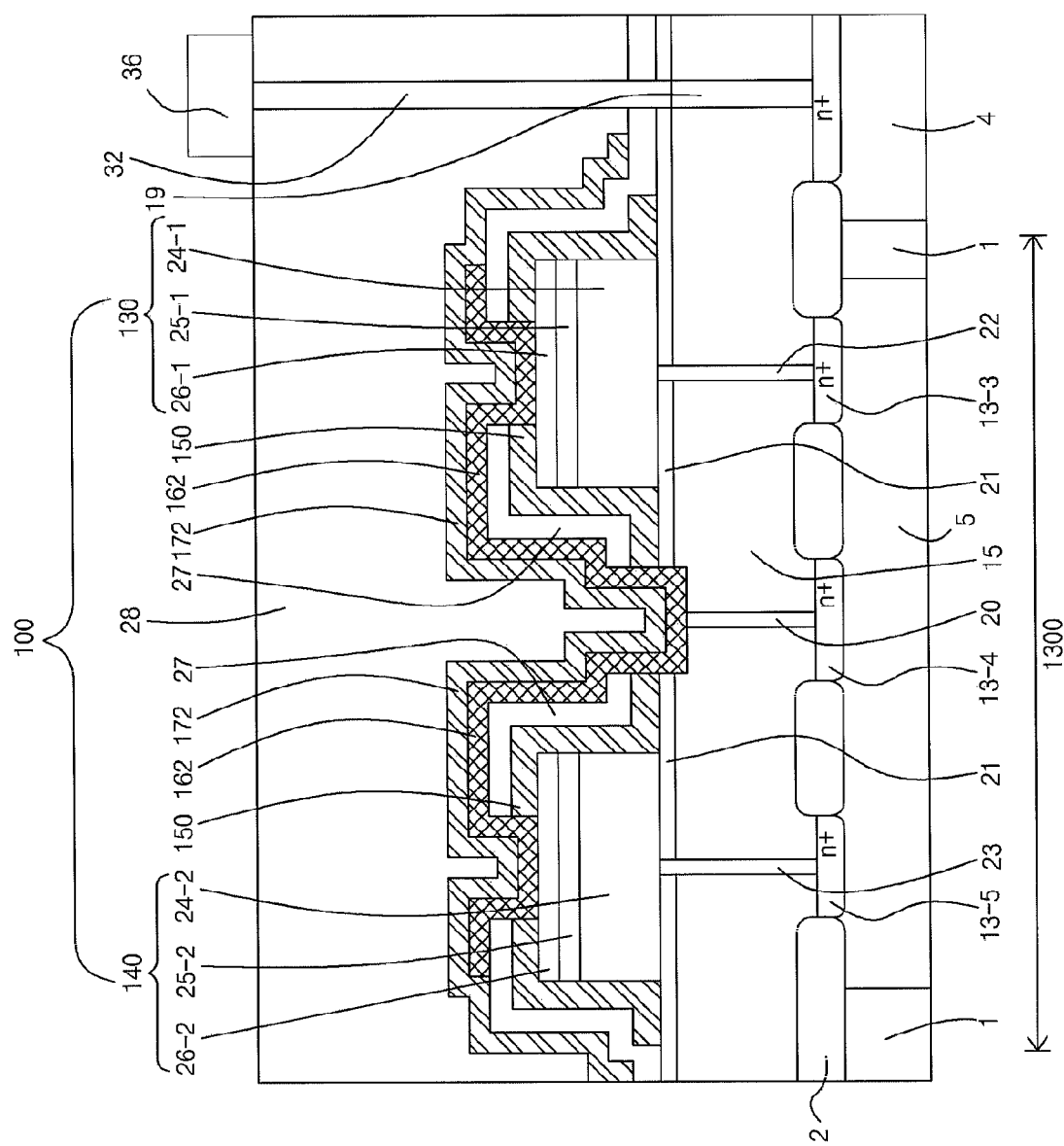
FIG. 65 is a partially enlarged vertical cross-sectional view of the pair of FeRAM cells shown in FIG. 64.

As shown in FIGS. 1 and 65, a pair of FeRAM cells 100 that is included in the semiconductor memory device according to this embodiment discussed above has hydrogen barrier structure that prevents or suppresses exposure of the first and second ferroelectric metal oxide films 25-1 and 25-2 that are included in first and the second capacitors 130 and 140, respectively, to hydrogen that is supplied from a reducing atmosphere and is diffused.

As discussed above, in this embodiment, the third and fourth interlayer insulating films 27 and 28 and eighth through eleventh conductive plugs 29, 30, 31, and 32 are formed by a CVD method after the first and second capacitors 130 and 140 are formed. In addition, the fourth interlayer insulating film 28 and eighth through eleventh conductive plugs 29, 30, 31, and 32 are formed by a CVD method after the first hydrogen non-permeable local interconnection layer 162 and the second insulating hydrogen barrier layer 172 are formed. The CVD process is performed in a reducing atmosphere. Accordingly, it is necessary to prevent that the first and second ferroelectric metal oxide films 25-1 and 25-2 that are included in the first and second capacitors 130 and 140, respectively, are reduced by diffusion of hydrogen that serves as a reducing agent supplied in this CVD process. Since the first and second upper electrodes 26-1 and 26-2 are formed of a substance that have electrical conductivity and hydrogen permeability, e.g., Pt, once hydrogen is diffused into the first and second upper electrodes 26-1 and 26-2, it may be also diffused into the first and second ferroelectric metal oxide films 25-1 and 25-2. Accordingly, it is necessary to prevent that the hydrogen is from diffusing into the first and second upper electrodes 26-1 and 26-2. In addition, it is necessary to prevent that hydrogen from directly entering the first and second ferroelectric metal oxide films 25-1 and 25-2 through respective side surfaces of the first and second ferroelectric metal oxide films 25-1 and 25-2. Additionally, it is preferable that the first and second lower electrodes 24-1 and 24-2 have multilayer structure that includes the lowest layer with electrical conductivity and impermeability to hydrogen. However, it is necessary to prevent that hydrogen from directly entering the first and second ferroelectric metal oxide films 25-1 and 25-2 from the side surfaces of layers of the multilayer structure other than the lowest layer. The aforementioned first insulating hydrogen barrier layer 150 cuts off a plurality of hydrogen diffusion paths.

However, the aforementioned third interlayer insulating film 27 that has electrical insulation and hydrogen permeability provides a hydrogen diffusion path.

Accordingly, in this embodiment, not only the first insulating hydrogen barrier layer 150 that covers the first and second capacitors 130 and 140 but also the first hydrogen non-permeable local interconnection layer 162 and the second insulating hydrogen barrier layer 172 are provided, the hydrogen diffusion path into the first and second ferroelectric metal oxide films 25-1 and 25-2 will be disconnected. Combination of the aforementioned first insulating hydrogen barrier layer 150, the first hydrogen non-permeable local interconnection layer 162 and the second insulating hydrogen barrier layer 172 reliably prevents hydrogen that serves as a reducing agent from diffusing into the first and the second ferroelectric metal oxide films 25-1 and 25-2. Therefore, this combination can reliably prevent ferroelectric characteristic deterioration of the first and second ferroelectric metal oxide films 25-1 and 25-2 due to reduction reaction by hydrogen.

Modified Embodiment

As discussed above, the first hydrogen non-permeable local interconnection layer 162 is provided to prevent diffusion of hydrogen through each contact portion between this first hydrogen non-permeable local interconnection layer 162 and each of the first and second upper electrodes 26-1 and 26-2. Accordingly, it is not necessary for this first hydrogen non-permeable local interconnection layer 162 to entirely have impermeability to hydrogen. However, the contact portions in contact with the first and second upper electrodes 26-1 and 26-2 of the first hydrogen non-permeable local interconnection layer 162 must have the characteristic of hydrogen non-permeability. That is, as discussed above, the whole first hydrogen non-permeable local interconnection layer 162 can be formed of a substance that has electrical conductivity and impermeability to hydrogen. In addition, while the contact portions in contact with the first and second upper electrodes 26-1 and 26-2 of the first hydrogen non-permeable local interconnection layer 162 can be formed of a substance that has electrical conductivity and impermeability to hydrogen, the rest of the first hydrogen non-permeable local interconnection layer 162 other than the contact portions can be formed of electrical conductivity and hydrogen permeability. That is, if it is possible to prevent diffusion of hydrogen through each contact portion between the first hydrogen non-permeable local interconnection layer 162 and each of the first and second upper electrodes 26-1 and 26-2, it is not necessary for non-contact portions of the first hydrogen non-permeable local interconnection layer 162 to have impermeability to hydrogen.

The present invention provides hydrogen barrier structure that prevents or suppresses characteristic deterioration of a dielectric that forms capacitor insulating films of the first and second capacitors 130 and 140 due to reduction by hydrogen. Accordingly, the capacitor insulating films of the first and second capacitors 130 and 140 are not limited to ferroelectric metal oxide. They can be any of ferroelectric oxide and high-dielectric oxide. That is, as long as the capacitor insulating films of the first and second capacitors 130 and 140 are dielectric oxide, there is significance that the hydrogen barrier structure according to the present invention is applied.

In addition, in the case where a dielectric that comprises the capacitor insulating film of the first and second capacitors 130 and 140 contains dielectric oxide, or the capacitor insulating film are partially composed of dielectric oxide, there is significance that the present invention is applied. For example, the capacitor insulating film of the first and second capacitors 130 and 140 may have multilayer structure that includes one dielectric oxide layer therein.

In this embodiment, the aforementioned hydrogen barrier structure is applied to a stack type capacitor in FeRAM cell. However, the aforementioned hydrogen barrier structure can be effectively applied to other capacitor, such as planar type capacitor. In addition, the aforementioned hydrogen barrier structure can be applied to a dielectric memory device other than capacitor that includes dielectric oxide necessary to be protected from reduction reaction, such as transistor type dielectric memory device. The transistor type dielectric memory device can have a gate insulating film that is formed of dielectric oxide. In this case, a gate wiring that has electrical conductivity and non-permeability of hydrogen can be provided on the gate insulating film.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially", "about" and "approximately" as used herein mean a reasonable amount of deviation of the modified term such that the end result is not significantly changed. For example, these terms can be construed as including a deviation of at least +−0.5% of the modified term if this deviation would not negate the meaning of the word it modifies.

This application claims priority to Japanese Patent Application No. 2005-130534. The entire disclosure of Japanese Patent Application No. 2005-130534 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A memory cell structure, comprising:
a first memory capacitor arranged in a local area and comprised of a first lower electrode, a first upper electrode, and a first dielectric oxide film interposed between the first lower electrode and the first upper electrode;
a second memory capacitor arranged in the local area, spaced apart from the first memory capacitor, and comprised of a second lower electrode, a second upper electrode, and a second dielectric oxide film interposed between the second lower electrode and the second upper electrode;
a local interconnection layer that is electrically conductive and impermeable to hydrogen, extends within the local area, and is comprised of a first contact portion that is in contact with the first upper electrode and spaced apart from the first dielectric oxide film by the first upper electrode, a second contact portion that is in contact with the second upper electrode and spaced apart from the second dielectric oxide film by the second upper electrode, and a non-contact portion that connects the first contact portion to the second contact portion and is spaced apart from the first and second memory capacitors; and
a hydrogen barrier layer that is electrically conductive and impermeable to hydrogen, and covers at least the first and second contact portions of the local interconnection layer.

2. The memory cell structure according to claim 1, further comprising an insulating film that is spaced apart from the first and second contact portions of the local interconnection layer by the hydrogen barrier layer.

3. The memory cell structure, comprising:
a first memory capacitor arranged in a local area and comprised of a first lower electrode, a first upper electrode, and a first dielectric oxide film interposed between the first lower electrode and the first upper electrode;
a second memory capacitor arranged in the local area, spaced apart from the first memory capacitor, and comprised of a second lower electrode, a second upper electrode, and a second dielectric oxide film interposed between the second lower electrode and the second upper electrode;
a local interconnection layer that is electrically conductive and impermeable to hydrogen, extends within the local area, and is comprised of a first contact portion that is in contact with the first upper electrode and spaced apart from the first dielectric oxide film by the first upper electrode, a second contact portion that is in contact with the second upper electrode and spaced apart from the second dielectric oxide film by the second upper electrode, and a non-contact portion that connects the first contact portion to the second contact portion and is spaced apart from the first and second memory capacitors;
a hydrogen barrier layer that is electrically insulating and impermeable to hydrogen, and is interposed between each of the first dielectric oxide film, the second dielectric oxide film, and the non-contact portion to separate the first dielectric oxide film and the first upper electrode from the non-contact portion, and to separate the second dielectric oxide film and the second upper electrode from the non-contact portion; and
an insulating film that is electrically insulating and permeable to hydrogen, and interposed between the non-contact portion and the hydrogen barrier layer.

4. A semiconductor memory device, comprising:
a word line;
a non-inverted bit line;
a inverted bit line;
a global interconnection layer;
a first memory capacitor comprised of a first accumulation electrode, a first counter electrode, and a first dielectric oxide film interposed between the first accumulation electrode and the first counter electrode;
a second memory capacitor comprised of a second accumulation electrode, a second counter electrode, and a second dielectric oxide film interposed between the second accumulation electrode and the second counter electrode;
a local interconnection layer that is electrically conductive and impermeable to hydrogen, and comprised of a first contact portion that is in contact with the first counter electrode and spaced apart from the first dielectric oxide film by the first counter electrode, a second contact portion that is in contact with the second counter electrode and spaced apart from the second dielectric oxide film by the second counter electrode, a non-contact portion that connects the first contact portion to the second contact portion and is spaced apart from the first and second memory capacitors;
a hydrogen barrier layer that is electrically insulating and impermeable to hydrogen, and covers at least the first and second contact portions of the local interconnection layer;
a first switching transistor comprised of a first gate electrode that is electrically connected to the word line, and providing an electrical connection between the non-inverted bit line and the first accumulation electrode;
a second switching transistor comprised of a second gate electrode that is electrically connected to the word line, and providing an electrical connection between the first inverted bit line and the second accumulation electrode; and
a third switching transistor comprised of a third gate electrode that is electrically connected to the word line, and providing an electrical connection between the local interconnection layer and the global interconnection layer.

5. The semiconductor memory device according to claim 4, further comprising an insulating film that is spaced apart from the first and second contact portions of the local interconnection layer by the hydrogen barrier layer.

6. A semiconductor memory device, comprising:
a word line;
a non-inverted bit line;
an inverted bit line;
a global interconnection layer;

a first memory capacitor comprised of a first accumulation electrode, a first counter electrode, and a first dielectric oxide film interposed between the first accumulation electrode and the first counter electrode;

a second memory capacitor comprised of a second accumulation electrode, a second counter electrode, and a second dielectric oxide film interposed between the second accumulation electrode and the second counter electrode;

a local interconnection layer that is electrically conductive and impermeable to hydrogen, and comprised a first contact portion that is in contact with the first counter electrode and spaced apart from the first dielectric oxide film by the first counter electrode, a second contact portion that is in contact with the second counter electrode and spaced apart from the second dielectric oxide film by the second counter electrode, and a non-contact portion that connects the first contact portion to the second contact portion and is spaced apart from the first and second memory capacitors;

a hydrogen barrier layer that is electrically insulating and impermeable to hydrogen, and surrounds the first and second contact portions of the local interconnection layer and covers the side and upper surfaces of the first and second memory capacitors;

an insulating film that is electrically insulating and permeable to hydrogen, and interposed between the non-contact portion of the local interconnection layer and the second hydrogen barrier layer;

a first switching transistor comprised of a first gate electrode electrically connected to the word line, and providing an electrical connection between the first non-inverted bit line and the first accumulation electrode of the first memory capacitor;

a second switching transistor comprised of a second gate electrically connected to the word line, and providing an electrical connection between the inverted bit line and the second accumulation electrode of the second memory capacitor; and a third switching transistor comprised of a third gate electrode electrically connected to the word line, and providing an electrical connection between the local interconnection layer and the global interconnection layer.

7. A semiconductor memory device, comprising:

a word line;

a plate line;

a first memory capacitor comprised of a first accumulation electrode, a first counter electrode, and a first dielectric oxide film interposed between the first accumulation electrode and the first counter electrode;

a second memory capacitor comprised of a second accumulation electrode, a second counter electrode, and a second dielectric oxide film interposed between the second accumulation electrode and the second counter electrode;

a first local interconnection layer that is electrically conductive and impermeable to hydrogen, and comprised of a first contact portion that is in contact with the first counter electrode and spaced apart from the first dielectric oxide film by the first counter electrode, a second contact portion that is in contact with the second counter electrode and spaced apart from the second dielectric oxide film by the second counter electrode, and a first non-contact portion that connects the first contact portion to the second contact portion of the first local interconnection layer and is spaced apart from the first and second memory capacitors; and a switching transistor having source and drain electrodes, and having a gate electrode electrically connected to the word line, one electrode from among the source and drain electrodes being connected to the plate line and another electrode from among the source and drain electrodes being connected to the first local interconnection layer, wherein the another electrode from among the source and drain electrodes is disposed between the first memory capacitor and the second memory capacitor.

8. The semiconductor memory device according to claim 7, further comprising an insulating film that is spaced apart from the first and second counter electrodes by the first local interconnection layer.

9. The semiconductor memory device according to claim 7, further comprising a hydrogen barrier layer that is electrically conductive and impermeable to hydrogen, and covers at least the first and second contact portions of the first local interconnection layer.

10. The semiconductor memory device according to claim 9, further comprising an insulating film that is spaced apart from the first and second contact portions by the hydrogen barrier layer.

11. The semiconductor memory device according to claim 7, further comprising a hydrogen barrier layer that is electrically insulating and impermeable to hydrogen, and covers at least the first and second contact portions of the first local interconnection layer.

12. The semiconductor memory device according to claim 7, further comprising a second interconnection layer that has a conductivity which is higher than that of the first local interconnection layer, is permeable to hydrogen, and is laminated on the first local interconnection layer.

13. The semiconductor memory device according to claim 12, further comprising an insulating film that is spaced apart from the first local interconnection layer by the second local interconnection layer.

14. The semiconductor memory device according to claim 7, further comprising:

a hydrogen barrier layer that is electrically insulating and impermeable to hydrogen, and interposed between each of the first dielectric oxide, the second dielectric oxide, and the first non-contact portion to separate the first dielectric oxide and the first counter electrode from the first non-contact portion, and separate the second dielectric oxide and the second counter electrode from the second non-contact portion; and an insulating film that is electrically insulating and permeable to hydrogen, and interposed between the first non-contact portion and the hydrogen barrier layer.

15. The semiconductor memory device according to claim 7, further comprising:

a hydrogen barrier layer that is electrically insulating and impermeable to hydrogen, and surrounds the first and second contact portions and covers the side and upper surfaces of the first and second memory capacitors; and an insulating film that is electrically insulating and permeable to hydrogen, and interposed between the first non-contact portion and the hydrogen barrier layer.

* * * * *